US012415635B2

(12) United States Patent
Berthelet et al.

(10) Patent No.: US 12,415,635 B2
(45) Date of Patent: Sep. 16, 2025

(54) BASE STATIONS FOR UNMANNED AERIAL VEHICLES (UAVS)

(71) Applicant: Skydio, Inc., Redwood City, CA (US)

(72) Inventors: Christopher C. Berthelet, Sunnyvale, CA (US); Shreetej Varakantam Reddy, San Mateo, CA (US); Ioan Trayanov, San Francisco, CA (US); Dylan Matthew Callaway, San Francisco, CA (US); Yevgeniy Kozlenko, Mountain View, CA (US)

(73) Assignee: Skydio, Inc., San Mateo, CA (US)

( * ) Notice: Subject to any disclaimer, the term of this patent is extended or adjusted under 35 U.S.C. 154(b) by 383 days.

(21) Appl. No.: 17/900,032

(22) Filed: Aug. 31, 2022

(65) Prior Publication Data

US 2023/0347766 A1 Nov. 2, 2023

Related U.S. Application Data

(60) Provisional application No. 63/356,596, filed on Jun. 29, 2022, provisional application No. 63/356,595, (Continued)

(51) Int. Cl.
*B60L 53/30* (2019.01)
*B60L 53/10* (2019.01)
(Continued)

(52) U.S. Cl.
CPC ............... *B60L 53/30* (2019.02); *B60L 53/10* (2019.02); *B60L 53/302* (2019.02); *B64F 1/22* (2013.01);
(Continued)

(58) Field of Classification Search
CPC ........ B60L 53/30; B60L 53/302; B60L 53/16; B60L 2200/10; B64U 70/92; B64U 70/00;
(Continued)

(56) References Cited

U.S. PATENT DOCUMENTS 2,834,573 A 5/1958 Stalker
4,123,020 A 10/1978 Korsak
(Continued)

FOREIGN PATENT DOCUMENTS

AU 2019213466 A1 9/2020
CA 1278288 C 12/1990
(Continued)

OTHER PUBLICATIONS

Han, B. et al., "Unmanned Aerial Vehicle Automatic Storage Cabin with Clamping Body and Opening and Closing Rotor Function" Machine Translation, Chinese Patent Office CN 113148211A, Jul. 23, 2021 (Year: 2021).*

(Continued)

*Primary Examiner* — Nathaniel E Wiehe
*Assistant Examiner* — Joshua R Beebe
(74) *Attorney, Agent, or Firm* — Young Basile Hanlon & MacFarlane, P.C.

(57) ABSTRACT

A base station for an unmanned aerial vehicle (UAV) is disclosed that includes: an enclosure defining an internal cavity that is configured to receive the UAV; a door that is movably connected to the enclosure; actuators that extend between the door and the enclosure to facilitate opening and closure of the door; a cradle that is configured to receive the UAV and which is movable in relation to the enclosure such that the cradle is repositionable between a retracted position and an extended position to facilitate movement of the UAV into and out of the enclosure; and engagement members that are secured to the actuators and which are configured for contact with propeller assemblies on the UAV to facilitate folding of the propeller assemblies during movement of the UAV into the enclosure.

20 Claims, 53 Drawing Sheets

Related U.S. Application Data filed on Jun. 29, 2022, provisional application No. 63/335,686, filed on Apr. 27, 2022.

(51) Int. Cl.

| | |
|---|---|
| ***B60L 53/302*** | (2019.01) |
| ***B64F 1/22*** | (2006.01) |
| ***B64F 1/36*** | (2017.01) |
| ***B64U 70/92*** | (2023.01) |
| ***B64U 80/25*** | (2023.01) |
| ***B64U 80/70*** | (2023.01) |
| ***F01D 7/00*** | (2006.01) |
| ***H01Q 1/22*** | (2006.01) |
| ***H05K 7/20*** | (2006.01) |
| *B60L 53/16* | (2019.01) |
| *B64C 39/02* | (2023.01) |
| *B64D 43/00* | (2006.01) |
| *B64D 47/00* | (2006.01) |
| *B64U 70/00* | (2023.01) |
| *H05B 1/02* | (2006.01) |
| *H05K 1/02* | (2006.01) |
| *H10N 10/13* | (2023.01) |
| *H10N 10/17* | (2023.01) |

(52) U.S. Cl.

CPC .............. *B64F 1/362* (2013.01); *B64U 70/92* (2023.01); *B64U 80/25* (2023.01); *B64U 80/70* (2023.01); *H01Q 1/22* (2013.01); *H05K 7/20145* (2013.01); *H05K 7/20154* (2013.01); *H05K 7/20209* (2013.01); *H05K 7/20436* (2013.01); *B60L 53/16* (2019.02); *B60L 2200/10* (2013.01); *B64C 39/024* (2013.01); *B64D 43/00* (2013.01); *B64D 47/00* (2013.01); *B64U 70/00* (2023.01); *H01Q 1/2291* (2013.01); *H05B 1/0227* (2013.01); *H05K 1/0215* (2013.01); *H10N 10/13* (2023.02); *H10N 10/17* (2023.02)

(58) Field of Classification Search

CPC ...... B64U 80/25; B64U 80/70; B64U 30/293; B64U 2102/35; B64F 1/22; B64F 1/362; H01Q 1/22; H01Q 1/2291; H10N 10/13; H10N 10/17; H05K 7/20145; H05K 7/20154; H05K 7/20209; H05K 7/20436; H05K 1/0215; B64C 39/024; B64C 11/28; B64D 43/00; B64D 47/00; H05B 1/0227; B25J 15/00; F01D 7/00

See application file for complete search history.

(56) References Cited

U.S. PATENT DOCUMENTS

| | | | |
|---|---|---|---|
| 5,727,754 A | 3/1998 | Carter, Jr. | |
| 5,950,373 A | 9/1999 | von Hoff et al. | |
| 6,233,003 B1 | 5/2001 | Ono | |
| 6,352,411 B1 | 3/2002 | Bucher et al. | |
| 6,435,453 B1 | 8/2002 | Carter, Jr. | |
| 6,487,779 B1 | 12/2002 | Underthun | |
| 6,802,694 B2 | 10/2004 | Bucher et al. | |
| 7,448,571 B1 | 11/2008 | Carter, Jr. et al. | |
| 8,511,606 B1 | 8/2013 | Lutke et al. | |
| 8,588,210 B2 | 11/2013 | Newberg et al. | |
| 9,139,310 B1 | 9/2015 | Wang | |
| 9,457,901 B2 | 10/2016 | Bertrand et al. | |
| 9,469,394 B2 | 10/2016 | Vaughn et al. | |
| 9,567,076 B2 | 2/2017 | Zhang | |
| 9,678,506 B2 | 6/2017 | Bachrach et al. | |
| 9,718,564 B1 | 8/2017 | Beckman et al. | |
| 9,764,829 B1 | 9/2017 | Beckman et al. | |
| 9,764,836 B1 | 9/2017 | Elzinga et al. | |
| 9,777,502 B2 | 10/2017 | Curlander et al. | |
| 9,783,075 B2 | 10/2017 | Henry et al. | |
| 9,798,322 B2 | 10/2017 | Bachrach et al. | |
| 9,834,305 B2 | 12/2017 | Taylor et al. | |
| 9,840,339 B1 | 12/2017 | O'Brien et al. | |
| 9,891,621 B2 | 2/2018 | Bachrach et al. | |
| 9,972,212 B1 | 5/2018 | Sperindeo et al. | |
| 10,011,352 B1 | 7/2018 | Dahlstrom | |
| 10,011,354 B2 | 7/2018 | Goldstein | |
| 10,104,289 B2 | 10/2018 | Enriquez et al. | |
| 10,137,983 B2 | 11/2018 | Horn | |
| 10,207,820 B2 | 2/2019 | Sullivan et al. | |
| 10,386,188 B2 | 8/2019 | Tian et al. | |
| 10,435,176 B2 | 10/2019 | McClure et al. | |
| 10,453,348 B2 | 10/2019 | Speasl et al. | |
| 10,455,155 B1 | 10/2019 | Kalinowski et al. | |
| 10,467,685 B1 | 11/2019 | Brisson et al. | |
| 10,494,094 B2 | 12/2019 | Foley | |
| 10,520,943 B2 | 12/2019 | Martirosyan et al. | |
| 10,549,850 B1 | 2/2020 | Ryan et al. | |
| 10,575,448 B1 | 2/2020 | Lewis et al. | |
| 10,612,523 B1 | 4/2020 | Srinivasan | |
| 10,618,650 B2 | 4/2020 | Hasinski et al. | |
| 10,647,404 B2 | 5/2020 | Sugaki et al. | |
| 10,717,524 B1 | 7/2020 | Boyes et al. | |
| 10,793,270 B2 | 10/2020 | Chen et al. | |
| 10,816,967 B2 | 10/2020 | Bachrach et al. | |
| 10,831,186 B2 | 11/2020 | Van Niekerk et al. | |
| D906,170 S | 12/2020 | Thompson et al. | |
| 10,913,546 B2 | 2/2021 | Krauss et al. | |
| 10,946,959 B2 | 3/2021 | Nwosu | |
| 10,981,661 B2 | 4/2021 | Oldroyd et al. | |
| 10,992,865 B2 | 4/2021 | Kalinowski et al. | |
| 11,007,290 B2 | 5/2021 | Kreitenberg et al. | |
| 11,065,976 B2 | 7/2021 | Venturelli et al. | |
| 11,111,033 B1 | 9/2021 | Burks et al. | |
| 11,124,298 B2 | 9/2021 | Chen et al. | |
| 11,148,805 B2 | 10/2021 | Cooper et al. | |
| 11,292,598 B2 | 4/2022 | Foley | |
| 11,308,815 B2 | 4/2022 | Speasl et al. | |
| 11,407,526 B2 | 8/2022 | Wang | |
| 11,453,513 B2 | 9/2022 | Thompson et al. | |
| 11,530,028 B1 | 12/2022 | Wiegman | |
| 11,530,052 B1 | 12/2022 | Alspaugh et al. | |
| 11,597,515 B2 | 3/2023 | Passley | |
| 11,636,771 B2 | 4/2023 | Barker et al. | |
| 2001/0046442 A1 | 11/2001 | Bucher et al. | |
| 2005/0224874 A1 | 10/2005 | Chakravarthi et al. | |
| 2006/0249622 A1 | 11/2006 | Steele | |
| 2006/0251522 A1 | 11/2006 | Matheny et al. | |
| 2008/0251308 A1 | 10/2008 | Molnar et al. | |
| 2009/0283629 A1 | 11/2009 | Kroetsch et al. | |
| 2011/0139665 A1 | 6/2011 | Madsen | |
| 2011/0268194 A1 | 11/2011 | Nagano | |
| 2012/0162913 A1 | 6/2012 | Lai | |
| 2012/0162917 A1 | 6/2012 | Chen et al. | |
| 2012/0232718 A1 | 9/2012 | Rischmuller et al. | |
| 2012/0287274 A1 | 11/2012 | Bevirt | |
| 2013/0051778 A1 | 2/2013 | Dimotakis | |
| 2013/0099063 A1 | 4/2013 | Grip et al. | |
| 2013/0175390 A1 | 7/2013 | Woodworth et al. | |
| 2013/0176423 A1 | 7/2013 | Rischmuller et al. | |
| 2013/0280084 A1 | 10/2013 | Nagle et al. | |
| 2014/0124621 A1 | 5/2014 | Godzdanker et al. | |
| 2014/0333074 A1 | 11/2014 | Wollacott et al. | |
| 2014/0356174 A1 | 12/2014 | Wang et al. | |
| 2015/0137424 A1 | 5/2015 | Lyons et al. | |
| 2015/0149000 A1 | 5/2015 | Rischmuller et al. | |
| 2015/0321758 A1 | 11/2015 | Sarna, II | |
| 2015/0370250 A1 | 12/2015 | Bachrach et al. | |
| 2016/0009413 A1* | 1/2016 | Lee .......................... | G08G 5/55 701/16 |
| 2016/0011592 A1 | 1/2016 | Zhang et al. | |
| 2016/0129998 A1 | 5/2016 | Welsh et al. | |
| 2016/0185466 A1 | 6/2016 | Dreano, Jr. | |
| 2016/0214713 A1 | 7/2016 | Cragg | |
| 2016/0214715 A1 | 7/2016 | Meffert | |
| 2016/0257426 A1 | 9/2016 | Mozer | |

(56) References Cited

U.S. PATENT DOCUMENTS

2016/0286128 A1 9/2016 Zhou
2016/0327950 A1 11/2016 Bachrach et al.
2016/0340028 A1 11/2016 Datta
2016/0364989 A1 12/2016 Speasl et al.
2016/0376000 A1 12/2016 Kohstall
2016/0376004 A1 12/2016 Claridge et al.
2017/0023949 A1 1/2017 Fisher et al.
2017/0036771 A1 2/2017 Woodman et al.
2017/0050749 A1* 2/2017 Pilskalns ................ B60L 53/14
2017/0057630 A1 3/2017 Schwaiger
2017/0073085 A1 3/2017 Tremblay et al.
2017/0075351 A1 3/2017 Liu
2017/0113793 A1 4/2017 Toulmay
2017/0113800 A1 4/2017 Freeman
2017/0117676 A1 4/2017 James et al.
2017/0126935 A1 5/2017 Tai et al.
2017/0129464 A1 5/2017 Wang et al.
2017/0144776 A1 5/2017 Fisher et al.
2017/0158328 A1 6/2017 Foley
2017/0158352 A1 6/2017 von Flotow et al.
2017/0217585 A1 8/2017 Hulsman et al.
2017/0225802 A1 8/2017 Lussier et al.
2017/0233069 A1 8/2017 Apkarian
2017/0240061 A1 8/2017 Waters
2017/0244270 A1 8/2017 Waters
2017/0297681 A1 10/2017 Yamada et al.
2017/0297738 A1 10/2017 von Flotow et al.
2017/0301111 A1 10/2017 Zhao et al.
2017/0327218 A1 11/2017 Morin et al.
2018/0024570 A1 1/2018 Hutson
2018/0032042 A1 2/2018 Turpin et al.
2018/0046187 A1 2/2018 Martirosyan et al.
2018/0093171 A1 4/2018 Mallinson
2018/0093781 A1 4/2018 Mallinson
2018/0181119 A1 6/2018 Lee et al.
2018/0194463 A1 7/2018 Hasinski et al.
2018/0208301 A1 7/2018 Ye
2018/0208311 A1 7/2018 Zhang et al.
2018/0284575 A1 10/2018 Sugaki et al.
2018/0312253 A1 11/2018 Zhao et al.
2018/0312254 A1 11/2018 Ni
2018/0326255 A1 11/2018 Schranz
2018/0327091 A1 11/2018 Burks et al.
2019/0002124 A1 1/2019 Garvin
2019/0002127 A1 1/2019 Straus et al.
2019/0023395 A1 1/2019 Lee et al.
2019/0023416 A1* 1/2019 Borko ................. B65G 1/0485
2019/0061976 A1 2/2019 Schweighart et al.
2019/0068953 A1 2/2019 Choi et al.
2019/0084673 A1 3/2019 Chen et al.
2019/0100313 A1 4/2019 Campbell
2019/0102874 A1 4/2019 Goja
2019/0118944 A1 4/2019 Kimchi et al.
2019/0135403 A1 5/2019 Perry et al.
2019/0144100 A1 5/2019 Samir
2019/0168872 A1 6/2019 Grubb et al.
2019/0217971 A1 7/2019 Comerford
2019/0230801 A1 7/2019 Neuman et al.
2019/0248487 A1 8/2019 Holtz et al.
2019/0270526 A1 9/2019 Hehn et al.
2019/0289193 A1 9/2019 Bevirt
2019/0329903 A1 10/2019 Thompson et al.
2019/0367185 A1 12/2019 Zambelli
2019/0377345 A1 12/2019 Bachrach et al.
2019/0378423 A1 12/2019 Bachrach et al.
2019/0379268 A1 12/2019 Adams et al.
2020/0001990 A1 1/2020 Jiang et al.
2020/0023995 A1 1/2020 Song et al.
2020/0036896 A1 1/2020 Kalinowski et al.
2020/0041996 A1 2/2020 Bachrach et al.
2020/0064135 A1 2/2020 Lai et al.
2020/0072283 A1 3/2020 Roberts et al.
2020/0073385 A1 3/2020 Jobanputra et al.
2020/0107154 A1 4/2020 Kam et al.
2020/0108930 A1 4/2020 Foley
2020/0156749 A1 5/2020 Scacchi
2020/0164966 A1 5/2020 Suzuki
2020/0165007 A1 5/2020 Augugliaro et al.
2020/0391864 A1 12/2020 Lee et al.
2020/0398999 A1 12/2020 Ortiz et al.
2021/0009269 A1 1/2021 Chen et al.
2021/0061482 A1 3/2021 Ulrich et al.
2021/0070468 A1 3/2021 Svirsky et al.
2021/0074170 A1 3/2021 Barker et al.
2021/0107682 A1* 4/2021 Kozlenko ............. B64U 70/30
2021/0107684 A1 4/2021 Le Lann
2021/0109312 A1 4/2021 Honjo et al.
2021/0114729 A1 4/2021 Ragan et al.
2021/0197983 A1 7/2021 Wang et al.
2021/0214067 A1 7/2021 West et al.
2021/0214068 A1 7/2021 Bry et al.
2021/0245860 A1 8/2021 Bry et al.
2021/0261252 A1 8/2021 Dayan
2021/0269174 A1 9/2021 Shuff
2021/0276733 A1 9/2021 Kozlenko et al.
2021/0276734 A1 9/2021 Kozlenko et al.
2021/0284335 A1 9/2021 McLaughlin et al.
2021/0309388 A1 10/2021 Ratajczak et al.
2021/0314490 A1 10/2021 Kalinowski et al.
2021/0403177 A1 12/2021 Thompson et al.
2022/0001982 A1 1/2022 Chen et al.
2022/0019247 A1 1/2022 Dayan et al.
2022/0185475 A1 6/2022 Foley
2022/0326705 A1 10/2022 Thompson et al.
2022/0355952 A1 11/2022 Thompson et al.
2022/0411102 A1 12/2022 Thompson et al.
2022/0411103 A1 12/2022 Thompson et al.
2022/0412023 A1 12/2022 Palombini
2023/0002074 A1 1/2023 Thompson et al.
2023/0017530 A1 1/2023 Lowe et al.
2023/0023246 A1 1/2023 McLaughlin et al.
2023/0136701 A1 5/2023 Wiegman
2023/0144408 A1 5/2023 Thompson et al.
2023/0166862 A1 6/2023 Thompson et al.
2023/0287675 A1 9/2023 Stahl et al.
2024/0132238 A1 4/2024 Qiu et al.

FOREIGN PATENT DOCUMENTS

CN 109455307 A 3/2019
CN 109622461 A 4/2019
CN 113247289 A 8/2021
CN 113562189 A 10/2021
CN 113716062 A 11/2021
CN 114475946 A 5/2022
CN 114537691 A 5/2022
CN 114572413 A 6/2022
CN 114655056 A 6/2022
CN 115626281 A 1/2023
DE 102018203290 A1 3/2019
DE 112017007148 T5 12/2019
EP 3418201 A1 12/2018
FR 3050981 A1 11/2017
WO 2021082794 A1 5/2021
WO 2022045459 A1 3/2022
WO 2023017027 A1 2/2023
WO 2023056516 A1 4/2023

OTHER PUBLICATIONS

Xing, Yang, "Blade Automatic Folding Device, Unmanned Aerial Vehicle Horn and Unmanned Aerial Vehicle" CPO, CN 107235145 A Machine Translation, Oct. 10, 2017 (Year: 2017).*
International Search Report and Written Opinion mailed on Mar. 13, 2023 in corresponding PCT Application No. PCT/US2022/050705.

* cited by examiner

FIG. 30
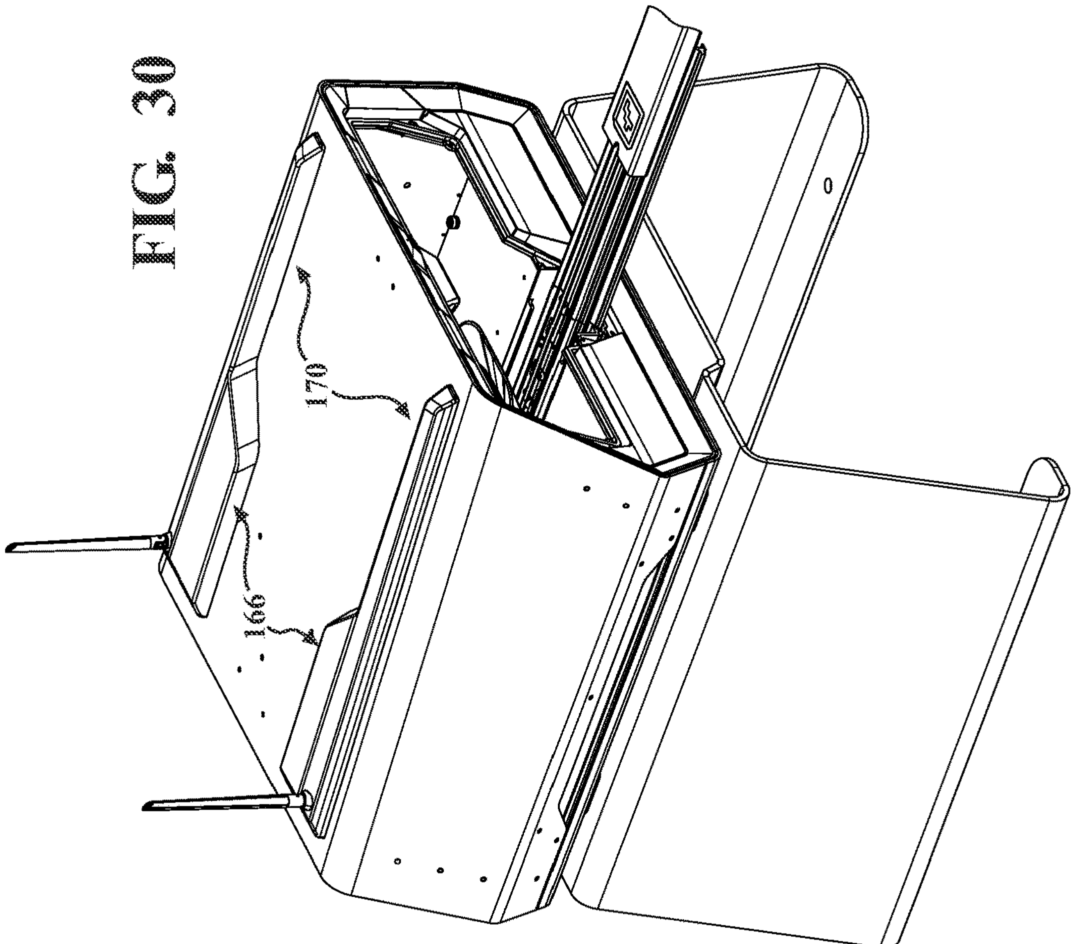
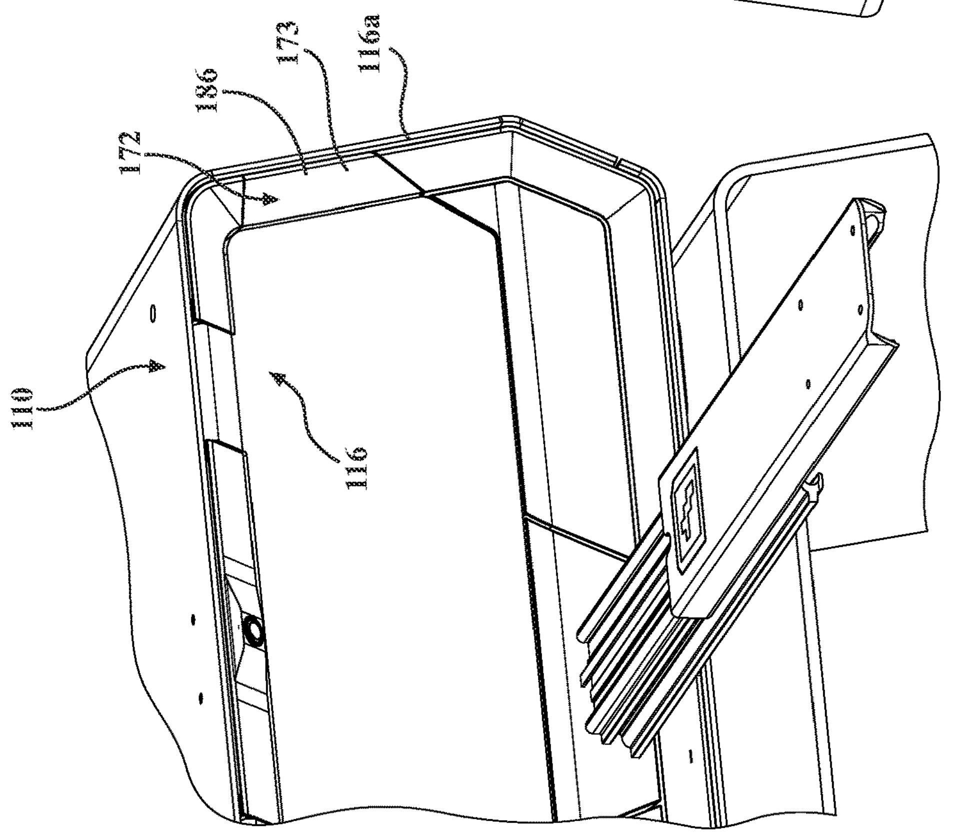
FIG. 29

FIG. 49
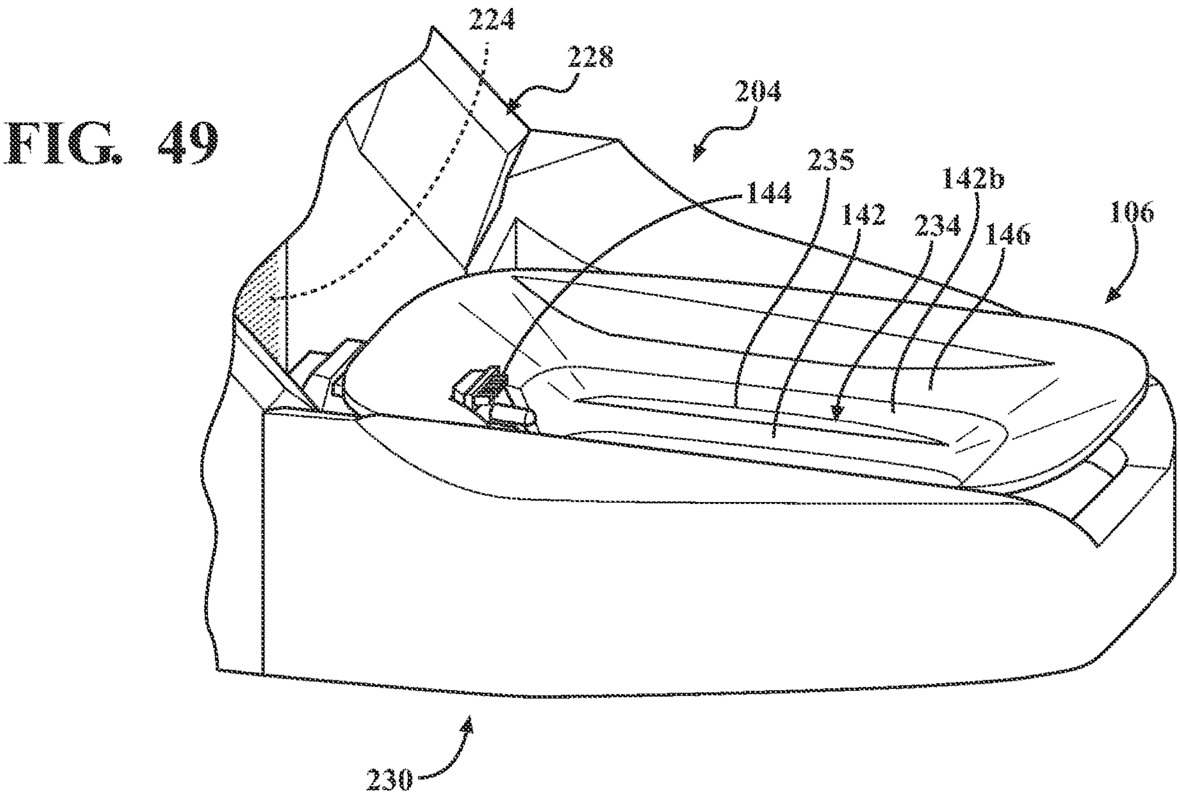
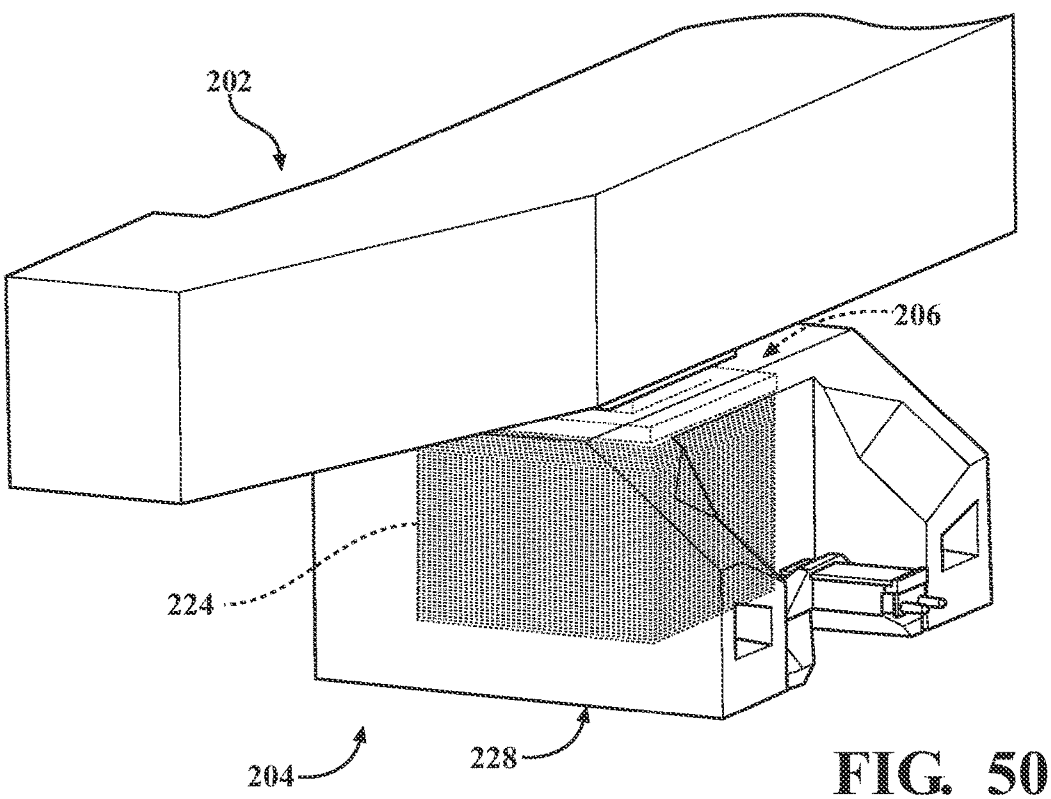
FIG. 50

BASE STATIONS FOR UNMANNED AERIAL VEHICLES (UAVS)

CROSS-REFERENCE TO RELATED APPLICATIONS

This application claims the benefit of and priority to U.S. Provisional Application No. 63/335,686, filed Apr. 27, 2022, U.S. Provisional Application No. 63/356,595, filed Jun. 29, 2022, and U.S. Provisional Application No. 63/356,596, filed Jun. 29, 2022, the disclosures of which are hereby incorporated by reference in their entirety.

TECHNICAL FIELD

The present disclosure relates to a base station (dock) for an unmanned aerial vehicle (UAV) (e.g., a drone). More specifically, the present disclosure relates to a base station that includes a series of integrated systems, which allow for automated servicing (e.g., docking, storage, charging, operation, etc.) and accommodation of a UAV.

BACKGROUND

Known base stations for UAVs are often large, mechanically complex, and expensive. The present disclosure addresses these deficiencies, among others, and provides a base station that offers improved servicing of UAVs and significant size reductions that allow for more efficient operation and substantial cost savings.

SUMMARY

In one aspect of the present disclosure, a base station is disclosed that is configured for use with an unmanned aerial vehicle (UAV). The base station includes: an enclosure; a cradle that is configured to receive the UAV during docking to facilitate charging of a power source of the UAV; and a temperature control system that is connected to the cradle and which is configured to vary temperature of the power source of the UAV. The cradle is movable between a retracted position, in which the cradle is positioned within the enclosure, and an extended position, in which the cradle is positioned externally of the enclosure to facilitate docking with the UAV. The temperature control system includes: a thermoelectric conditioner (TEC) having a first end and a second end; a first air circuit that is thermally connected to the TEC and which is configured to regulate temperature of the TEC; and a second air circuit that is thermally connected to the TEC such that the TEC is located between the first air circuit and the second air circuit. The second air circuit is configured to direct air across the cradle to thereby heat or cool the power source of the UAV when docked with the base station.

In various embodiments, the temperature control system may be configured to cool the power source of the UAV (e.g., when the base station and the UAV are used in hot environments) or to heat the power source of the UAV (e.g., when the base station and the UAV are used in cold environments).

In certain embodiments, the first air circuit may be configured as an open system and the second air circuit may be configured as a closed system.

In certain embodiments, the TEC may be configured as a Peltier system.

In certain embodiments, the first air circuit may include: a first plenum; a first heat sink that is connected to the first plenum and the first end of the TEC; and a first air circulator that is configured to direct air through the first plenum and across the first heat sink to vary air temperature within the first air circuit and thereby regulate the temperature of the TEC.

In certain embodiments, the second air circuit may include: a second plenum; a second heat sink that is connected to the second plenum and the second end of the TEC; and a second air circulator that is configured to direct air through the second plenum and across the second heat sink to vary air temperature within the second air circuit and thereby heat or cool the power source of the UAV when docked with the base station.

In certain embodiments, the temperature control system may be configured to cool the power source of the UAV when docked with the base station.

In certain embodiments, the second plenum may define an air inlet and an air outlet.

In certain embodiments, the air inlet may be configured to direct air into the cradle and across the power source of the UAV and the air outlet may be configured to receive the air directed across the power source of the UAV and redirect the air across the second heat sink.

In certain embodiments, the second plenum may include a first section and a second section that is movable in relation to the first section.

In certain embodiments, the first section may be connected to the TEC and the second section may be connected to the cradle.

In certain embodiments, the first section and the second section may be configured for mating engagement upon movement of the cradle into the retracted position.

In another aspect of the present disclosure, a base station is disclosed that is configured for use with a UAV. The base station includes a temperature control system that is configured to vary temperature of the UAV. The temperature control system includes: a thermoelectric conditioner (TEC); an open air circuit that is thermally connected to the TEC and which is configured to regulate temperature of the TEC; and a closed air circuit that is thermally connected to the TEC such that the TEC is located between the open air circuit and the closed air circuit. The closed air circuit is configured to direct air across the UAV when docked with the base station.

In certain embodiments, the temperature control system may be configured to heat or cool the UAV subject to environmental conditions.

In certain embodiments, the closed air circuit may include a first section and a second section that is movable in relation to the first section.

In certain embodiments, the base station may further include a cradle that is configured to receive the UAV during docking to facilitate charging of the UAV.

In certain embodiments, the cradle may be extendable from and retractable into the base station.

In certain embodiments, the first section of the closed air circuit may be connected to the TEC and the second section of the closed air circuit may be connected to the cradle.

In certain embodiments, the first section and the second section may be configured for mating engagement upon retraction of the cradle into the base station.

In another aspect of the present disclosure, a method is disclosed for regulating the temperature of a power source in a UAV. The method includes: docking the UAV within a cradle of a base station; retracting the cradle into the base station; and directing thermally conditioned air across the power source of the UAV via an air circuit that is connected to the cradle.

In certain embodiments, the method may further include directing air across a heat sink that is thermally connected to a thermoelectric conditioner (TEC) to treat the air prior to direction across the power source of the UAV.

In certain embodiments, directing air across the heat sink may include circulating the air through a plenum that is connected to the heat sink.

In certain embodiments, retracting the cradle into the base station may include closing the air circuit.

In certain embodiments, closing the air circuit may include mating a first section of the plenum with a second section of the plenum.

In certain embodiments, the first section of the plenum may be connected to the TEC and the second section of the plenum may be connected to the cradle.

In another aspect of the present disclosure, a base station is disclosed that is configured for use with a UAV. The base station includes: an enclosure with an outer housing that defines a roof section and an inner housing that is connected to the outer housing; one or more heating elements that are supported by the enclosure and which are configured to heat the roof section; one or more fiducials that are supported by the enclosure; an illumination system that is supported by the enclosure and which is configured to illuminate the one or more fiducials; and a visualization system that is supported by the enclosure.

In certain embodiments, the enclosure (e.g., the outer housing) may define one or more channels that are configured to direct water in a manner that inhibits entry into the base station.

In certain embodiments, the base station may further include one or more temperature sensors that are in communication with the one or more heating elements such that the one or more heating elements are activated upon receiving a signal relayed by the one or more temperature sensors indicating that temperature has crossed a threshold.

In certain embodiments, the one or more fiducials may include a first fiducial and a second fiducial, each of which is supported by the roof section.

In certain embodiments, the second fiducial may be removably connected to the roof section.

In certain embodiments, the first fiducial may define a first surface area, and the second fiducial may define a second surface area that is less than the first surface area.

In certain embodiments, the first surface area may lie substantially within the range of (approximately) 40 percent to (approximately) 80 percent of a surface area defined by the roof section.

In certain embodiments, the second surface area may lie substantially within the range of (approximately) 10 percent to (approximately) 50 percent of the first surface area.

In certain embodiments, the illumination system may include one or more light sources that are connected (secured) to the roof section and which are configured to light the first fiducial and the second fiducial.

In certain embodiments, the illumination system may be configured to strobe the one or more light sources according to a pattern that is recognizable by the UAV during approach to thereby identify the base station.

In certain embodiments, the visualization system may include a digital image capturing device that is configured to identify precipitation and actuate the one or more heating elements.

In certain embodiments, the base station may further include one or more status indicators that are supported by the enclosure (e.g., the outer housing).

In certain embodiments, the base station may further include one or more internal fans to regulate temperature and/or humidity within the base station.

In certain embodiments, the internal fan(s) may be supported by at least one of the outer housing and the inner housing.

In another aspect of the present disclosure, a base station is disclosed that is configured for use with a UAV. The base station includes: an enclosure; a (front) door that is movably connected to the enclosure such that the door is repositionable between a closed position and an open position; and one or more actuators that extend between the door and the enclosure. The enclosure includes an outer housing and an inner housing that is connected to the outer housing and which defines an internal cavity that is configured receive the UAV. Each actuator includes a motor assembly and a linkage assembly that extends between the motor assembly and the door. The motor assembly is connected (secured) to the inner housing such that the motor assembly is located between the outer housing and the inner housing, and the linkage assembly extends through the inner housing.

In certain embodiments, the linkage assembly may include: a drive screw that is operatively connected to the motor assembly such that actuation of the motor assembly causes rotation of the drive screw; a carrier that is threadably engaged to the drive screw such that rotation of the drive screw causes axial translation of the carrier; a first arm; and a second arm.

In certain embodiments, the first arm may have a first end that is pivotably connected to the carrier and a second end, and the second arm may have a first end that is pivotably connected to the second end of the first arm and a second end that is pivotably connected to the door.

In certain embodiments, the base station may further include a bracket that is fixedly connected to the door.

In certain embodiments, the bracket may be pivotably connected to the second end of the second arm.

In certain embodiments, the drive screw may be configured such that rotation of the drive screw in a first direction causes advancement of the carrier towards the door and rotation of the drive screw in a second direction causes advancement of the carrier away from the door.

In certain embodiments, the drive screw may include threading defining a pitch that is configured to inhibit force transmission from the door to the carrier to thereby maintain the door in the closed position.

In another aspect of the present disclosure, a base station is disclosed that is configured for use with an unmanned aerial vehicle (UAV). The base station includes: an enclosure defining an internal cavity that is configured to receive the UAV; a first fiducial that is supported by a roof section of the enclosure and which defines a first surface area; a second fiducial that is supported by the roof section of the enclosure and which defines a second surface area that is less than the first surface area; and an illumination system that is supported by roof section and which is configured to illuminate the first fiducial and the second fiducial.

In certain embodiments, the second fiducial may be configured for removable connection to the roof section.

In certain embodiments, the first surface area may lie substantially within the range of (approximately) 40 percent to (approximately) 80 percent of a surface area defined by the roof section.

In certain embodiments, the second surface area may lie substantially within the range of (approximately) 10 percent to (approximately) 50 percent of the first surface area.

In certain embodiments, the illumination system may be configured to strobe according to a pattern recognizable by the UAV during approach to thereby identify the base station.

In another aspect of the present disclosure, a UAV is disclosed that includes a power source. The power source includes: one or more power cells; one or more thermal transfer members that are thermally connected to the one or more power cells; and a heat exchanger that is thermally connected to the one or more thermal transfer members such that the one or more thermal transfer members and the heat exchanger facilitate a transfer of thermal energy between the power source and ambient air to decrease or increase temperature of the power source.

In certain embodiments, the one or more thermal transfer members may extend between the one or more power cells and the heat exchanger.

In certain embodiments, the one or more thermal transfer members may include graphite.

In certain embodiments, the one or more thermal transfer members may be unitary in construction.

In certain embodiments, the one or more power cells and the one or more thermal transfer members may correspond in number.

In certain embodiments, the one or more power cells may include a plurality of individual power cells and the one or more thermal transfer members may include a plurality of individual thermal transfer members.

In certain embodiments, the heat exchanger may include one or more diffusers to increase surface area of the heat exchanger and thermal energy distribution towards or away from the power source.

In certain embodiments, the one or more diffusers may extend axially and/or laterally along an outer surface of the heat exchanger.

In certain embodiments, the one or more diffusers may include a plurality of diffusers.

In certain embodiments, the plurality of diffusers may be configured as fins that define one or more channels therebetween.

In certain embodiments, the one or more channels may be configured to direct air flow along the heat exchanger to increase thermal energy distribution towards or away from the power source.

In another aspect of the present disclosure, a UAV is disclosed that includes a power source. The power source includes a heat exchanger that is configured to transfer thermal energy between the power source and ambient air to decrease or increase temperature of the power source. The heat exchanger includes one or more diffusers to increase surface area of the heat exchanger and thermal energy distribution towards or away from the power source.

In certain embodiments, the one or more diffusers may extend axially and/or laterally along an outer surface of the heat exchanger.

In certain embodiments, the one or more diffusers may include a plurality of diffusers.

In certain embodiments, the plurality of diffusers may be configured as fins that define one or more channels therebetween.

In certain embodiments, the one or more channels may be configured to direct air flow along the heat exchanger to increase thermal energy distribution towards or away from the power source.

In another aspect of the present disclosure, a UAV is disclosed that includes: a body; one or more antennas that extend from the body; and a power source that is connected to the body. The one or more antennas are reconfigurable between an active configuration, in which the one or more antennas extend outwardly from the body, and a passive configuration, in which the one or more antennas are positioned adjacent to the body. The power source includes one or more diffusers that extend axially and/or laterally along an outer surface of the power source to transfer thermal energy between the power source and ambient air to decrease or increase temperature of the power source.

In certain embodiments, the one or more antennas may be biased towards the active configuration.

In certain embodiments, the one or more diffusers may include a plurality of diffusers.

In certain embodiments, the plurality of diffusers may be configured as fins that define one or more channels therebetween.

In certain embodiments, the one or more channels may be configured to direct air flow along the power source to increase thermal energy distribution towards or away from the power source.

In certain embodiments, the power source may further includes one or more power cells and one or more thermal transfer members that are thermally connected to the one or more power cells and to the one or more diffusers.

In certain embodiments, the one or more thermal transfer members may include graphite.

In certain embodiments, the one or more thermal transfer members may be unitary in construction.

In another aspect of the present disclosure, a base station for an unmanned aerial vehicle (UAV) is disclosed that includes: an enclosure; a slide mechanism that includes openings; and a cradle.

The slide mechanism is repositionable between a retracted position and an extended position and is secured in relation (connected) to the enclosure via first mounts and second mounts. The first mounts and the second mounts are located between the slide mechanism and the enclosure so as to separate the slide mechanism from the enclosure and thereby reduce vibration of the slide mechanism during repositioning between the retracted position and the extended position (extension and retraction).

The cradle is connected to the slide mechanism and is configured for docking with the UAV such that the UAV is movable into and out of the enclosure during repositioning of the slide mechanism between the retracted position and the extended position.

In certain embodiments, the enclosure may include a plurality of studs that extend towards the slide mechanism.

In certain embodiments, each of the first mounts and the second mounts may be configured to receive one of the plurality of studs.

In certain embodiments, the first mounts may include: a first bushing; a shank extending from the first bushing that is configured for insertion into one of the openings in the slide mechanism; and a fastener that is configured for releasable connection to the shank such that the slide mechanism is secured between the first bushing and the fastener.

In certain embodiments, the first bushing may define an aperture to facilitate connection of the first bushing to the enclosure.

In certain embodiments, the shank and the fastener may be configured for threaded engagement.

In certain embodiments, the first bushing may include a compliant material to facilitate force absorption by the first mounts and thereby reduce vibration of the slide mechanism during repositioning between the retracted position and the extended position.

In certain embodiments, the second mounts may include a second bushing having a non-uniform transverse cross-sectional configuration.

In certain embodiments, the second bushing may include a base portion and a stem that extends from the base portion.

In certain embodiments, the base portion may define a first transverse cross-sectional dimension and the stem may define a second transverse cross-sectional dimension that is less than the first transverse cross-sectional dimension.

In certain embodiments, the stem may be configured for insertion into one of the openings in the slide mechanism.

In certain embodiments, the openings in the slide mechanism may define a third transverse cross-sectional dimension that is less than the first transverse cross-sectional dimension and greater than the second transverse cross-sectional dimension, whereby the stem is receivable by the slide mechanism such that the slide mechanism is movable in relation to the second mounts in two degrees-of-freedom that are oriented in generally orthogonal relation.

In certain embodiments, the second mounts may further include a fastener that is configured to secure the second bushing in relation to the enclosure.

In another aspect of the present disclosure, a base station for an unmanned aerial vehicle (UAV) is disclosed that includes: an enclosure having a plurality of studs that extend upwardly therefrom; a slide mechanism that includes openings; and a cradle.

The slide mechanism is repositionable between a retracted position and an extended position and is indirectly connected to the enclosure via first mounts and second mounts. The first mounts include a first threaded interface that is configured for connection to one of the plurality of studs and a second threaded interface that is separated from the first threaded interface by a compliant material. The second mounts include: a base portion that defines a first transverse cross-sectional dimension; a stem that extends from the base portion and which defines a second transverse cross-sectional dimension that is less than the first transverse cross-sectional dimension; and a channel that extends through the base portion and the stem and which is configured to receive one of the plurality of studs.

The cradle is connected to the slide mechanism and is configured for docking with the UAV such that the UAV is movable into and out of the enclosure via the slide mechanism.

In certain embodiments, the first mounts and the second mounts may be located between the enclosure and the slide mechanism such that the enclosure and the slide mechanism are physically separated by the first mounts and the second mounts.

In certain embodiments, the second threaded interface may include a shank that is configured for insertion into one of the openings in the slide mechanism and which is configured for connection to a fastener to thereby secure the first mounts and the slide mechanism to the enclosure.

In certain embodiments, the stem may be configured for insertion into one of the openings in the slide mechanism, which defines a third transverse cross-sectional dimension that is less than the first transverse cross-sectional dimension and greater than the second transverse cross-sectional dimension such that a lateral gap is defined between the stem and the opening in the slide mechanism to allow for predetermined lateral movement of the slide mechanism within the enclosure to inhibit lateral over-travel of the slide mechanism.

In certain embodiments, the second mounts may further include a fastener that is configured for releasable connection to the stud received by the channel such that an axial gap is defined between the fastener and the base portion to allow for predetermined axial movement of the slide mechanism within the enclosure to inhibit axial over-travel of the slide mechanism.

In another aspect of the present disclosure, a base station for an unmanned aerial vehicle (UAV) is disclosed that includes: an enclosure; a slide mechanism that includes openings and which is retractable and extendable in relation to the housing to facilitate movement of the UAV into and out of the enclosure; first mounts that are configured for insertion into the slide mechanism such that the first mounts are located between the slide mechanism and the enclosure; and second mounts that are configured for insertion into the slide mechanism such that the second mounts are located between the slide mechanism and the enclosure, wherein the first mounts and the second mounts include non-identical configurations.

In certain embodiments, the first mounts may be fixed in relation to the slide mechanism.

In certain embodiments, the second mounts may be configured to facilitate relative movement between the second mounts and the slide mechanism.

In certain embodiments, the second mounts may include a stepped configuration.

In certain embodiments, the second mounts may include a base portion defining a first transverse cross-sectional dimension and a stem that extends from the base portion and which defines a second transverse cross-sectional dimension that is less than the first transverse cross-sectional dimension.

In certain embodiments, the stem may be configured for insertion into one of the openings in the slide mechanism so as to define lateral and axial gaps allowing for predetermined lateral and axial movement of the slide mechanism within the enclosure in two degrees-of-freedom to inhibit over-travel of the slide mechanism and unintended contact between the slide mechanism and internal components of the base station.

In another aspect of the present disclosure, a method of assembling a base station for an unmanned aerial vehicle (UAV) is disclosed. The method includes: connecting first mounts to an enclosure of the base station; connecting second mounts to the enclosure, wherein the first mounts include a first configuration, and the second mounts include a second, different configuration; connecting a slide mechanism to the first mounts and the second mounts such that the first mounts and the second mounts are located between the slide mechanism and the enclosure to thereby separate the slide mechanism from the enclosure and reduce vibration of the slide mechanism during extension and retraction; and connecting a cradle configured for docking with the UAV to the slide mechanism such that the UAV is movable into and out of the enclosure during extension and retraction of the slide mechanism.

In certain embodiments, connecting the first mounts to the enclosure may include inserting first studs extending from the enclosure into apertures defined by the first mounts.

In certain embodiments, inserting the first studs into the apertures defined by the first mounts may include threadably connecting the first studs to first bushings of the first mounts such that the first studs extend partially into the first bushings.

In certain embodiments, connecting the second mounts to the enclosure may include inserting second studs extending from the enclosure into channels defined by second bushings of the second mounts such that the second studs extend through the second mounts.

In certain embodiments, connecting the slide mechanism to the first mounts may include inserting shanks extending from the first bushings into openings in the slide mechanism.

In certain embodiments, connecting the slide mechanism to the second mounts may include inserting the second bushings into openings in the slide mechanism.

In certain embodiments, inserting the second bushings into the openings in the slide mechanism may include positioning base portions of the second bushings between the enclosure and the slide mechanism and inserting stems extending from the base portions into the openings in the slide mechanism such that the slide mechanism is movable in relation to the second mounts in two degrees-of-freedom oriented in generally orthogonal relation.

In certain embodiments, connecting the slide mechanism to the first mounts may include threadably connecting first fasteners to the shanks extending from the first bushings.

In certain embodiments, connecting the slide mechanism to the second mounts may include threadably connecting second fasteners to the second studs extending through the second bushings.

In certain embodiments, connecting the slide mechanism to the second mounts may include forming radial gaps between the stems and the openings in the slide mechanism and forming axial gaps between the base portions and the second fasteners.

In another aspect of the present disclosure, a base station for an unmanned aerial vehicle (UAV) is disclosed that includes: an enclosure defining an internal cavity that is configured to receive the UAV; a (front) door that is movably connected to the enclosure; actuators that extend between the door and the enclosure to facilitate opening and closure of the door; a cradle that is configured to receive the UAV; and engagement members that are connected (secured) to the actuators and which are configured for contact with propeller assemblies on the UAV to facilitate folding of the propeller assemblies during movement of the UAV into the enclosure.

The cradle is movable in relation to the enclosure such that the cradle is repositionable between a retracted position and an extended position to facilitate movement of the UAV into and out of the enclosure.

In certain embodiments, the engagement members may include a compliant material to inhibit unseating of the UAV from the cradle upon contact between the engagement members and the propeller assemblies.

In certain embodiments, the engagement members may include mounting brackets that are configured for connection to the actuators.

In certain embodiments, the actuators may include a first actuator and a second actuator that is spaced laterally from the first actuator along a width of the enclosure.

In certain embodiments, the engagement members may include a first engagement member that is connected to the first actuator and a second engagement member that is connected to the second actuator such that the second engagement member is spaced laterally from the first engagement member along the width of the enclosure.

In another aspect of the present disclosure, a method of docking an unmanned aerial vehicle (UAV) within a base station is disclosed that includes: opening a (front) door of the base station; performing a first stage retraction of the UAV into the base station; partially folding rear propeller assemblies on the UAV via rotation of the rear propeller assemblies into contact with engagement members on the base station; performing a second stage retraction of the UAV into the base station; completely folding the rear propeller assemblies via rotation of the rear propeller assemblies into contact with the engagement members; performing a third stage retraction of the UAV into the base station; partially folding front propeller assemblies on the UAV via rotation of the front propeller assemblies into contact with the engagement members; and completely folding the front propeller assemblies.

In certain embodiments, performing the second stage retraction of the UAV may include folding an antenna on the UAV via contact with the door.

In certain embodiments, partially folding the rear propeller assemblies may include rotating a first rear propeller assembly in a first direction and rotating a second rear propeller assembly in a second direction, which is opposite to the first direction.

In certain embodiments, completely folding the rear propeller assemblies may include rotating the first rear propeller assembly in the second direction and rotating the second rear propeller assembly in the first direction.

In certain embodiments, completely folding the rear propeller assemblies may include positioning the rear propeller assemblies such that they are oriented towards the front propeller assemblies.

In certain embodiments, the method may further include partially closing the door to facilitate contact between the engagement members and the front propeller assemblies.

In certain embodiments, partially folding the front propeller assemblies may include actively rotating a first front propeller assembly in the second direction and actively rotating a second front propeller assembly in the first direction.

In certain embodiments, partially folding the front propeller assemblies may further include passively rotating the first front propeller assembly in the first direction and passively rotating the second front propeller assembly in the second direction.

In certain embodiments, passively rotating the first front propeller assembly and passively rotating the second front propeller assembly may include performing a fourth stage retraction of the UAV into the base station.

In certain embodiments, partially folding the front propeller assemblies may include positioning the front propeller assemblies such that they are oriented away from the rear propeller assemblies.

In certain embodiments, completely folding the front propeller assemblies may include rotating the first front propeller assembly in the first direction and rotating the second front propeller assembly in the second direction.

In certain embodiments, completely folding the front propeller assemblies may include actively rotating the front propeller assemblies such that they are oriented towards the rear propeller assemblies.

In another aspect of the present disclosure, a method of docking an unmanned aerial vehicle (UAV) within a base station is disclosed that includes: folding rear propeller assemblies on the UAV via rotation of the rear propeller assemblies into contact with engagement members on the base station; retracting the UAV into the base station; and folding front propeller assemblies on the UAV via rotation of the front propeller assemblies into contact with the engagement members.

In certain embodiments, the method may further include adjusting a position of a (front) door of the base station to facilitate contact between the engagement members and the rear propeller assemblies and contact between the engagement members and the front propeller assemblies.

In certain embodiments, folding the rear propeller assemblies and folding the front propeller assemblies may include rotating the rear propeller assemblies and rotating the front propeller assemblies into bumpers supported by actuators connected to the door of the base station, the actuators being configured to facilitate opening and closure of the door.

In certain embodiments, folding the rear propeller assemblies and folding the front propeller assemblies may include rotating the rear propeller assemblies and rotating the front propeller assemblies into bumpers supported by the door.

In another aspect of the present disclosure, a base station for an unmanned aerial vehicle (UAV) is disclosed. The base station includes: an enclosure; a slide mechanism that is connected to the enclosure and which is repositionable between a retracted position and an extended position; a cradle that is connected to the slide mechanism and which is configured for docking with the UAV such that the UAV is movable into and out of the enclosure during repositioning of the slide mechanism between the retracted position and the extended position; and a charging hub that is connected to the slide mechanism and which is configured for electrical connection to a power source of the UAV to charge the power source.

In certain embodiments, the slide mechanism may include a stationary slide member that is fixedly connected to the enclosure and a movable slide member that is slidable in relation to the stationary slide member.

In certain embodiments, the charging hub may be connected to the stationary slide member.

In certain embodiments, the charging hub may extend into the cradle when the slide mechanism is in the retracted position.

In certain embodiments, the charging hub may include a charging member that is configured for electrical connection to the power source of the UAV.

In certain embodiments, the cradle may define an opening that is configured to receive the charging member such that the charging member moves into and out of the cradle during repositioning of the slide mechanism between the retracted position and the extended position.

In certain embodiments, the charging hub may include: a base that is connected to the slide mechanism; an alignment bracket that is (movably) supported by the base; and a charging member that is connected to the alignment bracket and which is configured for electrical connection to the power source.

In certain embodiments, the charging member may be connected to the alignment bracket such that the charging member and the alignment bracket are movable in unison along an axis of movement.

In certain embodiments, the alignment bracket may include an anchor that extends into a corresponding opening in the charging member to inhibit relative movement between the alignment bracket and the charging member.

In certain embodiments, the base may be fixedly connected to the slide mechanism.

In certain embodiments, the base may define a cavity that is configured to receive the alignment bracket such that the alignment bracket is movable through the cavity during repositioning between a normal position and a deflected position.

In certain embodiments, the base may include a base wall defining the cavity.

In certain embodiments, the base wall may define an opening that is configured to receive the alignment bracket to facilitate assembly of the charging hub.

In certain embodiments, the base wall may be configured to support the alignment bracket during repositioning between the normal position and the deflected position.

In certain embodiments, the base wall may define a chamfered surface that is configured for engagement with the alignment bracket to facilitate repositioning of the alignment bracket between the normal position and the deflected position.

In certain embodiments, the charging hub may further include a biasing member that is located within the cavity.

In certain embodiments, the biasing member may be configured to bias the alignment bracket towards the normal position.

In certain embodiments, the biasing member may include a first end that is in engagement with the base and a second end that is in engagement with the alignment bracket.

In certain embodiments, the alignment bracket may include an alignment member that is configured for insertion into a receptacle defined by the power source of the UAV.

In certain embodiments, the alignment member may extend axially forward of the charging member along the axis of movement.

In certain embodiments, the alignment member may be vertically offset from the biasing member.

In certain embodiments, the charging hub may further include a cap that is removably connected to the base.

In certain embodiments, the cap may overlie the charging member to inhibit rotation of the charging member and the alignment bracket in relation to the base.

In another aspect of the present disclosure, a charging hub is disclosed for a base station that is configured for use with an unmanned aerial vehicle (UAV). The charging hub includes: a base; an alignment bracket that is movably supported by the base such that the alignment bracket is repositionable between a normal position and a deflected position; a biasing member that is positioned between the base and the alignment bracket and which is configured to bias the alignment bracket towards the normal position; a charging member that is connected to the alignment bracket such that the charging member moves contemporaneously with the alignment bracket during repositioning of the alignment bracket between the normal position and the deflected position; and a cap that is removably connected to the base such that the cap overlies the charging member to inhibit rotation of the charging member and the alignment bracket in relation to the base.

In certain embodiments, the biasing member may include a first end that is in engagement with the base and a second end that is in engagement with the alignment bracket.

In certain embodiments, the alignment bracket may include an anchor that extends into a corresponding opening in the charging member to inhibit relative movement between the alignment bracket and the charging member.

In certain embodiments, the base may define a cavity that is configured to receive the alignment bracket such that the alignment bracket is movable through the cavity during repositioning between the normal position and the deflected position.

In certain embodiments, the base may define an opening that is configured to receive the alignment bracket to facilitate assembly of the charging hub.

In certain embodiments, the base may include a base wall defining the cavity.

In certain embodiments, the base wall may be configured to support the alignment bracket during repositioning between the normal position and the deflected position.

In certain embodiments, the base wall may define a chamfered surface that is configured for engagement with the alignment bracket to facilitate repositioning of the alignment bracket between the normal position and the deflected position.

In certain embodiments, the alignment bracket may include an alignment member that is configured for insertion into a receptacle defined by a power source of the UAV.

In certain embodiments, the alignment member may extend axially forward of the charging member and may be vertically offset from the biasing member.

In another aspect of the present disclosure, a method of using a base station to charge an unmanned aerial vehicle (UAV) is disclosed. The method includes: docking the UAV with a cradle of the base station; retracting the cradle into an enclosure of the base station via a slide mechanism; and electrically connecting a power source of the UAV to a charging hub connected to the slide mechanism to thereby charge the power source.

In certain embodiments, docking the UAV with the cradle may include guiding the power source into a chamber defined by the cradle via contact between the UAV and tapered sidewalls of the cradle.

In certain embodiments, retracting the cradle may include repositioning the slide mechanism from an extended position into a retracted position.

In certain embodiments, repositioning the slide mechanism from the extended position into the retracted position may include telescopically repositioning a movable slide member in relation to a stationary slide member.

In certain embodiments, the charging hub may be connected to the stationary slide member.

In certain embodiments, electrically connecting the power source of the UAV to the charging hub may include inserting a charging member into the power source.

In certain embodiments, retracting the cradle may include aligning a first electrical connector on the charging hub with an opening on the power source to thereby facilitate engagement of the first electrical connector with a second electrical connector on the power source.

In certain embodiments, aligning the first electrical connector with the opening on the power source may include inserting an alignment bracket on the charging hub into a receptacle defined by the power source.

In certain embodiments, retracting the cradle may include inserting the alignment bracket into the receptacle.

In certain embodiments, inserting the alignment bracket into the receptacle may include repositioning the alignment bracket from a normal position into a deflected position via movement of the alignment bracket in relation to a base of the charging hub along an axis of movement.

In certain embodiments, the method may further include repositioning the alignment bracket from the normal position into the deflected position, wherein the charging member is connected to the alignment bracket such that the charging member and the alignment bracket move in unison.

In certain embodiments, repositioning the alignment bracket from the normal position into the deflected position may include compressing a biasing member that is located between the alignment bracket and a base of the charging hub, wherein the biasing member is configured to bias the alignment bracket towards the normal position.

In certain embodiments, repositioning the alignment bracket from the normal position into the deflected position may include increasing a preloaded force (e.g., a biasing force) applied to the alignment bracket.

In certain embodiments, inserting the alignment bracket into the receptacle may include inserting an alignment member on the alignment bracket into the receptacle.

In certain embodiments, the alignment member may extend axially forward of the first electrical connector along the axis of movement.

In certain embodiments, repositioning the alignment bracket from the normal position into the deflected position may include inhibiting rotation of the alignment bracket and the first electrical connector in relation to the base via a cap that is removably connected to the base.

In another aspect of the present disclosure, a method of using a base station to charge an unmanned aerial vehicle (UAV) is disclosed. The method includes: docking the UAV with the base station; retracting the UAV towards a charging hub of the base station; inserting an alignment member carried by an alignment bracket on the charging hub into a receptacle on a power source of the UAV; inserting a charging member on the charging hub into an opening on the power source; increasing a preloaded force applied to the alignment bracket by a biasing member positioned within a base of the charging hub, wherein the biasing member is vertically offset from the alignment member; and inhibiting rotation of the alignment bracket in relation to the base via a cap overlying the charging member.

In certain embodiments, increasing the preloaded force may include displacing the alignment bracket and the charging member.

In certain embodiments, displacing the alignment bracket and the charging member may include compressing the biasing member between the alignment bracket and the base.

In certain embodiments, displacing the alignment bracket and the charging member may include moving the alignment bracket and the charging member in unison.

In certain embodiments, displacing the alignment bracket and the charging member may include moving the charging member axially within a channel defined by the cap.

In another aspect of the present disclosure, a method of using a base station to charge an unmanned aerial vehicle (UAV) is disclosed. The method includes: docking the UAV with the base station; retracting the UAV towards a charging hub of the base station so as to insert an alignment bracket on the charging hub into a receptacle defined by a power source of the UAV and thereby align a first electrical connector on the charging hub with a second electrical connector on the power source; and engaging the first electrical connector and the second electrical connector to thereby establish an electrical connection between the base station and the UAV and charge the power source.

In certain embodiments, retracting the UAV towards the charging hub may include compressing a biasing member positioned between the alignment bracket and a base of the charging hub supporting the alignment bracket.

In certain embodiments, compressing the biasing member may include compressing the biasing member within a cavity defined by the base.

In certain embodiments, retracting the UAV towards the charging hub may include displacing the alignment bracket to thereby compress the biasing member.

In certain embodiments, displacing the alignment bracket may include causing corresponding displacement of a charging member supporting the first electrical connector and connected to the alignment bracket such that the alignment bracket and the charging member move in unison.

In another aspect of the present disclosure, a base station is disclosed for an unmanned aerial vehicle (UAV). The base station includes: an enclosure that is configured to receive the UAV and which includes a front end having a front door and a rear end having a rear door; a slide mechanism that is connected to the enclosure; a cradle that is configured for docking with the UAV and which is connected to the slide mechanism such that the UAV is movable into and out of the enclosure during repositioning of the cradle between a retracted position and an extended position; a first electronics module that is removably connected to the enclosure adjacent to the rear door; a second electronics module that is removably connected to a roof section of the enclosure; and a third electronics module that is removably connected to the slide mechanism, whereby the first electronics module, the second electronics module, and the third electronics module are individually removable from the base station.

In certain embodiments, the first electronics module may include a main heat sink and an auxiliary heat sink.

In certain embodiments, the auxiliary heat sink may be connected to the main heat sink such that the main heat sink defines a plurality of side walls collectively describing a perimeter of the first electronics module and the auxiliary heat sink defines an end wall of the first electronics module.

In certain embodiments, the auxiliary heat sink may include one or more diffusers that are configured to increase thermal energy distribution (e.g., of the auxiliary heat sink).

In certain embodiments, the first electronics module may further include: a logic board that is supported by the main heat sink such that the logic board is located between the main heat sink and the auxiliary heat sink; a first printed circuit board assembly (PCBA) that is supported by the main heat sink; and an interface member that is located between the main heat sink and the first PCBA.

In certain embodiments, the first electronics module may be configured to facilitate data processing and control of the base station. For example, in certain embodiments, the first PCBA may include a processor that is configured to facilitate data processing and control of the base station.

In certain embodiments, the main heat sink may define a cavity that is configured to receive the logic board.

In certain embodiments, the interface member may include at least one thermally conductive section that is configured to facilitate thermal energy transfer between the first PCBA and the main heat sink and at least one electrically conductive section that is configured to electrically ground the first PCBA.

In certain embodiments, the at least one electrically conductive section may include an adhesive to connect the first PCBA to the main heat sink.

In certain embodiments, the base station may further include an air circulation module that is connected to the enclosure adjacent to the rear door.

In certain embodiments, the air circulation module may be positioned about the first electronics module to facilitate cooling thereof.

In certain embodiments, the enclosure may include a frame that defines an outer surface and an inner surface.

In certain embodiments, the first electronics module may be connected to the outer surface of the frame and the air circulation module may be connected to the inner surface of the frame such that the frame is located between the first electronics module and the air circulation module, whereby the first electronics module is removable from the base station separately from the air circulation module.

In certain embodiments, the air circulation module may include ducting that is configured to direct air across the first electronics module and a fan that is supported by the ducting.

In certain embodiments, the rear door may include a non-metallic frame and a metallic panel that is connected to the non-metallic frame.

In certain embodiments, the metallic panel may be positioned in correspondence with the first electronics module so as to create a Faraday cage for the first electronics module and thereby reduce electromagnetic emissions from the base station.

In certain embodiments, the rear door may further include a sealing member that extends about the metallic panel and which is configured for engagement with the enclosure.

In certain embodiments, the second electronics module may be configured to control opening and closure of the front door.

In certain embodiments, the second electronics module may include: an access panel that is removably connected to the roof section of the enclosure; a second PCBA that is connected to the access panel; and a fan that is connected to the access panel.

In certain embodiments, the access panel may be removably connected to an inner surface of the roof section via a plurality of mechanical fasteners such that the second electronics module is accessible from within the enclosure.

In certain embodiments, the plurality of mechanical fasteners may be configured as thumb screws to allow for toolless connection and disconnection of the access panel.

In certain embodiments, the third electronics module may be configured to facilitate and control repositioning of the cradle between the retracted position and the extended position. For example, in certain embodiments, the third electronics module may be configured to control the slide mechanism.

In certain embodiments, the third electronics module may include a third PCBA that is removably connected to the slide mechanism via a plurality of mechanical fasteners such that the third electronics module is accessible from within the enclosure upon removal of the UAV.

In certain embodiments, the slide mechanism may include a stationary slide member that is connected to the enclosure and a movable slide member that is slidable in relation to the stationary slide member.

In certain embodiments, the third PCBA may be removably connected to the stationary slide member.

In another aspect of the present disclosure, a base station is disclosed for an unmanned aerial vehicle (UAV). The base station includes: an enclosure defining a window that is configured to receive the UAV to allow for entry of the UAV into the base station and exit of the UAV from the base station; a door that is movably connected to the enclosure such that the door is repositionable between a closed position and an open position; a sealing member that extends about the window and which is configured for engagement with the door so as to form a seal therewith when the door is in the closed position; and a heating system that is supported by the enclosure and which is configured to heat the door and/or the sealing member to support operation (e.g., opening and closure) of the door in a cold environment.

In certain embodiments, the heating system may include at least one light source and at least one heating element.

In certain embodiments, the at least one light source may be configured to identify a status of the base station.

In certain embodiments, the at least one light source may be supported on an outer surface of the enclosure and the at least one heating element may be supported on an inner surface of the enclosure.

In certain embodiments, the base station may further include a thermal interface material that is located between the enclosure and the at least one heating element.

In certain embodiments, the heating system may further include at least one temperature sensor that is supported by the enclosure.

In certain embodiments, the door may include a thermally conductive member to further facilitate heating of the door.

In certain embodiments, the thermally conductive member may be embedded within the door.

In certain embodiments, the sealing member may include a thermally conductive member to further facilitate heating of the sealing member.

In certain embodiments, the thermally conductive member may be embedded within the sealing member.

In certain embodiments, the base station may further include at least one additional heating element that is supported by a roof section of the enclosure.

In another aspect of the present disclosure, a docking system is disclosed for an unmanned aerial vehicle (UAV). The docking system includes a base station that is configured to receive the UAV and a pedestal that is configured to support the base station in an elevated position. The pedestal defines an interior space that is configured in correspondence with an outer contour of the base station such that the base station is positionable within the pedestal to protect the base station during nonuse.

In certain embodiments, the pedestal may be unitary in construction.

In certain embodiments, the pedestal may include: an upper wall having a non-linear configuration; first and second side walls extending from the upper wall, wherein each of the first and second side walls have a generally linear configuration; and first and second base walls extending laterally inward from the first and second side walls, respectively, wherein each of the first and second base walls have a generally linear configuration.

In certain embodiments, the upper wall may include: a first segment that extends laterally inward from the first side wall; a second segment that extends laterally inward from the second side wall; a third segment that extends in generally parallel relation to the first segment and the second segment; a fourth segment that extends between the first segment and the third segment; and a fifth segment that extends between the second segment and the third segment.

In certain embodiments, the first segment and the second segment may be vertically aligned.

In certain embodiments, the third segment may be vertically offset from the first segment and the second segment so as to define a well.

In certain embodiments, the first side wall may be configured so as to define a first acute angle with a first reference axis oriented in generally orthogonal relation to the first base wall and the second side wall may be configured so as to define a second acute angle with a second reference axis oriented in generally orthogonal relation to the second base wall.

In certain embodiments, the well may be configured in correspondence with at least one antenna on the base station to create vertical clearance for the at least one antenna when the base station is positioned within the pedestal.

In certain embodiments, the base station may include a pair of antennas.

In certain embodiments, the fourth segment and the fifth segment may respectively subtend generally identical obtuse angles with the first segment and the second segment such that the well extends into a space defined between the pair of antennas when the base station is positioned within the pedestal.

In another aspect of the present disclosure, a base station is disclosed for an unmanned aerial vehicle (UAV). The base station includes: an enclosure; a slide mechanism that is connected to the enclosure and which is repositionable between a retracted position and an extended position; and a cradle that is connected to the slide mechanism and which defines a chamber that is configured to receive the UAV such that the UAV is movable into and out of the enclosure during repositioning of the slide mechanism between the retracted position and the extended position. The cradle includes: an upper shell; a lower shell that is connected to the upper shell; and at least one thermal insulator that is located between the upper shell and the lower shell.

In certain embodiments, the cradle may define an airflow channel that extends about the chamber and which is configured to facilitate air circulation within the cradle.

In certain embodiments, the cradle may further define an air inlet (vent) and an air outlet (vent) that are in communication with the airflow channel and which are configured to direct air flow across the chamber to thereby heat or cool a power source of the UAV when the UAV is docked within the cradle.

In certain embodiments, the cradle may include a rear end that defines lead-ins which are configured for engagement with the enclosure during retraction of the cradle to facilitate entry of the cradle into the enclosure.

In certain embodiments, the upper shell may define an angled guide surface that is configured for engagement with the UAV to thereby direct the UAV into the chamber and facilitate proper docking of the UAV within the cradle.

In certain embodiments, the upper shell and the lower shell may each include a non-metallic material.

In certain embodiments, the at least one thermal insulator may include an insulative foam.

In certain embodiments, the airflow channel may be defined by the at least one thermal insulator.

In certain embodiments, the airflow channel may include a discontinuous configuration.

In certain embodiments, the airflow channel may include a first channel portion and a second channel portion.

In certain embodiments, the first channel portion and the second channel portion may be separated by a nose section of the cradle.

In certain embodiments, the first channel portion may be in communication with the air inlet and the second channel portion may be in communication with the air outlet.

In another aspect of the present disclosure, a base station is disclosed for an unmanned aerial vehicle (UAV). The base station includes: an enclosure that is configured to receive the UAV; a door that is movably connected to the enclosure such that the door is repositionable between a closed position and an open position; a primary heating system that is associated with a roof section of the enclosure; and a secondary heating system that is associated with the door.

In certain embodiments, the secondary heating system may include an exterior light source and an interior heating element.

In certain embodiments, the primary heating system and/or the secondary heating system may be configured for automatic activation upon receiving an activation signal.

In certain embodiments, the base station may further include a temperature sensor that is configured to relay the activation signal to the primary heating system and/or the secondary heating system upon detecting a threshold temperature.

In certain embodiments, the base station may further include a visualization system that is supported by the enclosure and which is configured to visually inspect environmental conditions.

In certain embodiments, the visualization system may be configured to relay the activation signal to the primary heating system and/or the secondary heating system.

In another aspect of the present disclosure, a method is disclosed for heating a base station for an unmanned aerial vehicle (UAV). The method includes activating a primary heating system that is associated with a roof section of the base station to expose at least one fiducial that is supported by the roof section and thereby facilitate visual identification of the base station by the UAV and/or guidance of the UAV during landing and docking with the base station.

In certain embodiments, the method may further include activating a secondary heating system that is associated with a door of the base station to facilitate opening and closure thereof.

In certain embodiments, activating the secondary heating system may include activating at least one thermally conductive member, wherein the at least one thermally conductive member is connected to the door and/or a sealing member that is configured for engagement with the door.

In certain embodiments, activating the secondary heating system may include activating an exterior light source and activating an interior heating element.

In certain embodiments, activating the primary heating system and activating the secondary heating system may include automatically activating the primary heating system and automatically activating the secondary heating system upon receiving an activation signal from at least one of: a temperature sensor on the base station that is configured to detect a threshold temperature; a visualization system on the base station that is configured to visually inspect environmental conditions; and a weather station that is wirelessly connected to the base station.

In another aspect of the present disclosure, a docking system is disclosed for an unmanned aerial vehicle (UAV). The docking system includes a base station that is configured to receive the UAV and a pedestal that is configured to receive and support the base station such that the docking system is reconfigurable between a nested configuration, in which the base station is positioned within an interior space defined by the pedestal, and a stacked configuration, in which the base station is supported by the pedestal in an elevated position.

In certain embodiments, the pedestal may be configured to create clearance with the base station about an entire periphery thereof so as to inhibit contact between the pedestal and the base station in the nested configuration.

In certain embodiments, the interior space may be configured in correspondence with an outer contour of the base station.

In certain embodiments, the base station may include a pair of antennas.

In certain embodiments, the pedestal may define a well that is configured for positioning between the pair of antennas when the docking system is in the nested configuration.

In certain embodiments, the pedestal may include a plurality of adjustable footings that are configured for removable connection thereto.

In another aspect of the present disclosure, a method of using a docking system for an unmanned aerial vehicle (UAV) is disclosed. The method includes: storing a base station for the UAV within an interior space defined by a pedestal during nonuse of the base station; removing the base station from the interior space defined by the pedestal; and supporting the base station on the pedestal in an elevated position.

In certain embodiments, the method may further include adjusting at least one footing on the pedestal to thereby stabilize the pedestal and the base station when the base station is in the elevated position.

In certain embodiments, supporting the base station on the pedestal may include releasably connecting the base station to the pedestal to inhibit unintended separation thereof.

In certain embodiments, the method may further include: facilitating takeoff of the UAV from the base station; docking the UAV with the base station after flight; and nesting the base station within the pedestal following docking of the UAV by returning the base station to the interior space.

In certain embodiments, nesting the base station within the pedestal may include positioning a well defined by the pedestal between antennas on the base station.

In another aspect of the present disclosure, a base station is disclosed for an unmanned aerial vehicle (UAV). The base station includes: an enclosure; a slide mechanism that is connected to the enclosure and which is repositionable between a retracted position and an extended position; and a cradle that is connected to the slide mechanism and which defines a chamber that is configured to receive the UAV such that the UAV is movable into and out of the enclosure during repositioning of the slide mechanism between the retracted position and the extended position. The cradle includes: an upper shell that defines an air inlet and an air outlet; a lower shell that is connected to the upper shell; and at least one thermal insulator that is positioned between the upper shell and the lower shell. The lower shell defines a first airflow opening that is in communication with the air inlet and a second airflow opening in communication with the air outlet. The at least one thermal insulator defines an airflow channel that is in communication with the first airflow opening and the second airflow opening and which extends about the chamber to facilitate air circulation within the cradle.

In certain embodiments, the at least one thermal insulator may include an upper thermal insulator and a lower thermal insulator.

In certain embodiments, the airflow channel may extend between the upper thermal insulator and the lower thermal insulator.

In certain embodiments, the airflow channel may include a discontinuous configuration.

In certain embodiments, the airflow channel may include a first channel portion and a second channel portion.

In certain embodiments, the first channel portion may be in communication with the air inlet and the first airflow opening, and the second channel portion may be in communication with the air outlet and the second airflow opening.

In certain embodiments, the first channel portion and the second channel portion may be separated by a nose section of the cradle such that the nose section inhibits airflow between the first channel portion and the second channel portion to thereby direct airflow from the air inlet, across the chamber, and into the air outlet.

In another aspect of the present disclosure, a base station is disclosed for an unmanned aerial vehicle (UAV). The base station includes: an enclosure; a slide mechanism that is connected to the enclosure and which is repositionable between a retracted position and an extended position; a charging hub that is connected to the slide mechanism and which is configured for electrical connection to a power source of the UAV; and a cradle that is connected to the slide mechanism and which defines a chamber that is configured to receive the UAV such that the UAV is movable into and out of the enclosure during repositioning of the slide mechanism between the retracted position and the extended position. The cradle includes: a housing and at least one thermal insulator. The at least one thermal insulator is located within the housing and defines an airflow channel that extends discontinuously about the chamber.

In certain embodiments, the housing may define a charging window that is configured to receive the charging hub such that the charging hub is extendable into the cradle during repositioning of the slide mechanism between the retracted position and the extended position.

In certain embodiments, the housing may define an air inlet and an air outlet that are positioned on opposite sides of the chamber.

In certain embodiments, the airflow channel may include a first channel portion that is in communication with the air inlet and a second channel portion that is in communication with the air outlet.

In certain embodiments, the first channel portion and the second channel portion may be separated by a nose section of the cradle such that the nose section inhibits airflow therebetween to thereby direct airflow from the air inlet, across the chamber, and into the air outlet.

In another aspect of the present disclosure, a base station is disclosed for an unmanned aerial vehicle (UAV). The base station includes: an enclosure that is configured to receive the UAV and a charging hub that is operatively connected to the enclosure and which is configured to charge the UAV. The charging hub includes: a base; an alignment bracket that is movably supported by the base such that the alignment bracket is repositionable between a normal position and a deflected position; and a charging member that is configured for electrical connection to the UAV. The charging member is connected to the alignment bracket such that the charging member and the alignment bracket are movable in unison along an axis of movement during repositioning of the alignment bracket between the normal position and the deflected position.

In certain embodiments, the charging hub may further include a biasing member that is positioned between the base and the alignment bracket and which is configured to bias the alignment bracket towards the normal position.

In certain embodiments, the alignment bracket may include an alignment member that is configured for insertion into a receptacle defined by the UAV to facilitate proper positioning of the charging member and electrical connection of the charging hub to the UAV.

In certain embodiments, the alignment member may extend axially forward of the charging member along the axis of movement.

In certain embodiments, the alignment member may be vertically offset from the biasing member.

In another aspect of the present disclosure, a base station is disclosed for an unmanned aerial vehicle (UAV). The base station includes: an enclosure having a front end that is configured to receive the UAV and a rear end; a cradle that is configured for docking with the UAV and which is movable in relation to the enclosure via a slide mechanism; a first electronics module that is removably connected to the rear end of the enclosure and which is configured to facilitate data processing and control of the base station; and an air circulation module that is connected to the rear end of the enclosure and which is positioned about the first electronics module to facilitate cooling thereof.

In certain embodiments, the base station may further include a second electronics module and a third electronics module.

In certain embodiments, the second electronics module may be removably connected to a roof section of the enclosure and may be configured to facilitate opening and closure of the enclosure, and the third electronics module may be removably connected to the slide mechanism and may be configured to facilitate repositioning of the cradle, whereby the first electronics module, the second electronics module, and the third electronics module may be individually removable from the base station.

In certain embodiments, the first electronics module may include a heat sink.

In certain embodiments, the ducting may define a chamber having an inner contour that corresponds to an outer contour of the heat sink.

In another aspect of the present disclosure, a base station is disclosed for an unmanned aerial vehicle (UAV). The base station includes: a metallic enclosure; a first electronics module; a second electronics module; and a third electronics module, wherein the first electronics module, the second electronics module, and the third electronics module are each configured for individual removal from the metallic enclosure. The metallic enclosure is configured to receive the UAV and includes a front end having a front door and a rear end having a rear door. The rear door is located adjacent to the first electronics module and includes a metallic panel that is positioned in correspondence with the first electronics module so as to create a Faraday cage for the first electronics module and thereby reduce electromagnetic emissions from the base station.

In certain embodiments, the rear door may further include a non-metallic frame.

In certain embodiments, the metallic panel may be connected to the non-metallic frame.

In certain embodiments, the second electronics module may include an access panel that is removably connected to a roof section of the metallic enclosure.

In certain embodiments, the access panel may be removably connected to an inner surface of the roof section via a plurality of mechanical fasteners such that the second electronics module is accessible from within the metallic enclosure.

In certain embodiments, the mechanical fasteners may be configured to allow for toolless connection of the access panel to the roof section and toolless disconnection of the access panel from the roof section.

In certain embodiments, the base station may further include a slide mechanism and a cradle that is connected to the slide mechanism.

In certain embodiments, the slide mechanism may be connected to the metallic enclosure.

In certain embodiments, the slide mechanism may be repositionable between a retracted position and an extended position.

In certain embodiments, the cradle may be configured for docking with the UAV such that the UAV is movable into and out of the metallic enclosure during repositioning of the slide mechanism between the retracted position and the extended position.

In certain embodiments, the third electronics module may be removably connected to the slide mechanism such that the third electronics module is accessible from within the metallic enclosure upon removal of the UAV.

BRIEF DESCRIPTION OF THE DRAWINGS

The present disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 29 is a partial, front, perspective view of the base station illustrating a status indicator.

FIG. 30 is a partial, top, perspective view of the base station according to an embodiment of the disclosure that includes an illumination system on the roof section.

FIG. 49 is a partial, side, schematic view of the cradle and the second air circuit.

FIG. 50 is partial, side, schematic view of the temperature control system.

DETAILED DESCRIPTION

Overview

Figure 1:
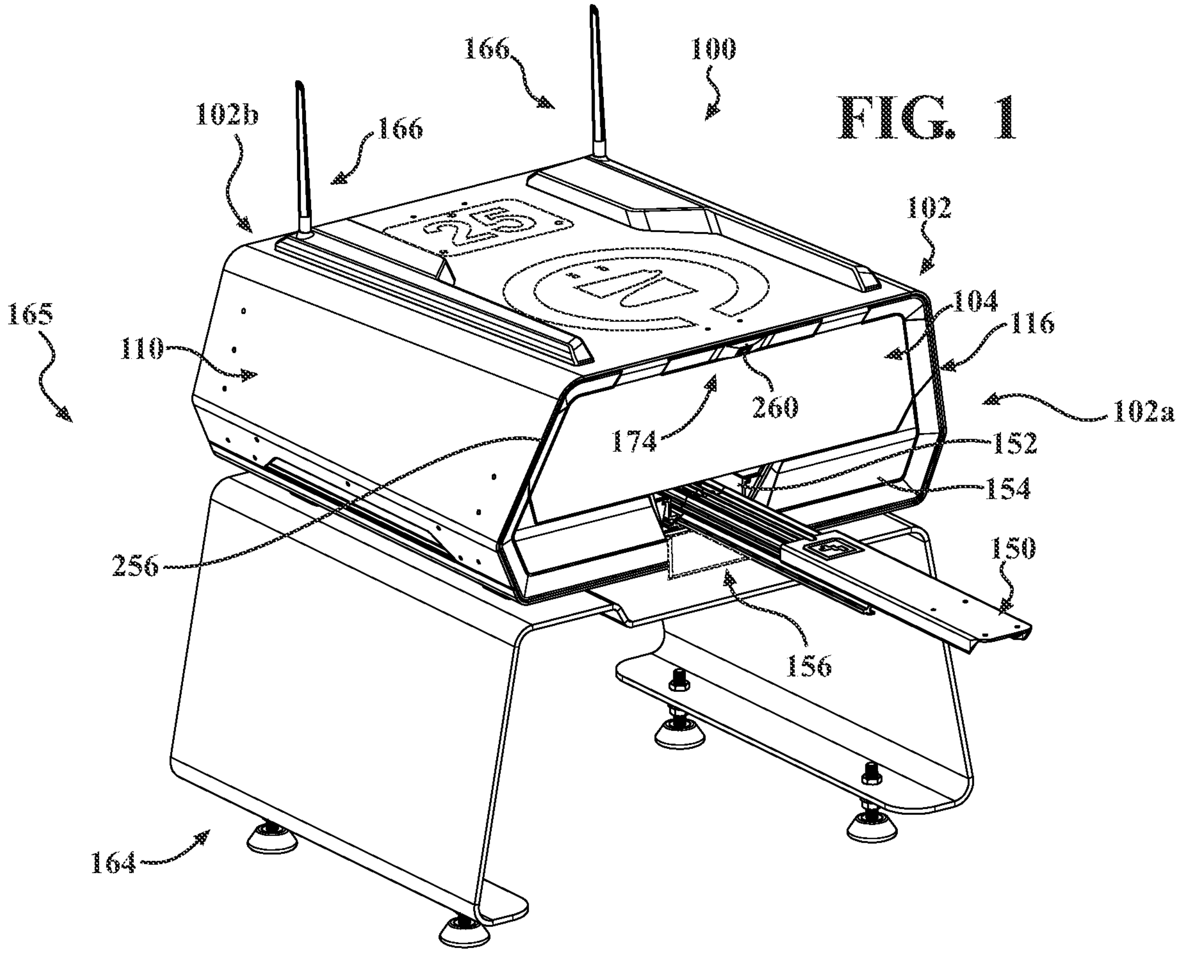
FIG. 1 is a front, perspective view of a base station (dock) according to the principles of the present disclosure.

The present disclosure relates to a base station for use with a UAV that is configured to not only charge the power source of the UAV, but regulate the temperature of the power source of the UAV. In various embodiments of the disclosure, depending upon the environmental conditions, the base station may be configured to cool the power source of the UAV (e.g., when the base station and the UAV are used in hot environments) or heat the power source of the UAV (e.g., when the base station and the UAV are used in cold environments).

To facilitate cooling and/or heating of the power source of the UAV, the base station includes a temperature control system. The temperature control system includes: a thermoelectric conditioner (TEC); a first air circuit that is thermally connected to the TEC and which is configured to regulate (e.g., increase or decrease) temperature of the TEC; and a second air circuit that is thermally connected to the TEC such that the TEC is located between the first air circuit and the second air circuit. The second air circuit is configured to direct treated air (e.g., air that has been either cooled or heated) across the power source of the UAV to thereby heat or cool the power source (subject to environmental conditions).

To increase functionality and improve operation of the base station, the base station includes a plurality of additional (ancillary) systems that are configured to address environmental concerns (e.g., humidity, precipitation, etc.), security concerns (e.g., anti-theft systems and mechanisms), etc. For example, the base station may include: a heating element that is supported by a roof section to reduce the presence of snow and/or ice; one or more fiducials that facilitate visual identification of the base station by the UAV; an illumination system that improves visibility of the one or more fiducials (e.g., during nighttime operation); and a visualization system (e.g., a digital image capturing device) that supports observation and visual analysis of the environment in which the base station and the UAV are located.

The base station includes a cradle that is configured to receive the UAV during docking and which is extendable from and retractable into the base station via a slide mechanism. In certain embodiments of the disclosure, the slide mechanism is (indirectly) connected (secured) to the base station (e.g., to a sheet metal base) via first and second mounts, which separate the slide mechanism from the base station in order to reduce vibration (and other such movement) of the slide mechanism during extension and retraction.

In certain embodiments of the disclosure, upon docking of the UAV with the base station, propeller assemblies on the UAV may be reconfigured (e.g., folded) from an extended configuration into a collapsed configuration, which not only allows for a reduction in the overall size of the base station, but inhibits (if not entirely prevents) undesirable contact with the propeller assemblies. To facilitate such reconfiguration, the base station includes engagement members, which may be supported by (connected to) the (front) door of the base station, actuators for the door, or any other suitable structure, and are configured for contact with the propeller assemblies to facilitate folding thereof. More specifically, during retraction of the cradle and the UAV into the base station, the propeller assemblies are folded via bidirectional rotation into contact with the engagement members.

Figure 2:
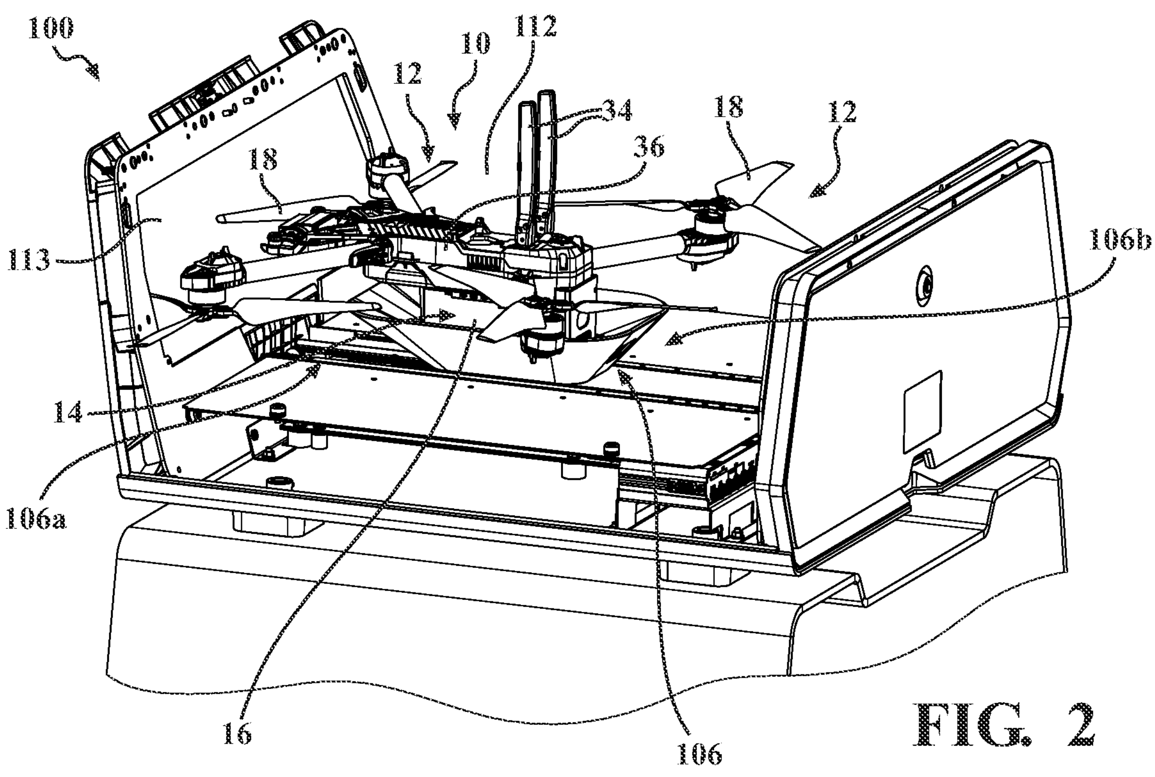
FIG. 2 is a partial, side view of the base station shown with one embodiment of a UAV docked within a cradle of the base station, which includes a plurality of propulsion mechanisms (e.g., propeller assemblies), each of which includes a hub and a plurality of propeller blades connected thereto.

Referring now to the drawings, FIGS. 1 and 2 illustrate an unmanned aerial vehicle (UAV) 10 and a base (docking) station 100 that is configured for automated servicing (e.g., docking, storage, charging, operation, etc.) and accommodation of the UAV 10. While a single UAV 10 and a single base station 100 are shown and described herein, in certain embodiments of the disclosure, it is envisioned that a plurality of UAVs 10 and a plurality of base stations 100 may be utilized depending, for example, upon the particular intended use of the UAVs 10. The UAV The UAV 10 includes one or more propulsion mechanisms (systems) 12 and a power source 14 (e.g., a battery 16). To support autonomous landing and docking of the UAV 10 with the base station 100, it is envisioned that the UAV 10 may follow any suitable process or procedure and may include any suitable electrical and/or logic components, as described in U.S. application Ser. No. 16/991,122 ("the '122 application"), the entire contents of which are hereby incorporated by reference.

Figure 3:
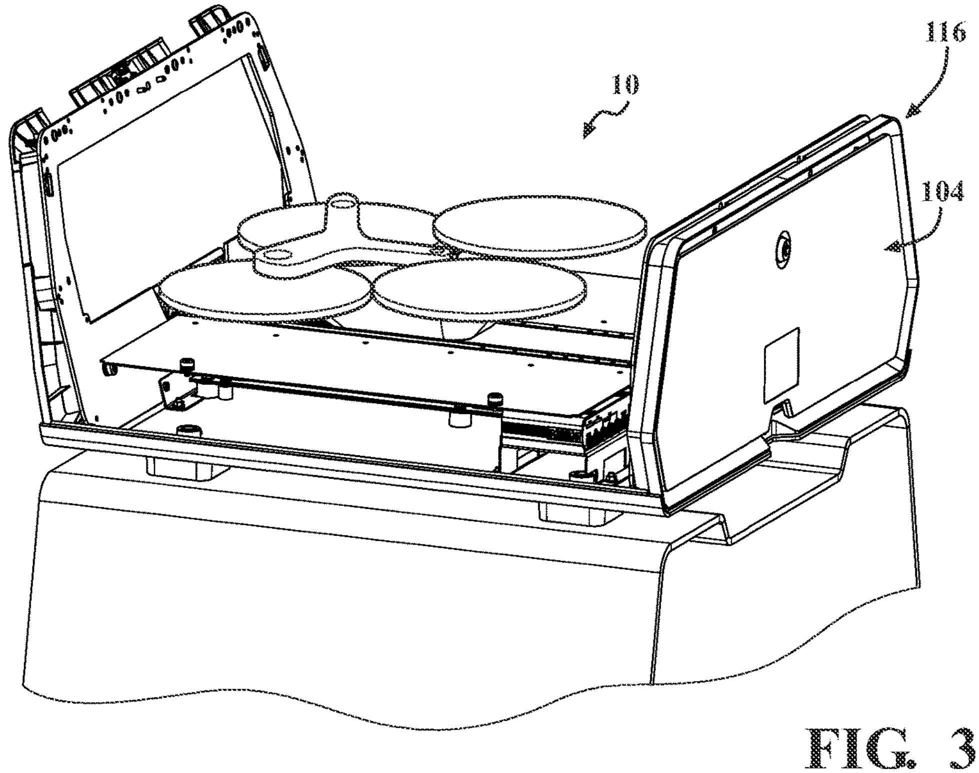
FIG. 3 is a partial, side view of the base station shown with an alternate embodiment of the UAV seen in FIG. 2.
Figure 32:
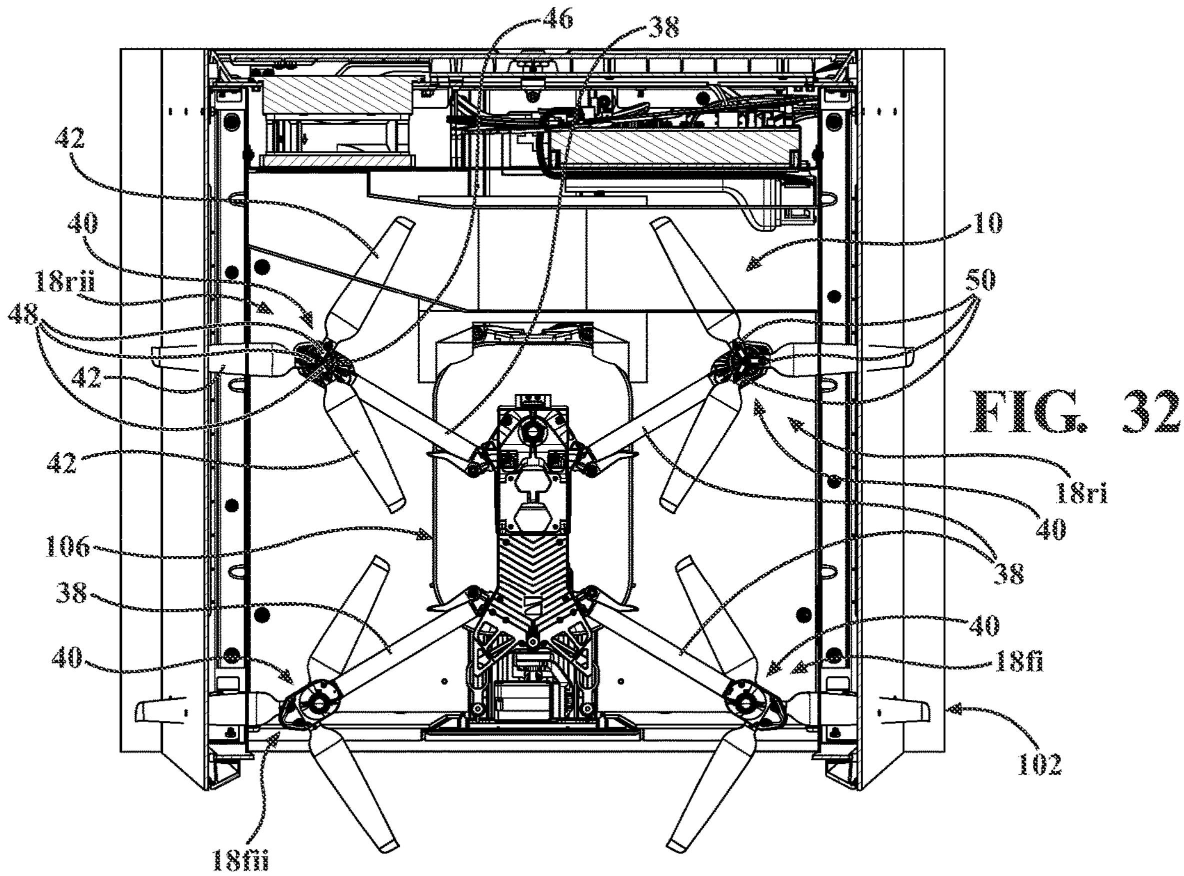
FIG. 32 is partial, top, plan view of the base station and the UAV shown in a flight configuration.
Figure 33:
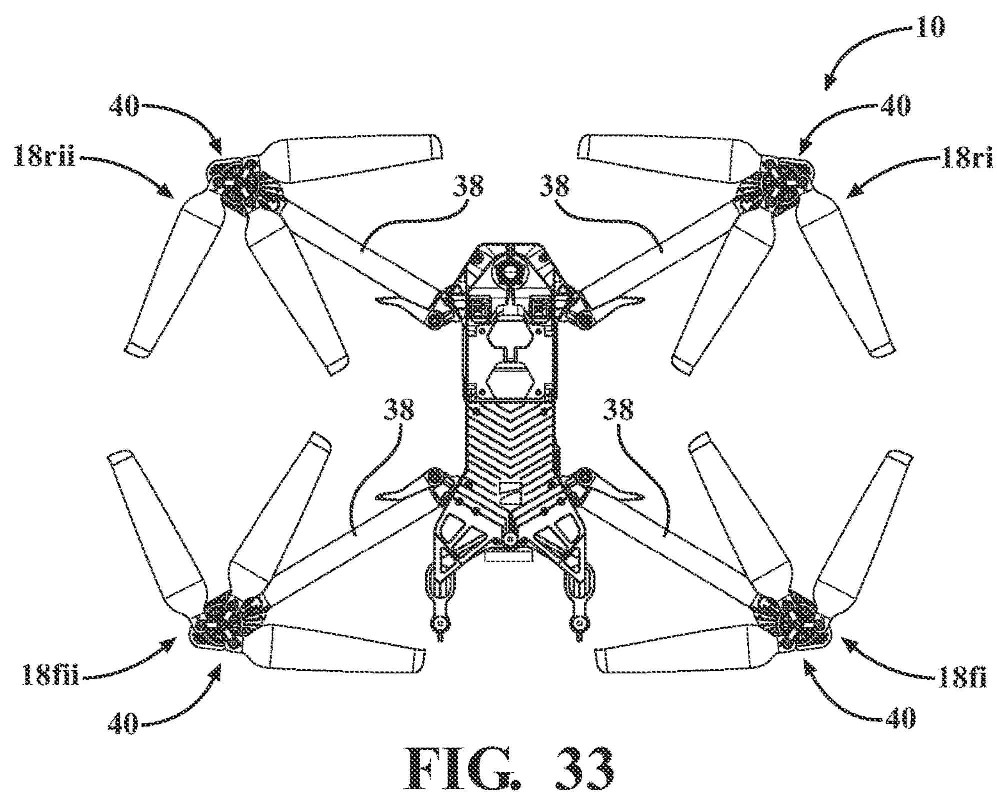
FIG. 33 is top, plan view of the UAV shown separated from the base station.

The propulsion mechanism(s) 12 may include any components and/or structures suitable for the intended purpose of supporting flight of the UAV 10. For example, in the particular embodiment of the UAV 10 seen in FIGS. 2 and 32, the propulsion mechanism(s) 12 are configured as propeller assemblies 18 that include: propeller arms 38; (rotatable) hubs 40 that are supported by the propeller arms 38; and a plurality of propeller blades 42 that are connected (secured) to the hubs 40, either directly or indirectly (operatively). More specifically, the hubs 40 each include: a motor 44 (or other such drive mechanism); a rotatable drive shaft 46, which is connected to the motor 44; and a plurality of supports 48, which are connected to (and extend between) the drive shaft 46 and the propeller blades 42 such that rotation of the drive shaft 46 causes corresponding rotation of the propeller blades 42. It should be appreciated, however, that the particular configuration and/or components of the propulsion mechanism(s) 12 may be varied without departing from the scope of the present disclosure. FIG. 3, for example, illustrates an alternate configuration for the UAV 10.

In the particular embodiment of the UAV 10 illustrated, the UAV 10 includes four propeller assemblies 18. More specifically, the UAV 10 includes: a (first) rear propeller assembly **18*ri*; a (second) rear propeller assembly 18*rii*; a (first) front propeller assembly 18*fi*; and a (second) front propeller assembly 18*fii*. As seen in FIG. 2, the rear propeller assemblies 18*ri*, 18*rii* and the front propeller assemblies 18*fi*, 18*fii* are oriented in (vertically) opposite directions (e.g., the rear propeller assemblies 18*ri*, 18*rii* are oriented (vertically) upwards and the front propeller assemblies 18*fi*, 18*fii* are oriented (vertically) downwards), whereby the rear propeller assemblies 18*ri*, 18*rii* are positioned in a first vertical location (e.g., height) and the front propeller assemblies 18*fi*, 18*fii* are positioned in a second, lower vertical location (e.g., height). It should be appreciated, however, that the particular number of propeller assemblies 18, the configuration of the propeller assemblies 18, the location of the propeller assemblies 18, and/or the orientation of the propeller assemblies 18 may be varied in alternate embodiments without departing from the scope of the present disclosure. As such, embodiments of the UAV 10 including both fewer and greater numbers of propeller assemblies 18** are also envisioned herein and would not be beyond the scope of the present disclosure.

It is envisioned that the propeller assemblies 18 may include either a fixed configuration or a variable configuration. For example, it is envisioned that the propeller assemblies 18 may be reconfigurable between an extended (first) configuration and a collapsed (folded, second) configuration to allow for a reduction in the overall size of the UAV 10 (e.g., during entry into the base station 100) and, thus, a reduction in the overall size of the base station 100, as described in further detail below. To facilitate reconfiguration of the propeller assemblies 18 between the extended configuration and the collapsed configuration, in certain embodiments, it is envisioned that the propeller blades 42 may be pivotably connected to the supports 48 via pivot members 50 (FIGS. 32, 42-44) (e.g., pins, posts, or the like) so as to facilitate folding of the propeller assemblies 18, further details of which are provided below.

The power source 14 is located (e.g., attached to or otherwise supported on) a lower (bottom) surface of the UAV 10 and includes one or more conducting (electrical) contacts (not shown) that are configured for engagement (contract) with one or more corresponding conducting (electrical) contacts on the base station 100 to enable charging of the power source 14, as described in further detail below.

Heat Exchange

Figure 4:
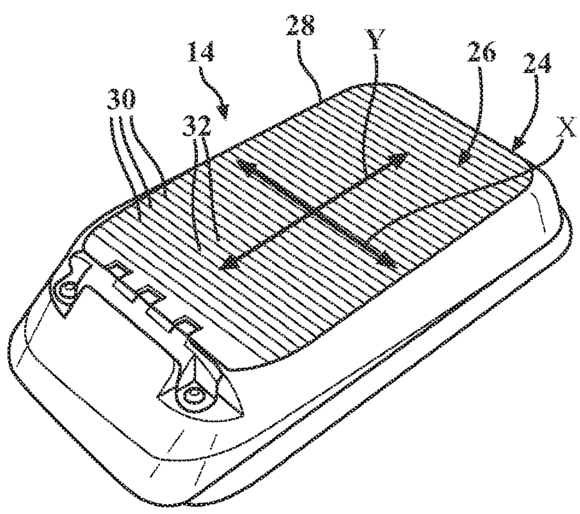
FIG. 4 is a bottom, perspective view of a power source of the UAV.
Figure 5:
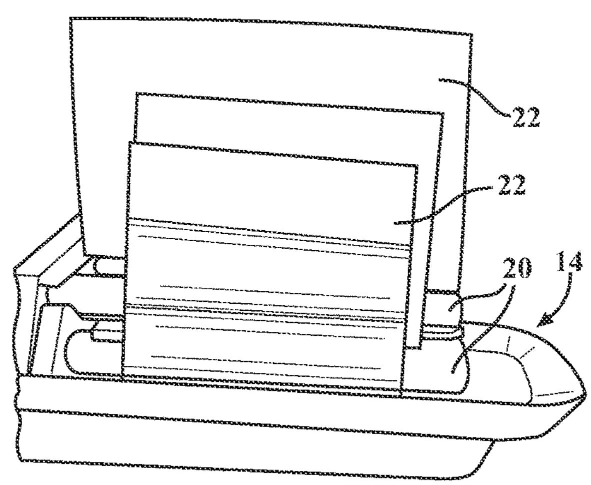
FIG. 5 is a partial, side, perspective view of the power source of the UAV.
Figure 6:
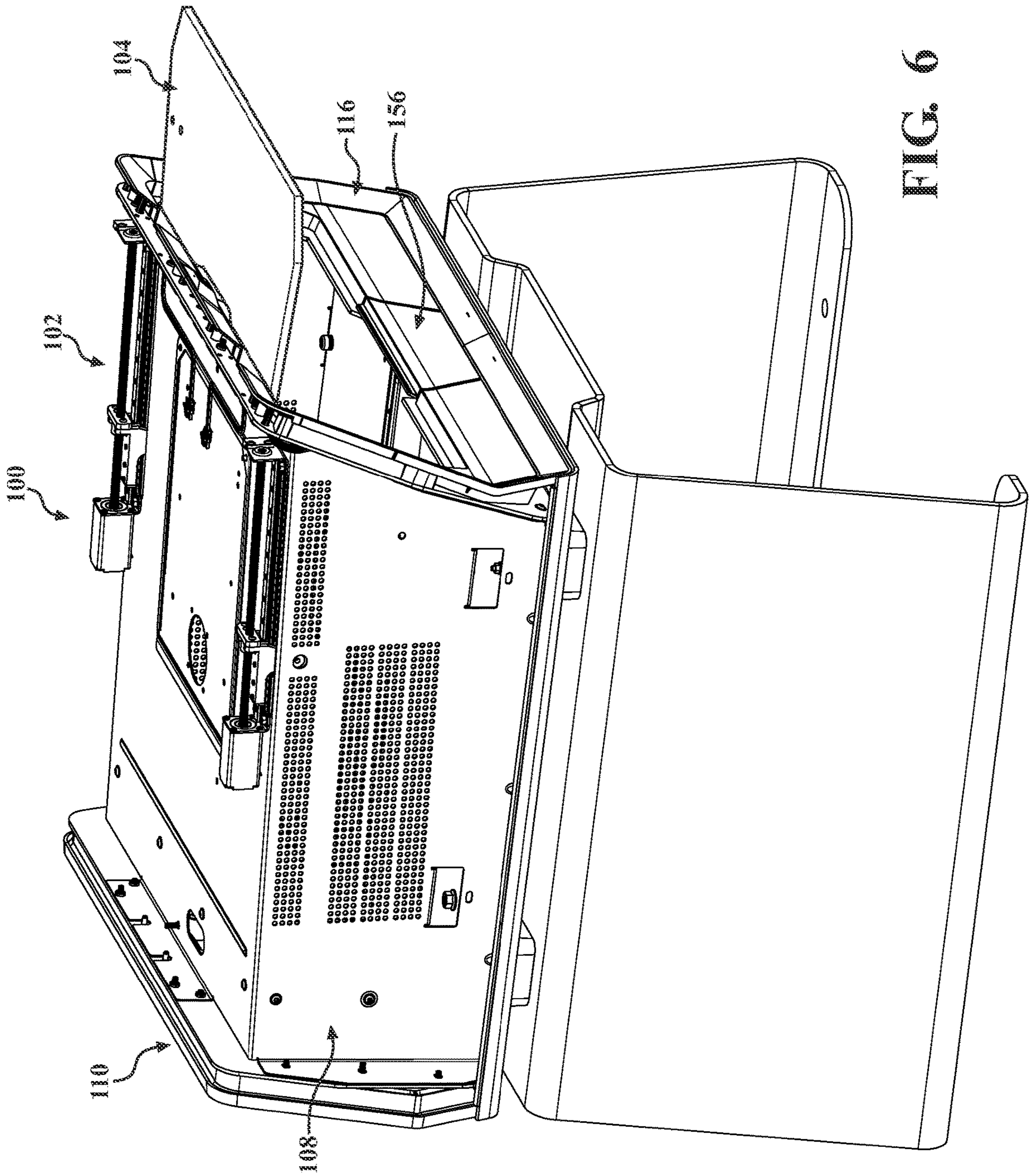
FIG. 6 is a side, schematic view of the base station.
Figure 7:
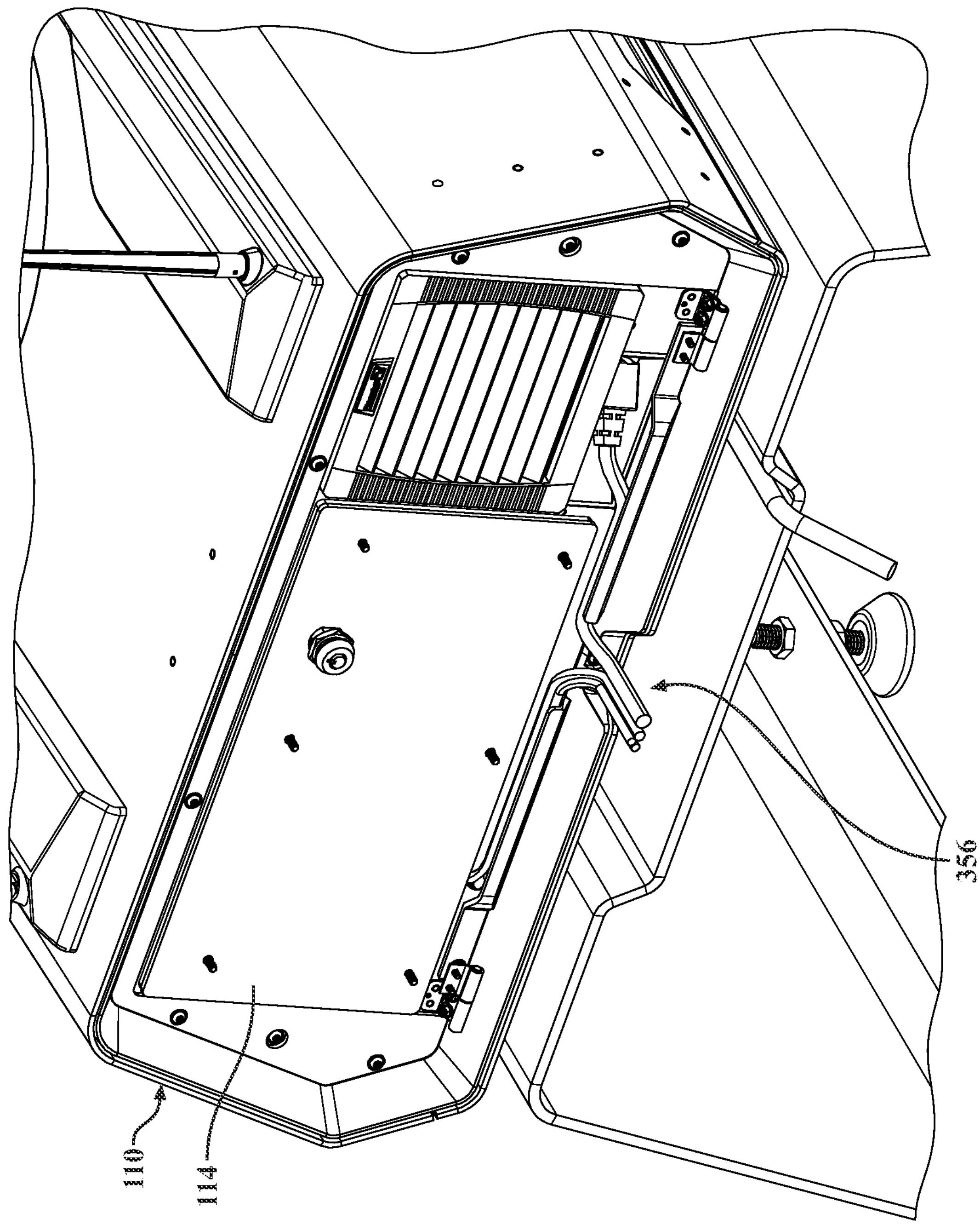
FIG. 7 is a partial, rear, perspective view of the base station.
Figure 8:
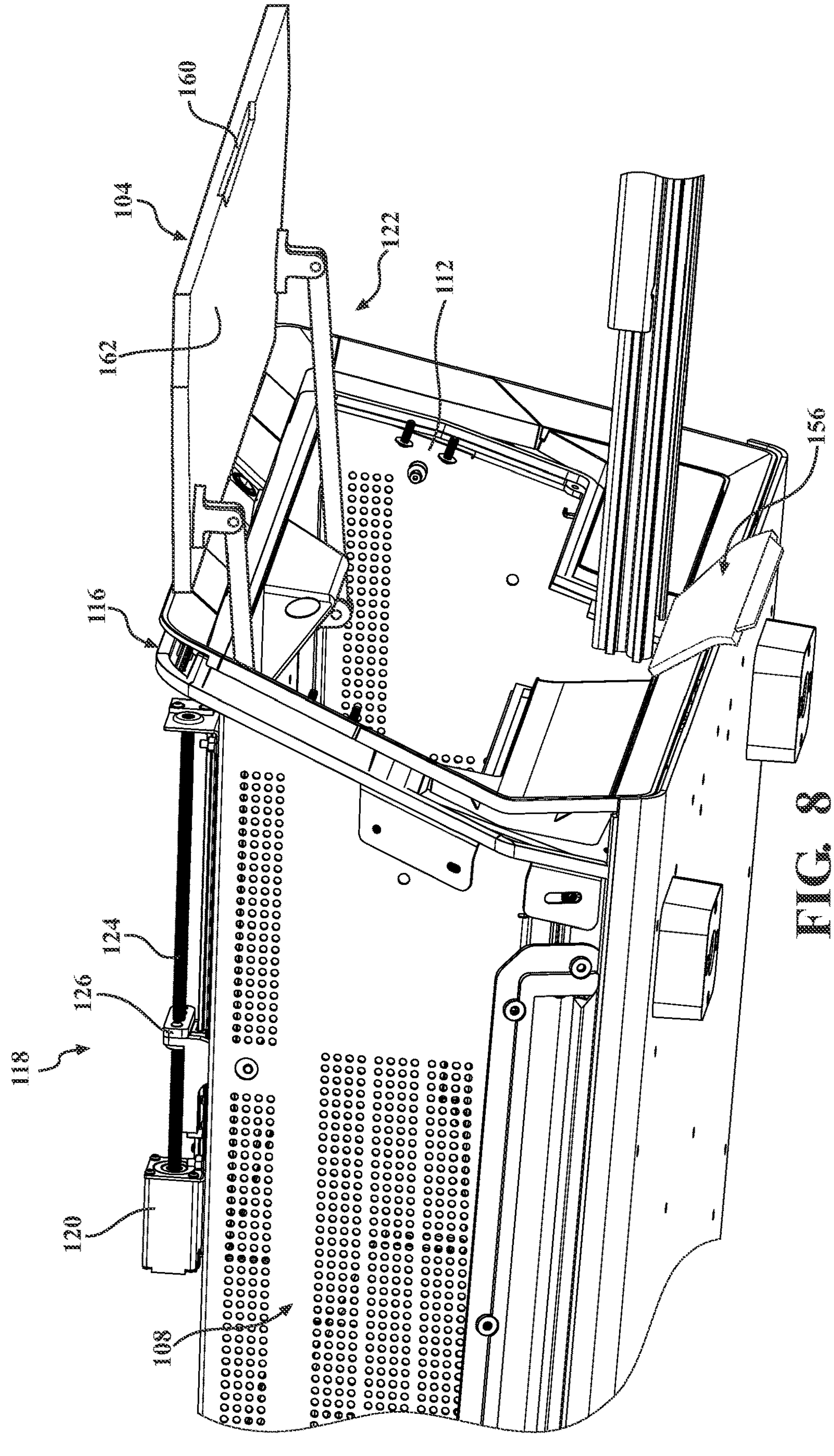
FIG. 8 is a partial, side, perspective view of the base station illustrating a plurality of actuators that are configured to open and close a (front) door of the base station.
Figure 9:
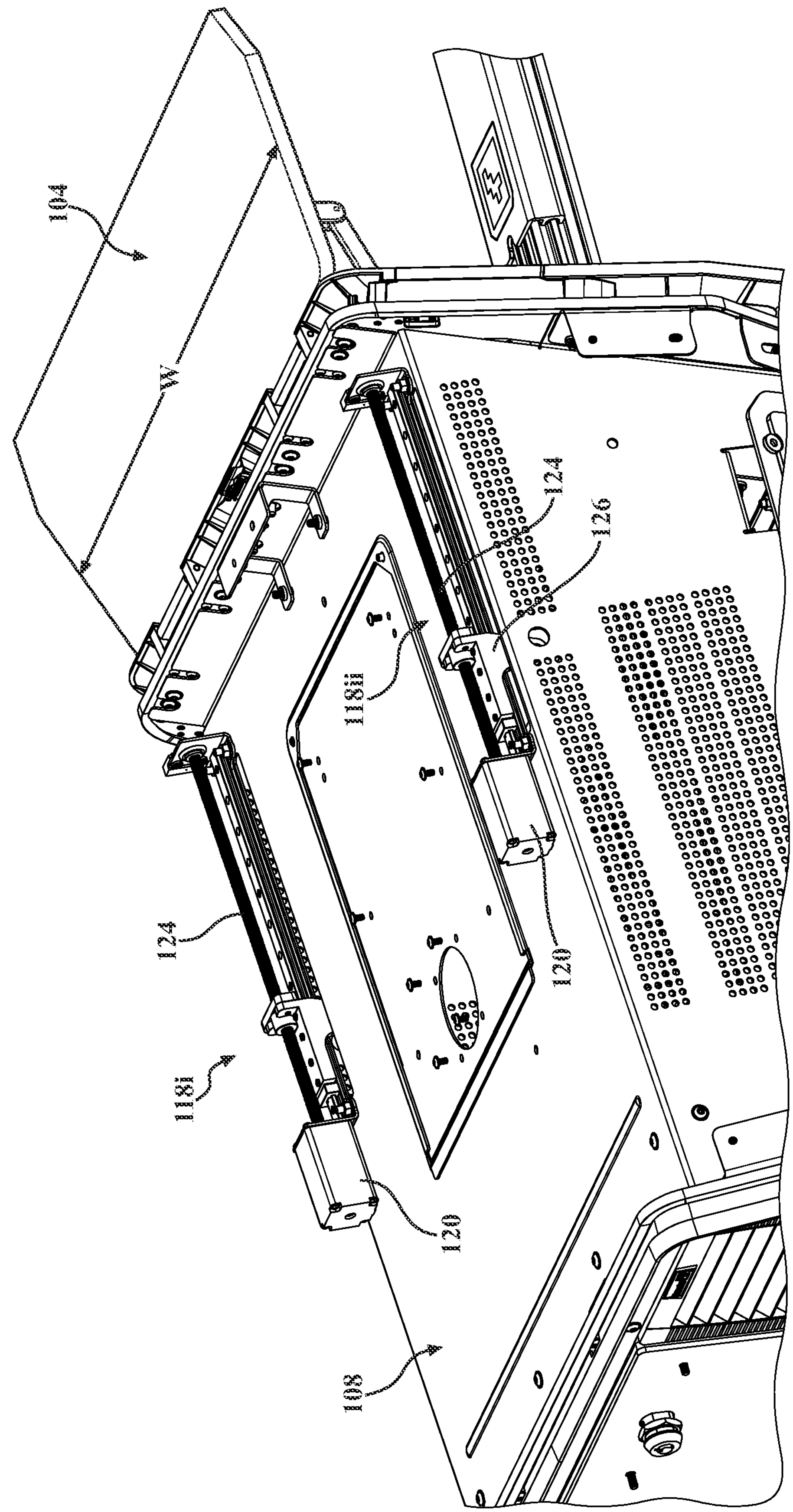
FIGS. 9 and 10 are partial, top, perspective views of the base station illustrating the plurality of actuators.

As seen in FIGS. 4 and 5, the power source 14 includes one or more power cells 20; one or more thermal transfer members 22; and a heat exchanger 24, which defines a lower (bottom) surface of the power source 14 and acts as a cover for the power cell(s) 20 and the thermal transfer member(s) 22. The thermal transfer member(s) 22 and the heat exchanger 24 are configured to facilitate the transfer of thermal energy between the power source 14 and the ambient (air) to decrease or increase temperature of the power source 14. For example, depending upon the particular environment in which the UAV 10 and the base station 100 are employed, the thermal transfer member(s) 22 and the heat exchanger 24 may be utilized to dissipate heat generated by the power source 14 during use and/or charging of the UAV 10 (e.g., in hot environments) or to transfer heat to the power source 14 (e.g., in cold environments) to thereby improve efficiency, operation, and/or the usable life of the UAV 10 and/or the power source 14.

In the particular embodiment illustrated, the power source 14 includes a plurality of individual (e.g., discrete) power cells 20. It should be appreciated, however, that the particular number and/or configuration of the power cells 20 may be varied in alternate embodiments without departing from the scope of the present disclosure. For example, embodiments of the power source 14 including a single power cell 20 are also envisioned herein.

The thermal transfer member(s) 22 are thermally connected to, and extend between, the power cell(s) 20 and the heat exchanger 24. In the particular embodiment of the disclosure illustrated, the power source 14 includes a plurality of individual (e.g., discrete) thermal transfer members 22, each of which is associated with (e.g., thermally connected to) a corresponding power cell 20 (e.g., such that the power source 14 includes a corresponding (equal) number of power cells 20 and thermal transfer members 22). It should be appreciated, however, that the particular number of the thermal transfer members 22 may be varied in alternate embodiments without departing from the scope of the present disclosure and that embodiments of the power source 14 including an unequal number of power cells 20 and thermal transfer members 22 are also envisioned herein. For example, the present disclosure contemplates embodiments in which the number of power cells 20 may exceed the number of thermal transfer members 22 are also envisioned herein (e.g., embodiments in which the power source 14 includes a single thermal transfer member 22 that extends between the collection of power cells 20 and the heat exchanger 24) as well as embodiments in which the number of thermal transfer members 22 may exceed the number of power cells 20.

The thermal transfer member(s) 22 may include (e.g., may be formed partially or entirely from) any material or combination of materials that is suitable for the intended purpose of transferring heat between, and thermally connecting, the power cell(s) 20 and the heat exchanger 24. For example, in one particular embodiment, it is envisioned that the thermal transfer member(s) 22 may include (e.g., may be formed partially or entirely from) graphite. It should be appreciated, however, that the use of other materials would not be beyond the scope of the present disclosure. Additionally, although each thermal transfer member 22 is shown as being unitary in construction (i.e., as being formed from a single piece of material), in alternate embodiments of the disclosure, it is envisioned that each thermal transfer member 22 may include a series of individual segments that are connected to each other during manufacture, assembly of the power source 14, or at any other suitable point in time.

The heat exchanger 24 is thermally connected to the thermal transfer member(s) 22 and is configured to communicate and distribute thermal energy between the power source 14 and the ambient (air), either away from the power source 14 (e.g., when utilized in hot environments) or towards the power source 14 (e.g., when utilized in cold environments), and may include (e.g., may be formed partially or entirely from) any material or combination of materials suitable for that intended purpose. For example, it is envisioned that the heat exchanger 24 may include (e.g., may be formed partially or entirely from) aluminum, magnesium, copper, etc.

To increase the available surface area and, thus, the distribution of thermal energy (either towards or away from the power source 14), in certain embodiments, such as that illustrated throughout the figures, the heat exchanger 24 may include one or more diffusers 26, which may be configured in any manner suitable for that intended purpose. For example, it is envisioned that the diffuser(s) 26 may be configured as pins, protrusions, ribs, or other such surface irregularities and may extend axially (e.g., along a longitudinal axis Y) and/or laterally (e.g., a long a transverse axis X) along an outer (bottom) surface 28 of the heat exchanger 24. In the particular embodiment of the heat exchanger 24 illustrated throughout the figures, for example, the diffusers 26 are configured as fins 30 that define a plurality of channels 32 therebetween, which collectively direct air flow along the heat exchanger 24 to further increase the distribution of thermal energy.

Although shown as including a plurality of diffusers 26 and channels 32 in the particular embodiment of the disclosure illustrated, it should be appreciated that the particular number of the diffusers 26 and/or channels 32 may be varied in alternate embodiments without departing from the scope of the present disclosure. For example, embodiments of the heat exchanger 24 including a single diffuser 26 are also envisioned herein.

Base Station Construction

With reference now to FIGS. 4-26 as well, the base station 100 includes: an enclosure (body) 102 having a front end **102*a* and a rear end 102*b*; a (front) door 104 that is movably connected to the enclosure 102 (at the front end 102*a*); and a cradle 106 that is configured to receive (accommodate) the UAV 10**.

The enclosure 102 includes an inner housing (shell) 108 and an outer housing (cover) 110. The respective inner and outer housings 108, 110 are configured as separate, discrete structures that may be connected together in any suitable manner, whether fixedly or removably (e.g., to allow for repeated assembly and disassembly of the base station 100 during maintenance, repair, etc.). For example, it is envisioned that the respective inner and outer housings 108, 110 may be connected via a plurality of mechanical fasteners (e.g., screws, pins, bolts, clips, etc.), which may be hidden (or otherwise obscured) to inhibit theft and/or unauthorized disassembly of the base station 100.

The inner housing 108 defines an internal cavity 112 and a window 113, each of which is configured to receive and accommodate the UAV 10 to allow for entry of the UAV 10 into the base station 100 and exit of the UAV 10 from the base station 100. Additionally, the inner housing 108 provides a mounting surface for various components of the base station 100 including, for example, electrical components, actuators, and the like, which are connected (secured, mounted) to the inner housing 108 and support operation of the base station 100.

As described in detail below, the outer housing 110 protects the inner housing 108 and the various components that are connected (secured, mounted) thereto (e.g., from dust, debris, the ingress of moisture and/or water, etc.), supports various external components of the base station 100, and provides structural support to the base station 100. For example, in the particular embodiment shown, the outer housing 110 includes a sheet metal construction. It should be appreciated, however, that embodiments of the base station 110 in which the outer housing 110 may include one or more alternative materials are also envisioned herein.

To facilitate access to the various components accommodated within the outer housing 110 (and/or the inner housing 108), in certain embodiments, it is envisioned that the outer housing 110 may include an access panel 114 (FIG. 7) to support maintenance, repair, etc., which may be incorporated in any suitable location. For example, in the particular embodiment illustrated, the access panel 114 is located at the rear end 102*b* of the enclosure 102 (e.g., the outer housing 110). It should be appreciated, however, that the particular location of the access panel 114 may be varied in alternate embodiments without departing from the scope of the present disclosure (e.g., the access panel 114 may be located on a side of the base station 100, rather than the rear end 102*b*.

In certain embodiments of the disclosure, it is envisioned that the outer housing 110 may include exterior coloration that not only reduces solar loading (heating), but promotes contrast to facilitate visualization and/or identification of the base station 100 by the UAV 10 during docking, as described in further detail below.

The door 104 is movably connected to the outer housing 110 such that the door 104 is repositionable between a (fully) closed position (FIG. 1), in which the door 104 conceals the internal cavity 112 and the window 113, and an open position (FIG. 6), in which the internal cavity 112 and the window 113 are exposed. More specifically, the door 104 is movably connected to a forward frame 116 of the outer housing 110. Although illustrated as being pivotably connected to the forward frame 116 in the particular embodiment illustrated throughout the figures, it is also envisioned that the door 104 may be slidably repositionable between the closed position and the open position in alternate embodiments of the disclosure.

As discussed below, due to the metallic (e.g., sheet metal) construction of the outer housing 110 and, thus, the forward frame 116, the forward frame 116 conducts and facilitates the transfer of thermal energy in both hot and cold environments. More specifically, in hot environments, the forward frame 116 is operable as a heat sink that draws thermal energy (heat) away from thermally-sensitive components of the base station 100, and in cold environments, the forward frame 116 is operable as a thermal conduit that directs thermal energy (heat) towards certain components of the base station 100 to facilitate heating thereof.

To facilitate movement of the door 104 between the closed position and the open position, the base station 100 includes one or more actuators 118 (FIGS. 8-10) that extend between the door 104 and the enclosure 102. Although shown as including respective first and second actuators 118*i*, 118*ii* in the particular embodiment illustrated, which are connected (secured) to opposing lateral ends of the door 104 such that the actuators 118*i*, 118*ii* are spaced laterally from each other along a width W of the enclosure 102, it should be appreciated that the present disclosure also contemplates embodiments in which a single actuator 118 may be utilized to control the position of the door 104 (e.g., to reduce the overall cost and complexity of the base station 100).

Each actuator 118 includes a motor assembly 120 (e.g., a stepper motor) and a linkage assembly 122 that extends between the motor assembly 120 and the door 104. More specifically, each motor assembly 120 is connected (secured) to the inner housing 108 such that the motor assembly (ies) 120 are located between the inner housing 108 and the outer housing 110, which protects the motor assembly (ies) 120 and inhibits the collection of any dust, debris, etc. The linkage assembly 122 extends from the motor assembly 120, through the inner housing 108, and pivotably engages the door 104 such that, upon actuation of the motor assembly 120, the linkage assembly 122 applies a force to the door 104 to thereby facilitate movement of the door 104 between the closed position and the open position.

Each linkage assembly 122 includes: a (threaded) drive screw 124; a carrier 126; a first arm 128; and a second arm 130. The drive screw 124 is (operatively) connected to the motor assembly 120 such that actuation of the motor assembly 120 causes rotation of the drive screw 124. The carrier 126 is threadably engaged to the drive screw 124 such that rotation of the drive screw 124 causes axial translation of the carrier 126. More specifically, rotation of the drive screw in a first direction (e.g., clockwise) causes forward advancement of the carrier 126 (e.g., movement of the carrier 126 towards the door 104) and rotation of the drive screw in a second direction (e.g., counterclockwise) causes rearward advancement of the carrier 126 (e.g., movement of the carrier 126 away from the door 104). The first arm 128 includes a first end 132 that is connected to the carrier 126 (either fixedly or pivotably) and a second end 134 that is pivotably connected to the second arm 130. The second arm 130 includes a first end 136 that is pivotably connected to the second end 134 of the first arm 128 and a second end 138 that is pivotably connected to a bracket 140. The bracket 140 is fixedly connected to the door 104 which allows for the transmission of force from the carrier 126 to the door 104 via the arms 128, 130.

Figure 10:
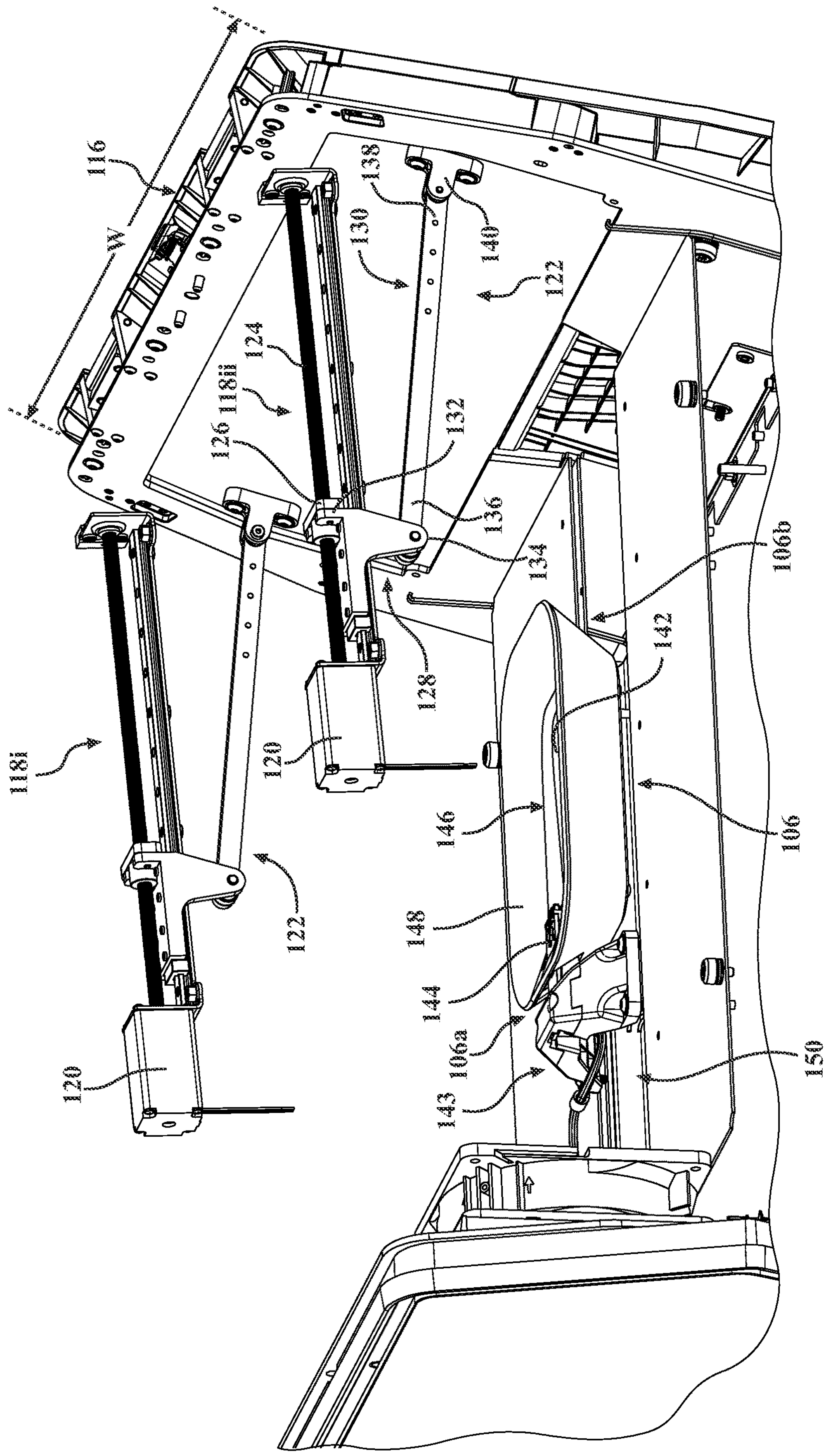
Figure 11:
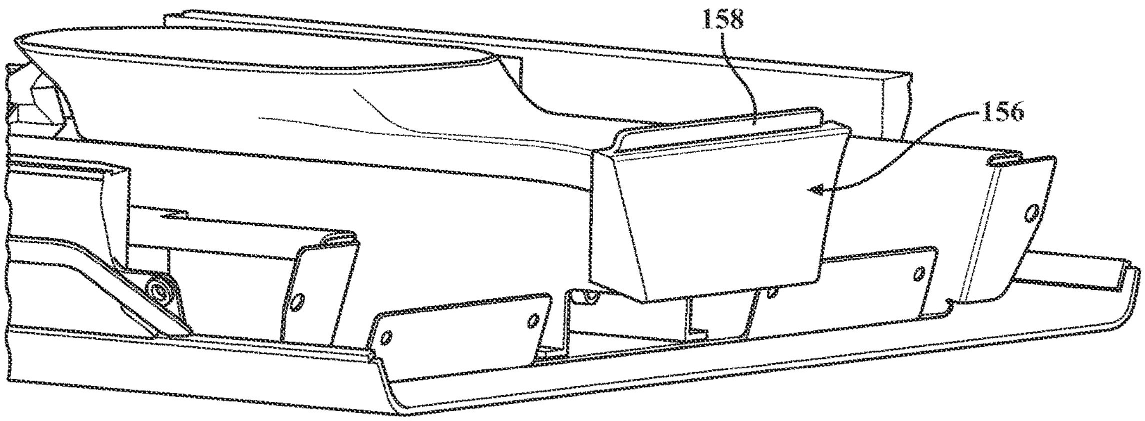
FIG. 11 is a partial, front, perspective view of the base station illustrating a cap that is supported on a slide mechanism, which facilitates movement of the cradle between a retracted position and an extended position.
Figure 12:
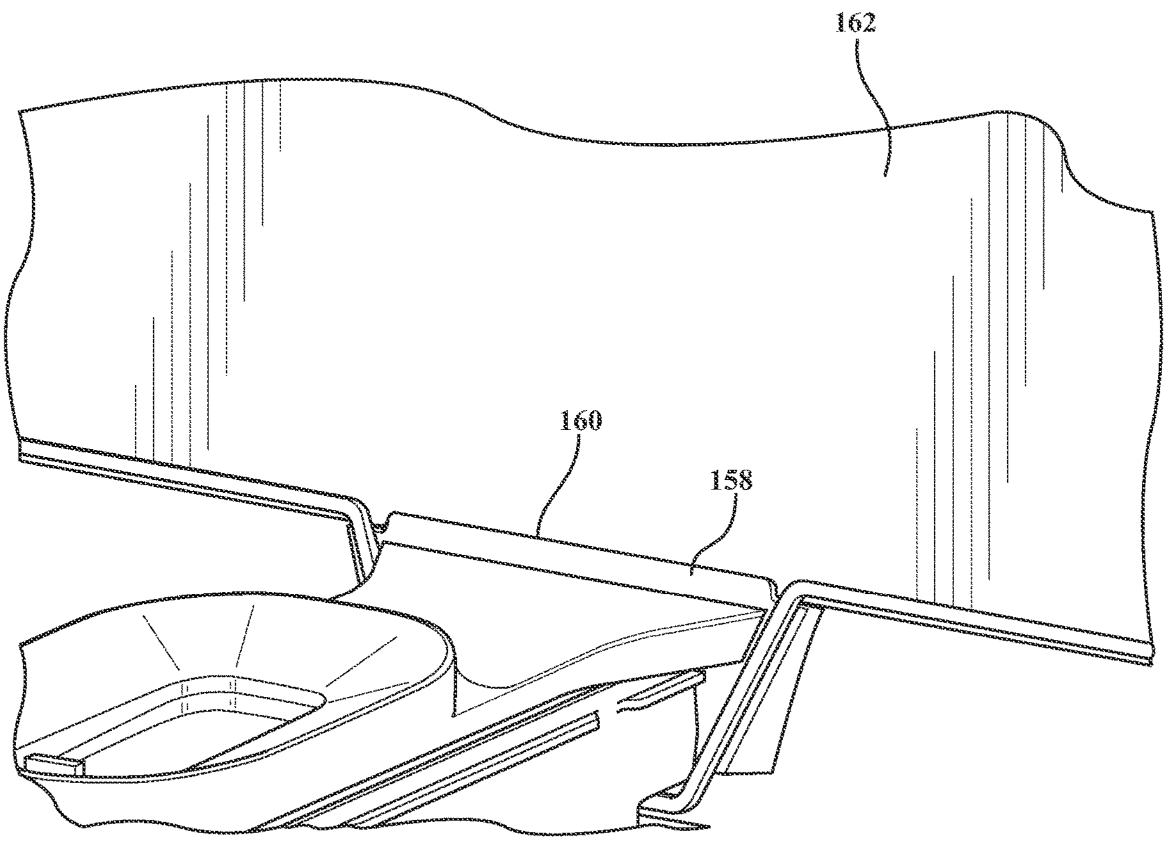
FIG. 12 is a partial, rear, perspective view of the cap shown overlayed by the door of the base station upon closure.

The cradle 106 defines respective (first and second) front and rear ends 106*a*, 106*b* (FIGS. 2, 10, 13) and a chamber 142 (FIG. 10) that is configured to receive the UAV 10 during docking so as to facilitate (support) charging of the power source 14. More specifically, the base station 100 includes a charging hub (assembly) 143 (FIGS. 10, 66-75) that is configured for engagement with, and electrical connection to, the power source 14 upon receipt of the UAV 10 within the chamber 142 to thereby charge the power source 14, as described in further detail below. To facilitate proper docking of the UAV 10 and a proper electrical interface between the power source 14 and the charging hub 143, the cradle 106 defines sidewalls 146 that taper inwardly towards the chamber 142 so as to define an angled guide surface 148 (FIG. 10). The angled guide surface 148 is configured for engagement (contact) with the UAV 10 to direct the UAV 10 into the chamber 142 so as to facilitate seating of the UAV 10 within the cradle 106.

The cradle 106 is movable between a (fully) retracted position (FIGS. 2, 10), in which the cradle 106 (and the UAV 10) are positioned within the enclosure 102 (e.g., within the internal cavity 112), a plurality of partially retracted positions, as described in further detail below, and an extended position (FIG. 13), in which the cradle 106 (and the UAV 10) are positioned externally of the enclosure 102 to facilitate docking with the UAV 10, whereby the UAV 10 is movable into and out of the enclosure 102. To support movement between the extended and retracted positions (extension and retraction), the cradle 106 is connected to a telescoping slide mechanism 150, which is also movable between extended and retracted positions corresponding to those of the cradle 106. The slide mechanism 150 extends through a window 152 (FIG. 1) defined by a bezel portion 154 of the forward frame 116 and supports a cap (hatch, cover) 156 (FIGS. 1, 8, 11, 12) that is configured in correspondence with the window 152. The cap 156 is movably (e.g., pivotably) connected to (supported by) the enclosure 102 (e.g., the forward frame 116 of the outer housing 110) such that the cap 156 is movable between a closed position (FIGS. 6, 11, 12) and an open position (FIGS. 1, 8) as the cradle 106 (and the slide mechanism 150) move between the retracted position and the extended position, respectively. More specifically, the cap 156 moves from the closed position into the open position as the cradle 106 (and the slide mechanism 150) move from the retracted position into the extended position and such that the cap 156 moves from the open position into the closed position as the cradle 106 (and the slide mechanism 150) move from the extended position into the retracted position, whereby the cap 156 engages the bezel portion 154 and is received within the window 152.

In certain embodiments of the disclosure, such as that illustrated throughout the figures, the cap 156 may include an upstanding tab 158 (FIG. 11) that is configured for receipt within a corresponding recess 160 (FIGS. 8, 12) defined in an inner surface 162 of the door 104. Receipt of the tab 158 within the recess 160 not only allows for proper closure of the door 104, but allows for overlayment of the cap 156 by the door 104 upon closure to facilitate sealing of the enclosure 102 and inhibit (if not entirely prevent) the entry of dust, debris, etc., through the door 104 and/or the bezel portion 154. Additionally, the engagement between the bezel portion 154, the slide mechanism 150, and the door 104 (e.g., reception of the tab 158 by the recess 160) improves the security of the base station 100 by inhibiting access to the cradle 106 and, thus, the UAV 10.

Figure 13:
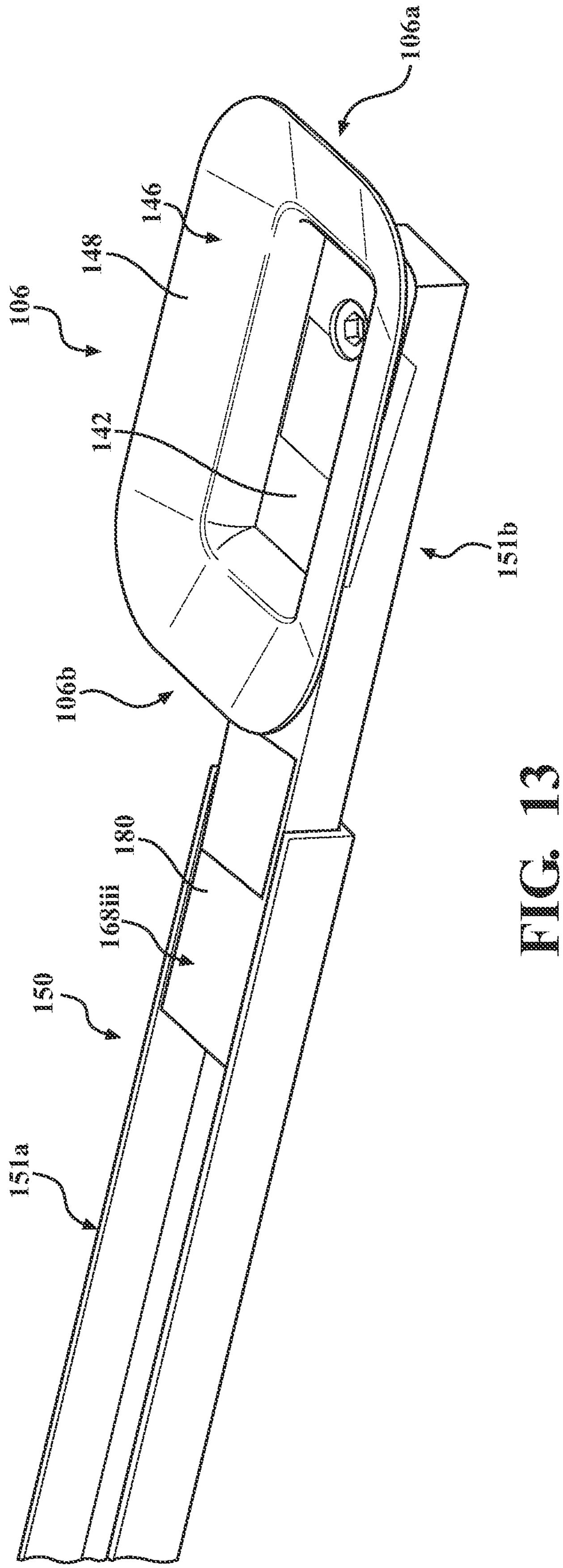
FIG. 13 is a partial, side, perspective view of the base station with the cradle shown in the extended position.
Figure 14:
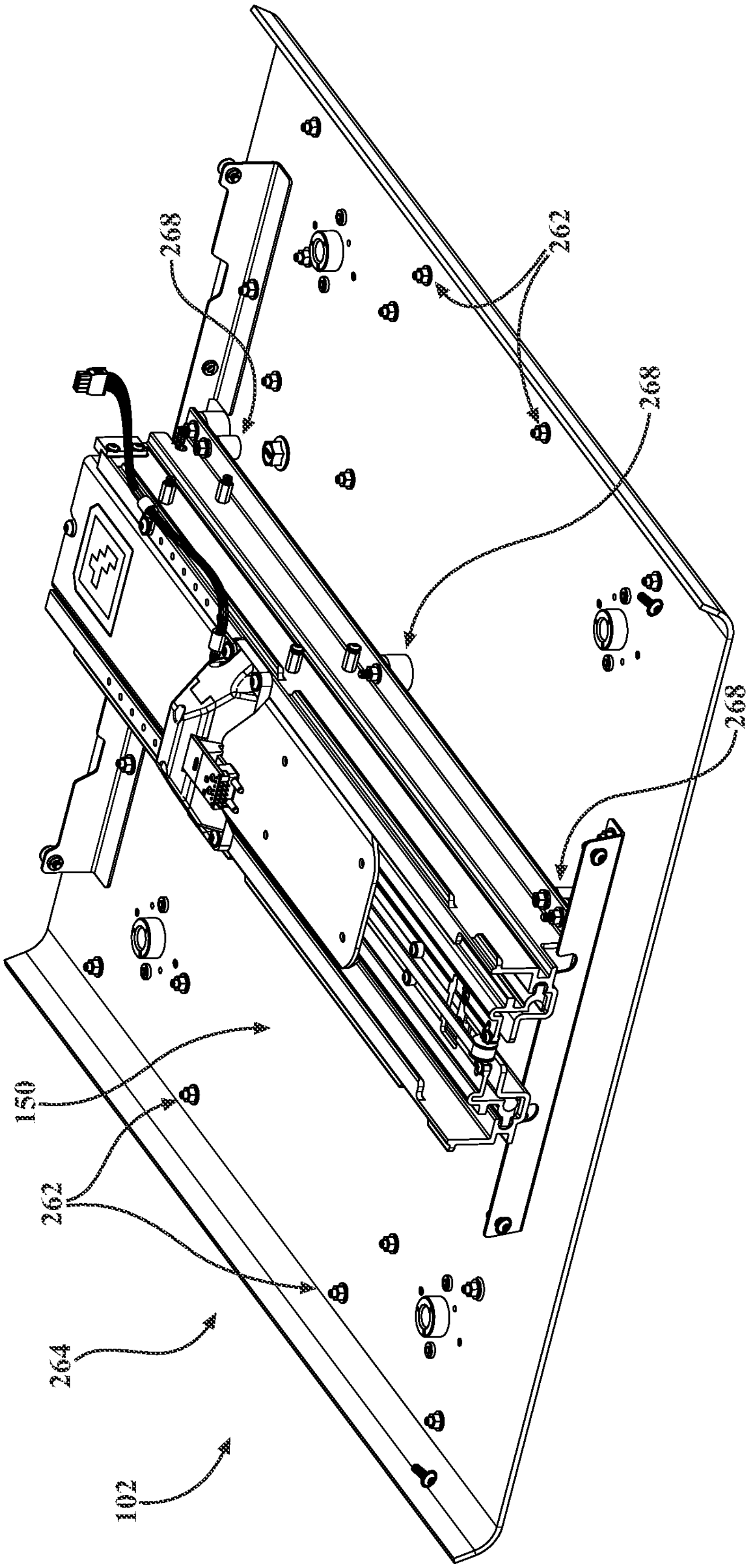
FIG. 14 is top, perspective view of the slide mechanism according to one embodiment of the disclosure, in which the slide mechanism is connected (secured) to an enclosure of the base station via a plurality of first mounts and a plurality of second mounts.
Figure 15:
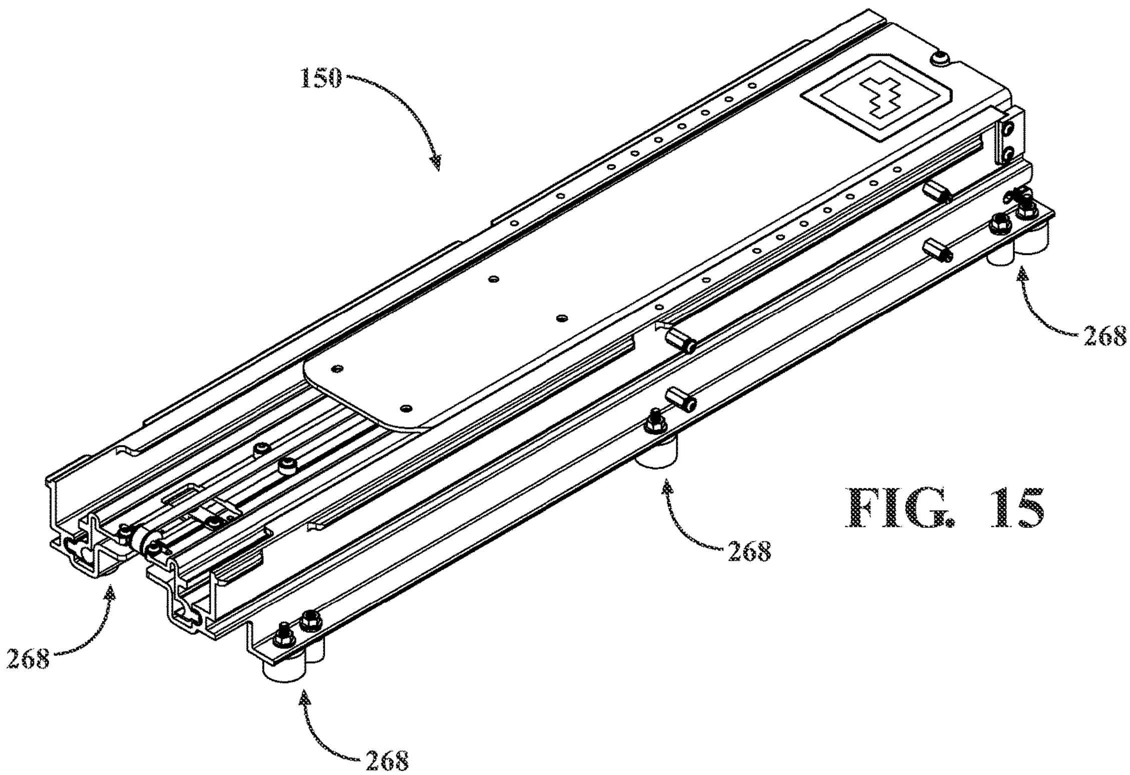
FIG. 15 is a top, perspective view of the slide mechanism, the first mounts, and the second mounts.
Figure 16:
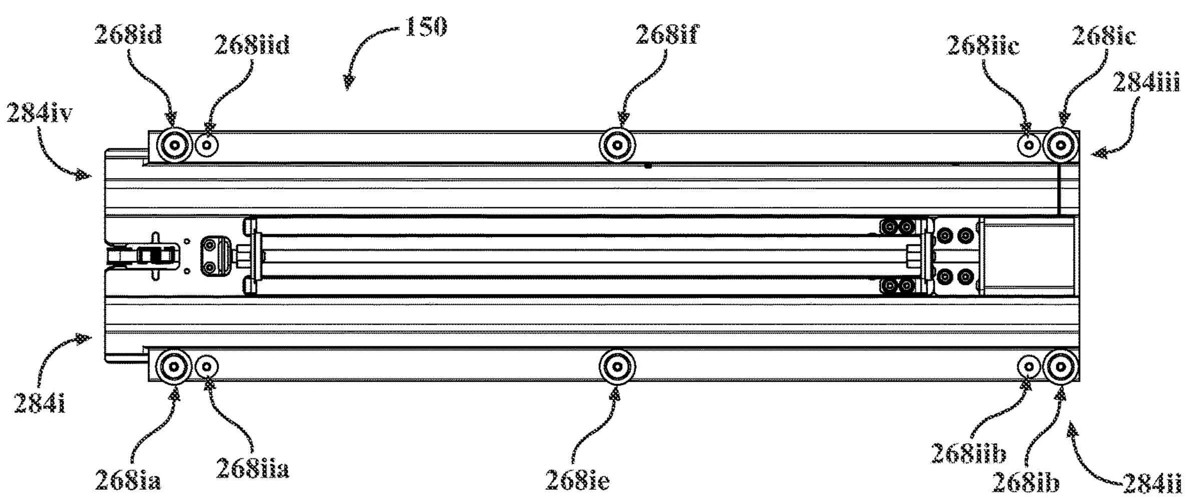
FIG. 16 is a bottom, plan view of the slide mechanism, the first mounts, and the second mounts.
Figure 17:
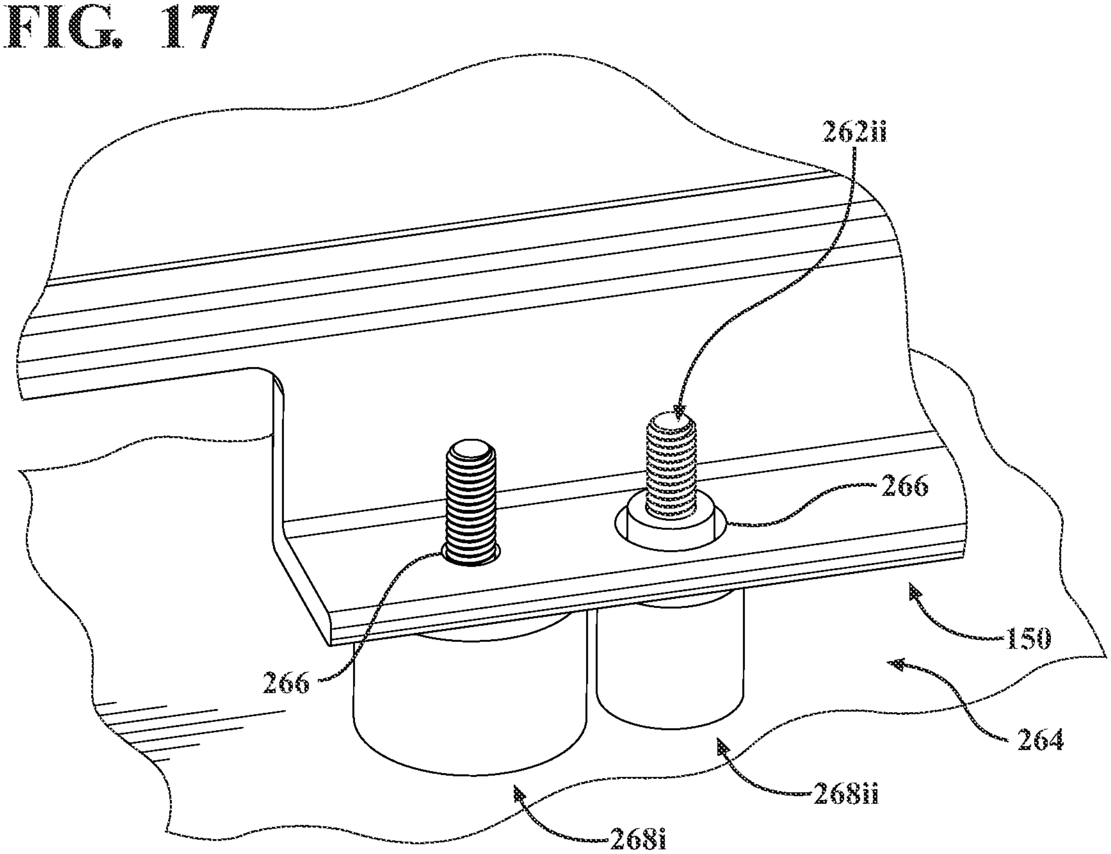
FIG. 17 is a partial, side, perspective view of the slide mechanism, one of the first mounts, and one of the second mounts during assembly.

The slide mechanism 150 includes a stationary slide member 151*a* (FIG. 13), which is supported by the enclosure 102, and a movable slide member 151*b*, which is slidably supported by the stationary slide member 151*a* so as to allow for telescopic movement of the slide mechanism 150 between an extended and retracted positions (which correspond to the extended and retracted positions of the cradle 106). It is envisioned that the stationary slide member 151*a* may be positioned about the movable slide member 151*b* such that that movable slide member 151*b* is received by the stationary slide member 151*a*, as seen in FIG. 13, or that the movable stationary slide member 151*b* may be positioned about the stationary slide member 151*a* such that that stationary slide member 151*a* is received by the movable slide member 151*b*.

Figure 24:
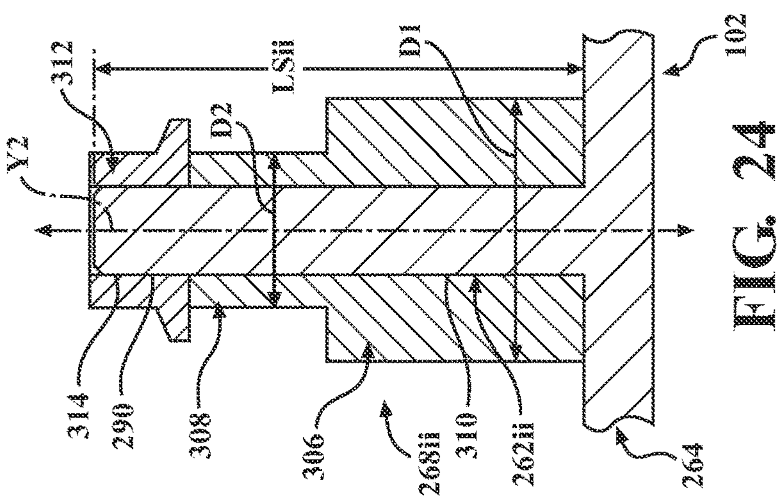
FIG. 24 is an axial (vertical), cross-sectional view illustrating assembly of the enclosure, the slide mechanism, and one of the second mounts.

In alternate embodiments of the disclosure, it is envisioned that the slide mechanism 150 may be either directly or indirectly (operatively) connected (secured) to the enclosure 102. For example, in certain embodiments, it is envisioned that the slide mechanism 150 (e.g., the stationary slide member 151*a*) may be directly and fixedly (e.g., non-movably) connected (secured) to a plurality of studs 262 (FIGS. 14, 17, 21) that extend (vertically) upward from a sheet metal base 264 of the enclosure 102 (e.g., towards the slide mechanism 150) and which are configured for insertion into openings (apertures) 266 (FIGS. 17, 24, 25) in the slide mechanism 150. Alternatively, it is envisioned that the slide mechanism 150 (e.g., the stationary slide member 151*a*) may be indirectly (operatively) connected (secured) to the enclosure 102 via a plurality of mounts 268 (FIGS. 14-26), that are located between the enclosure 102 (e.g., the sheet metal base 264) and the slide mechanism 150. As described in detail below, positioning of the mounts 268 between the enclosure 102 and the slide mechanism 150 physically separates the slide mechanism 150 from the enclosure 102, which reduces the rigidity of the interface therebetween. Physically separating the slide mechanism 150 from the enclosure 102 also increases the tolerance for relative movement (deflection) between the enclosure 102 and the slide mechanism 150 during extension and retraction and reduces (resonant) vibration of the slide mechanism 150 and, thus, undesirable movement (e.g., shaking, jittering, etc.). In the particular embodiment of the base station 100 illustrated in FIGS. 14-26, the slide mechanism 150 is connected (secured) to the enclosure 102 via a plurality of first mounts 268*i* and a plurality of second mounts 268*ii*. The mounts 268*i*, 268*ii* are each configured to receive one of the studs 262 extending from the base 264 of the enclosure 102 and include dissimilar (e.g., non-identical configurations), as described in further detail below (e.g., the mounts 268*i* include a first configuration and the mounts 268*ii* include a second, different configuration). More specifically, the mounts 268*i* are each configured to receive first studs 262*i* (FIG. 22), which define a first length LSi, and the mounts 268*ii* are each configured to receive second studs 262*ii* (FIGS. 17, 18, 24), which define a second length LSii (FIG. 24).

Figure 18:
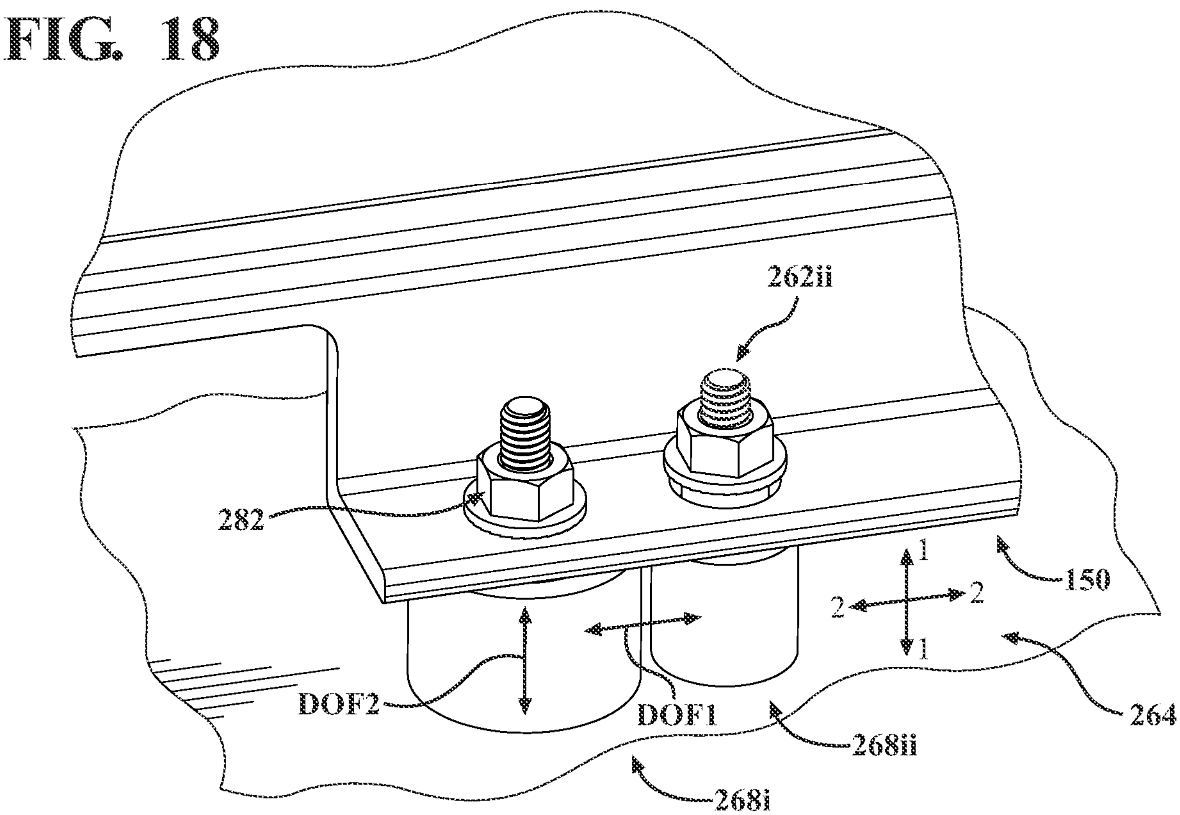
FIG. 18 is a partial, side, perspective view of the slide mechanism, the first mount, and the second mount seen in FIG. 17 upon assembly.
Figure 19:
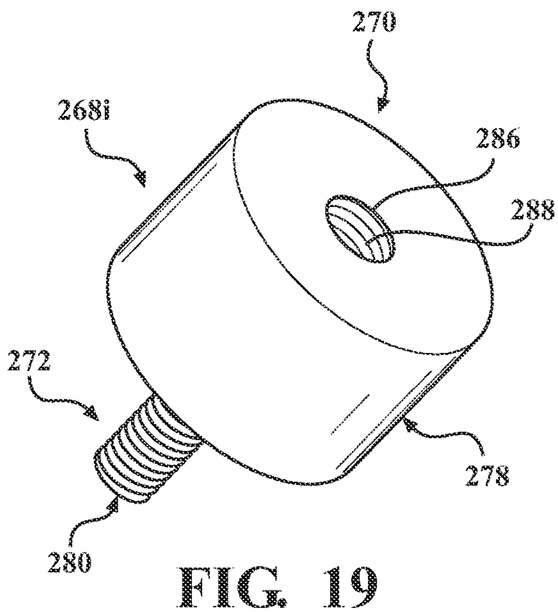
FIG. 19 is bottom, perspective view of one of the first mounts.
Figure 20:
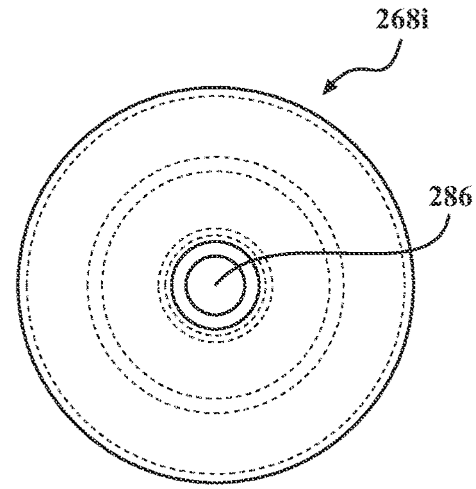
FIG. 20 is transverse (horizontal), cross-sectional view of one of the first mounts.
Figure 21:
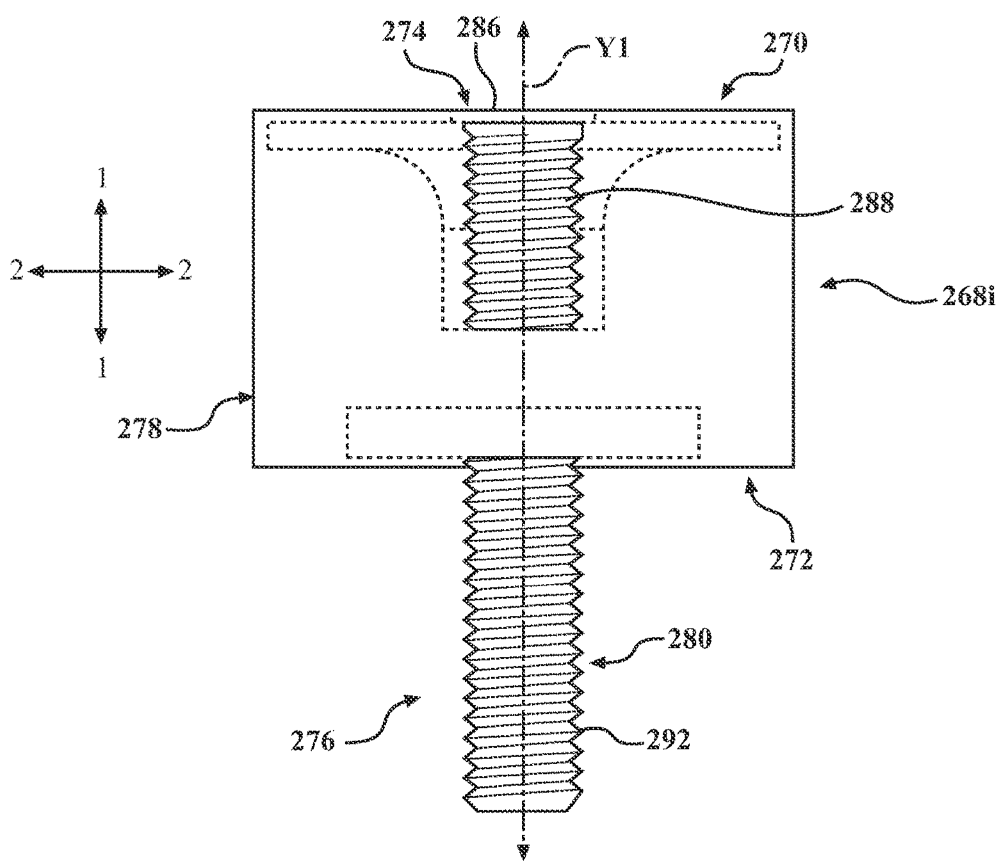
FIG. 21 is an axial (vertical), cross-sectional view of one of the first mounts.
Figure 22:
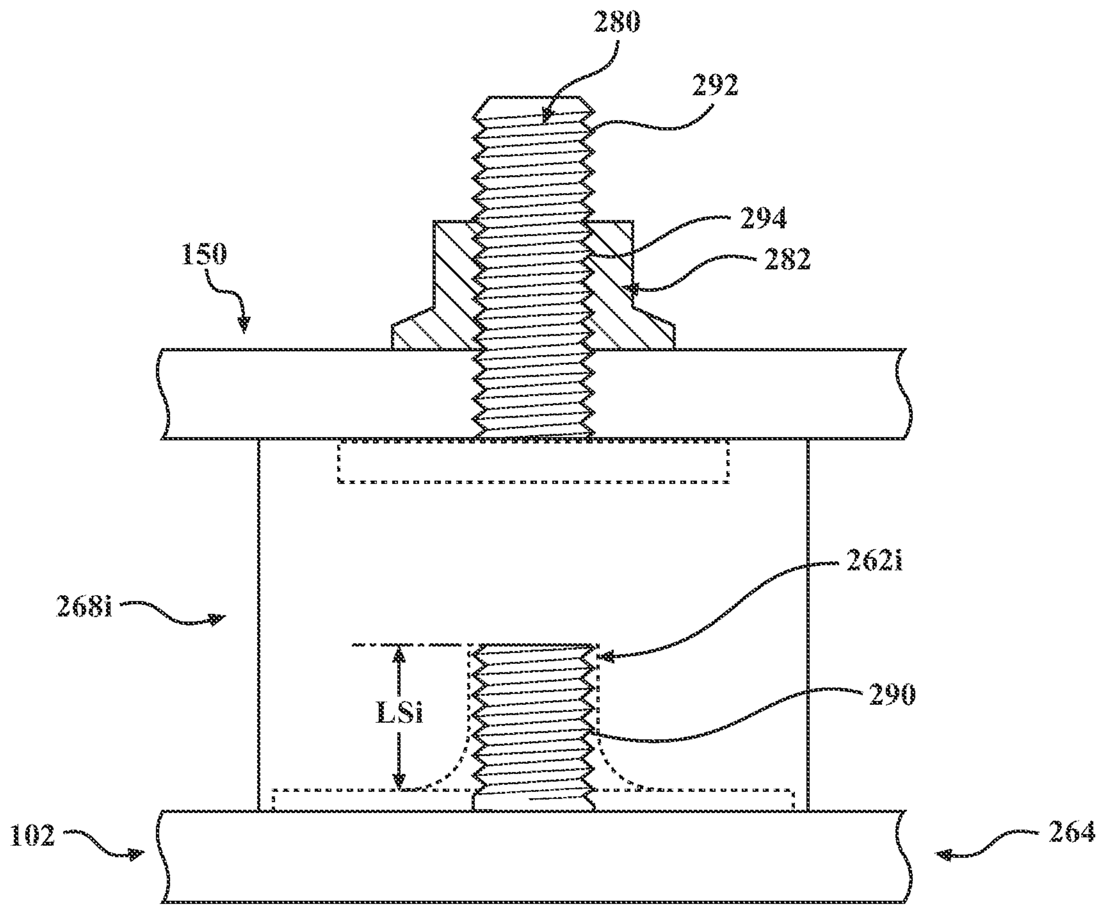
FIG. 22 is an axial (vertical), cross-sectional view illustrating connection of the slide mechanism to the enclosure via one of the first mounts.
Figure 23:
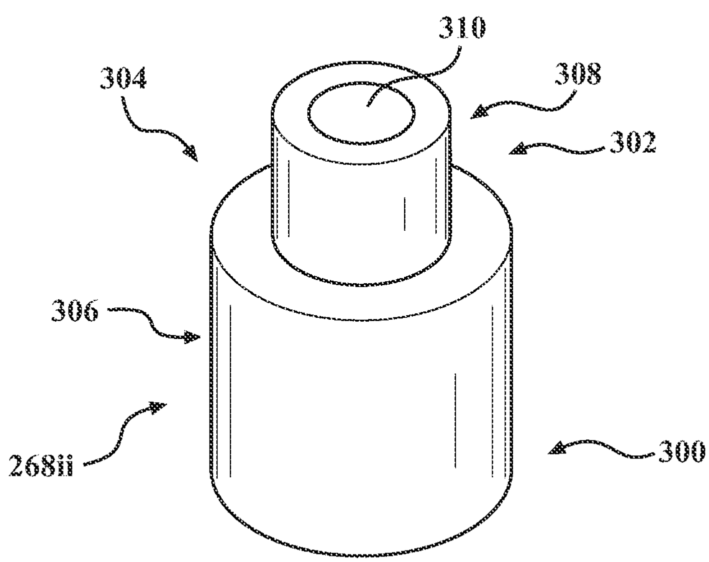
FIG. 23 is a side, perspective view of one of the second mounts.
Figure 25:
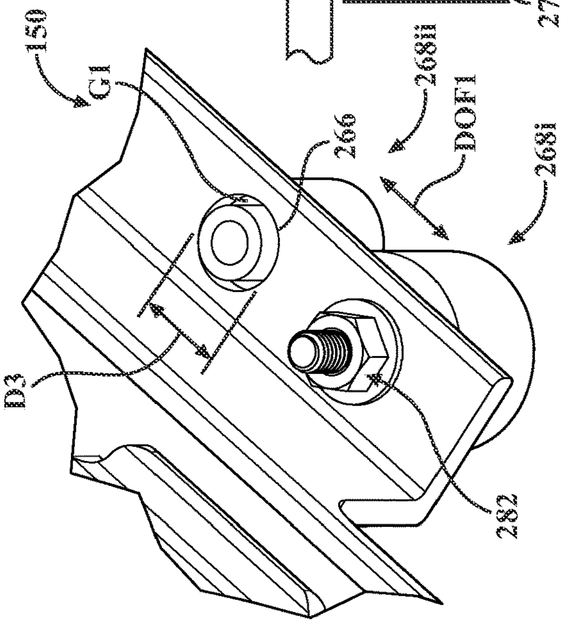
FIG. 25 is a partial, top, perspective view of the slide mechanism, one of the first mounts, and one of the second mounts during assembly and illustrating a lateral (radial, horizontal) gap between the slide mechanism and the second mount.

The mounts 268*i* define opposing (first and second) ends 270, 272 (FIGS. 19, 21) having (first and second) female and male interfaces 274, 276, respectively, and each include: a (first) bushing (body, body portion) 278; a shank 280; and a (first) fastener 282 (FIGS. 18, 22, 25). In the particular embodiment illustrated in FIGS. 14-26, the base station 100 includes six mounts 268*ia*-268*if*. More specifically, the mounts 268*ia*-268*id* are located in corner sections (regions) 284*i*-284*iv* of the slide mechanism 150, respectively, one mount 268*ie* that is located between the corner sections 284*i*, 284*ii* (e.g., such that the corner sections 284*i*, 284*ii* are spaced equidistant (or approximately equidistant) from the mount 268*ie*), and one mount 268*if* that is located between the corner sections 284*iii*, 284*iv* (e.g., such that the corner sections 284*iii*, 284*iv* are spaced equidistant (or approximately equidistant) from the mount 268*if*). It should be appreciated, however, that the particular number of mounts 268*i* may be varied in alternate embodiments without departing from the scope of the present disclosure (e.g., depending upon the particular configuration of the base station 100, the slide mechanism 150, etc.). As such, embodiments including both greater and fewer numbers of mounts 268*i* are envisioned herein and would not be beyond the scope of the present disclosure.

The bushing 278 includes (e.g., is formed partially or entirely from) a compliant material, which (axially) separates the interfaces 274, 276 along a longitudinal axis Y1 of the mount 268*i* and absorbs forces created during extension and retraction of the slide mechanism 150 so as to reduce vibration, shaking, jittering, etc. At the end 270, the bushing 278 defines an aperture 286, which defines the female interface 274 and is configured to receive one of the studs 262*i* to facilitate connection of the bushing 278 to the enclosure 102 (e.g., via the studs 262*i*). More specifically, as seen in FIG. 22, the aperture 286 extends into, but not through, the bushing 278, whereby the stud 262*ii* extends partially into the bushing 278.

In the particular embodiment illustrated, the aperture 286 includes threading 288, which is configured for engagement with corresponding threading 290 (FIG. 22) on the studs 262*i* such that the bushing 278 threadably engages (contacts) the sheet metal base 264 of the enclosure 102 (via the studs 262*i*). It is envisioned, however, that the mounts 268*i* and the enclosure 102 may be configured for engagement in any suitable manner. For example, in alternate embodiments of the disclosure, it is envisioned that the threading 288, 290 may be omitted and that the mounts 268*i* and the studs 262*i* may be configured for engagement in a press-fit (interference fit) arrangement.

The shank 280 defines the male interface 276 and extends (vertically) upward from the bushing 278 (e.g., away from the sheet metal base 264) such that the shank 280 is insertable into one of the openings 266 (FIGS. 17, 24, 25) in the slide mechanism 150. The shank 280 is configured for (releasable) connection to (engagement with) the fastener 282 (FIGS. 18, 22, 25) such that the slide mechanism 150 is secured between the bushing 278 and the fastener 282. More specifically, in the particular embodiment illustrated, the shank 280 and the fastener 282 include corresponding threading 292, 294. It is envisioned, however, that the shank 280 and the fastener 282 may be configured for engagement in any manner suitable for the intended purpose of fixing the mounts 268*i* and the slide mechanism 150 in relation to each other (e.g., so as to inhibit (if not entirely prevent) relative movement therebetween). For example, in alternate embodiments, it is envisioned that the threading 292, 294 may be omitted and that the shank 280 and the fastener 282 may be configured for engagement in a press-fit (interference fit) arrangement.

Figure 26:
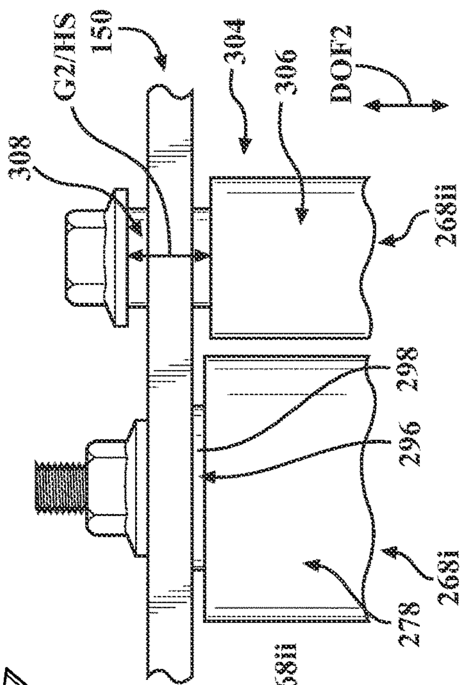
FIG. 26 is a side, plan view of the slide mechanism, the first mount, and the second mount seen in FIG. 25 upon assembly and illustrating an axial (vertical) gap between the slide mechanism and the second mount.

In the particular embodiment illustrated in FIGS. 16-22, the mounts 268*i* are configured such that the bushing 278 is in direct contact with the enclosure 102 (e.g., the sheet metal base 264) and the slide mechanism 150. Alternatively, however, it is envisioned that the mounts 268*i* may be configured such that the bushing 278 is separated from the enclosure 102 (e.g., the sheet metal base 264) and/or the slide mechanism 150. For example, FIG. 26 illustrates an embodiment in which the mounts 268*i* include an intermediate member 296 (e.g., a washer 298, an O-ring, etc.) that is located between the bushing 278 and the slide mechanism 150.

Due to the complaint construction of the bushing 278, during repositioning of the slide mechanism 150 between the retracted position and the extended position, the mounts 268*i* undergo deformation (e.g., expansion and contraction) in the lateral (radial) directions identified by the arrows 1 (FIGS. 18, 21) and/or the axial (vertical) directions identified by the arrows 2. The lateral and/or axial deformation tolerated by the mounts 268*i* allows for relative movement between the slide mechanism 150 and the enclosure 102 (e.g., the sheet metal base 264), which not only eliminates a direct, rigid connection therebetween, but dampens (absorbs) vibration during repositioning of the slide mechanism 150 so as to increase predictability, consistency, and/or uniformity in movement of the slide mechanism 150.

The mounts 268*ii* define opposing (first and second) ends 300, 302 and include: a (second) bushing (body, body portion) 304 with a base portion 306 and a stem 308 extending therefrom; a channel 310; and a (second) fastener 312. In the particular embodiment illustrated in FIGS. 14-26, the base station 100 includes four mounts 268*ii*. More specifically, the base station 100 includes four mounts 268*iia*-268*iid* that are located adjacent (or generally adjacent) to the mounts 268*ia*-268*id* in the corner sections 284*i*-284*iv* of the slide mechanism 150, respectively. It should be appreciated, however, that the particular number of mounts 268*ii* may be varied in alternate embodiments without departing from the scope of the present disclosure (e.g., depending upon the particular configuration of the base station 100, the slide mechanism 150, etc.). As such, embodiments including both greater and fewer numbers of mounts 268*ii* are envisioned herein and would not be beyond the scope of the present disclosure.

In the particular embodiment illustrated, the bushing 304 includes (e.g., is formed partially or entirely from) a compliant material to further facilitate force absorption by the mounts 268*ii* and further reduce vibration of the slide mechanism 150 during extension and retraction. Embodiments of the base station 100 in which the bushing 304 may include a non-compliant material, however, are also envisioned herein and would not be beyond the scope of present disclosure.

The base portion 306 defines a first transverse cross-sectional dimension (e.g., a diameter) D1 (FIG. 24) and the stem 308 defines a second transverse cross-sectional dimension (e.g., a diameter) D2 that is less than the first transverse cross-sectional dimension D1, whereby the bushing 304 includes (defines) a non-uniform, stepped transverse cross-sectional configuration that varies along a longitudinal axis Y2 of the mount 268*ii*. More specifically, the stem 308 is configured for insertion into one of the openings 266 (FIGS. 17, 24, 25) in the slide mechanism 150, which defines a third transverse cross-sectional dimension (e.g., a diameter) D3 (FIG. 25) that is less than the first transverse cross-sectional dimension D1 and greater than the second transverse cross-sectional dimension D2, such that the base portion 306 is positioned (located) between the enclosure 102 (e.g., the sheet metal base 264) and the slide mechanism 150. The differential between the transverse cross-sectional dimensions D2, D3 respectively defined by the stem 308 and the opening 266 results in the formation (definition) of a lateral (radial, horizontal) gap G1 (FIG. 25) therebetween. For example, in the particular embodiment illustrated, the gap G1 lies (substantially) within the range of (approximately) 0.5 mm to (approximately) 1.5 mm (e.g., (approximately) 1 mm). A gap G1 outside of this range, however, is also envisioned herein and would not be beyond the scope of present disclosure.

The channel 310 extends through the bushing 304 is configured to receive one of the studs 262*ii* such that the stud 262*ii* extends through the mount 268*ii*, which facilities (releasable) connection of (engagement between) the stud 262*ii* and the fastener 312 such that the slide mechanism 150 is secured between the bushing 304 and the fastener 312 so as to inhibit (if not entirely prevent) relative movement between the mounts 268*ii* and the enclosure 102 (e.g., the studs 262*ii*) while allowing for relative movement between the mounts 268*ii* and the slide mechanism 150, as described in further detail below. For example, it is envisioned that the bushing 304 may be compressible retained between the fastener 312 and the sheet metal base 264 so as to secure the mount 268*i* in relation to the enclosure 102.

In the particular embodiment illustrated, the fastener 312 includes threading 314 (FIG. 24) that is configured for engagement with the threading 290 on the stud 262*ii* extending through the mount 268*ii* (via the channel 310). It is envisioned, however, that the studs 262*ii* and the fasteners 312 may be configured for engagement in any manner suitable for the intended purpose(s) discussed above. For example, in alternate embodiments, it is envisioned that the threading 290, 314 may be omitted and that the stud 262*ii* and the fastener 312 may be configured for engagement in a press-fit (interference fit) arrangement.

As seen in FIG. 26, upon connection of the fastener 312 to the stud 262*ii*, an axial (vertical) gap G2 is defined between the fastener 312 and the base portion 306, which is equivalent to a (vertical) height HS defined by the stem 308 of the bushing 304. For example, in the particular embodiment illustrated, the gap G2 lies (substantially) within the range of (approximately) 1 mm to (approximately) 2 mm (e.g., (approximately) 1.5 mm). A gap G2 outside of this range, however, is also envisioned herein and would not be beyond the scope of present disclosure.

The gaps G1, G2 allow for reception of the stem 308 by the opening 266 in the slide mechanism 150 in a manner that inhibits (if not entirely prevents) contact between (engagement of) the mounts 268*ii* and the slide mechanism 150 when the slide mechanism 150 is in a normal state (condition) (e.g., when the slide mechanism 150 is stationary between periods of extension and retraction). The gaps G1, G2 also allow for movement of the slide mechanism 150 in relation to the enclosure 102 and the second mounts 268*ii*, which is further facilitated by the compliant material comprising the bushings 278 of the first mounts 268*i*, in two degrees-of-freedom DOF1 (FIGS. 18, 25), DOF2 (FIGS. 18, 26), which are oriented in orthogonal (or generally orthogonal) relation. More specifically, the gaps G1 (FIG. 25), G2 (FIG. 26) respectively allow for predetermined lateral (radial) and axial (vertical) movement of the slide mechanism 150 (in relation to the enclosure 102 and the second mounts 268*ii*) so as to limit (restrict) deformation of the mounts 268*i* and movement of the slide mechanism 150 during extension and retraction, which inhibits (if not entirely prevents) lateral over-travel (e.g., in the degree-of-freedom DOF1) and axial over-travel (e.g., in the degree-of-freedom DOF2). Limiting deformation of the mounts 268*i* and movement of the slide mechanism 150 (in relation to the enclosure 102 and the second mounts 268*ii*) inhibits (if not entirely prevents) damage to (e.g., shearing of) the mounts 268*i* and over-travel of the slide mechanism 150 within the enclosure 102, which reduces (if not entirely eliminates) any likelihood of undesirable contact between the slide mechanism 150 and the various internal components of the base station 100. For example, during docking of the UAV 10, the slide mechanism 150 may experience (vertical) deflection under the weight of the UAV 10 and/or as a result of the force applied to the cradle 106 during landing. Any such (vertical) deflection (e.g., movement of the slide mechanism 150 in the degree-of-freedom DOF2), however, is restricted by the mounts 268*ii* via contact between the slide mechanism 150 and the fastener 312, which also restricts axial (vertical) deformation of the mounts 268*i*, thus inhibiting (if not entirely preventing) damage to the mounts 268*i* (e.g., overstretching, tearing) that may otherwise occur.

In the particular embodiment of the base station 100 illustrated in FIGS. 14-26, the mounts 268*i* and the mounts 268*ii* include non-identical (dissimilar) configurations, as described above. It should be appreciated, however, that embodiments of the base station 100 including a single variety of mount 268 are also envisioned herein and would not be beyond the scope of the present disclosure. For example, the present disclosure contemplates an embodiment of the base station 100 that is devoid of the mounts 268*ii* and which exclusively includes the mounts 268*i*.

In certain embodiments of the disclosure, it is envisioned that the door 104 and the cradle 106 may be automatically actuated upon the receipt of an incoming/docking signal from the UAV 10. For example, it is envisioned that the incoming/docking signal may automatically engage the actuator(s) 118 to thereby open the door 104. Thereafter, when it is determined that the door 104 is fully opened, which may be achieved through the employ of Hall sensors (or any other such suitable detection mechanism), the cradle 106 may be extended via (telescopic) movement of the slide mechanism 150.

Anti-Theft and Security Measures

To further improve the security of the base station 100, in certain embodiments of the disclosure, it is envisioned that the door 104 may include a locking mechanism. For example, it is envisioned that the door 104 may include a magnetic lock to maintain closure of the door 104 in the absence of power to prevent inadvertent and/or unauthorized opening of the door 104 and, thus, access to the UAV 10.

Additionally, or alternatively, it is envisioned that the actuator(s) 118 (FIGS. 8-10) may be configured to resist the application of (manual) force to the door 104, and thereby maintain closure of the door 104, by inhibit (if not entirely preventing) the transmission of force from the door 104 to the motor assembly (ies) 120. For example, it is envisioned that the threading defined by the drive screw 124 may include a fine pitch, which would inhibit (if not entirely prevent) the transmission of force applied to the door 104 to the carrier(s) 126, thereby maintaining closure of the door 104. Additionally, or alternatively, it is envisioned that the actuator(s) 118 may include a solenoid (or other such mechanism) that is configured to engage a locking pin (or other such member).

Pedestal

With reference to FIG. 1, in certain embodiments, the base station 100 may be configured for use with a pedestal 164 (or other such free-standing platform) that is configured to support the base station 100 and the UAV 10 in an elevated position (e.g., above the ground). Together, the base station 100 and the pedestal 164 describe a docking system 165 for the UAV 10 that creates free air space to not only reduce turbulence (e.g., propeller wash) during takeoff and landing of the UAV 10, but mitigate the entry of debris (e.g., dust, particulate, etc.) into the base station 100.

In certain embodiments of the docking system 165, it is envisioned that the pedestal 164 and the base station 100 may include corresponding engagement structures (e.g., pins and holes, detents and recesses, ribs and slots, a footing and a channel, etc.) that are configured for releasable engagement (connection) to promote proper alignment of the pedestal 164 and the base station 100 and inhibit (if not entirely prevent) unintended separation of the base station 100 from the pedestal 164, such as, for example, in the event that the base station 100 and/or the pedestal 164 is subjected to an applied force (e.g., a wind gust, impact with an external object, etc.). In one particular embodiment, it is envisioned that the corresponding engagement structures may include one or more openings and corresponding mechanical fasteners (e.g., bolts, screws, pins, etc.) that are configured for insertion into the opening(s) to allow for fixed, releasably connection of the pedestal 164 and the base station 100.

To inhibit (if not entirely prevent) unauthorized separation of the base station 100 from the pedestal 164 (e.g., to guard against theft of the base station 100 and/or the pedestal 164), it is envisioned that the pedestal 164 and the base station 100 may include corresponding eyelets (or other such openings) that are configured to receive a lockable tether, chain, cable, bar, etc.

Figure 54:
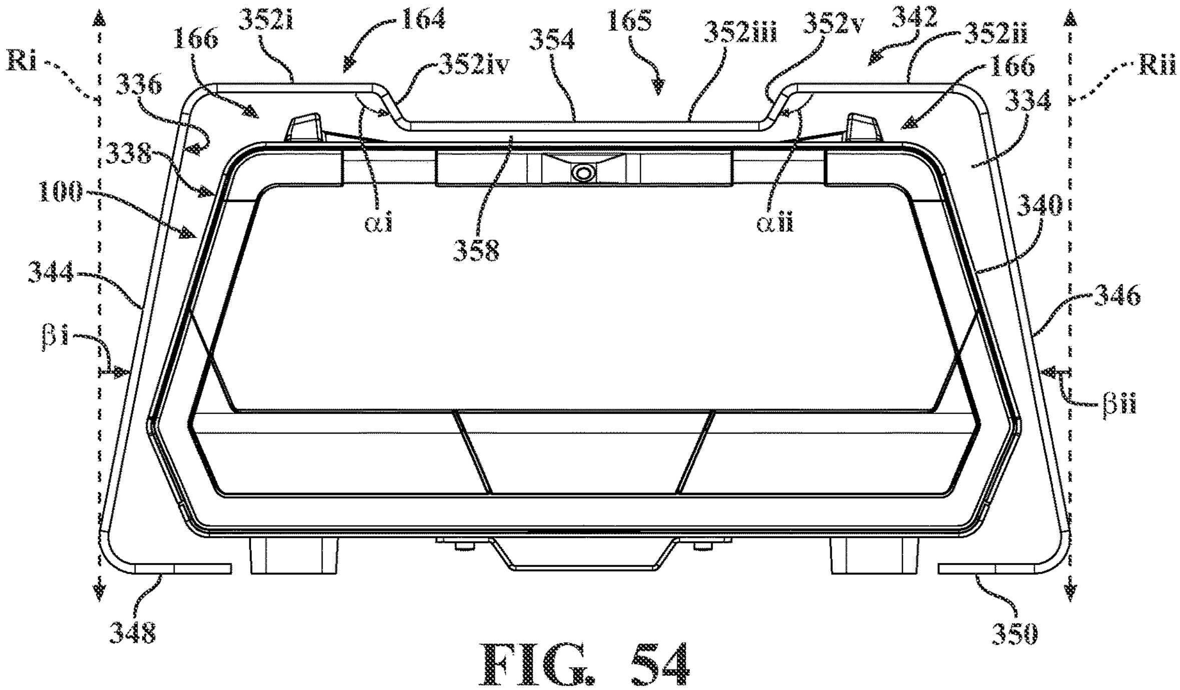
FIG. 54 is a front, plan view of the base station shown nested within a pedestal.
Figure 55:
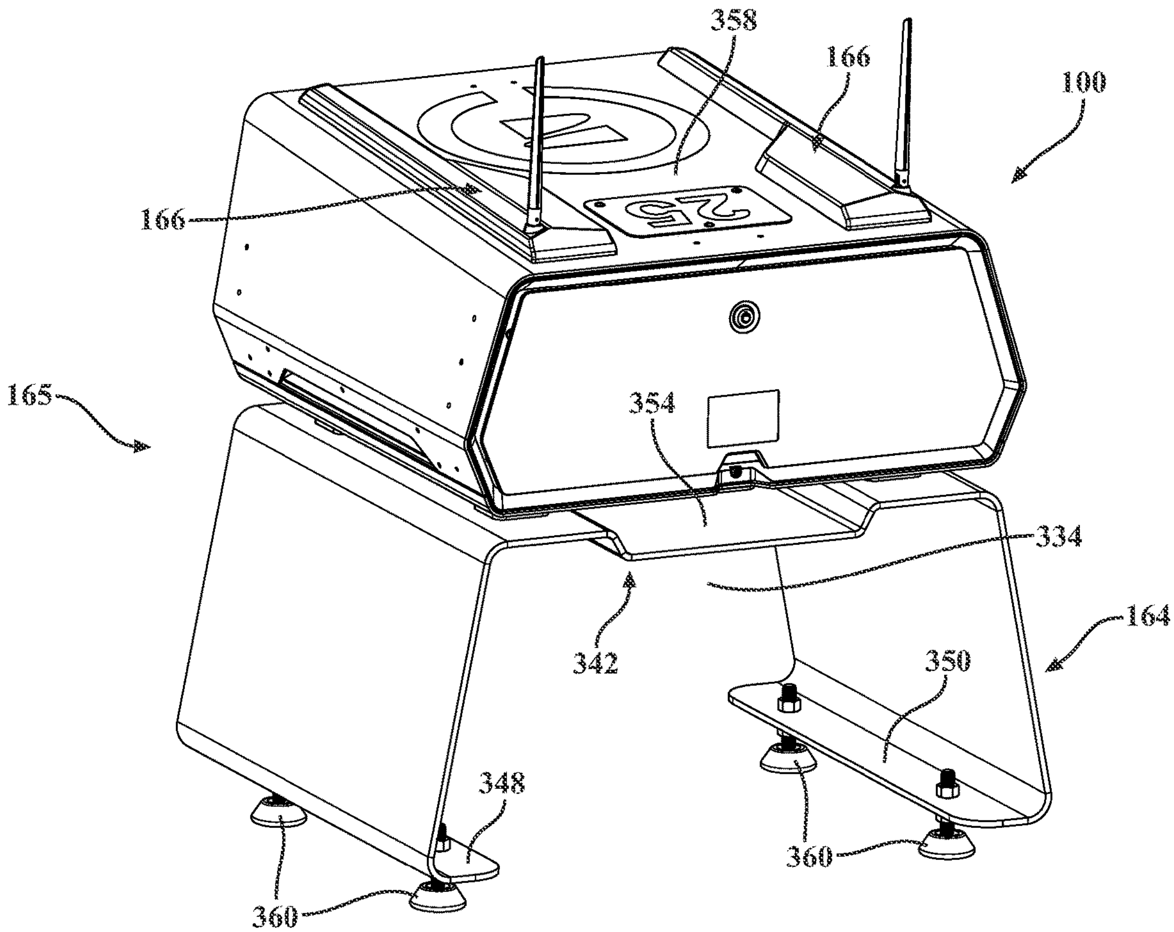
FIG. 55 is a side, perspective view of the base station and the pedestal seen in FIG. 54 with the base station shown in an elevated position.

With reference to FIGS. 54 and 55 as well, the pedestal 164 defines an interior space 334 having an inner contour 336 that is configured in correspondence with an outer contour 338 of the base station 100 (e.g., such that a vertical transverse cross-sectional configuration of the pedestal 164 approximates a vertical transverse cross-sectional configuration of the base station 100). The corresponding contours 336, 338 respectively defined by the interior space 334 and the base station 100 allows for positioning of the base station 100 within the pedestal 164 during nonuse (e.g., such that the base station 100 can be sorted within the interior space 334 to protect the base station 100 during transport, in inclement weather, etc.) such that the docking system 165 is reconfigurable between a nested (inactive) configuration (arrangement), as seen in FIG. 54, in which the base station 100 received by the pedestal 164, and a stacked (active) configuration (arrangement), as seen in FIG. 55, in which the base station 100 (and the UAV 10) are supported by the pedestal 164 in the elevated position. As seen in FIG. 54, the pedestal 164 is configured and dimensioned to create clearance with the base station 100 about an entire periphery 340 (e.g., an exterior envelope) of the base station 100), which inhibits (if not entirely prevents) contact between the pedestal 164 and the base station 100.

In the particular embodiment illustrated, the pedestal 164 is unitary (e.g., monolithic) in construction and is formed from a single piece of (rigid or semi-rigid) material, which may be either metallic (e.g., aluminum, sheet metal, steel, etc.) or non-metallic (e.g., plastic, polymeric carbon fiber, etc.). In alternate embodiments of the disclosure, however, it is envisioned that the pedestal 164 may include a series of individual components that are connected together in any suitable manner (e.g., via one or more mechanical fasteners, in an interference fit, etc.).

The pedestal 164 includes a trapezoidal (or generally trapezoidal) vertical cross-sectional configuration that defines: an upper wall 342 having a non-linear configuration; first and second side walls 344, 346, respectively, that extend vertically from the upper wall 342 and which each include a linear (or generally linear) configuration; and first and second base walls 348, 350 that extend laterally inward from the first and second side walls 344, 346, respectively, and which each include a linear (or generally linear) configuration.

The upper wall 342 includes: a first segment 352*i* that extends laterally inward from the first side wall 344; a second segment 352*ii* that extends laterally inward from the second side wall 346; a third segment 352*iii* that extends in parallel (or generally parallel) relation to the segments 352*i*, 352*ii*; a fourth segment 352*iv* that extends between the segments 352*i*, 352*iii*; and a fifth segment 352*v* that extends between the segments 352*ii*, 352*iii*. Whereas the segments 352*i*, 352*ii* are vertically aligned (e.g., such that the segments 352*i*, 352*ii* are positioned in the same (or substantially the same) vertical location), the segments 352*iii* is vertically offset from the segments 352*i*, 352*ii* (e.g., such that the segment 352*iii* is positioned in a different vertical location than the segments 352*i*, 352*ii*) so as to define a well 354. Inclusion of the well 354 increases the strength and/or rigidity of the upper wall 342 and creates (vertical) clearance with the base station 100 (e.g., the antenna(s) 166). Additionally, the well 354 is configured to receive a power cable 356 (FIG. 7) of the base station 100 so as to inhibit (if not entirely prevent) bending, kinking, and/or damage to the power cable 356.

In the particular embodiment illustrated, the segments 352*iv*, 352*v* subtend identical (or generally identical) obtuse angles ai, aii with the segments 352*i*, 352*ii*, respectively, whereby the well 354 extends into a space (gap) 358 defined between the antennas 166. It should be appreciated, however, that the particular configuration of the upper wall 342 and the arrangement of the segments 352 may be varied in alternate embodiments without departing from the scope of the present disclosure. For example, embodiments are envisioned in which the upper wall 342 may be configured such that the angles ai, aii are equal (or approximately equal) to 90°, as are embodiments in which the angles ai, aii may be unequal as well as embodiments in which the segment 352*iii* may be vertically aligned with the segments 352*i*, 352*ii* so as to eliminate the well 354 such that the upper wall 342 includes a linear (or generally linear) configuration.

To increase stability of the pedestal 164 (e.g., in windy conditions), the sidewalls 344, 346 are angled in relation to the upper wall 342 and the base walls 348, 350, respectively, whereby the base walls 348, 350 extend laterally outward of (beyond) the upper wall 342. More specifically, the sidewalls 344, 346 are configured so as to respectively define first and second (acute) angles Bi, Bii with first and second reference axes Ri, Rii, which are oriented in orthogonal (or generally orthogonal) relation to the base walls 348, 350.

To further increase stability (e.g., on uneven terrain), it is envisioned that the pedestal 164 may include a plurality of adjustable footings 360. The footings 360 are configured for removable connection to (engagement with) the base walls 348, 350 and are reconfigurable to level the pedestal 164 and, thus, the base station 100 (e.g., by shortening and lengthening the footings 360).

Takeoff, Landing, and Docking

With reference now to FIGS. 27-31B as well, the base station 100 includes a plurality of systems, components, and features that support takeoff of the UAV 10, landing of the UAV 10, and docking of the UAV 10 with the base station 100 after flight. For example, as described below, the base station 100 may include: one or more connection antennas 166; one or more fiducials 168 that are supported by the enclosure 102; an illumination system 170 that is supported by the enclosure 102; one or more status indicators 172 that are supported by the enclosure 102; and a visualization system 174 that is supported by the enclosure 102.

Connection Antennas

The base station 100 includes primary connection antenna(s) 166 that facilitate wireless communication between the base station 100 and the UAV 10, either directly or indirectly. For example, it is envisioned that that the primary connection antenna(s) 166 may be utilized to facilitate communication between the base station 100 and an intervening communication point, such as a hangar, a warehouse, etc. In such embodiments, the primary connection antenna(s) 166 on the base station 100 support direct communication with the hangar (or the like), which would communicate directly with the UAV 10.

Figure 27:
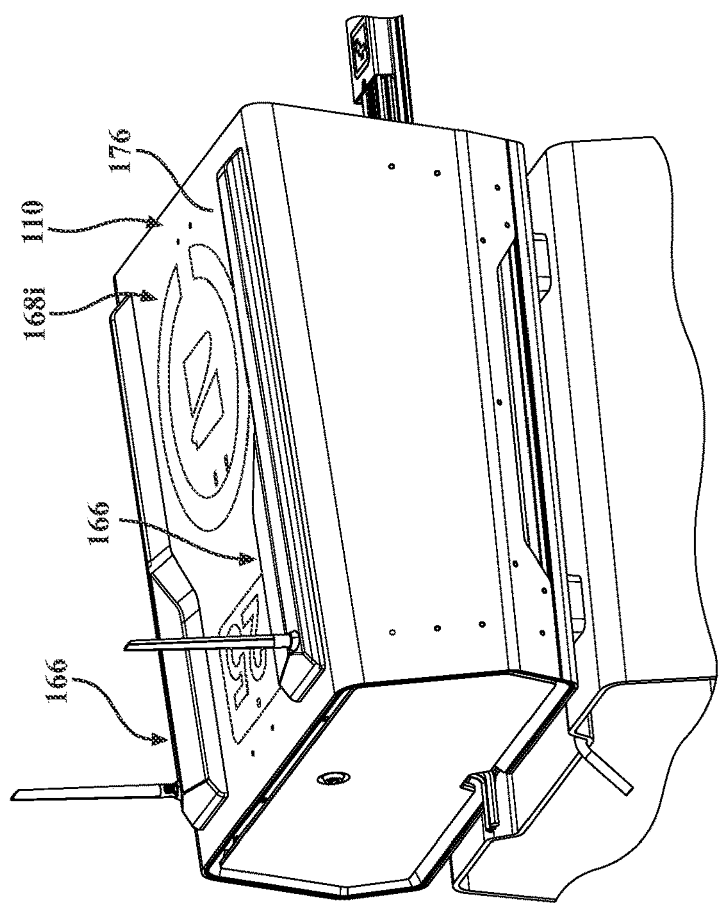
FIG. 27 is a partial, top, perspective view of the base station illustrating one or more connection antennas and one or more fiducials that are supported on a roof section thereof.

In the particular embodiment seen in FIG. 27, for example, the base station 100 includes a pair of primary connection antennas 166 that are connected (secured) to (or otherwise engaged with) a roof section 176 of the outer housing 110. It should be appreciated, however, that the particular number of primary connection antennas 166 and/or the location of the primary connection antennas 166 may be varied in alternate embodiments without departing from the scope of the present disclosure. For example, embodiments including a single primary connection antenna 166 are also envisioned herein, as are embodiments in which the base station 100 may include one or more primary connection antennas 166 that are located on sidewalls of the outer housing 110.

In certain embodiments of the disclosure, it is envisioned that the base station 100 may include one more secondary communication antennas that facilitate communication over cellular and/or WiFi networks and/or support GPS functionality. In such embodiments, it is envisioned that the primary connection antenna(s) 166 and the secondary communication antenna(s) may operate in tandem. For example, embodiments are envisioned in which the primary communication antenna(s) 166 may facilitate docking of the UAV 10 with the base station 100 (and communication therebetween) while the secondary communication antenna(s) may facilitate communication between the base station 100 and the hangar (or vice versa).

Fiducials

The fiducials 168 facilitate not only visual identification of the base station 100 by the UAV 10, but guidance of the UAV 10 during landing and docking with the base station 100. To promote or otherwise enhance visualization and/or recognition of the fiducials 168, it is envisioned that the outer housing 110 may include contrasting coloration.

Figure 28:
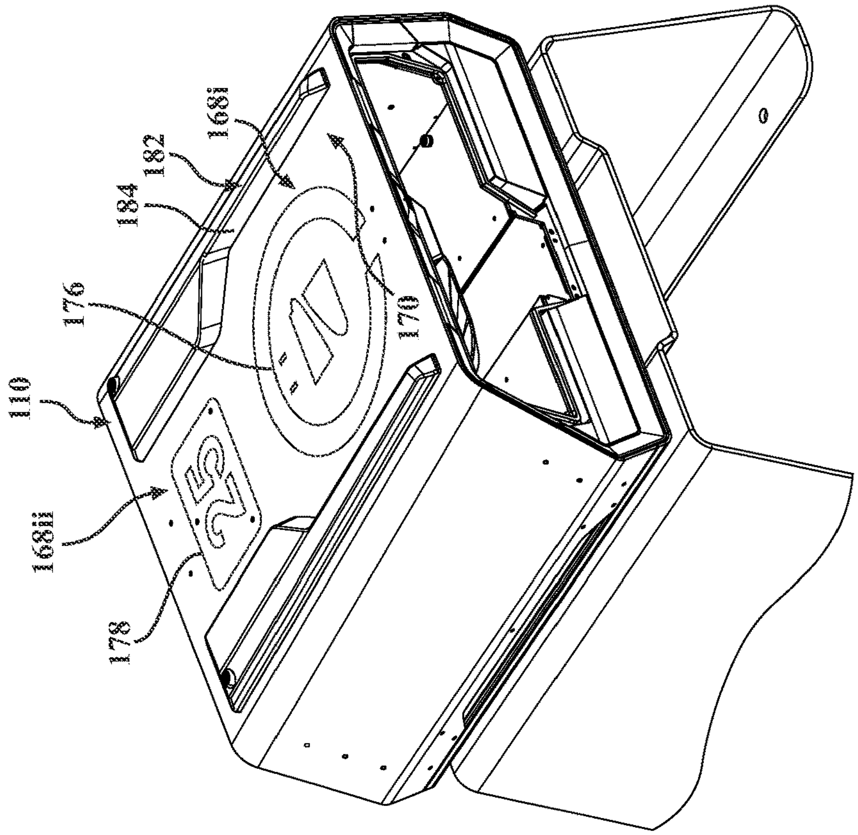
FIG. 28 is a partial, top, perspective view of the base station according to an embodiment of the disclosure that includes a plurality of fiducials on the roof section.

In the particular embodiment of the disclosure seen in FIGS. 13, 27, and 28, for example, the base station 100 includes (first and second) fiducials **168*i*, 168*ii* that are located on (supported by) the roof section 176 of the outer housing 110 (e.g., between the primary connection antennas 166) and a (third) fiducial 168*iii* that is associated with (e.g., located on or adjacent to) the cradle 106. It should be appreciated, however, that the particular number of fiducials 168** and/or the location(s) thereof, may be varied in alternate embodiments without departing from the scope of the present disclosure.

The fiducial **168*i* is initially recognized by the UAV 10 to guide the UAV 10 during approach. The fiducial 168*i* defines a (first) surface area, which is sufficiently large to allow for visual recognition by the UAV 10 from a desired distance. For example, in certain embodiments, it is envisioned that the (first) surface area defined by the fiducial 168*i* may lie substantially within the range of (approximately) 40 percent to (approximately) 80 percent of the surface area defined by the roof section 176. Surface areas for the fiducial 168*i* that lie outside the disclosed range, however, would not be beyond the scope of the present disclosure (e.g., to account for advancements in visualization technology utilized in the UAV 10**).

The fiducial **168*ii* is configured as an identification member 178 that is recognized by the UAV 10 during approach to the base station 100 (e.g., after recognition of the fiducial 168*i*), which allows the UAV 10 to distinguish amongst a plurality of base stations 100 to facilitate proper pairing (e.g., docking of the UAV 10 to a specific base station 100). In certain embodiments of the disclosure, it is envisioned that the fiducial 168*i* may be fixedly connected to the base station 100 (e.g., the roof section 176) and that the fiducial 168*ii* may be configured for removable connection to the base station 100 (e.g., the roof section 176). Removable connection of the fiducial 168*ii* allows for the uniform manufacture of a fleet of base stations 100 and the subsequent attachment of the fiducials 168*ii* thereto. Embodiments in which the fiducial 168*ii* may be integrally (e.g., monolithically) formed with the base station 100**, however, would not be beyond the present disclosure.

In the particular embodiment illustrated, the fiducial **168*ii* defines a (second) surface area, which is less than the (first) surface area defined by the fiducial 168*i*. For example, it is envisioned that the (second) surface area defined by the fiducial 168*ii* may lie substantially within the range of (approximately) 10 percent to (approximately) 50 percent of the (first) surface area defined by the fiducial 168*i*. Surface areas for the fiducial 168*ii* that lie outside the disclosed range, however, would not be beyond the scope of the present disclosure (e.g., to account for advancements in visualization technology utilized in the UAV 10**).

The fiducial **168*iii* is configured as an April tag 180 and is recognized by the UAV 10 after recognition of the fiducial 168*ii*. In the particular embodiment of the disclosure illustrated, the fiducial 168*iii* is located on the slide mechanism 150, which inhibits (if not entirely prevents) any interference with air flow across the cradle 106 during cooling and/or heating of the power source 14 of the UAV 10, which is discussed in further detail below. Embodiments in which the fiducial 168*iii* may be located on the cradle 106** itself, however, are also envisioned herein and would not be beyond the scope of the present disclosure.

Illumination System

The illumination system 170 is configured to improve visibility of the fiducials 168 during nighttime operation. In the particular embodiment of the disclosure illustrated, the illumination system 170 includes one or more light sources 182 (FIG. 28) (e.g., LEDs 184) that are secured (connected, mounted) to, or otherwise supported by, the roof section 176 of the outer housing 110 to support lighting (illumination) of the fiducials **168*i*, 168*ii*. It is envisioned that the illumination system 170 may be connected to any suitable power source, whether internal to the base station 100** (e.g., to the power supply controlled by the main board/processor) or external (e.g., to a separate power supply, battery, or the like).

In certain embodiments of the disclosure, it is envisioned that the illumination system 170 may be controlled by the main board/processor and configured to flash or strobe the light source(s) 182 according to a particular pattern, which can be recognized by the UAV 10 during approach to thereby identify the base station 100. In such embodiments, it is envisioned that the illumination system 170 may either supplement or replace the fiducial **168*ii* as a means of identifying the base station 100**.

Status Indicators

The status indicator(s) 172 (FIG. 29) identify the status of the base station 100 (e.g., that the base station 100 is ready, requires service, is undergoing the docking procedure with the UAV 10, etc.). Each status indicator 172 includes an (exterior) light source 173 (e.g., one or more LEDs 186) that is supported by an outer (exterior, external) surface **116*a* of the forward frame 116, which not only supports status indication, but illumination of the fiducial 168*iii* (FIG. 13) and/or the cradle 106 (e.g., to facilitate docking of the UAV 10). For example, in one particular embodiment, it is envisioned that one or more of the LEDs 186 may be configured to emit a colored light (e.g., red, blue, yellow, etc.) and that one or more of the LEDs 186 may be configured to emit a while light to illuminate the fiducial 168*iii* and/or the cradle 106**.

In the particular embodiment of the disclosure illustrated in FIG. 29, the status indicator(s) 172 are secured (connected, mounted) to, or otherwise supported by, the forward frame 116 of the outer housing 110. It should be appreciated, however, that the particular location of the status indicator(s) 172 may be varied in alternate embodiments without departing from the scope of the present disclosure. It is envisioned that the status indicator(s) 172 may be connected to any suitable power source, whether internal to the base station 100 (e.g., to the power supply controlled by the main board/processor) or external (e.g., to a separate power supply, battery, or the like).

UAV Storage

Figure 34A:
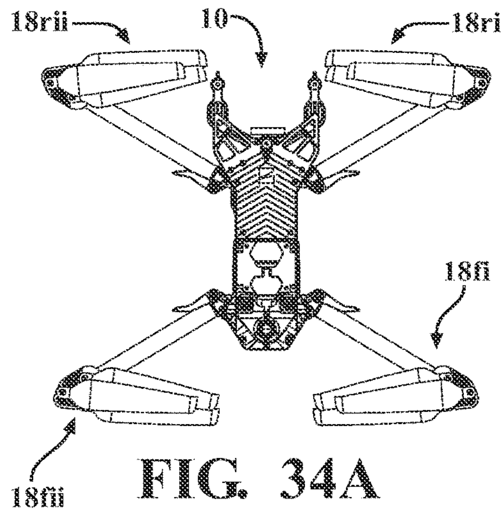
FIGS. 34A-34C are top, plan views of the UAV shown in the storage configuration with the propeller assemblies shown in a variety of orientations.
Figure 34B:
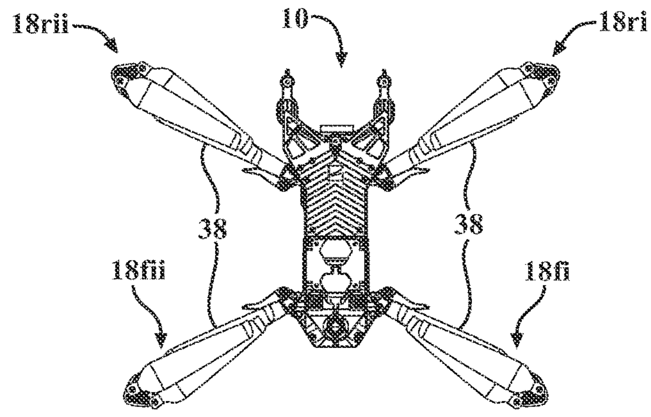
Figure 34C:
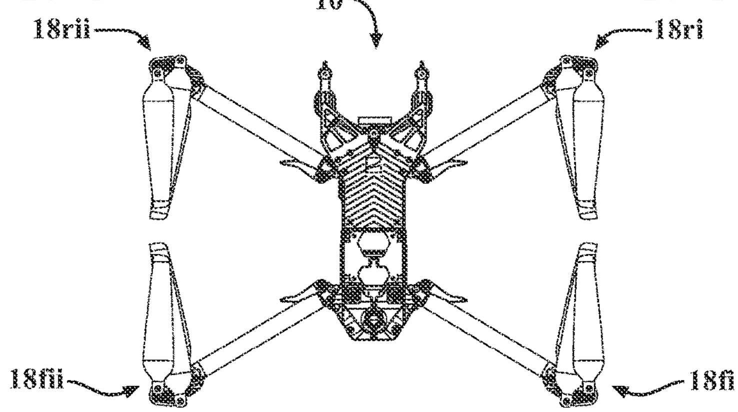
Figure 35:
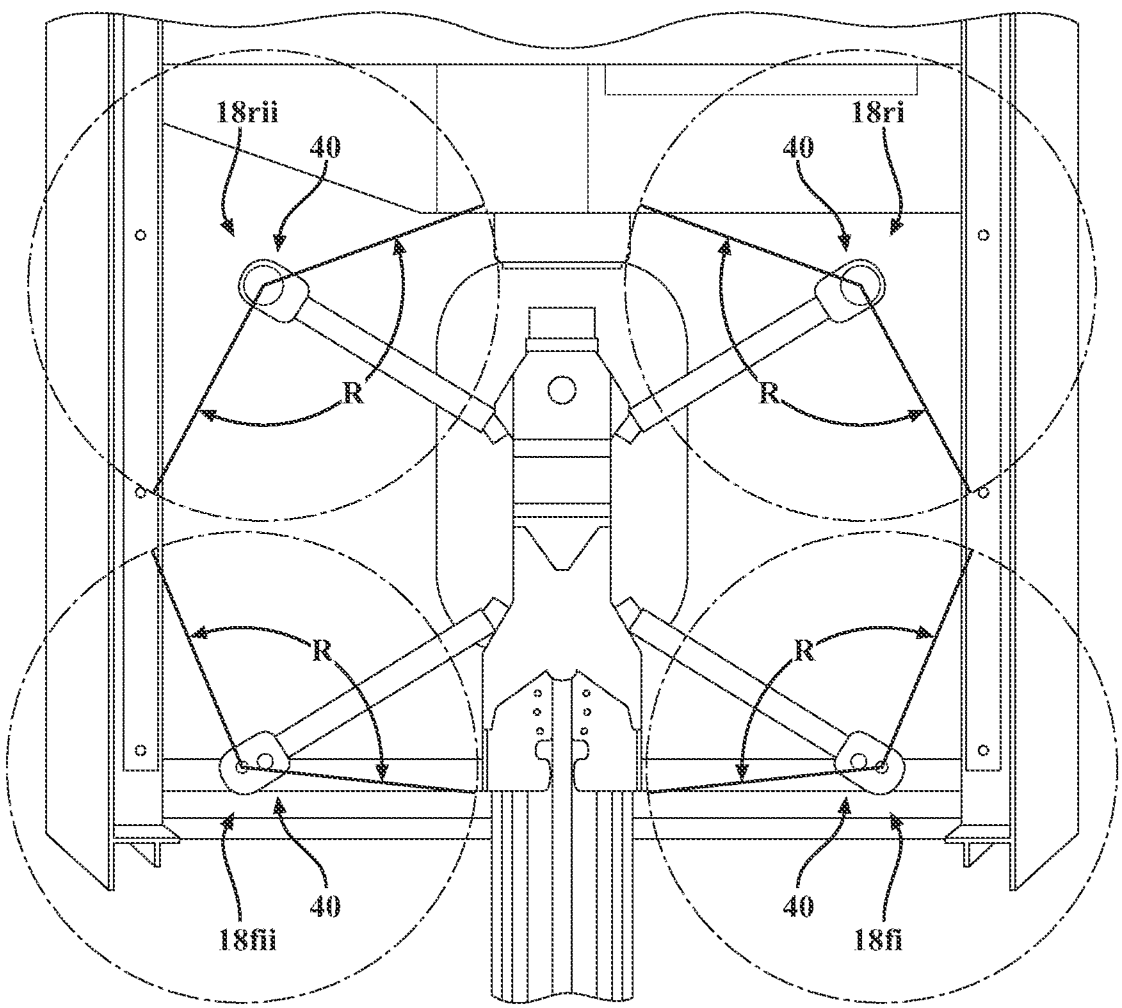
FIG. 35 is a partial, top, plan view of the UAV illustrating desired positional ranges for the propeller assemblies of the UAV in the storage configuration.

In certain embodiments of the disclosure, it is envisioned that the UAV 10 may be reconfigurable between a flight (unfolded) configuration (FIG. 32), in which the propeller assemblies 18 are in the extended configuration, and a storage (folded) configuration (FIGS. 33 and 34A-34C), in which each of the propeller assemblies 18 is in the collapsed configuration and oriented within the positional range identified by the reference character R in FIG. 35. Reconfiguration of the UAV 10 into the storage configuration not only allows for a reduction in the overall size of the base station 100, but inhibits (if not entirely prevents) undesirable contact between the propeller assemblies 18 and the enclosure 102 (FIG. 32) that may otherwise result in unseating of the UAV 10 from the cradle 106, interference with operation of the door 104, damage to the various internal components of the base station 100, etc.

To support movement from the flight configuration into the storage configuration, it is envisioned that the base station 100 may be configured for engagement with the propeller assemblies 18 (e.g., during retraction of the cradle 106). For example, it is envisioned that the base station 100 may include one or more engagement members that are configured to physically interface with (contact) the propeller assemblies 18 to fold the propeller assemblies 18 and move the propeller assemblies 18 into the collapsed configuration during retraction of the cradle 106 and movement of the UAV 10 into the enclosure 102, as described in further detail below. It is envisioned that the engagement member(s) may be integrated into (or defined by) one or more surface(s) of the enclosure 102 (e.g., the forward frame 116 of the outer housing 110). For example, the engagement member(s) may be configured as rollers, brushes, (spring-biased) stoppers, or the like.

In certain embodiments of the disclosure, it is envisioned that the engagement member(s) may be configured for passive interaction with the propeller assemblies 18, whereby the propeller assemblies 18 are brought into contact with the engagement member(s) by virtue of the retraction of the cradle 106. Alternatively, it is envisioned that the engagement member(s) may be configured for active engagement (interaction) with the propeller assemblies 18. For example, it is envisioned that the engagement member(s) may be repositionable (reconfigurable) between a first position (configuration), in which the engagement member(s) are positioned (configured) to avoid contact with the propeller assemblies 18 (e.g., such that the engagement member(s) are located outside the path followed by the propeller assemblies 18 during retraction of the cradle 106), and a second position (configuration), in which the engagement member(s) are positioned (configured) for contact with the propeller assemblies 18 (e.g., such that the engagement member(s) are located within the path followed by the propeller assemblies 18 during retraction of the cradle 106).

To allow for additional reductions in the overall size of the base station 100, it is envisioned that the base station 100 may include one or more contact members 188 that are configured for engagement (contact) with one or more antennas 34 on the UAV 10 to facilitate reconfiguration (repositioning, folding) thereof between an active (use, unfolded, deployed) configuration (FIG. 2), in which the antenna(s) 34 extend outwardly (away) from a body 36 of the UAV 10, which supports (is connected to) the power source 14, and a passive (storage, folded, undeployed) configuration, in which the antenna(s) 34 are positioned adjacent to (e.g., in contact (engagement) with the body 36 of the UAV 10). Reconfiguration of the antenna(s) 34 from the active configuration into the passive configuration creates clearance with the various internal components of the base station 100 to inhibit (if not entirely prevent) unintended contact between the UAV 10 and the base station 100 during movement of the cradle 106 (and the UAV 10) between the extended position (FIG. 13) and the retracted position (FIGS. 2, 10). In the particular embodiment of the UAV 10 illustrated throughout the figures, the antenna(s) 34 are biased towards the active configuration via one or more biasing members (e.g., springs or the like) such that the antenna(s) 34 are automatically reconfigured from the passive configuration into the active configuration as the UAV 10 exits the base station 100 (e.g., via movement of the cradle 106 from the retracted position (FIGS. 2, 10) into the extended position (FIG. 13)).

Figure 31A:
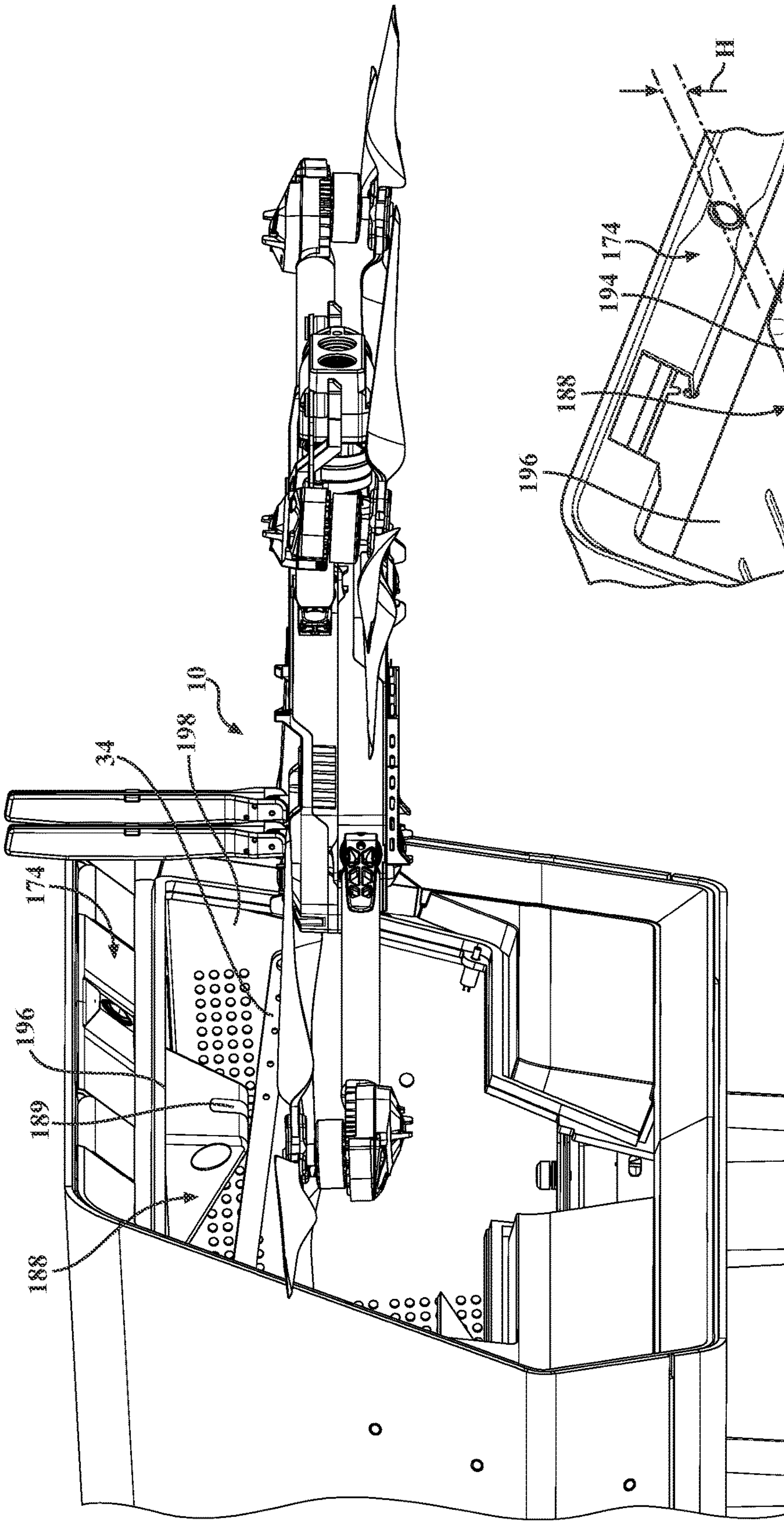
FIG. 31A is a partial, front, perspective view of the base station during movement of the cradle into the retracted position after docking of the UAV.
Figure 31B:
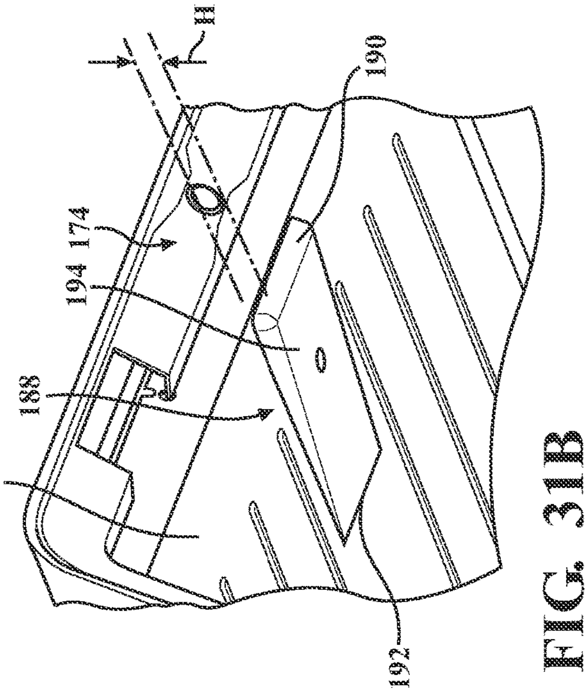
FIG. 31B is a partial, front, perspective view of the base station during movement of the cradle into the retracted position after docking of the UAV illustrating one embodiment of a contact member that is configured to facilitate reconfiguration (e.g., folding) of one or more antennas on the UAV.

In the embodiment illustrated in FIG. 31A, the contact member 188 defines a groove (channel) 189 that is configured to receive the antenna(s) 34 during retraction of the cradle 106 as the UAV 10 is withdrawn into the enclosure 102. FIG. 31B illustrates another embodiment of the contact member 188 that includes a leading (forward) edge 190 and a trailing (rear) edge 192 and defines a (vertical) height H that varies between the edges 190, 192 so as to defined an angled (chamfered, beveled, ramped) surface 194 that is configured for engagement (contact) with the antenna(s) 34 on the UAV 10. In the particular embodiment of the disclosure seen in FIG. 31B, each contact member 188 tapers such that the height H decreases from the leading edge 190 towards the trailing edge 192. Embodiments in which each contact member 188 may taper such that the height H increases from the leading edge 190 towards the trailing edge 192 are also envisioned herein and would not be beyond the scope of the present disclosure (e.g., depending upon the particular configuration and/or location of the antenna(s) 34 on the UAV 10, spatial constraints of the enclosure 102, etc.).

In the embodiments illustrated in FIGS. 31A and 31B, the base station 100 includes a single contact member 188 that is secured (connected) to (or otherwise engaged with) an inner (e.g., upper) surface 196 of the inner housing 108. It should be appreciated, however, that the particular number of contact members 188 and/or the location of the contact member(s) 188 may be varied in alternate embodiments without departing from the scope of the present disclosure (e.g., depending upon the number of antennas 34 on the UAV 10 and/or the location thereof). For example, embodiments including multiple contact members 188 are also envisioned herein, as are embodiments in which the base station 100 may include one or more contact members 188 that are located on sidewalls 198 of the inner housing 108.

It is envisioned that the contact member(s) 188 may be secured (connected) to the inner housing 108 in any suitable manner. For example, it is envisioned that the contact member(s) 188 may be integrally (e.g., monolithically) formed with the inner housing 108 or that the contact member(s) 188 and the inner housing 108 may be formed as separate, discrete structures, which may be secured (connected) together via one or more mechanical fasteners, an adhesive, etc.

Folding of the Propeller Assemblies

In certain embodiments of the disclosure, as indicated above, it is envisioned that the base station 100 may include one or more engagement members, which are identified by the reference character 316 (FIGS. 34D, 36-40), that are configured to facilitate movement of the propeller assemblies 18 into the collapsed configuration during retraction of the cradle 106 and the UAV 10 into the enclosure 102. The engagement members 316 each include a mounting bracket 318 and a bumper 320 that is supported by (secured, connected to) the mounting bracket 318 such that the bumpers 320 contact (engage) the propeller assemblies 18 during retraction of the UAV into the enclosure 102, which results in repeated, consistent positioning of the propeller assemblies 18 within the positional ranges R (FIG. 35), as described in further detail below.

In the particular embodiment of the disclosure illustrated, the base station 100 includes first and second engagement members 316*i*, 316*ii* that are (non-movably) supported by the actuators 118*i*, 118*ii*, respectively, such that the engagement members 316*i*, 316*ii* are spaced laterally from each other along the width W of the enclosure 102. More specifically, the engagement members 316*i*, 316*ii* are fixedly connected to outer (lateral) faces 322 of the linkage assemblies 122 and are positioned outside (laterally outward of) the hubs 40 of the propeller assemblies 18 (e.g., in line with the propeller arms 38), which allows the UAV 10 to pass between the engagement members 316*i*, 316*ii* during retraction of the cradle 106 into the enclosure 102. It should be appreciated, however, that the particular location of the engagement members 316 may be altered in various embodiments without departing from the scope of the present disclosure (e.g., depending upon the particular configuration of the UAV 10, the desired positions of the propeller assemblies 18 in the collapsed configuration, etc.). For example, the present disclosure envisions an embodiment in which the engagement members 316 may be (non-movably) supported by (e.g., secured, connected to) the door 104, as described in further detail below.

The mounting brackets 318 may be connected to the actuators 118 (e.g., the linkage assemblies 122) in any suitable manner. For example, in the particular embodiment seen in FIGS. 36-38, the mounting brackets 318 are configured for (releasable) connection to the actuators 118 via one or more mechanical fasteners 324 (e.g., screws, pins, bolts, clips, etc.), which simplifies assembly and disassembly and facilitates repair, replacement, etc. Alternatively, however, it is envisioned that that the mounting brackets 318 and the actuators 118 may be configured for connection in a press-fit (interference fit) arrangement, or that the mounting brackets 318 and the actuators 118 may be fixedly (non-removably) connected. For example, in certain embodiments, it is envisioned that the mounting brackets 318 and the actuators 118 may be integrally (e.g., monolithically) formed.

Mounting of the engagement members 316 to the actuators 118 allows the vertical positions thereof to be adjusted with opening and closure of the door 104 so as to facilitate proper contact with the propeller assemblies 18, as described in further detail below, while inhibiting (if not entirely preventing) interference with operation of the door 104 and unintended contact between the engagement members 316 and the various internal components of the base station 100. Additionally, with reference to FIGS. 39 and 40, mounting the engagement members 316 to the actuators 118 allows for a reduction in the angular range of motion (path) A1 followed by the actuators 118 and, thus, the engagement members 316, during opening and closure of the door 104 when compared to the angular range of motion (path) A2 followed by the door 104 itself. The reduced angular path A1 allows the vertical positions of the engagement members 316 to be adjusted with less angular variation and allows for a reduction in a height (length) HE (FIG. 38) of the engagement members 316, which further reduces any likelihood of unintended contact between the engagement members 316 and the various internal components of the base station 100, the enclosure 102 (e.g., the forward frame 116 (FIG. 36)), etc.

Figure 36:
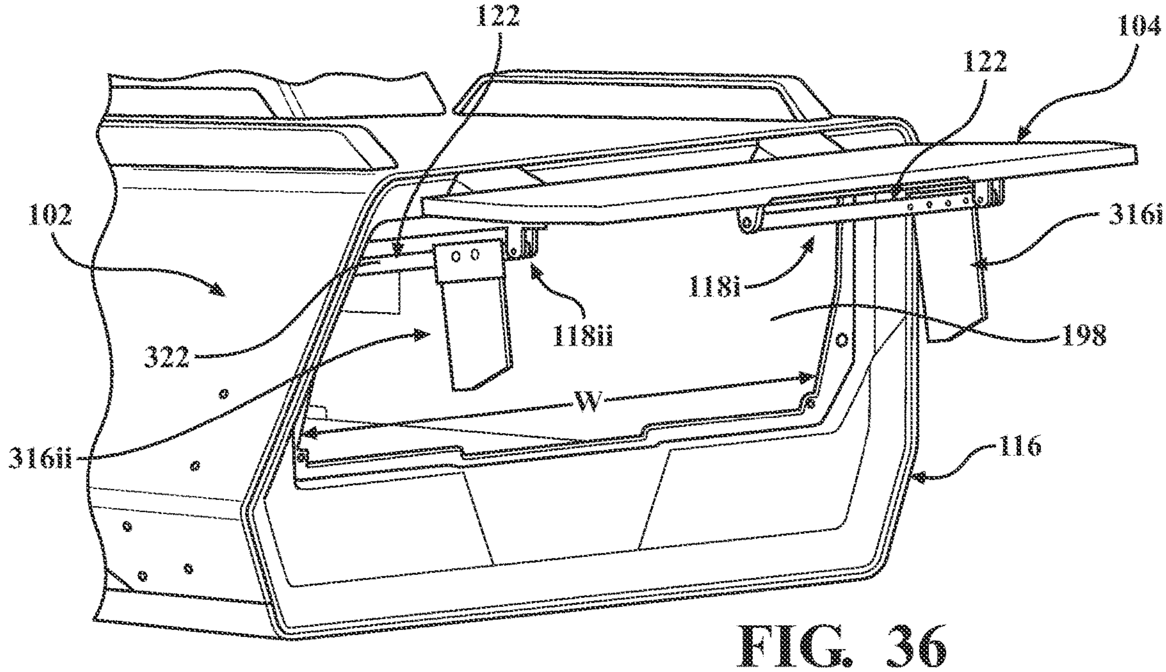
FIG. 36 is a partial, end view of the base station shown with the door shown in an open position according to one embodiment of the disclosure, which includes engagement members (e.g., bumpers) that are supported by the actuators and configured to for contact with the propeller assemblies to facilitate reconfiguration of the UAV into the storage configuration.
Figure 37:
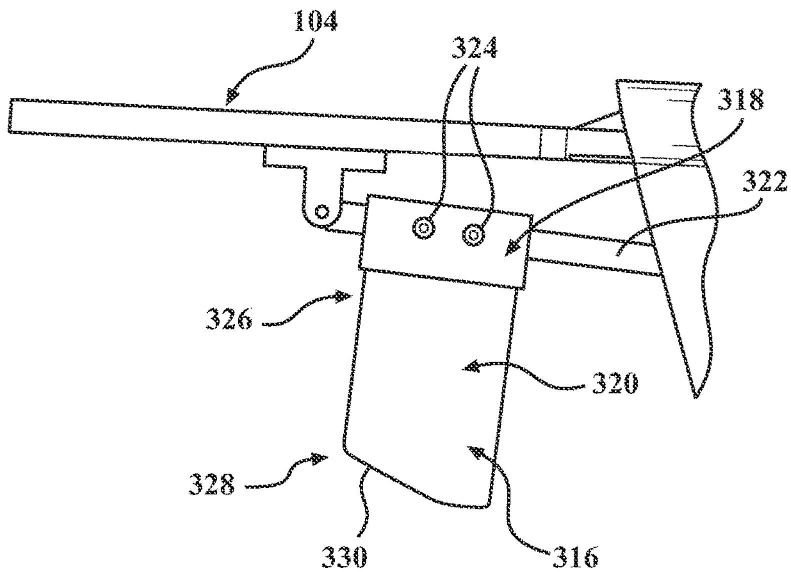
FIG. 37 is a partial, side, plan view of the base station and one of the engagement members.
Figure 38:
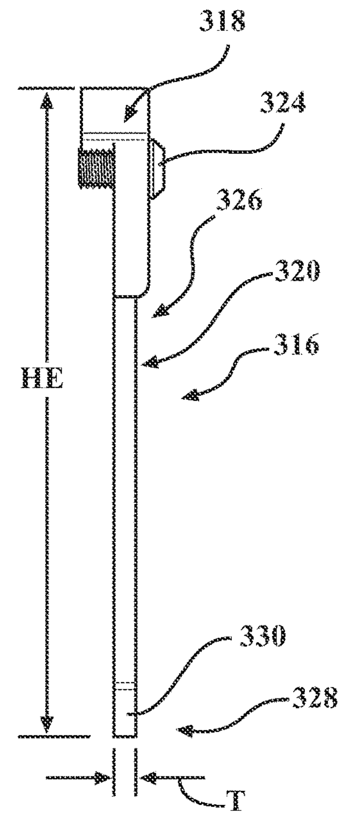
FIG. 38 is an end view of one of the engagement members shown separated from the base station.
Figure 39:
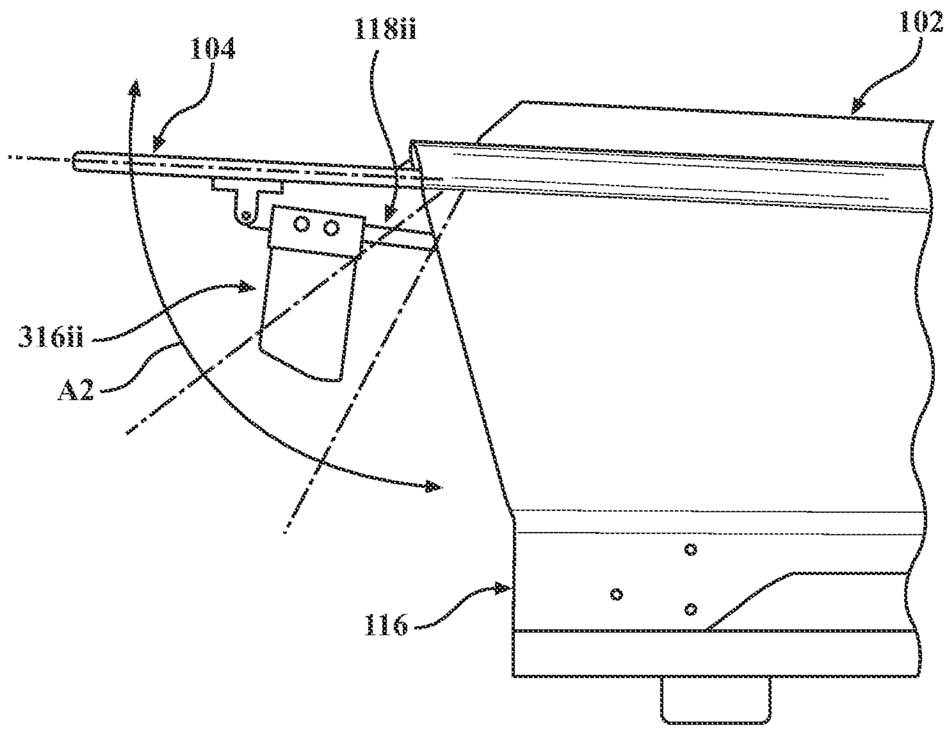
FIG. 39 is a partial, side, plan view of the base station illustrating an (angular) range of motion for the door.
Figure 40:
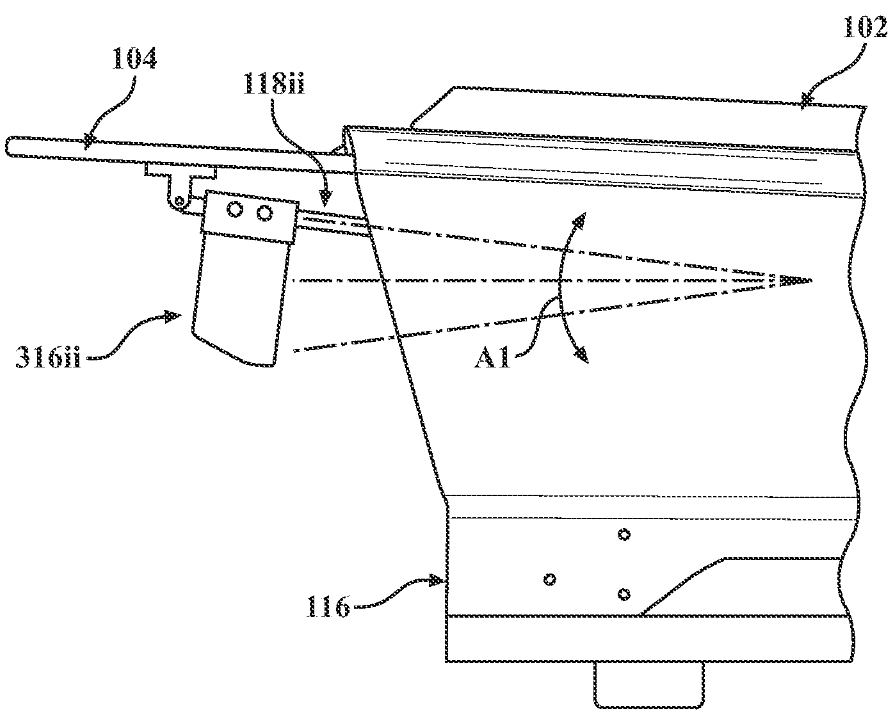
FIG. 40 is a partial, side, plan view of the base station illustrating an (angular) range of motion for the actuators and the engagement members.
Figure 41:
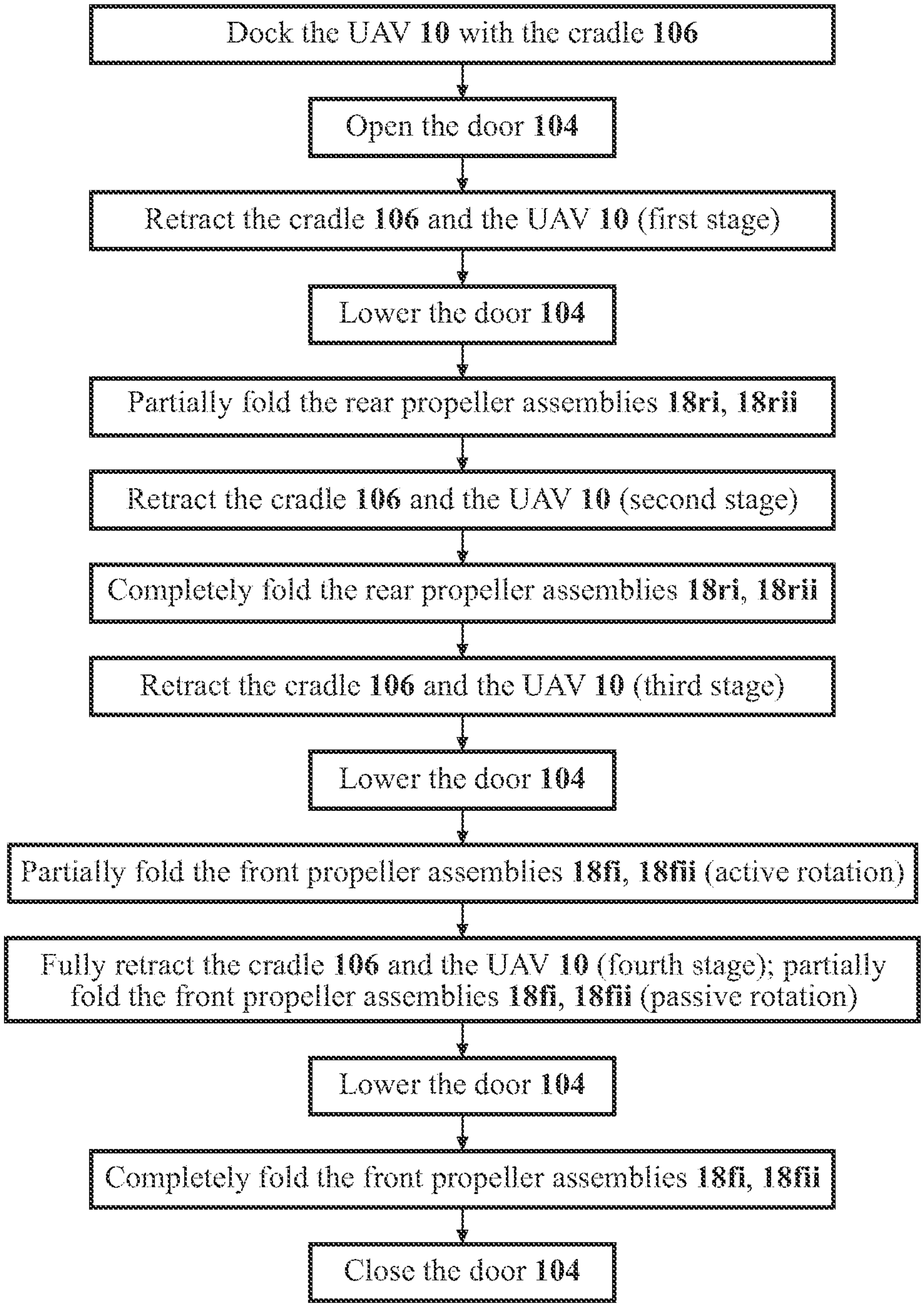
FIG. 41 illustrates a method of reconfiguring (e.g., folding) the propeller assemblies of the UAV.
Figure 42:
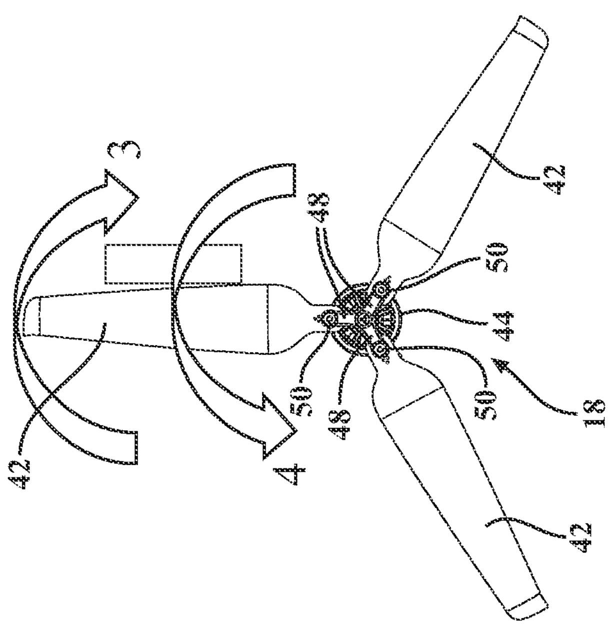
FIG. 42 is a top, plan view of one of the propeller assemblies illustrating contact with one of the engagement members.

In the particular embodiment of the disclosure seen in FIGS. 36-38, the bumpers 320 include (e.g., are formed partially or entirely from) one or more compliant (flexible) materials, the stiffness of which may be altered by varying one or more parameters of the bumpers 320. For example, the stiffness of the bumpers 320 may be altered by varying the height HE (FIG. 38), a (lateral) thickness T of the bumpers 320, the configuration (e.g., the shape, profile) of the bumpers 320, the durometer of the material(s) selected, etc. The use of compliant material(s) facilitates folding of the propeller assemblies 18 while allowing for resilient deflection (e.g., bending) of the bumpers 320, which inhibits (if not entirely prevents) spearing of the bumpers 320 by the propeller blades 42 and unseating of the UAV 10 from the cradle 106 that might otherwise occur. The use of compliant material(s) also allows the bumpers 320 to return to their normal (undeflected) positions upon sufficient retraction of the UAV 10 to facilitate subsequent contact with the propeller assemblies 18.

While the bumpers 320 are illustrated as including a rubberized, weather-resistant, and abrasion-resistant material in the particular embodiment of the disclosure seen in FIGS. 36-38, it is envisioned that the bumpers 320 may include any material(s) that support the operation and functionality described herein.

The bumpers 320 include a first (upper) end portion 326 that extends from (is connected to) the corresponding mounting bracket 318 and a second (lower) end portion 328. In the particular embodiment seen in FIGS. 36-38, the second end portion 328 defines an angled (chamfered, beveled, ramped) surface 330. It is envisioned that the angled surface 330 may guide the bumpers 320 over the propeller assemblies 18 during retraction of the UAV 10 (e.g., to reduce the force applied to the UAV 10 by the engagement members 316). Embodiments devoid of the angled surface 330, however, are also envisioned herein and would not be beyond the scope of the present disclosure With reference now to FIGS. 2, 32, and 35-41, upon docking of the UAV 10 with the base station 100, the door 104 is moved from the closed position (FIG. 1) into the open position (FIGS. 1, 36), and the cradle 106 begins to retract into the UAV 10 (e.g., during a first stage of retraction), which brings the rear propeller assemblies 18*ri*, 18*rii* into alignment (or general alignment) with the engagement members 316. With the cradle 106 in a first partially retracted position, the door 104 is lowered (e.g., moved into a first partially closed position) and the rear propeller assemblies 18*ri*, 18*rii* are actively rotated (e.g., via actuation of the corresponding motors 44 (FIG. 2)). Lowering of the door 104 facilitates contact (engagement) with the antenna(s) 34 (FIG. 2) and reconfiguration thereof between the active configuration and the passive configuration as well as adjustment in the vertical positions of the engagement members 316 (FIGS. 39, 40), and active rotation of the rear propeller assemblies 18*ri*, 18*rii* causes the propeller blades 42 to contact (engage) the engagement members 316 (throughout the following discussion, rotation of the propeller assemblies 18 is described from a point-of-view located vertically above the UAV 10). More specifically, the rear propeller assembly 18*ri* is rotated in a first direction (e.g., clockwise) and the rear propeller assembly 18*rii* is rotated in a second, opposite direction (e.g., counterclockwise). Upon contact with the engagement members 316, continued rotation of the rear propeller assemblies 18*ri*, 18*rii* causes the propeller blades 42 to pivot about the pivot members 50 (FIG. 32), which results in partial folding of the rear propeller assemblies 18*ri*, 18*rii* and movement of the rear propeller assemblies 18*ri*, 18*rii* from the extended configuration towards the collapsed configuration.

Following partial folding of the rear propeller assemblies 18*ri*, 18*rii*, retraction of the cradle 106 continues (e.g., during a second stage of retraction), which moves the cradle 106 into a second partially retracted position and reconfigures (folds) the antenna(s) 34 from the active configuration into the passive configuration (e.g., via contact (engagement) with the door 104). The rear propeller assemblies 18*ri*, 18*rii* are then actively rotated (e.g., via actuation of the corresponding motors 44) such that the propeller blades 42 are again brought into contact (engagement) with the engagement members 316. More specifically, the rear propeller assembly 18*ri* is rotated in the second direction (e.g., counterclockwise) and the rear propeller assembly 18*rii* is rotated in the first direction (e.g., clockwise), which completes folding of the rear propeller assemblies 18*ri*, 18*rii* such that rear propeller assemblies 18*ri*, 18*rii* are oriented within the desired positional ranges R (FIG. 35). Folding of the rear propeller assemblies 18*ri*, 18*rii* is thus performed in two stages (e.g., a first stage, in which the rear propeller assemblies 18*ri*, 18*rii* are partially folded, and a second stage, in which the rear propeller assemblies 18*ri*, 18*rii* are completely folded).

In certain embodiments of the disclosure, it is envisioned that the rear propeller assemblies 18*ri*, 18*rii* may be oriented forwardly (e.g., towards the front propeller assemblies 18*fi*, 18*fii* and the door 104) upon complete folding, as seen in FIG. 34C (for example).

Following complete folding of the rear propeller assemblies 18*ri*, 18*rii*, retraction of the cradle 106 continues (e.g., during a third stage of retraction) as the cradle 106 moves into a third partially retracted position, and the door 104 is lowered (e.g., into a second partially closed position). Retraction of the cradle 106 brings the front propeller assemblies 18*fi*, 18*fii* into alignment (or general alignment) with the engagement members 316, and lowering of the door 104 adjusts the vertical positions of the engagement members 316 (FIGS. 39, 40) to facilitate contact (engagement) with the front propeller assemblies 18*fi*, 18*fii*, which accommodates (compensates for) the difference in the vertical locations (heights) between the rear propeller assemblies 18*ri*, 18*rii* and the front propeller assemblies 18*fi*, 18*fii*.

The front propeller assemblies 18*fi*, 18*fii* are then actively rotated (e.g., via actuation of the corresponding motors 44) such that the propeller blades 42 are brought into contact (engagement) with the engagement members 316. More specifically, the front propeller assembly 18*fi* is rotated in the second direction and the front propeller assembly 18*fii* is rotated in the first direction. Upon contact with the engagement members 316, continued rotation of the front propeller assemblies 18*fi*, 18*fii* causes the propeller blades 42 to pivot about the pivot members 50 (FIG. 32), which results in partial folding of the front propeller assemblies 18*fi*, 18*fii* and movement of the front propeller assemblies 18*fi*, 18*fii* from the extended configuration towards the collapsed configuration.

Figure 34D:
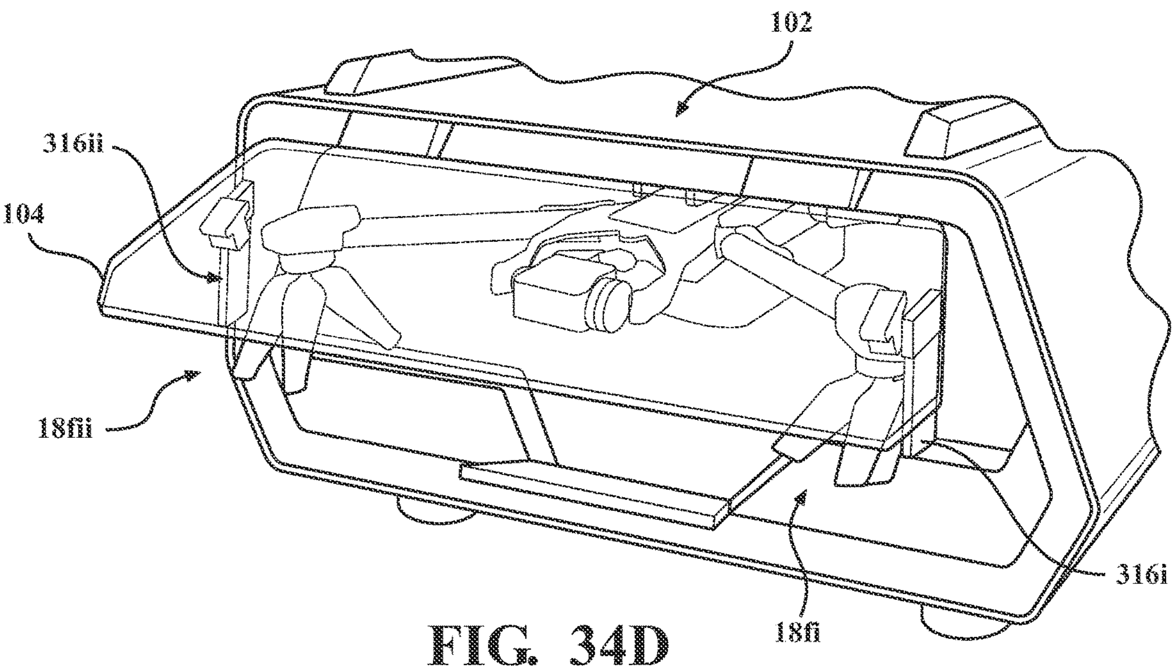
FIG. 34D is a partial, front, perspective view of the base station and the UAV during retraction of the UAV into the base station according to one embodiment of the disclosure.

Thereafter, retraction of the cradle 106 continues (e.g., during a fourth stage of retraction) until the cradle 106 is moved into the fully retracted position. As the cradle 106 is moved into the fully retracted position, the cap 156 (FIGS. 1, 8, 11, 12) moves into the closed position so as to engage the bezel portion 154, and the front propeller assemblies 18*fi*, 18*fii* are subjected to additional, passive rotation, during which, the corresponding motors 44 are inactive. More specifically, retraction of the cradle 106 causes the front propeller assembly 18*fi* to rotate in the first direction via contact with the engagement members 316*i* and the front propeller assembly 18*fii* to rotate in the second direction via contact with the engagement member 316*ii*, which results in forward orientation of the front propeller assemblies 18*fi*, 18*fii* (e.g., such that the front propeller assemblies 18*fi*, 18*fii* are oriented away from the rear propeller assemblies 18*ri*, 18*rii* and towards the door 104), as seen in FIG. 34D.

The door 104 is then lowered further (e.g., into a third partially closed position) and the orientation of the front propeller assemblies 18*fi*, 18*fii* is altered so as to inhibit (if not entirely prevent) contact between the front propeller assemblies 18*fi*, 18*fii* and the door 104 during (final) closure. More specifically, the orientation of the front propeller assemblies 18*fi*, 18*fii* is reversed such that the front propeller assemblies 18*fi*, 18*fii* are oriented rearwardly (e.g., towards the rear propeller assemblies 18*ri*, 18*rii* and away from the door 104), as seen in FIG. 34C (for example), which completes folding of the front propeller assemblies 18*fi*, 18*fii* such that the front propeller assemblies 18*fi*, 18*fii* are oriented within the desired positional ranges R (FIG. 35). To reverse the orientation of the front propeller assemblies 18*fi*, 18*fii*, in the particular embodiment illustrated, the front propeller assemblies 18*fi*, 18*fii* are actively rotated (e.g., via actuation of the corresponding motors 44) in the first and second directions, respectively. Folding of the front propeller assemblies 18*fi*, 18*fii* is, thus, performed in three stages (e.g., a first stage, in which the front propeller assemblies 18*fi*, 18*fii* are partially folded via active rotation, a second stage, in which the front propeller assemblies 18*fi*, 18*fii* are partially folded via passive rotation, and a third stage, in which the orientations of the front propeller assemblies 18*fi*, 18*fii* are reversed).

Following complete retraction of the cradle 106 and the UAV 10 into the enclosure 102, the door 104 is lowered into the (fully) closed position.

In certain embodiments of the disclosure, it is envisioned that the propeller assemblies 18 may undergo a final stage rotation (e.g., a third stage of rotation for the rear propeller assemblies 18*ri*, 18*rii* and a fourth stage of rotation for the front propeller assemblies 18*fi*, 18*fii*). In the final stage of rotation, the orientations of the propeller assemblies 18 are altered in order to avoid contact with the various internal components of the docking station 100 (e.g., during subsequent extension of the cradle 106 and the UAV 10). It is envisioned that particular orientations of the propeller assemblies 18 achieved during the final stage of rotation may be varied depending upon the particular locations and/or configurations of the various internal components of the docking station 100. For example, embodiments are envisioned in which the front propeller assemblies 18*fi*, 18*fii* and the rear propeller assemblies 18*ri*, 18*rii* may be oriented in the same direction, as are embodiments in which the front propeller assemblies 18*fi*, 18*fii* and the rear propeller assemblies 18*ri*, 18*rii* may be oriented in different directions and embodiments in which each of the propeller assemblies 18*fi*, 18*fii*, 18*ri*, 18*rii* may be oriented differently. The present disclosure also contemplates embodiments in which the final stage rotation may only be performed on certain propeller assemblies 18. For example, it is envisioned that the final stage of rotation may only be performed on the front propeller assemblies 18*fi*, 18*fii*, the rear propeller assemblies 18*ri*, 18*rii*, the front propeller assembly 18*fi* and the rear propeller assembly 18*rii*, etc.

During the aforedescribed sequence, educated (informed) positioning of the door 104 (e.g., the ability of the docking station 100 to control and vary the position (height) of the door 104 and, thus, the engagement members 316) reduces any likelihood of unintended contact between the engagement members 316 and the UAV 10. More specifically, allowing the engagement members 316 to remain in an elevated vertical position during retraction of the cradle 106 reduces any likelihood of spearing of the engagement members 316 by the propeller assemblies 18 and unseating of the UAV 10 from the cradle 106 that may otherwise occur. Educated positioning of the door 104 also allows for adjustments in the flexibility of the engagement members 316. More specifically, lowering the vertical positions of the engagement members 316 and reducing spacing with the propeller assemblies 18 effectively increases the stiffness of the engagement members 316, which facilitates and supports reconfiguration of the propeller assemblies 18 in the manner discussed above.

Figure 43:
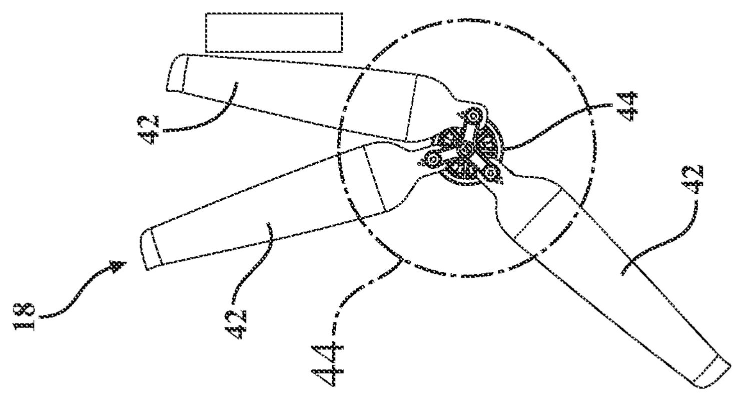
FIG. 43 is a top, plan view of the propeller assembly and the engagement member seen in FIG. 42 during folding of the propeller assembly.
Figure 44:
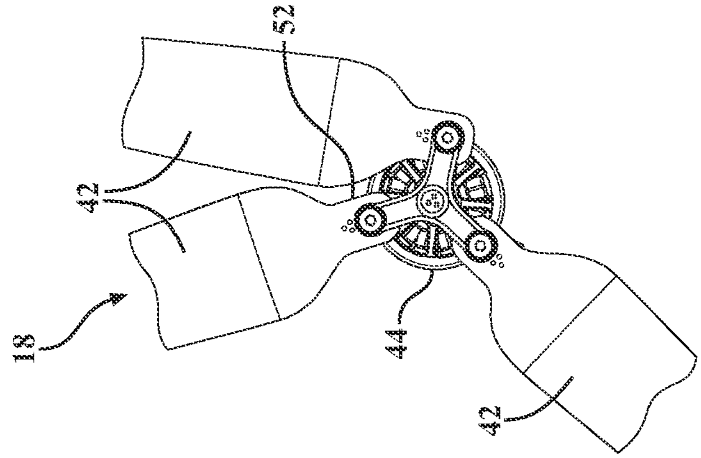
FIG. 44 is an enlargement of the area of detail identified in FIG. 43.

Additionally, the bidirectional rotation of the propeller assemblies 18 discussed in connection with the aforedescribed sequence (e.g., rotation of the propeller assemblies 18 in the first and second directions) is dictated by the specific configuration of the propeller assemblies 18 included in the particular embodiment of the UAV 10 illustrated. For example, with reference to FIGS. 42-44, the propeller assemblies 18 included on the UAV 10 define hard stops 52, which are configured for contact with an adjacent propeller blade 42 to limit continued rotation thereof. The bidirectional rotation of the propeller assemblies 18 discussed above accounts for (accommodates) the hard stops 52, however, and allows for reconfiguration of the propeller assemblies 18 in the aforedescribed manner. More specifically, rotation of the propeller assemblies 18 in the first direction (e.g., clockwise), which is identified by the arrow 3 (FIG. 42), causes engagement (contact) between the propeller blades 42 and the corresponding hard stops 52, as seen in FIGS. 43 and 44, which results in partial folding of the propeller assemblies 18. Thereafter, the propeller assemblies 18 are rotated in the opposite, second direction (e.g., counterclockwise), which is identified by the arrow 4, to complete folding of the propeller assemblies 18. Embodiments of the UAV 10 are also envisioned, however, in which the propeller assemblies 18 (e.g., the propeller blades 42 and/or the hard stops 52) may be reconfigured (altered) so as to allow for unidirectional rotation during reconfiguration from the extended configuration into the collapsed configuration and would not be beyond the scope of the present disclosure.

During reconfiguration of the propeller assemblies 18, active rotation of the propeller assemblies 18 can be precisely controlled by varying the speed, the duration, and the direction of rotation (e.g., via embedded programming in the UAV 10 and/or the docking station 100). Additionally, feedback from the motors 44 (FIGS. 2, 42-44) can be utilized to detect contact between the propeller blades 42 and the hard stops 52. For example, upon contact between a propeller blade 42 and the corresponding hard stop 52, a current spike may be detected in the motor 44. In such embodiments, upon exceeding a threshold current, the motor 44 may be caused to rotate the propeller assembly 18 in the opposite direction or to halt rotation altogether.

In an alternate embodiment of the disclosure, during a different sequence, it is envisioned that the motors 44 remain inactive and that folding of the propeller assemblies 18 may be accomplished solely via contact (engagement) with the engagement members 316. In such embodiments, the engagement members 316 (e.g., the bumper 320) act as guides that inhibit (if not entirely prevent) unintended contact between the propeller assemblies 18 and the enclosure 102 (e.g., spearing of the enclosure 102 by the propeller assemblies 18) during retraction of the cradle 106. More specifically, the engagement members 316 deflect the propeller blades 42 inwardly so as to inhibit (if not entirely prevent) contact with the forward frame 116 (FIG. 36) (e.g., adjacent to the door 104), which allows for folding of the propeller assemblies 18 during retraction of the cradle 106 via contact with the sidewalls 198 (FIGS. 31A, 36) of the inner housing 108. In order to facilitate folding of the propeller assemblies 18, it is envisioned that the visualization system 174 (FIG. 31B) may be utilized to verify that the propeller assemblies 18 are positioned properly (e.g., that the propeller blades 42 have been successfully deflected so as to avoid contact with the forward frame 116) prior to continued retraction of the cradle 106.

Figure 45:
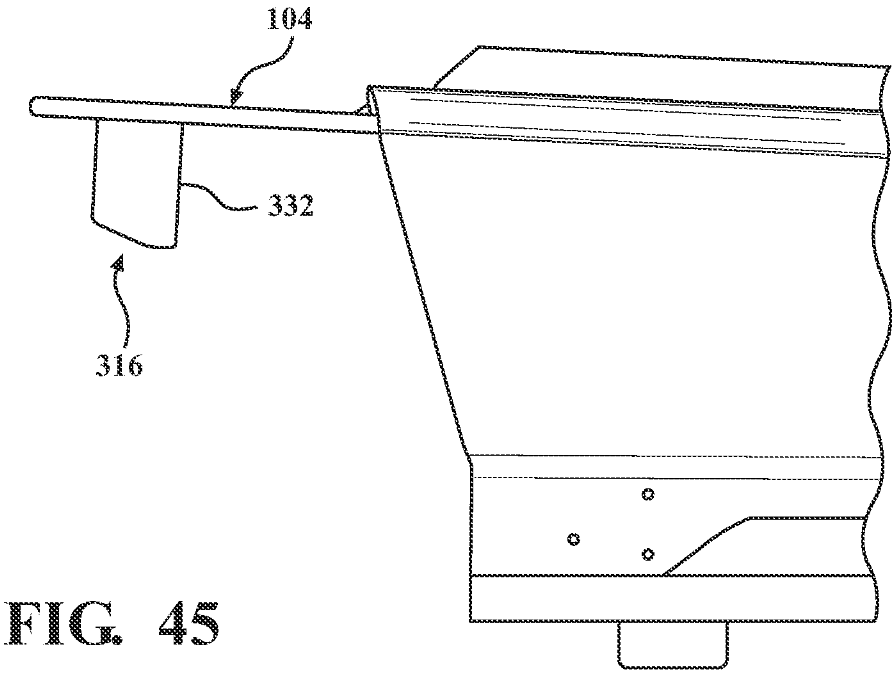
FIG. 45 is side, plan view of an alternate embodiment of the base station, in which the engagement members are supported by the door.
Figure 46:
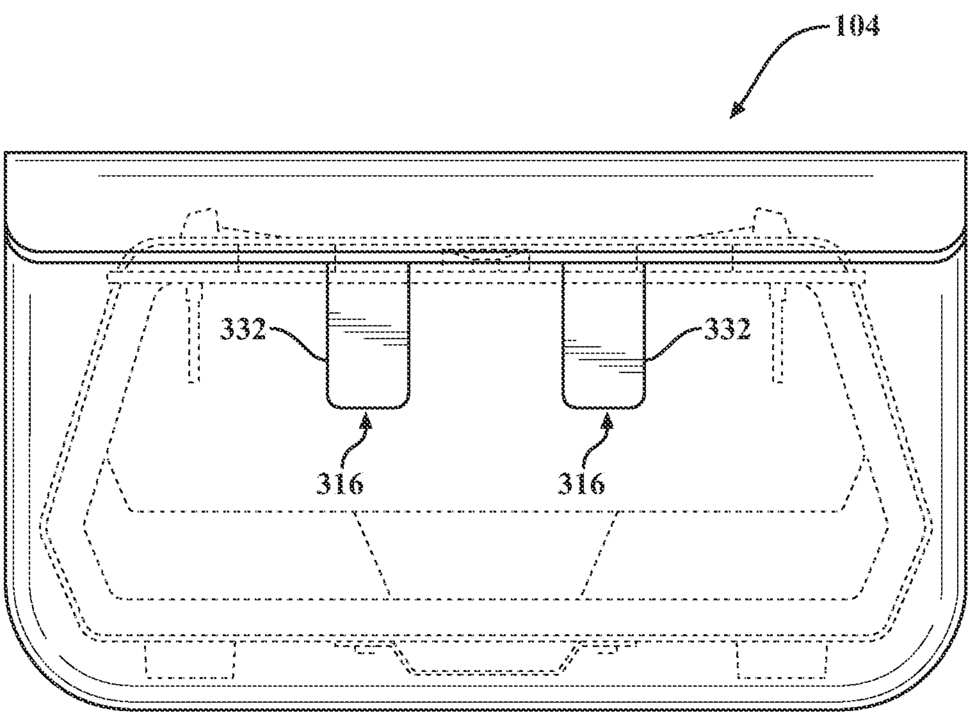
FIG. 46 is an end, plan view of the base station seen in FIG. 45.
Figure 47:
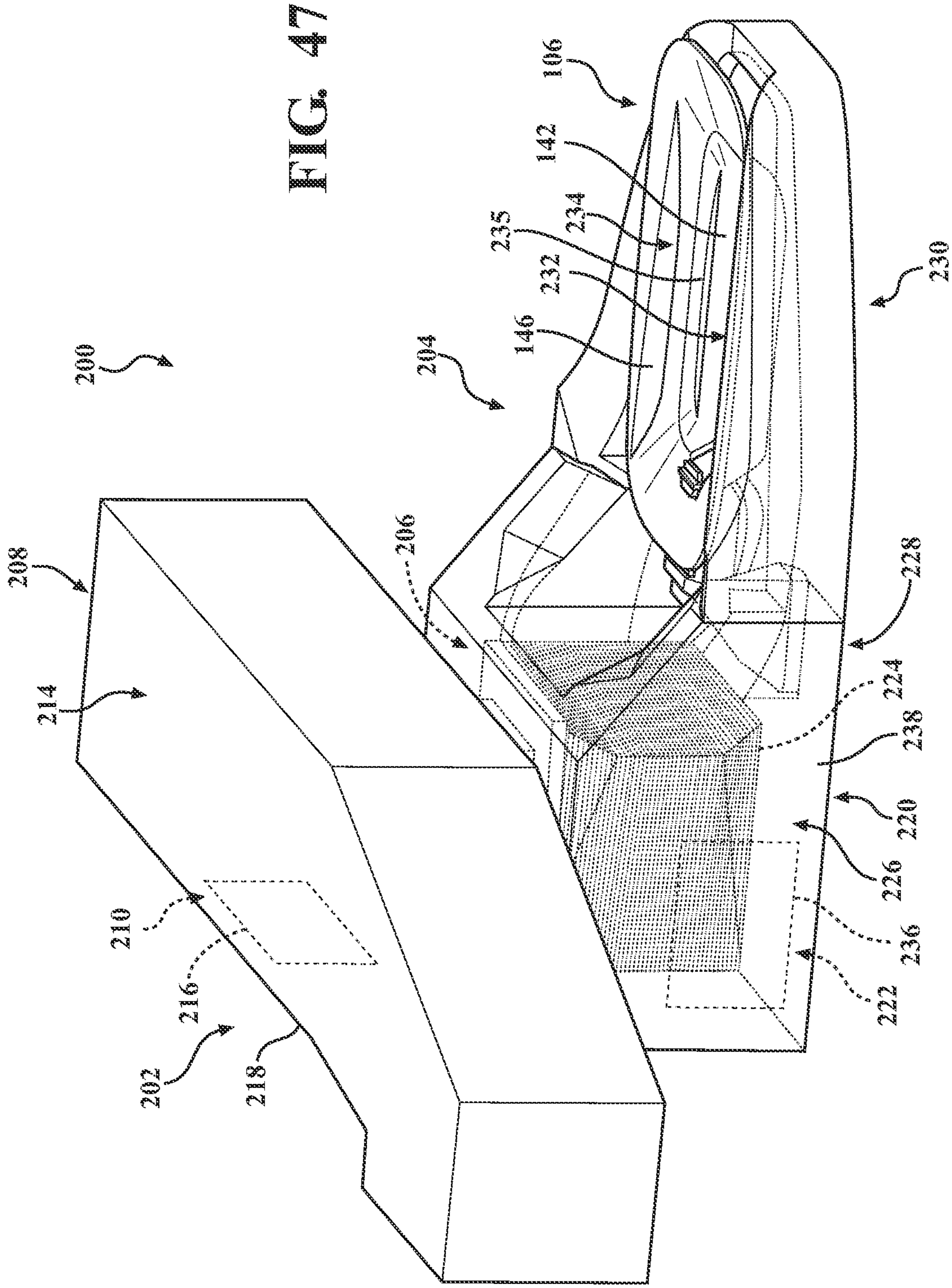
FIGS. 47 and 48 are opposite side, schematic views of a temperature control system of the base station, which includes a first air circuit; a second air circuit; and a thermoelectric conditioner (TEC).
Figure 48:
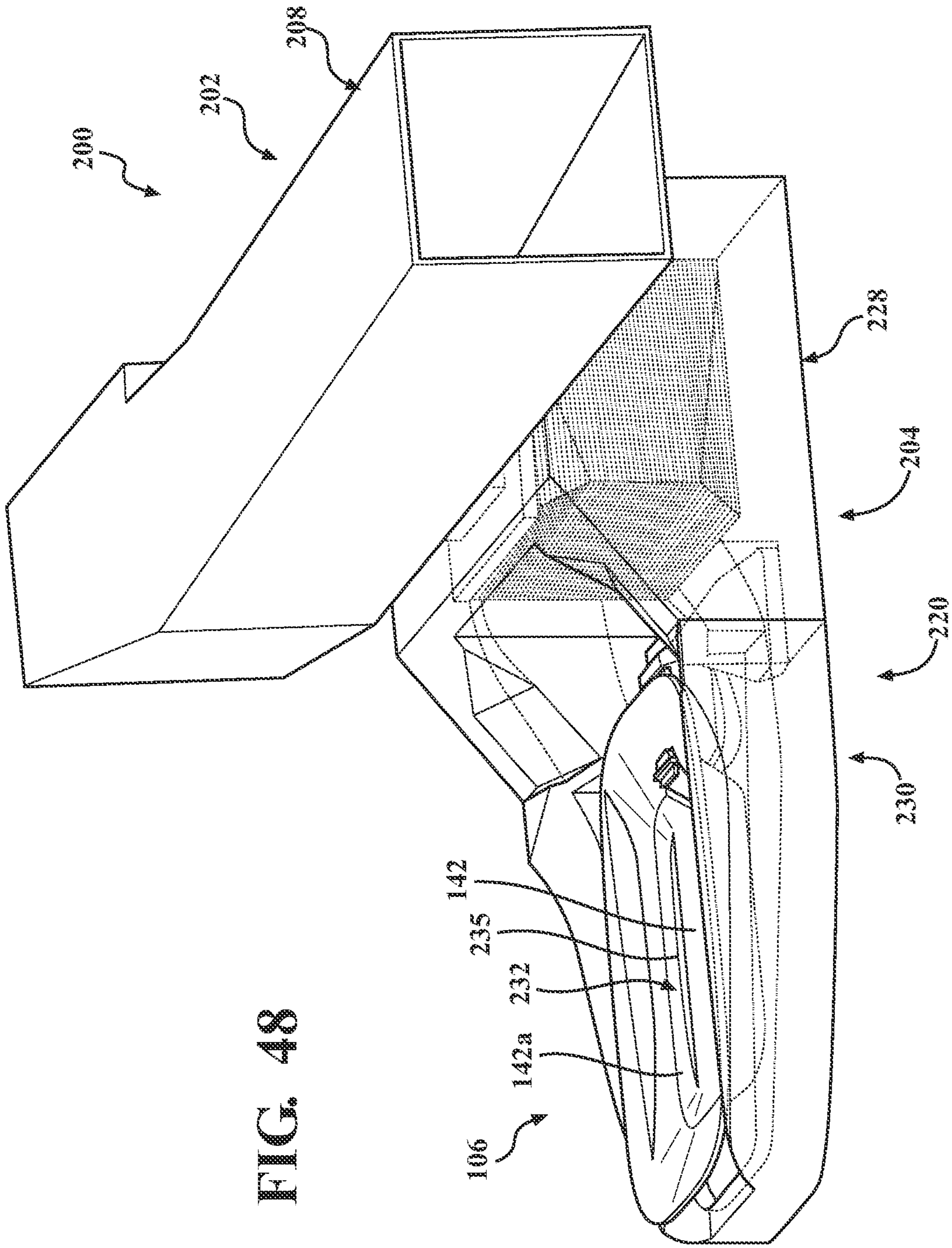
Figure 51:
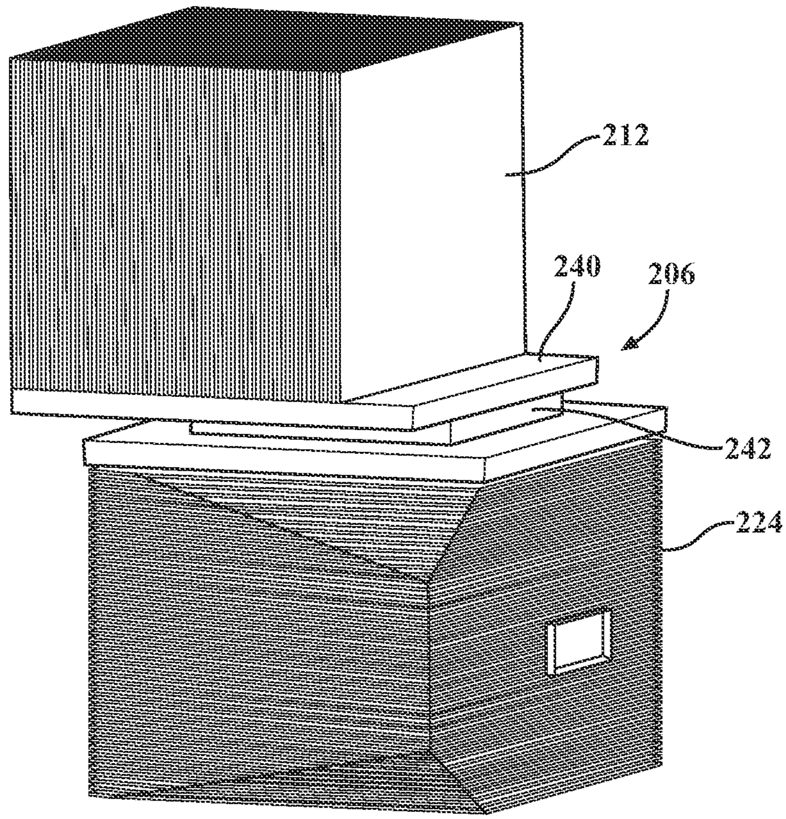
FIG. 51 is a partial, side, schematic view of the temperature control system illustrating a first heat sink and a second heat sink.
Figure 52:
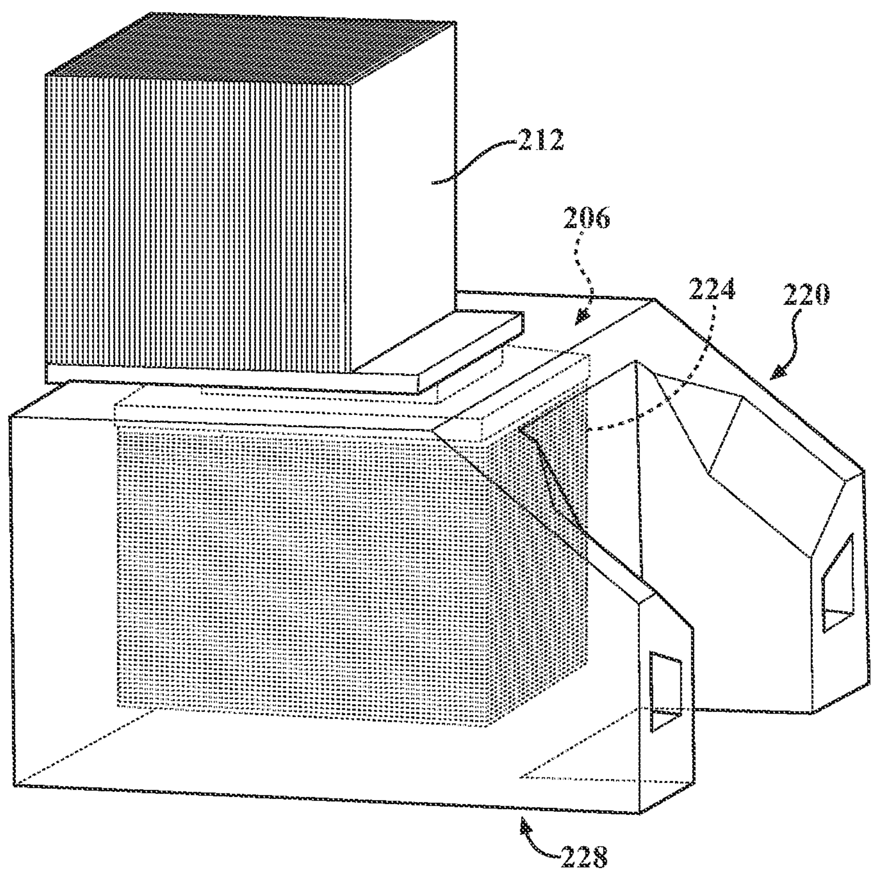
FIG. 52 is a partial, side, schematic view of the first heat sink and the second heat sink, which is shown located within a plenum of the second air circuit.

With reference now to FIGS. 45 and 46, in an alternate embodiment of the base station 100, it is envisioned that the engagement members 316 may be (non-movably) supported by (e.g., secured, connected to) the door 104, as mentioned above. In the particular embodiment illustrated, the engagement members 316 are configured as bumpers 332 that each include a cylindrical (or generally cylindrical) configuration. It should be appreciated, however, that the configuration of the bumpers 332 may be varied without departing from the scope of the present disclosure. For example, it is envisioned that the bumpers 332 may be replaced by the aforedescribed bumpers 320.

The bumpers 332 are positioned inside (laterally inward of) the hubs 40 (FIGS. 32, 33, 35) of the propeller assemblies 18 (e.g., in line with the propeller arms 38), which allows the propeller assemblies 18 to be oriented in alignment (or general alignment) with the propeller arms 38 in the collapsed configuration, as seen in FIG. 34B.

Temperature Control System

With reference now to FIGS. 47-52, the base station 100 includes a temperature control (e.g., heating and cooling) system 200 that is connected to the cradle 106 and which is configured to thermally condition (e.g., cool and heat) the power source 14 (FIGS. 2, 4, 5) of the UAV 10 when the UAV 10 is docked in the base station 100 (subject to environmental conditions). In the particular embodiment of the disclosure illustrated throughout the figures, the temperature control system 200 is configured to cool the power source 14 of the UAV 10 (e.g., when the UAV 10 and the base station 100 are operated in hot environments). It should be appreciated, however, that embodiments in which the temperature control system 200 may be configured to heat the power source 14 of the UAV 10 (e.g., when the UAV 10 and the base station 100 are operated in cold environments) are also envisioned herein and would not be beyond the scope of the present disclosure, as described in further detail below.

The temperature control system 200 includes: an upper air circuit 202; a lower air circuit 204; and a thermoelectric conditioner (TEC) 206 that is thermally connected to, and located between, the respective upper and lower air circuits 202, 204.

The upper air circuit 202 is an open system that receives and circulates ambient air, which may be sourced from within the base station 100 or externally of the base station 100 (e.g., via an air intake) to vary (regulate) the temperature of the TEC 206. The upper air circuit 202 includes: an upper (first) plenum 208; an upper (first) air circulator 210; and an upper (first) heat sink 212.

The upper plenum 208 includes an (upper) ducting system 214 that receives and circulates the ambient air. The ducting system 214 may include any suitable material (or combination of materials) and may include either a unitary configuration, in which the upper plenum 208 is formed from a single piece of material, or a segmented configuration, in which the upper plenum 208 is formed from a plurality of segments that are connected together (e.g., via one or more mechanical fasteners, an adhesive, in an interference fit, etc.). In certain embodiments, it is envisioned that the upper plenum 208 may also include one or more sensors that are configured to detect and monitor temperature, humidity, etc. within the upper plenum 208.

The upper air circulator 210 supports and directs air flow through the upper plenum 208 and across the upper heat sink 212 to vary air temperature within the upper air 202 and thereby regulate the temperature of the TEC 206, as described in further detail below. The upper air circulator 210 may include any structure or mechanism suitable for that intended purpose and may be positioned in any location suitable. For example, in the illustrated embodiment, the upper air circulator 210 is configured as a fan 216 (e.g., an axial fan) that is located within the upper plenum 208 (e.g., within the ducting system 214). It is also envisioned, however, that the upper air circulator 210 may be located externally of the upper plenum 208. For example, the upper air circulator 210 may be connected to (or otherwise supported on) an outer surface 218 of the ducting system 214.

The upper heat sink 212 (FIGS. 51, 52) is connected to (e.g., located within) the upper plenum 208 and is configured to alter the temperature of the air circulated through the upper air circuit 202. For example, when the temperature control system 200 is utilized to cool the power source 14 (FIGS. 2, 4, 5) of the UAV 10, the upper heat sink 212 absorbs and distributes thermal energy (heat) generated by the TEC 206 to lower the temperature of the air flowing through the upper plenum 208, as described in further detail below. To increase the absorption and distribution of thermal energy by the upper heat sink 212, air flow through the upper plenum 208 and, thus, air flow across the upper heat sink 212, may be increased by increasing the speed of the upper air circulator 210 (e.g., by increasing power to the fan 216).

The lower air circuit 204 includes a lower (second) plenum 220; a lower (second) air circulator 222; and a lower (second) heat sink 224 and is configured as a closed system. As such, in contrast to the upper air circuit 202, rather than drawing in additional ambient air, the lower air circuit 204 continuously circulates the air that is naturally present within the lower plenum 220.

The lower plenum 220 includes a (lower) ducting system 226 that directs air flow across the cradle 106 and the power source 14 of the UAV 10 when the UAV 10 is docked within the base station 100 and may include any suitable material (or combination of materials). The lower plenum 220 (e.g., the ducting system 226) includes a segmented (non-unitary) configuration that defines a rear (first, fixed) section 228 and a forward (second, movable) section 230 that is movable in relation to the rear section 228. In various embodiments of the disclosure, it is envisioned that the sections 228, 230 may include either a unitary configuration, in which the sections 228, 230 are each formed from a single piece of material, or a segmented configuration, in which the sections 228, 230 are formed from a plurality of segments that are connected together (e.g., via one or more mechanical fasteners, an adhesive, in an interference fit, etc.). In certain embodiments, it is envisioned that the lower plenum 220 may also include one or more sensors that are configured to detect and monitor temperature, humidity, etc. within the upper plenum 208.

The rear section 228 of the lower plenum 220 is fixedly secured (connected) to the TEC 206 and, as such, is fixed in relation to the upper air circuit 202. The forward section 230 of the lower plenum 220 is secured (connected) to the cradle 106 and is movable therewith during repositioning of the cradle 106 between the retracted position (FIGS. 2, 10) and the extended position (FIG. 13). As such, throughout the following disclosure, any references to the cradle 106 should be understood as referring to the assembly of the cradle 106 and the forward section 230 of the lower plenum 220.

The forward section 230 of the lower plenum 220 receives air from the rear section 228 and defines an air inlet 232 and an air outlet 234, which are provided in (defined by) the cradle 106 and are located on opposite sides 142*a*, 142*b* of the chamber 142). The air inlet 232 and the air outlet 234 each include one or more vents 235 (e.g., slits, apertures, or other such openings) that extend through the cradle 106 (e.g., the sidewalls 146) and into the chamber 142. The vents 235 facilitate air flow into and across the chamber 142 by directing air conditioned by the lower air circuit 204 into the cradle 106 and across the power source 14 of the UAV 10 when the UAV 10 is docked in the base station 100. More specifically, the air inlet 232 is configured to direct air into the cradle 106 and across the power source 14 of the UAV 10 and the air outlet 234 is configured to receive the air directed across the power source 14 and redirect the air through the lower plenum 220 and across the lower heat sink 224, as described in further detail below.

Although shown as extending entirely about the cradle 106 in the particular embodiment illustrated throughout the figures, embodiments are also envisioned in which the forward section 230 of the lower plenum 220 may only partially circumscribe the cradle 106. For example, embodiments are envisioned in which the forward section 230 of the lower plenum 220 may include opposite terminal ends that respectively define the air inlet 232 and the air outlet 234.

Additionally, while the forward section 230 of the lower plenum 220 and the cradle 106 are illustrated as being integrally (e.g., monolithically) formed in the illustrated embodiment, it is also envisioned that the lower plenum 220 and the cradle 106 may be configured for releasable (detachable) engagement to allow for repeated connection and disconnection of the lower plenum 220 and the cradle 106 (e.g., via corresponding engagement structures such as detents, clips, fasteners, or the like).

The lower air circulator 222 supports and directs air flow through the lower plenum 220 and across the lower heat sink 224 to thermally condition the air within the lower air circuit 204 (e.g., vary the temperature thereof) and thereby heat or cool the power source 14 of the UAV 10, as described in further detail below. The lower air circulator 222 may include any structure or mechanism suitable for that intended purpose and may be positioned in any location suitable. For example, in the illustrated embodiment, the lower air circulator 222 is configured as a fan 236 (e.g., a blower fan) that is located within the lower plenum 220 (e.g., within the ducting system 226). It is also envisioned, however, that the lower air circulator 222 may be located externally of the lower plenum 220. For example, the lower air circulator 222 may be connected to (or otherwise supported on) an outer surface 238 of the ducting system 226.

The lower heat sink 224 is connected to (e.g., located within) the lower plenum 220 and is configured to treat the air circulated therethrough (e.g., alter the temperature of the air within the lower plenum 220 via cooling or heating) prior to direction across the power source 14 of the UAV 10. For example, when the temperature control system 200 is utilized to cool the power source 14 of the UAV 10, the lower heat sink 224 absorbs and distributes thermal energy (heat) from the air flowing through the lower plenum 220 to lower the temperature thereof and, thus, the power source 14 of the UAV 10. To increase the absorption and distribution of thermal energy by the lower heat sink 224 and, thus, enhance cooling of the power source 14 of the UAV 10, air flow through the lower plenum 220 and, thus, air flow across the lower heat sink 224, may be increased by increasing the speed of the lower air circulator 222 (e.g., by increasing power to the fan 236).

The TEC 206 is configured as a Peltier system and includes and a dedicated/integrated power source/control as well as a first (upper, "hot") end 240 (FIG. 51) and a second (lower, "cold") end 242, each of which includes a thermal member (e.g., a ceramic plate). The first end 240 is thermally and/or physically connected to the upper heat sink 212 and the second end 242 is thermally and/or physically connected to the lower heat sink 224. Upon activation, as current flows through the TEC 206, the temperature of the first end 240 increases (to an upper temperature threshold) while the temperature of the second end 242 decreases (to a lower temperature threshold) until a predetermined, fixed temperature differential is realized. For example, it is envisioned that the differential between the respective upper and lower ends 240, 242 of the TEC 206 may lie substantially within the range of (approximately) 30° C. to (approximately) 70° C. (e.g., (approximately) 50° C.). Embodiments in which the temperature differential may lie outside the disclosed range, however, are also envisioned herein and would not be beyond the scope of the present disclosure. Consequently, reducing the upper temperature threshold allows for a corresponding reduction in the lower temperature threshold.

During operation of the temperature control system 200, in the particular embodiment of the disclosure illustrated, thermal energy (heat) generated by the TEC 206 is absorbed and dissipated by the upper heat sink 212 and the ambient air flowing through the upper plenum 208. The upper air circuit 202 thus cools the first ("hot") end 240 of the TEC 206, which results in corresponding cooling of the second ("cold") end 242 of the TEC 206 and, thus, increased cooling of the air flowing through the lower plenum 220 and the power source 14 of the UAV 10 when the UAV 10 is docked in the base station 100.

Although illustrated as including a single TEC 206 in the particular embodiment shown throughout the figures, embodiments are also envisioned in which the temperature control system 200 may include multiple TECs 206. In such embodiments, it is envisioned that the TECs 206 may be identical or non-identical in configuration (e.g., it is envisioned that the temperature control system 200 may include TECs 206 that vary in size) and/or that the TECs 206 may be arranged in series or in parallel (e.g., in a stacked configuration).

As indicated above, embodiments of the disclosure are envisioned herein in which the temperature control system 200 may be configured to heat, rather than cool, the power source 14 of the UAV 10 when the UAV 10 is docked in the base station 100. In such embodiments, current flow through the TEC 206 can be reversed (e.g., via electronic control) such that the first end 240 of the TEC 206 functions as the "cold" end and the second end 242 of the TEC 206 functions as the "hot" end.

During use of the temperature control system 200, the upper air circuit 202 draws air in from the ambient, either from within the base station 100 or externally of the base station 100, which is directed across the upper heat sink 212 via the upper air circulator 210. As the air flows across the upper heat sink 212, heat is withdrawn, thereby cooling the upper heat sink 212 and, thus, the first ("hot) end 240 of the TEC 206, and heating the air. The heated air is then discharged from the upper air circuit 202, being expelled either into the base station 100 or externally thereof (e.g., through a vent), and is replaced by cooler ambient air that is drawing into the upper air circuit 202 by the upper air circulator 210.

Upon docking of the UAV 10, as the cradle 106 moves from the extended position (FIG. 13) into the retracted position (FIGS. 2, 10), the forward section 230 of the lower plenum 220 mates with (engages) the rear section 228, which closes the lower air circuit 204 and allows for the continuous circulation of air therethrough. To facilitate mating engagement between the forward section 230 and the rear section 228, it is envisioned that the forward section 230 and the rear section 228 may include one or more seals (e.g., O-rings) or corresponding engagement structures (e.g., collars, flanges, or the like) at the interface therebetween.

Air flowing through the lower air circuit 204 is directed across the lower heat sink 224 via the lower air circulator 222, which withdraws heat from the air to cool the air prior to entering the chamber 142 of the cradle 106 via the air inlet 232. As the cooled air flows through across the cradle 106 and through the chamber 142, heat is withdrawn from the power source 14 (FIGS. 2, 4, 5) of the docked UAV 10, which is facilitated by the heat exchanger 24. More specifically, in the illustrated embodiment, the cooled air flows through the channels 32 (FIG. 4) defined by the diffusers 26 (e.g., the fins 30), which increases the distribution of thermal energy from the power source 14 of the UAV 10 to enhance cooling, and increases the temperature of the air. After flowing across the power source 14, the (heated) air exits the chamber 142 via the air outlet 234 and is redirected across the lower heat sink 224 (e.g., via the lower air circulator 222) to again cool the air prior to recirculation through the cradle 106 and across the power source 14.

Cradle Insulation

Figure 56:
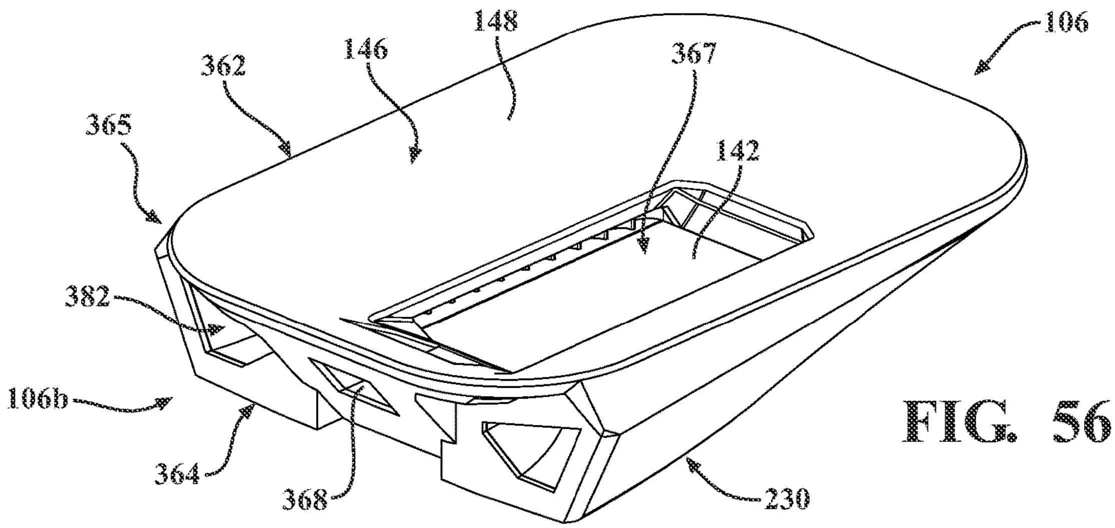
FIG. 56 is a rear, perspective view of an insulated cradle according to one embodiment of the disclosure.
Figure 57:
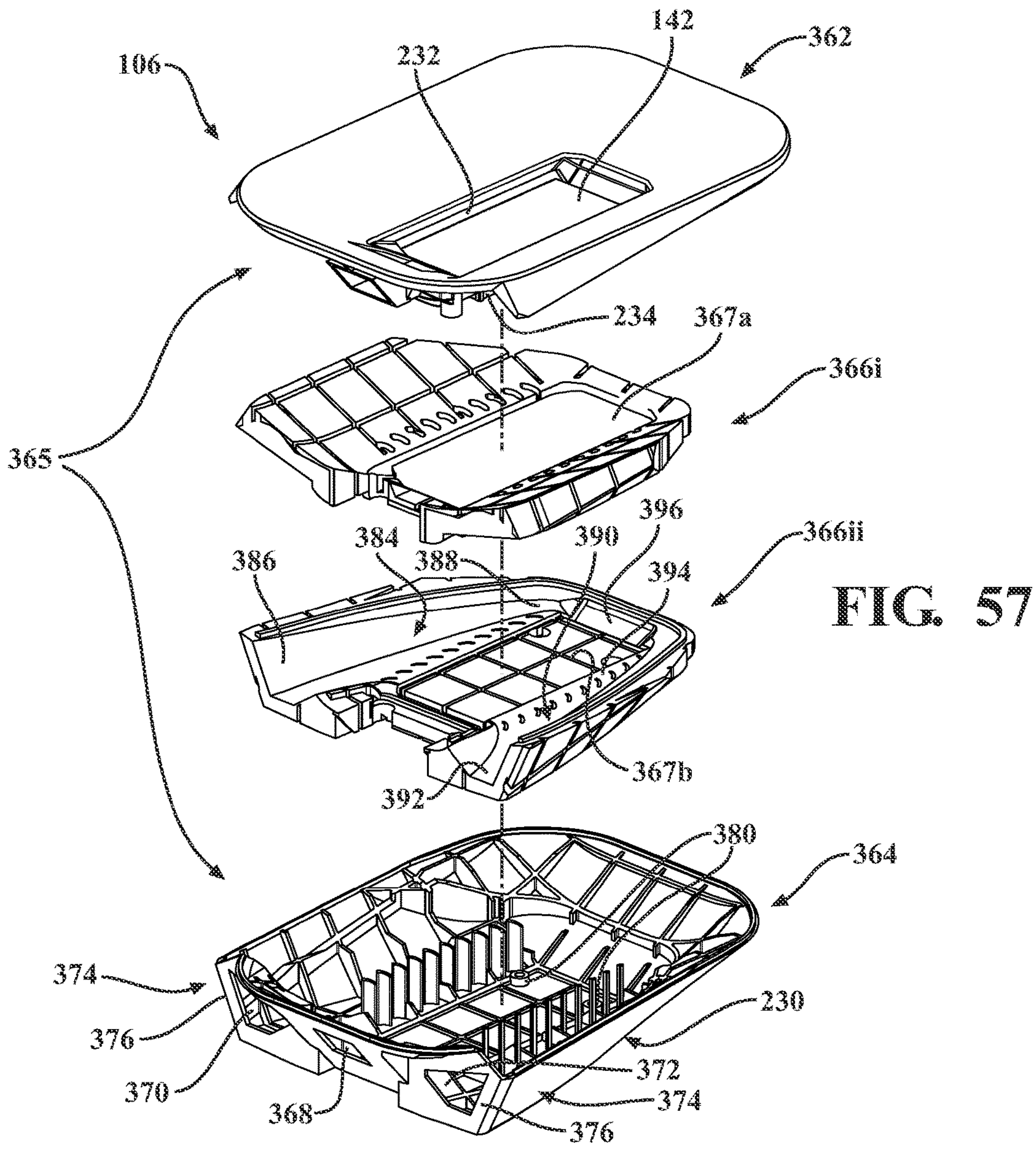
FIG. 57 is a rear, perspective view of the insulated cradle seen in FIG. 56 with parts separated.
Figure 58:
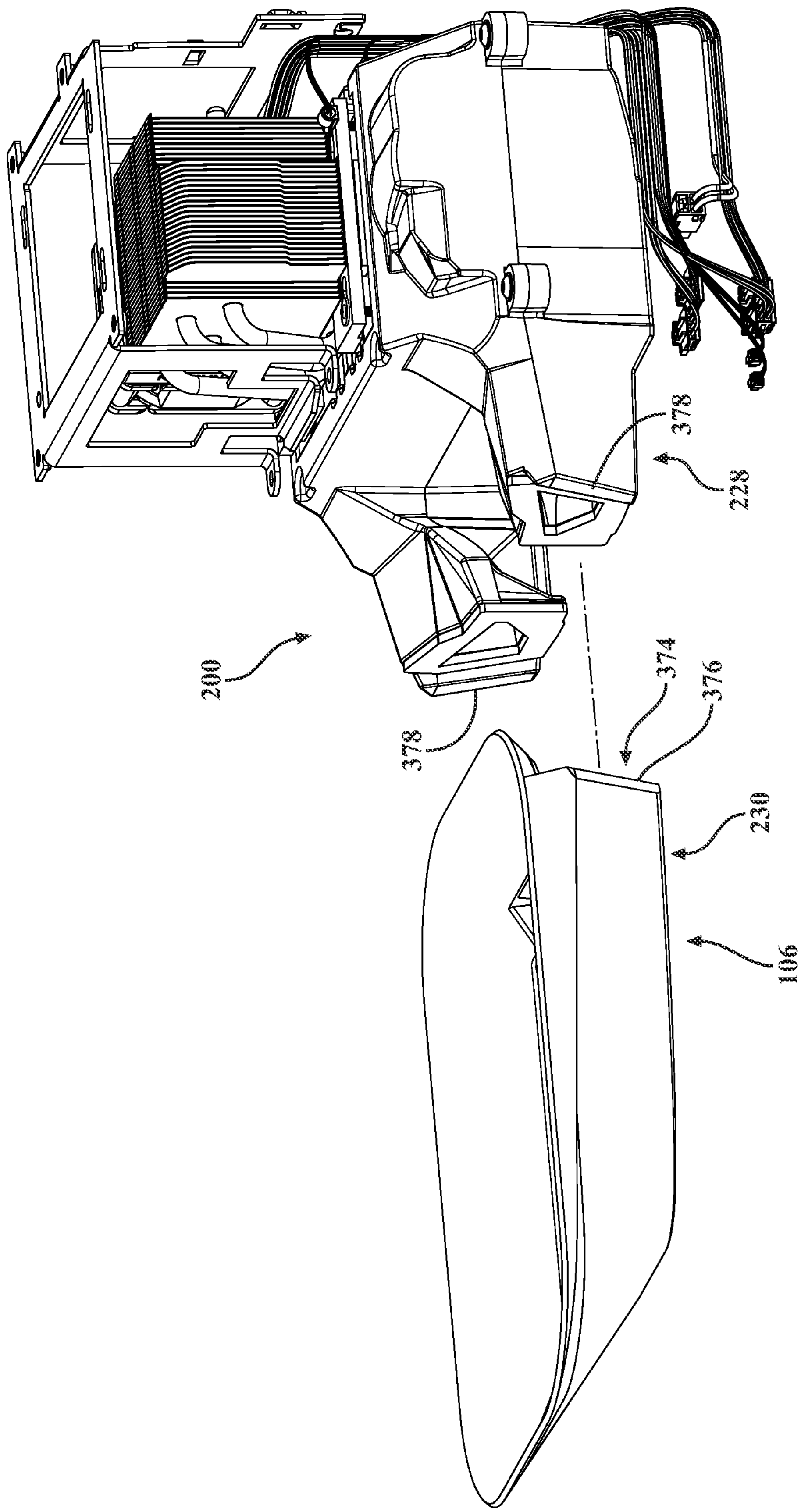
FIG. 58 is a side, perspective view illustrating mating of the insulated cradle and the plenum of the second air circuit.
Figure 59:
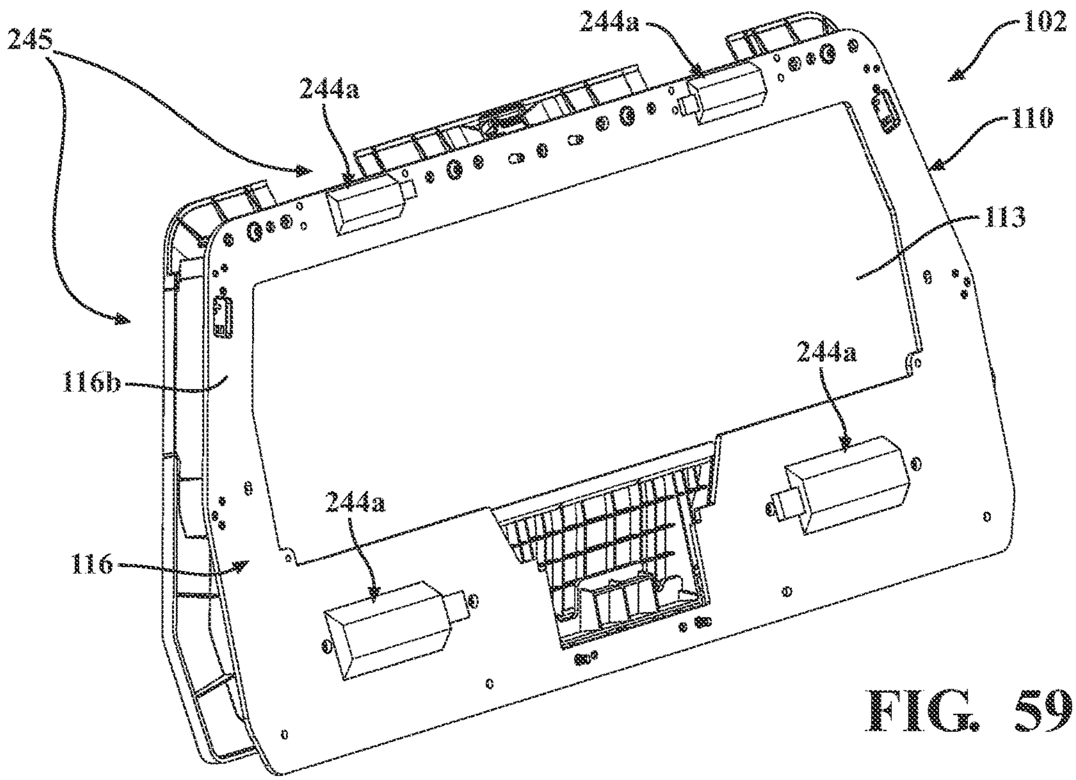
FIG. 59 is a partial, rear, perspective view of the base station according to one embodiment of the disclosure, which includes a plurality of heating elements secured to an inner surface of the enclosure.
Figure 60:
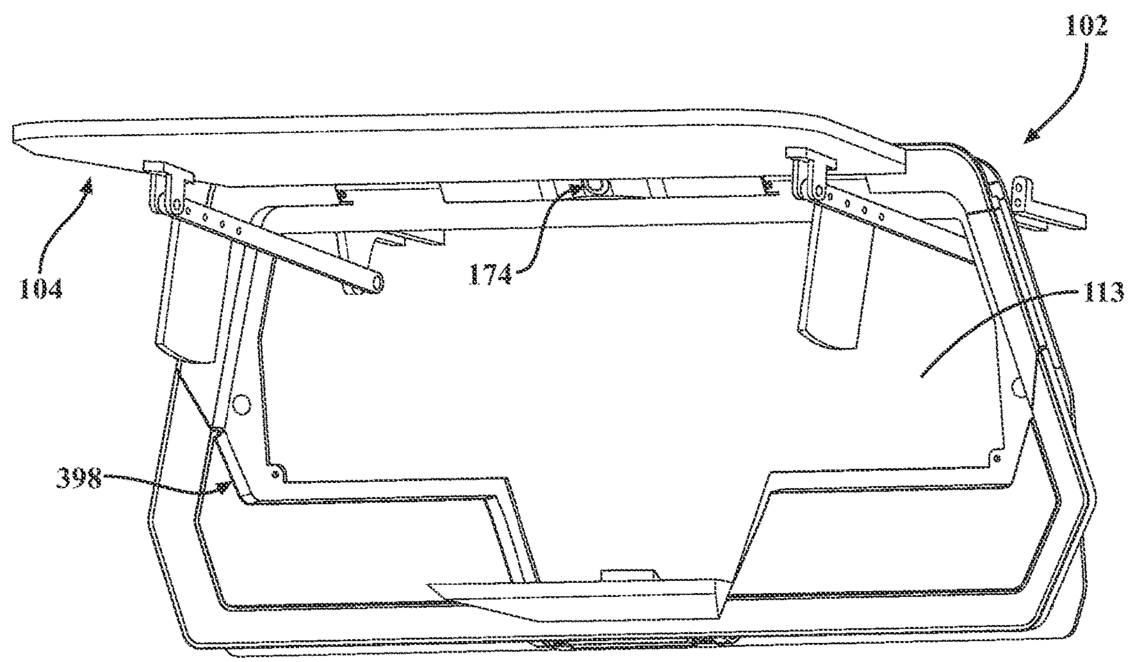
FIG. 60 is a partial, front, perspective view of the base station with the (front) door shown in the open position.

With reference to FIGS. 56-58, in certain embodiments of the disclosure, it is envisioned that the cradle 106 may include an insulated construction to allow for increased control over, and regulation of, the temperature of the power source 14 of the UAV 10 when the UAV 10 is docked within the base station 100. More specifically, insulation of the cradle 106 promotes and facilitates cooling and heating of the power source 14 and maintains the temperature of the power source 14 for increased periods of time.

The (insulated) cradle 106 includes: an upper (first) shell 362; a lower (second) shell 364; and one or more thermal insulators 366, wherein the shells 362, 364 collectively define a housing 365 of the cradle 106. It is envisioned that the shells 362, 364 and the thermal insulator(s) 366 may be formed from any suitable materials. For example, in the particular embodiment illustrated, the shells 362, 364 each include (e.g., are formed partially or entirely from) one or more non-metallic (e.g., plastic) materials and the thermal insulator(s) 366 include (e.g., are formed partially or entirely from) an insulative foam. Embodiments in which the shells 362, 364 and/or the thermal insulator(s) 366 may include one or more alternate materials, however, would not be beyond the scope of the present disclosure. For example, embodiments in which the shell 362 and/or the shell 364 may include a composite material (e.g., carbon fiber) are also envisioned herein (e.g., to increase the overall strength and/or rigidity of the cradle 106).

The upper shell 362 is configured to receive the UAV 10 during docking and defines the chamber 142, the sidewalls 146, the air inlet 232 (FIGS. 47-49), the air outlet 234, and the angled guide surface 148 mentioned above, which collectively facilitate proper seating of the UAV 10 within the cradle 106.

The lower shell 364 is connected to the upper shell 362 and provides structural rigidity to the cradle 106. The lower shell 364 defines a charging window 368, which is located in the rear end 106*b* of the cradle 106, as well as a pair of airflow openings 370, 372 that are in respective communication with the air inlet 232 and the air outlet 234 so as to facilitate the circulation of cooled and heated air through the cradle 106 following conditioning by the TEC 206. As described in further detail below, the charging window 368 is configured to receive the charging hub 143 (FIG. 10) such that the charging hub 143 is extendable into and through the cradle 106 during retraction of the UAV 10 into the base station 100 to thereby facilitate connection of the charging hub 143 to the power source 14 of the UAV 10. The airflow openings 370, 372 are in communication with the air inlet 232 and the air outlet 234, respectively, and allow cooled and heated air to enter the cradle 106 following condition by the TEC 206.

With reference to FIG. 58 in particular, the cradle 106 (e.g., the assembly of the cradle 106 and the forward section 230 of the lower plenum 220) includes lead-ins 374, which are positioned adjacent to (e.g., about) the airflow openings 370, 372 and each define a chamfered (beveled, angled) end walls 376 that facilitates entry of the cradle 106 into the base station 100 during retraction. For example, in the event of misalignment with the window 113 (FIG. 2) and contact with the enclosure 102 (e.g., the forward frame 116), the lead-ins 374 redirect the cradle 106 (and the forward section 230 of the lower plenum 220) laterally inward, thereby inhibiting (if not entirely preventing) jamming, damage to the cradle 106 and/or the forward section 230 of the lower plenum 220, damage to the enclosure 102, etc. The chamfered end walls 376 also facilitate proper registration of the cradle 106 (and the forward section 230 of the lower plenum 220) and are configured for (mating) engagement (contact) with corresponding chamfered (beveled, angled) end walls 378 (FIG. 58) on the rear section 228 of the lower plenum 220 such that, upon retraction of the cradle 106, the cradle 106 (and the forward section 230 of the lower plenum 220) mates with the rear section 228 of the lower plenum 220, thereby facilitating proper air flow through the temperature control system 200 and the cradle 106 to support thermal conditioning (e.g., heating and cooling) of the power source 14 of the UAV 10. The end walls 376, 378 thus define corresponding mating surfaces on the cradle 106 and the rear section 228 of the lower plenum 220, respectively.

It is envisioned that the shells 362, 364 may be connected together in any suitable manner. For example, in the particular embodiment of the cradle 106 illustrated, the shells 362, 364 are connected via one or more mechanical fasteners (e.g., screws, pins, bolts, clips, etc.), which extend through openings 380 in the shells 362, 364. It is envisioned, however, that the shells 362, 364 may be configured for connection in any suitable manner. For example, embodiments are also envisioned in which the shells 362, 364 may be configured for engagement in a press-fit (interference fit) arrangement. Mechanically connecting the shells 362, 364 simplifies assembly and disassembly of the cradle 106 so as to facilitate repair of the cradle 106, replacement of any of the components thereof, etc.

The thermal insulator(s) 366 are located and secured between the shells 362, 364 (e.g., such that the thermal insulator(s) 366 are located within the housing 365) and collectively define an airflow channel 382 that extends about the chamber 142 and, thus, the power source 14 when the UAV 10 is docked within the cradle 106. In the particular embodiment of the disclosure illustrated, the cradle 106 is shown as including a pair of thermal insulators 366 (e.g., an upper thermal insulator 366*i* and a lower thermal insulator 366*ii*), which facilitates and simplifies the manufacture and assembly of the cradle 106. Embodiments are also envisioned, however, in which the cradle 106 may include a single thermal insulator 366 that is unitary in construction (e.g., a monolithic thermal insulator 366 that is formed from a single piece of (insulative) material).

The thermal insulator(s) 366 define an internal compartment 367 that is configured to receive (accommodate) the upper shell 362 such that the upper shell 362 (e.g., the chamber 142) extends into the thermal insulator(s) 366. More specifically, in the particular embodiment illustrated, the thermal insulators 366*i*, 366*ii* respectively include an opening 367*a* and a recess 367*b* that collectively define the internal compartment 367 such that, upon assembly of the cradle 106, the chamber 142 extends through the opening 367*a* and is received by (positioned withing) the recess 367*b*.

The airflow channel 382 is configured to receive, direct, and circulate thermally-conditioned air within (e.g., through, across) the cradle 106. In the particular embodiment illustrated, the airflow channel 382 extends between thermal insulators 366*i*, 366*ii* and includes a (first) channel portion 384 with respective rear and front ends 386, 388 that is in communication with the airflow opening 370 and the air inlet 232 and a (second) channel portion 390 with respective rear and front ends 392, 394 that is in communication with the airflow opening 370 and the air outlet 234. As seen in FIG. 57, the respective front ends 388, 392 of the channel portions 384, 390 are separated by a nose section 396 of the cradle 106. The airflow channel 382 thus includes a discontinuous configuration that partially circumscribes the cradle 106 and the chamber 142 and inhibits (if not entirely prevents) air flow from the front end 388 of the channel portion 384 into the front end 394 of the channel portion 390, thereby directing air from the air inlet 232, across the chamber 142, and into the air outlet 234. Embodiments in which the airflow channel 382 may include a continuous (uninterrupted) configuration that entirely circumscribes the cradle 106 and the chamber 142 would not be beyond the scope of the present disclosure, however.

Weather and Climate Management

To allow for operation in various weather conditions, the base station 100 includes a plurality of components and systems that are configured to regulate temperature, moisture, humidity, and the like in order to maximize operability in a variety of environments.

Snow and Ice

Figure 53A:
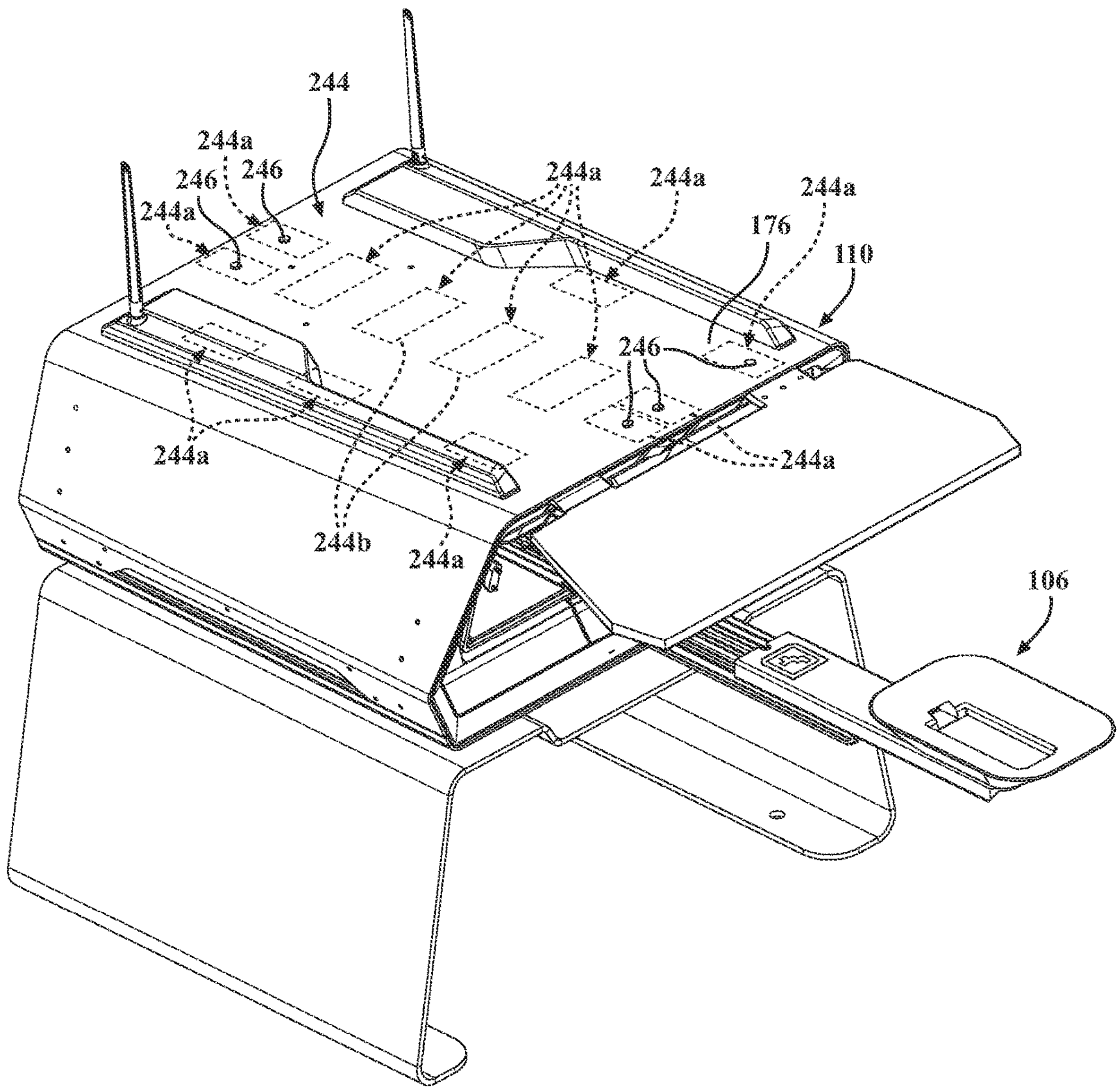
FIG. 53A is a partial, top, schematic view of the base station according to an embodiment of the disclosure that includes one or more heating elements on the roof section.
Figure 53B:
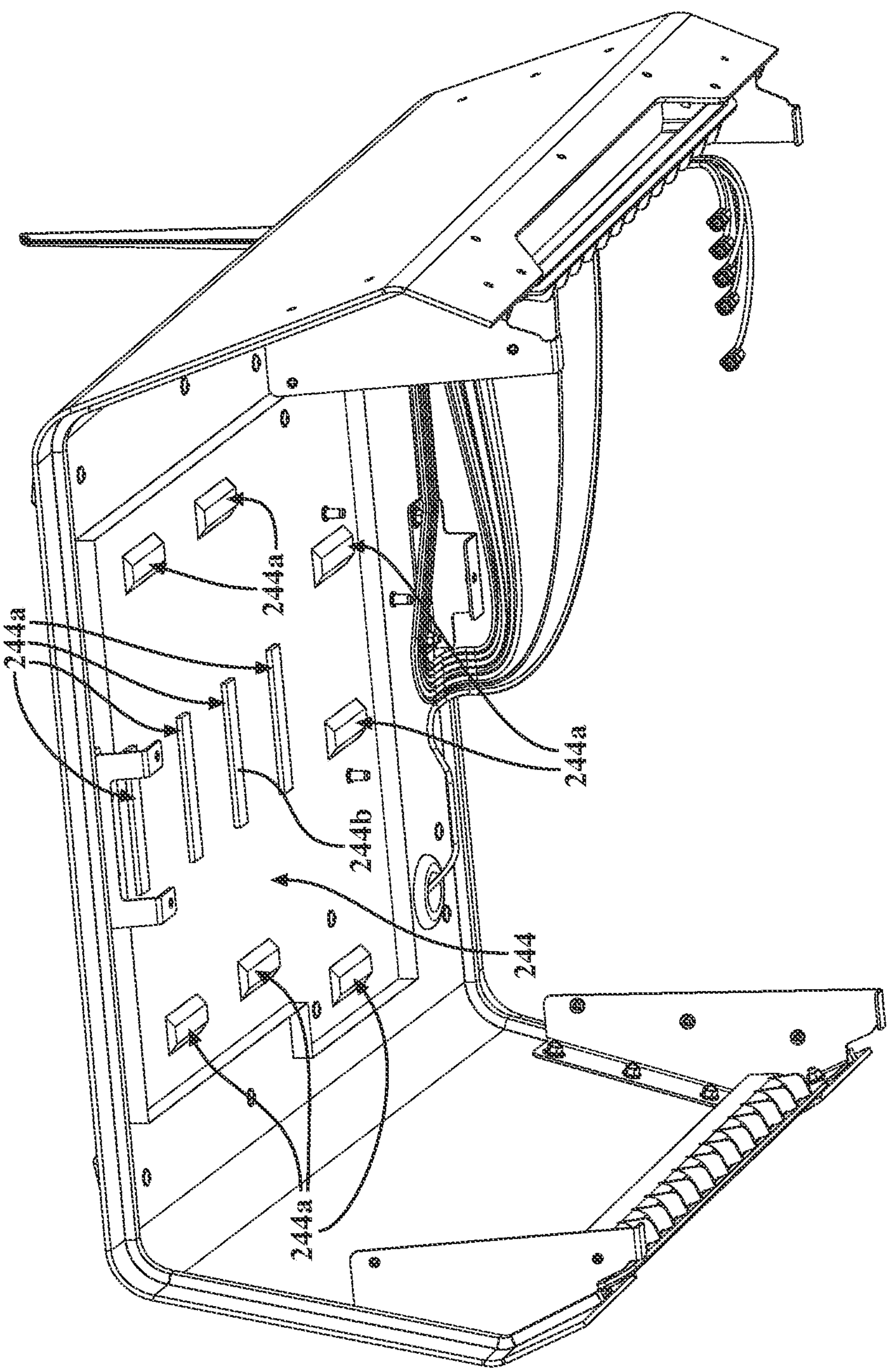
FIG. 53B is a is a partial, bottom, schematic view of the base station illustrating the heating element(s) on the roof section seen in FIG. 53A.

As seen in FIGS. 53A and 53B, in certain embodiments of the disclosure, the base station 100 includes a (primary) heating system 244 that includes one or more heating elements 244*a* (e.g., resistive heaters 244*b*) that are thermally and/or physically connected to (supported by) the enclosure 102 (e.g., via an adhesive). Although shown as being associated with (supported by) the roof section 176 of the outer housing 110 in the particular embodiment illustrated, it is envisioned that the heating element(s) 244*a* may be thermally and/or physically connected to any section(s) of the outer housing 110 that may benefit from heating. Upon activation, the heating element(s) 244*a* increase the temperature of (heat) the outer housing 110 (e.g., to reduce the presence of snow and/or ice on the roof section 176 and thereby expose (reveal) the fiducial(s) 168 to facilitate visual identification of the base station 100 and/or guidance of the UAV 10 during landing and docking with the base station 100). To further assist with the management of precipitation (e.g., snow, ice, sleet, rain, etc.), it is envisioned that the roof section 176 may be pitched (e.g., at) 3°-5° to encourage runoff and inhibit (if not entirely prevent) pooling on the roof section 176.

It is envisioned that the heating element(s) 244*a* may be connected to any suitable power source, whether internal to the base station 100 (e.g., to the power supply controlled by the main board/processor) or external (e.g., to a separate power supply, battery, or the like), and that the heating system 244 (e.g., the heating element(s) 244*a*) may be either manually or automatically activated. For example, it is envisioned that he heating system 244 may be activated via a signal that is relayed by one or more temperature sensors 246 that are in communication with the heating element(s) 244*a* and which are configured to detect a threshold (environmental) temperature such that the heating system 244 is automatically activated when the temperature falls below or exceeds a predetermined value (e.g., 32° F.). Additionally, or alternatively, it is envisioned that the heating system 244 may be activated upon receiving an activation signal from a weather station (e.g., via a cloud-based or other such wireless connection) and/or from the visualization system 174, which may be configured to visually inspect environmental conditions (e.g., to detect the presence of snow and/or ice) and relay the activation signal to the heating system 244.

Figure 61:
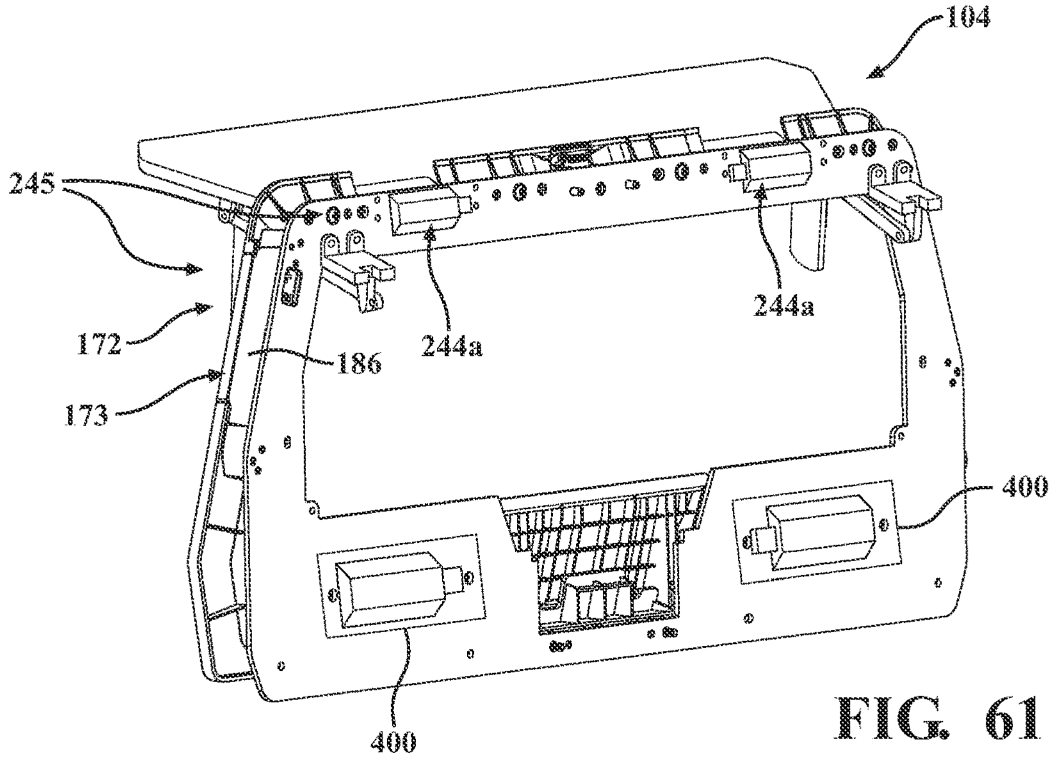
FIG. 61 is a partial, rear, perspective view of the base station according to one embodiment of the disclosure, which includes a thermal interface material located between the enclosure and the heating elements.
Figure 62:
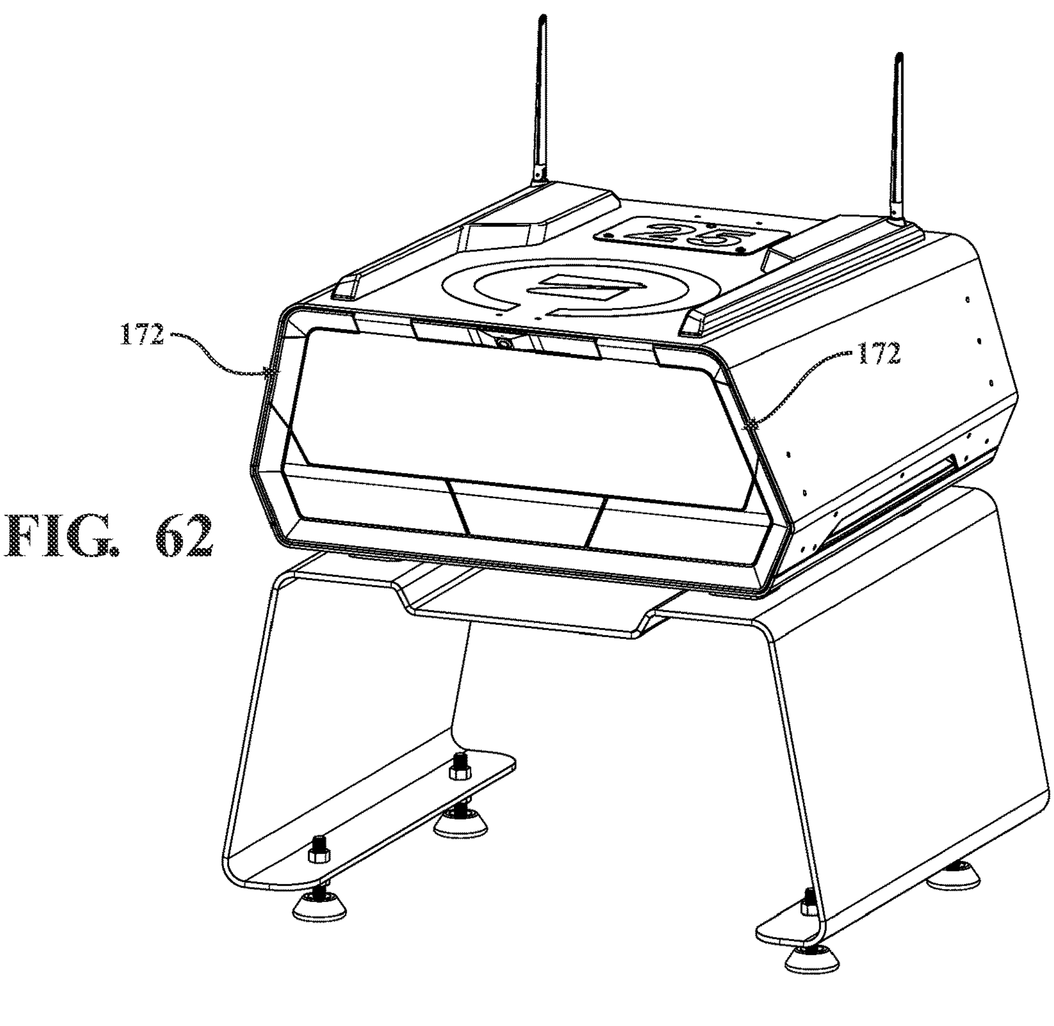
FIG. 62 is a front, perspective view of the base station according to one embodiment of the disclosure in which the status indicator(s) are configured to heat the door and/or a sealing member that is supported by the enclosure and which is configured for engagement with the door.

With reference to FIGS. 59-62, to further support operation of the base station 100 in cold environments and/or conditions, it is envisioned that the base station 100 may include a (secondary) heating system 245 that is supported by the enclosure 102. More specifically, the heating system 245 includes one or more additional (interior) heating elements 244*a* that are supported by (connected to) an inner (internal) surface 116*b* of the forward frame 116 to facilitate opening and closure of the door 104. The heating system 245 is located (positioned) adjacent (or generally adjacent) to a sealing member 398, which is configured for engagement (contact) with the door 104 to form a seal therewith so as to inhibit (if not entirely prevent) the entry of dust, debris, moisture, water, etc., into the base station 100. More specifically, the sealing member 398 is supported by the enclosure 102 (e.g., the forward frame 116) and extends about the window 113. To augment the distribution of thermal energy from the heating elements 244*a*, in certain embodiments, it is envisioned that a thermal interface material 400 may be provided (located) between the forward frame 116 and the heating element(s) 244*a*, as seen in FIG. 61.

As discussed above in connection with FIGS. 53*a*, 53*b* and heating of the roof section 176, the heating system 245 may be connected to any suitable power source, whether internal or external to the base station 100 and may be either manually or automatically activated (e.g., via a signal that is relayed by one or more temperature sensors 246, upon receiving an activation signal from a weather station and/or from the visualization system 174, etc.). Upon activation of the heating element(s) 244*a*, thermal energy is communicated to the sealing member 398 and/or the door 104 to heat the sealing member 398 and/or the door 104. Heating of the sealing member 398 and/or the door 104 melts snow, ice, etc., and thereby facilitates proper opening and closure of the door 104.

In certain embodiments of the disclosure, it is envisioned that the heating system 245 may also include the status indicator(s) 172. In such embodiments, the light source(s) 173 (e.g., the LED(s) 186) may serve to augment the thermal effects of the heating element(s) 244*a* by utilizing the thermal conductivity of the sheet metal used comprising the outer housing 110 (e.g., the forward frame 116) to communicate heat generated via operation of the status indicator(s) 172 to the sealing member 398 and/or the door 104. In such embodiments of the disclosure, the status indicator(s) 172 thus offer dual functionality (e.g., illumination and heating of the sealing member 398 and/or the door 104).

Figure 63:
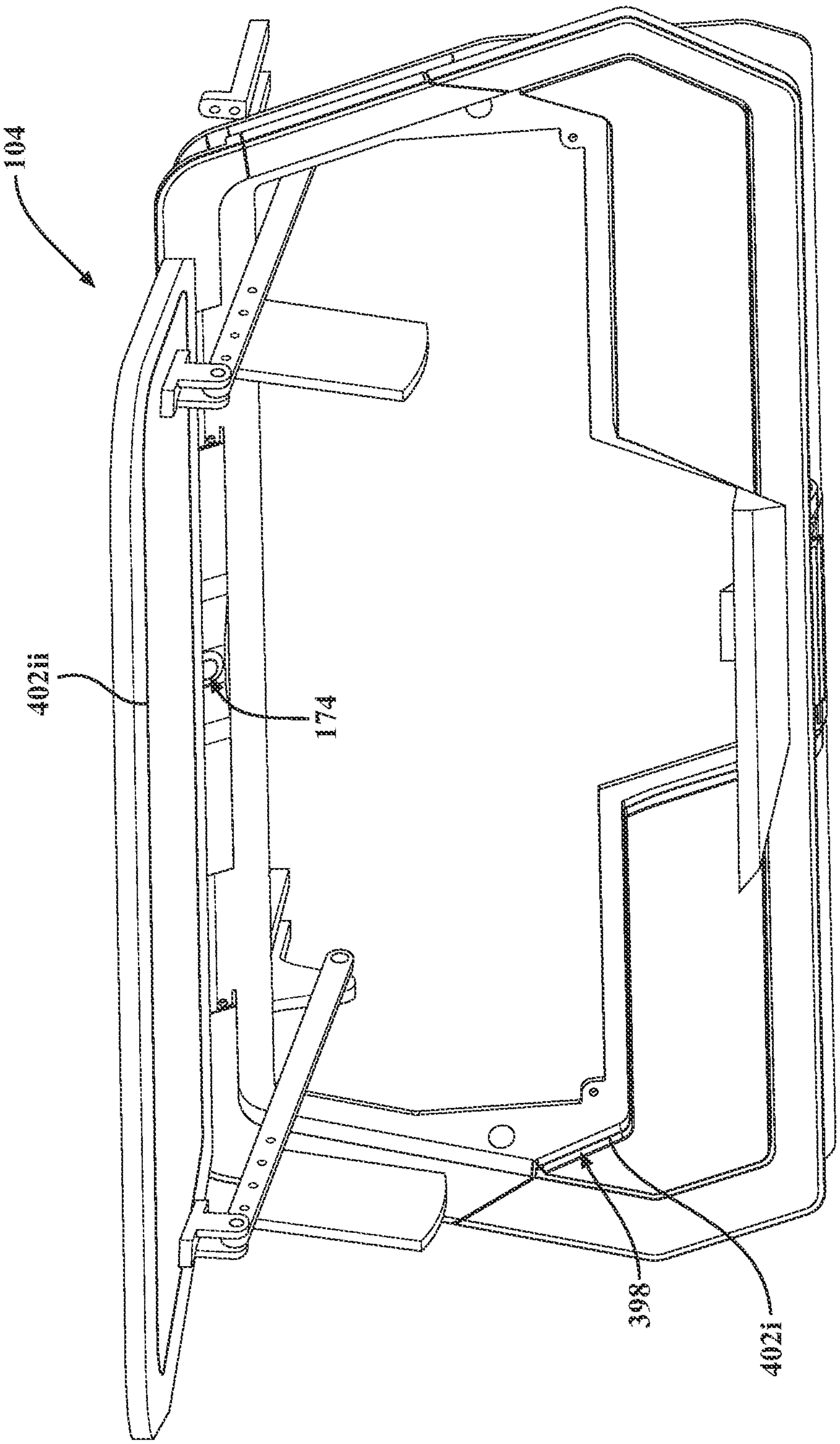
FIG. 63 is a partial, front, perspective view of an alternate embodiment of the base station, which includes thermally conductive members that are embedded within the door and/or the sealing member.

With reference to FIG. 63, in certain embodiments of the disclosure, additionally or alternatively, it is envisioned that the sealing member 398 and/or the door 104 may include one or more thermally conductive members 402 (e.g., strip heaters, wires, coils, plates, etc.), which may be connected to any suitable power source, whether internal or external to the base station 100. For example, in the particular embodiment illustrated, the base station 100 includes a (first) thermally conductive member 402*i* that is embedded within the sealing member 398 and a (second) thermally conductive member 402*ii* that is embedded within the door 104. In such embodiments, upon activation of the thermally conductive members 402, electrical energy is communicated (transferred) to the sealing member 398 and/or the door 104 to thereby heat the sealing member 398 and/or the door 104 and effectuate the necessary or desired temperature change.

Internal Temperature and Humidity Regulation

To regulate (control) the temperature and/or humidity within the base station 100, it is envisioned that the base station 100 may include one or more internal fans 248 (FIG. 64), which may be supported in any suitable location on the inner housing 108 and/or the outer housing 110. The internal fan(s) 248 regulate (e.g., vary, control) temperature and/or humidity within the base station 100 and may be configured to either cool the base station 100 or heat the base station 100 (e.g., via thermal connection to one or more heating elements or components).

The internal fan(s) 248 are controllable (e.g., via the main board/processor) to draw air in and exhaust air through one or more ports/vents in the outer housing 110 and/or the inner housing 108, the location(s) of which may be varied to direct air flow in a particular direction (e.g., across the UAV 10). For example, it is envisioned that the port(s)/vent(s) may be located and/or configured to create air flow through the base station 100 in any effective (or otherwise desired) pattern.

In certain embodiments of the disclosure, it is envisioned that the internal fan(s) 248 may be automatically activated via a signal that is relayed by one or more sensors 250 that are configured to detect temperature, humidity, etc. Additionally, or alternatively, it is envisioned that the internal fan(s) 248 may be connected to a timer such that the internal fan(s) 248 are automatically activated at a particular time of day.

In the context of humidity regulation, upon the detection of moisture, the sensor(s) 250 may generate an activation signal that can be utilized to initiate one or more mitigation processes. For example, it is envisioned that the sensor(s) may be in communication with the internal fan(s) 248 such that the internal fan(s) 248 are engaged upon receipt of the activation signal from the sensor(s) 250 to remove (or otherwise mitigate) excess humidity within the base station 100, thereby inhibiting (if not entirely preventing) condensation that might otherwise compromise the functionality of one or more components of the UAV 10 or the base station 100. For example, the presence of condensation may result in malfunction and/or damage to the electronics modules (e.g., the main board/processor) and/or "fogging" of the visualization system 174. To further inhibit (if not entirely prevent) the presence of humidity, condensation, moisture, etc., in certain embodiments of the disclosure, it is envisioned that the electronics modules may be sealed within the base station 100. For example, the electronics module, or the various components thereof (e.g., motor drivers, interface boards, lighting boards, etc.), may be sealed, either collectively (via hermetic sealing) or individually (e.g., via dip coating).

Drainage

In certain embodiments of the disclosure, the enclosure 102 (e.g., the outer housing 110) may include one or more channels 252 (FIG. 65) that are configured to collect and direct water away from any entry points into the enclosure 102 in a manner that inhibits (if not entirely prevents) entry into the base station 100 and/or away from any components, whether electronic, mechanical, or otherwise, that may be compromised by the presence of moisture. For example, it is envisioned that the channel(s) 252 may be configured to collect and direct water away from the interface with any power cables, any locking members/mechanisms, the door 104 (FIG. 1), etc. While the enclosure 102 is shown as including a single channel 252 that extends about a rear periphery 254 of the outer housing 110 in the particular embodiment illustrated, it should be appreciated that the number of channels 252 and/or the location of the channels 252 may be varied without departing from the present disclosure. For example, embodiments including one or more additional channels 252 are also envisioned herein, as are embodiments in which the enclosure 102 may include one or more channels 252 that extend about a front periphery 256 (FIG. 1) of the outer housing 110, the roof section 176, etc.

Figure 65:
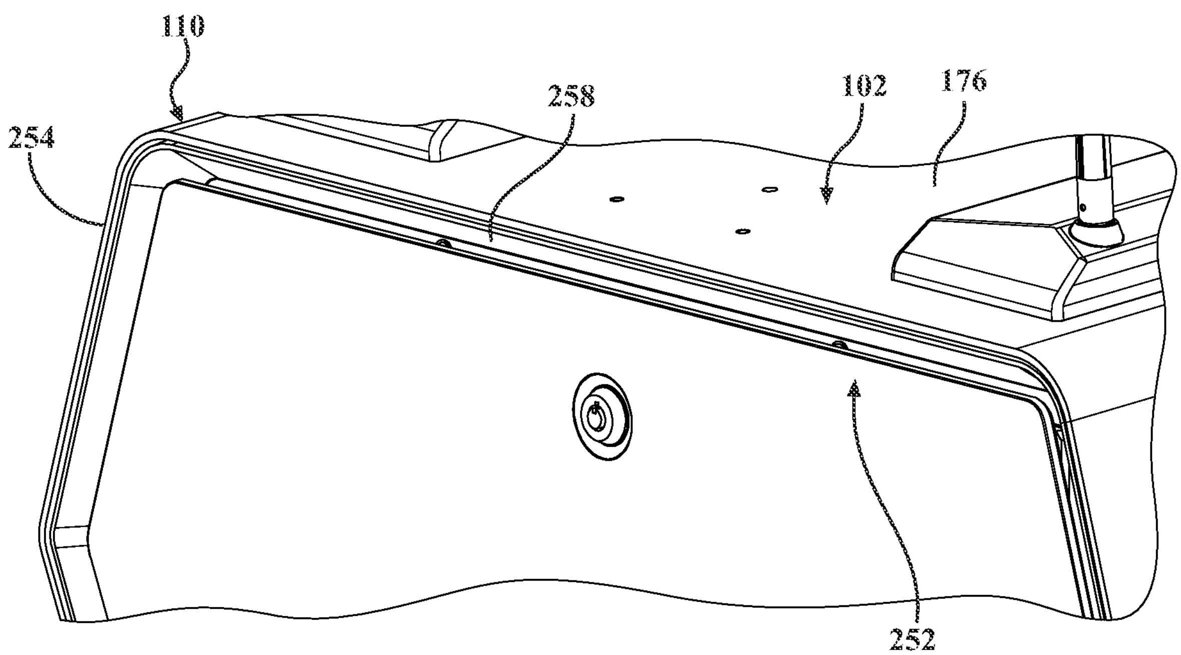
FIG. 65 is a partial, rear, perspective view of the base station illustrating one or more channels that collect and direct water.
Figure 67:
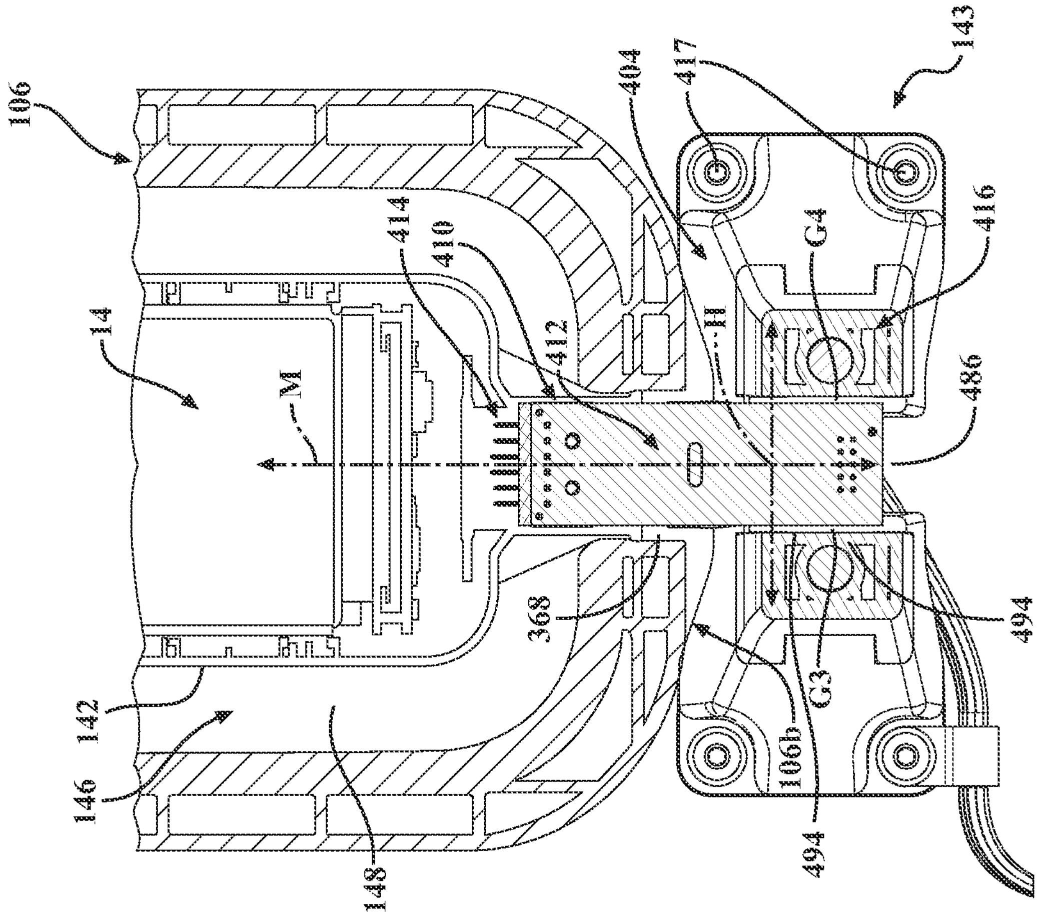
FIG. 67 is a partial, top, plan view of the UAV and the charging hub shown with the cap removed.
Figure 66:
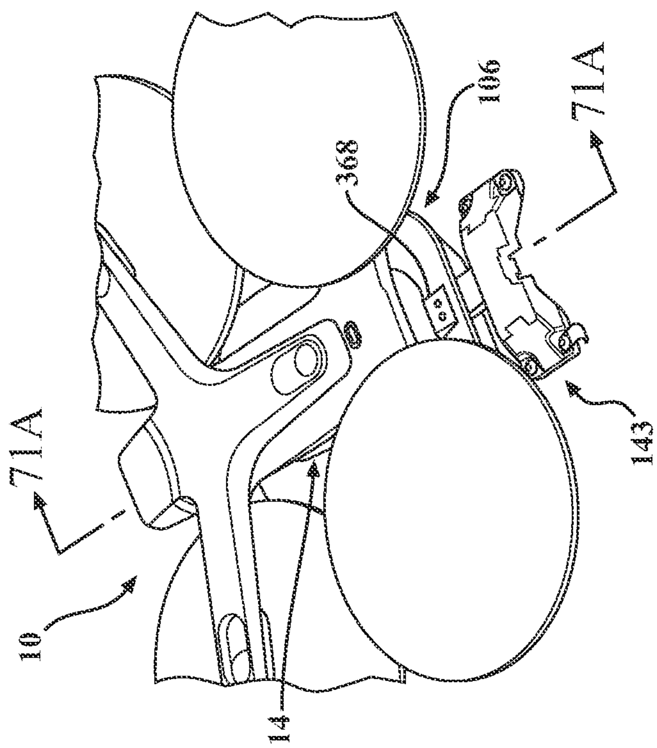
FIG. 66 is a top, perspective view of the UAV shown connected to a charging hub of the base station, which includes: a base; an alignment bracket; one or more biasing members; a charging member; and a cap.

In the particular embodiment of the base station 100 illustrated in FIG. 65, the channel 252 is defined by an (molded) insert 258 that is incorporated into the outer housing 110. It is envisioned, however, that the channel(s) 252 may be configured in any manner suitable for the intended purpose of collecting and/or directing water in the manner described herein. For example, embodiments are also envisioned in which the channel(s) 252 may be integrally (e.g., monolithically) formed with the outer housing 110.

In certain embodiments of the disclosure, to further inhibit (if not entirely prevent) water penetration, it is envisioned that the enclosure 102 may include one or more seals, gaskets, etc., that are associated with the channel(s) 252. For example, it is envisioned that such seals, gaskets, etc., may be positioned about the insert 258 and supported by the inner housing 108 and/or the outer housing 110.

It should be appreciated that any of the aforementioned components and/or systems may be omitted in order to reduce the overall cost and complexity of the base station 100. For example, in hot (e.g., desert) climates, it is envisioned that the heating element(s) 244*a* may be eliminated.

Visualization System

With reference now to FIG. 1, the visualization system 174 includes a digital image capturing device 260 (e.g., a digital camera) or the like. It is envisioned that the visualization system 174 may be connected to any suitable power source, whether internal to the base station 100 (e.g., to the power supply controlled by the main board/processor) or external (e.g., to a separate power supply, battery, or the like).

In the particular embodiment of the disclosure illustrated, the visualization system 174 includes a single digital image capturing device 260 that is secured (connected, mounted) to, or otherwise supported by, the forward frame 116 of the outer housing 110, which supports observation and visual analysis of the environment in which the base station 100 is located as well as observation and visual analysis of the UAV 10 (FIG. 2) prior to takeoff, during takeoff, and during landing. It should be appreciated, however, that the number of digital image capturing devices 260 and/or the location of the digital image capturing device(s) 260 may be varied in alternate embodiments without departing from the present disclosure. For example, embodiments including one or more additional digital image capturing devices 260 are also envisioned herein.

During operation of the base station 100, the visualization system 174 supports visual inspection of the environment, which not only improves safety of the base station 100 and the UAV 10 by confirming the absence of people, animals, etc., prior to takeoff, during takeoff, and during landing of the UAV 10, but functionality of the base station 100 as well. For example, it is envisioned that the visualization system 174 may be configured to identify precipitation (e.g., snow, ice, rain, etc.) and actuate (trigger) operation of the heating element(s) 244*a* (FIGS. 53A, 53B), the internal fan(s) 248 (FIG. 64), or other such systems. It is also envisioned that the visualization system 174 may be utilized to inspect the UAV 10 (e.g., prior to takeoff and/or during docking) and identify any damage that may result in subsequent suboptimal performance.

Charging of the UAV

With reference now to FIGS. 66-75, charging of the UAV 10 will be discussed. As indicated above, upon docking with the base station 100, the UAV 10 and the power source 14 are received by the cradle 106, which facilitates alignment and engagement with the charging hub 143. The charging hub 143 is configured for electrical connection to any suitable power source, whether internal to the base station 100 or external, and includes: a base 404; an alignment bracket 406 that is movably (slidably) supported by the base 404; one or more biasing members 408; a charging member 410 including a PCB 412 and a (male) electrical connector 414; and a cap (cover, lid) 416 that overlies the charging member 410.

Figure 64:
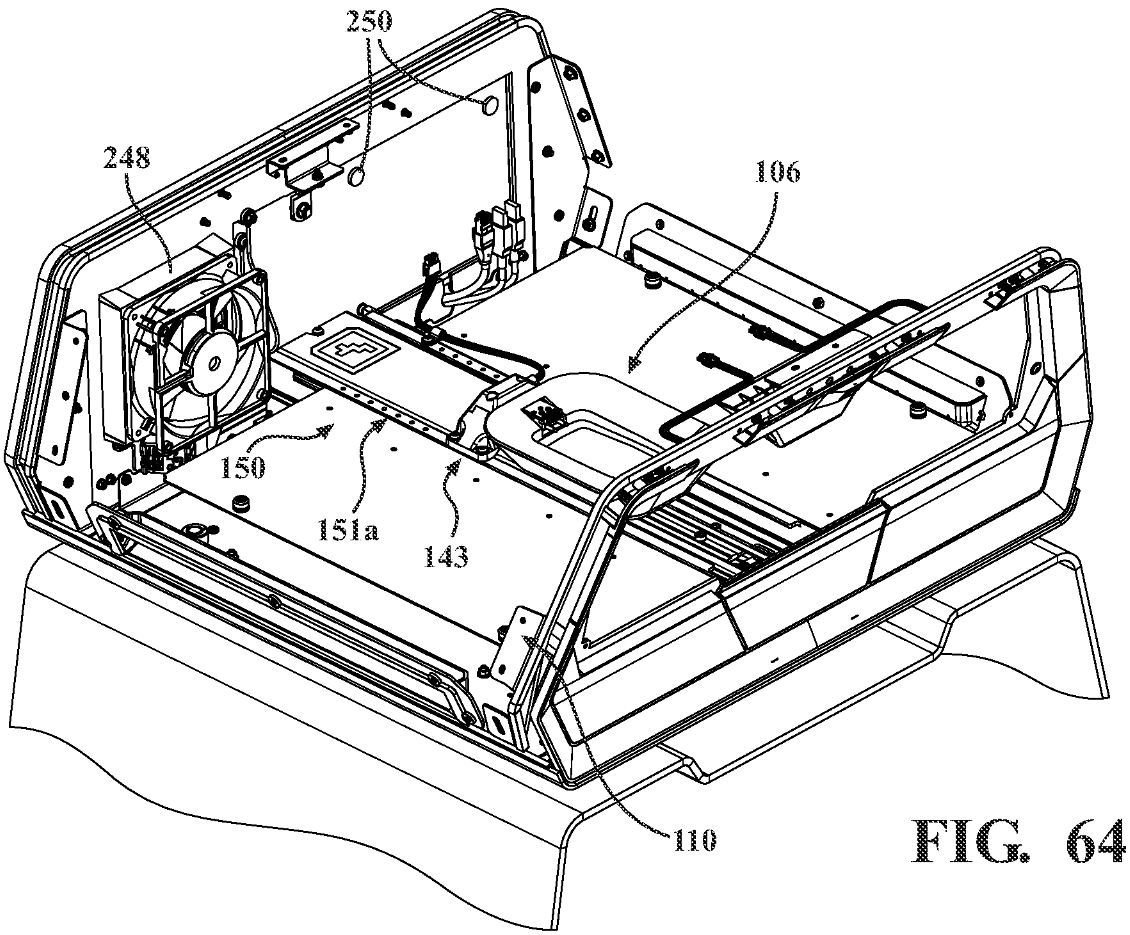
FIG. 64 is a partial, top, schematic view of the base station illustrating an internal fan.

The base 404 is fixedly (non-movably) connected to the enclosure 102 and supports the remaining components of the charging hub 143. More specifically, in the particular embodiment illustrated, the base 404 is fixedly (non-movably) connected to the slide mechanism 150 (e.g., the stationary slide member 151*a*), as seen in FIGS. 10 and 64, for example, by a plurality of mechanical fasteners 417 (FIG. 67) (e.g., screws, pins, bolts, clips, etc.), which fixes the charging hub 143 in relation to not only the enclosure 102, but the cradle 106 and the UAV 10. It should be appreciated, however, that the particular location of the base 404 may be varied in alternate embodiments without departing from the scope of the present disclosure. For example, embodiments are also envisioned in which the base 404 may be connected to the sheet metal base 264 (FIG. 14) of the enclosure 102.

The base 404 defines a cavity (receptacle) 418 (FIG. 71A) that is configured to receive the alignment bracket 406 (and the biasing member(s) 408) such that the alignment bracket 406 is movable within the cavity 418 and in relation to the base 404 during repositioning between a normal (initial, extended) position (FIG. 71A) and a deflected (subsequent, retracted) position (FIG. 71B), as described in further detail below. More specifically, the base 404 includes: a rear end wall 420, which includes a boss (support) 422; a front end wall 424; sidewalls 426, 428; and a base wall 430, which collectively define the cavity 418.

The base wall 430 is configured to support the alignment bracket 406 during repositioning between the normal and deflected positions. The base wall 430 extends between the side walls 426, 428 and includes opposing (rear and front) ends 434, 436 that are spaced from the end walls 420, 424, respectively. More specifically, the ends 434, 436 of the base wall 430 are spaced (axially) from the end walls 420, 424 such that the base 404 defines (first, rear and second, front) openings 438, 440, respectively. The opening 438 is configured to provide access to the cavity 418 during manufacture and assembly of the charging hub 143 (e.g., to facilitate fabrication of the base 404 and the alignment bracket 406) and the opening 440 is configured to receive the alignment bracket 406 such that the alignment bracket 406 is insertable into the base 404 during assembly of the charging hub 143.

The base wall 430 defines a guide surface 442 (FIG. 73) that is configured for contact (engagement) with the alignment bracket 406 during extension and retraction within the cavity 418. In order to facilitate and support proper movement and repositioning of the alignment bracket 406, the (front) end 436 of the base wall 430 includes a chamfered (beveled) surface 444 that is configured for engagement (contact) with the alignment bracket 406 so as to direct the alignment bracket 406 into contact (engagement) with the guide surface 442 and thereby inhibit jamming.

The alignment bracket 406 supports (and is connected to) the charging member 410 and facilitates proper alignment between the UAV 10 and the charging hub 143 during retraction of the cradle 106 and, thus, electrical connection of the charging member 410 and the power source 14 of the UAV 10. In the particular embodiment illustrated, the alignment bracket 406 is unitary (e.g., monolithic) in construction and is formed from a single piece of material. In alternate embodiments of the disclosure, however, it is envisioned that the alignment bracket 406 may include a series of individual components that are connected together in any suitable manner (e.g., via one or more mechanical fasteners, in an interference fit, etc.). As described in detail below, the alignment bracket 406 includes: a head section 448; a body 450 that extends from the head section 448; and a leg 452 that extends from the body 450.

The head section 448 defines (first and second) platforms 454, 456 that are configured to support the PCB 412 and the electrical connector 414, respectively, and includes one or more alignment members 458. The platform 454 defines an aperture 460 that is configured to receive a mechanical fastener 462 (FIG. 72) (e.g., a screw, a pin, a bolt, a clip, etc.), which releasably and fixedly (non-movably) connects the charging member 410 and the alignment bracket 406 such that the charging member 410 and the alignment bracket 406 are movable in unison (contemporaneously), along an axis of movement M, during repositioning of the alignment bracket 406 between the normal and deflected positions.

The alignment member(s) 458 extends axially forward of the charging member 410 (e.g., the electrical connector 414) along the axis of movement M and are configured for insertion into a receptacle 464 defined by the power source 14 of the UAV 10 so as to facilitate proper positioning of the charging member 410 and electrical connection to the UAV 10, as described in further detail below. In the particular embodiment illustrated, the alignment bracket 406 includes a pair of alignment members 458*i*, 458*ii* that are each configured as a pin 466. It should be appreciated, however, that the particular number and/or configuration of the alignment members 458 may be altered in various embodiments without departing from the scope of the present disclosure. For example, an embodiment of the alignment bracket 406 including a single alignment member 458 is also envisioned herein.

In order to improve tolerances, the alignment member 458 includes a tapered (conical) end 468 and the receptacle 464 includes chamfered (beveled) mouth 470. The tapered end 468 of the alignment member 458 and the chamfered mouth 470 of the receptacle 464 allow and account for any offset (misalignment) therebetween and thereby facilitate proper insertion of the alignment member 458 into the receptacle 464

The body 450 of the alignment bracket 406 extends rearwardly from the head section 448 and defines a recess 472 (FIG. 71A), which extends between the head section 448 and the leg 452. The recess 472 is configured to receive the end wall 424 (defining the cavity 418 in the base 404) such that the end wall 424 spaced an axial distance D from the head section 448 of the alignment member 458, which extends in parallel (or generally parallel) relation to the axis of movement M. During retraction of the alignment bracket 406 (e.g., as the UAV 10 is connected to charging hub 143), the end wall 424 moves forwardly through the recess 472 (e.g., towards the head section 448 of the alignment member 458), and during extension of the alignment bracket 406 (e.g., as the UAV 10 is disconnected from charging hub 143), the end wall 424 moves rearwardly through the recess 472 (e.g., towards the leg 452). The range of (maximum) relative motion between the alignment bracket 406 and the base 404 is thus equivalent to (defined by) the distance D between the end wall 424 of the base 404 and the head section 448 of the alignment member 458.

The leg 452 extends vertically upward from the body 450 of the alignment bracket 406 in parallel (or generally parallel) relation to the head section 448 and includes a boss (support) 474 and an anchor (foot) 476. The boss 474 extends rearwardly from the leg 452 (e.g., away from the head section 448) and is (vertically) aligned (or generally aligned) with the boss 422 so as to facilitate engagement of (contact between) the bosses 422, 474 upon movement of the alignment member 458 into the deflected position (FIG. 71B), whereby the bosses 422, 474 collectively define a hard stop 477 that prevents overtravel of the alignment bracket 406 and, thus, the charging member 410 and the electrical connector 414. In certain embodiments of the disclosure, it is also envisioned that bosses 422, 474 may be formed and accessed through the opening 438 in the base 404 (e.g., during injection molding) and that the bosses 422, 474 may provide location features (reference points) to facilitate proper assembly of the charging hub 143.

Figure 72:
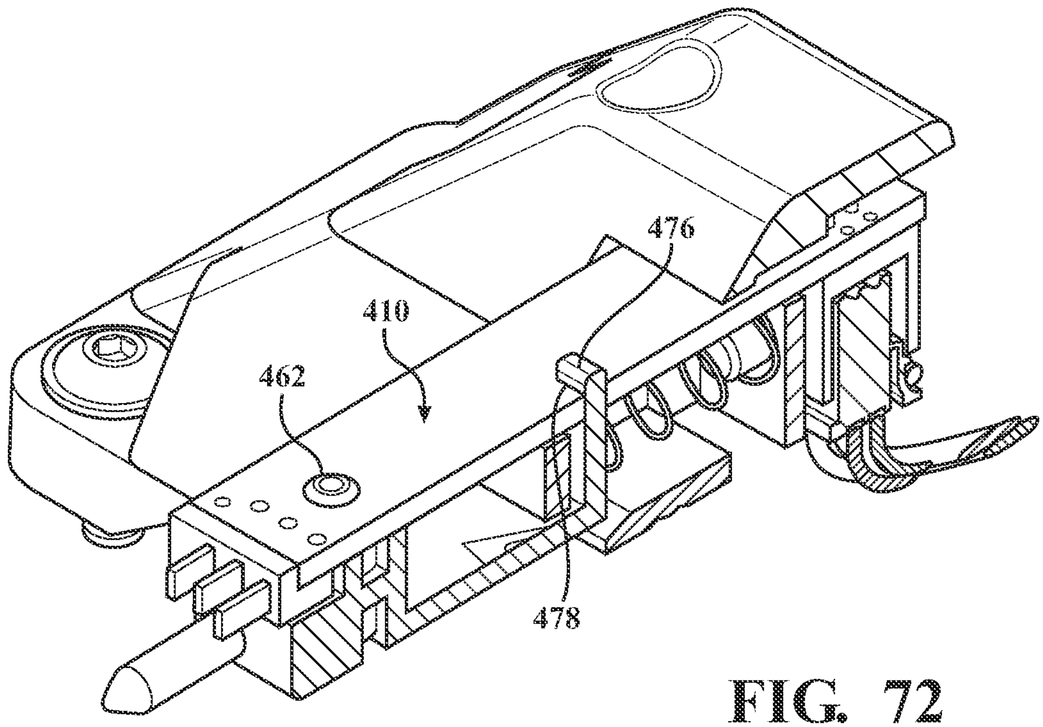
FIG. 72 is a partial, longitudinal, cross-sectional view of the charging hub.
Figure 73:
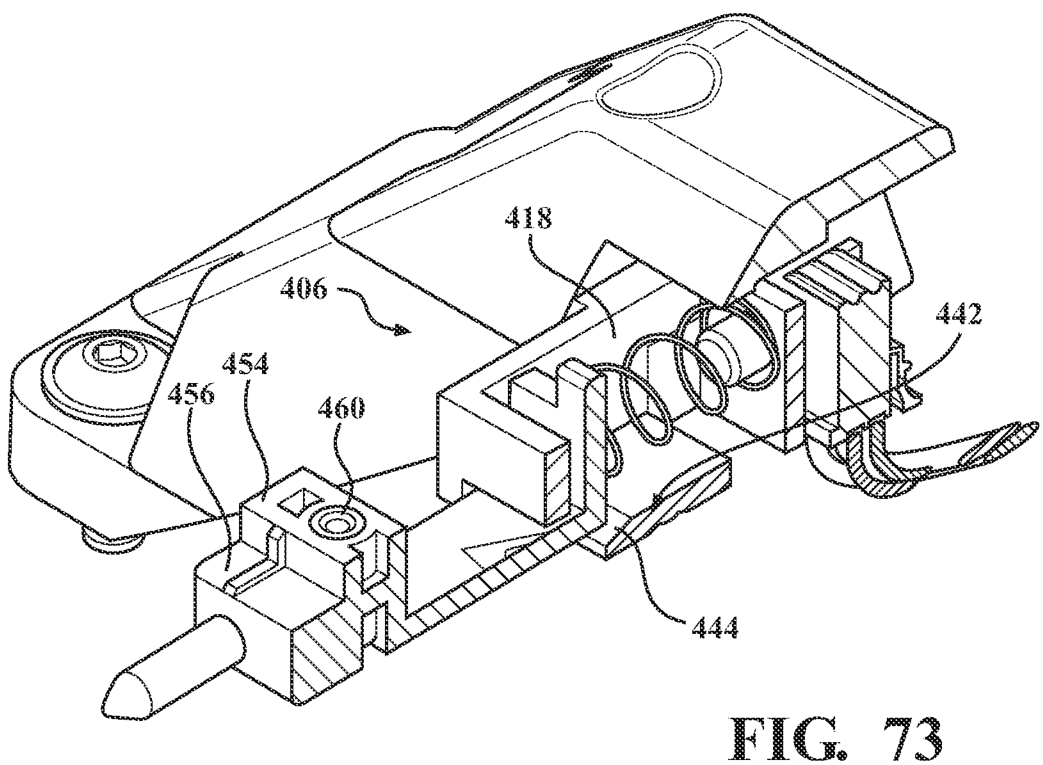
FIG. 73 is a partial, longitudinal, cross-sectional view of the charging hub shown with the charging member removed.

As seen in FIG. 72, the anchor 476 is configured for insertion into a corresponding opening 478 in the charging member 410 (e.g., the PCB 412). Positioning of the anchor 476 within the opening 478 further facilitates connection of the charging member 410 to the alignment bracket 406 and inhibits (if not entirely prevents) relative movement therebetween such that the charging member 410 moves concomitantly with the alignment bracket 406 during retraction and extension.

Figure 74:
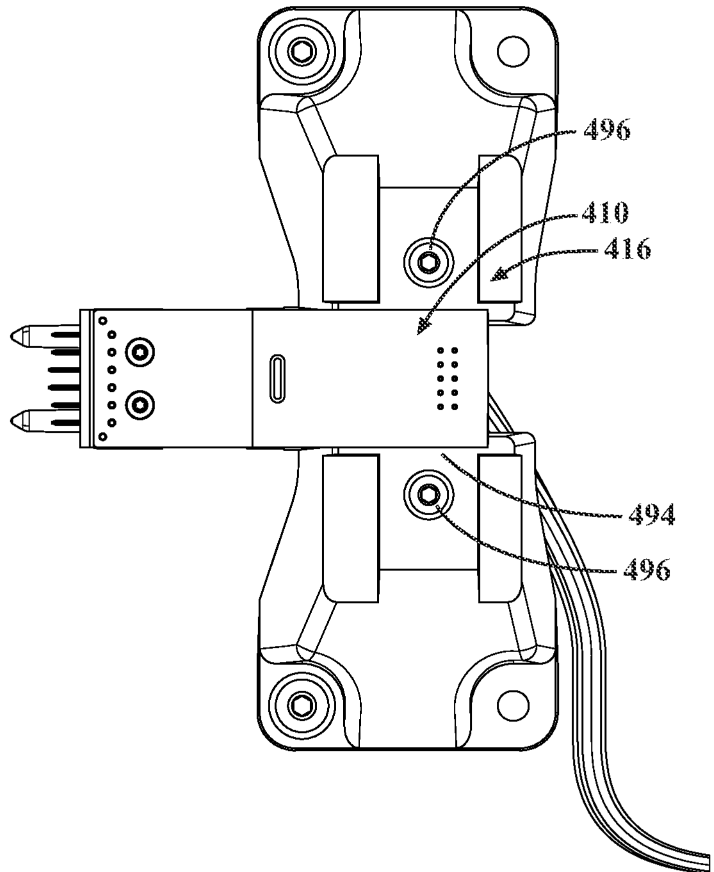
FIG. 74 is a top, plan view of the charging hub shown with the cap removed.
Figure 75:
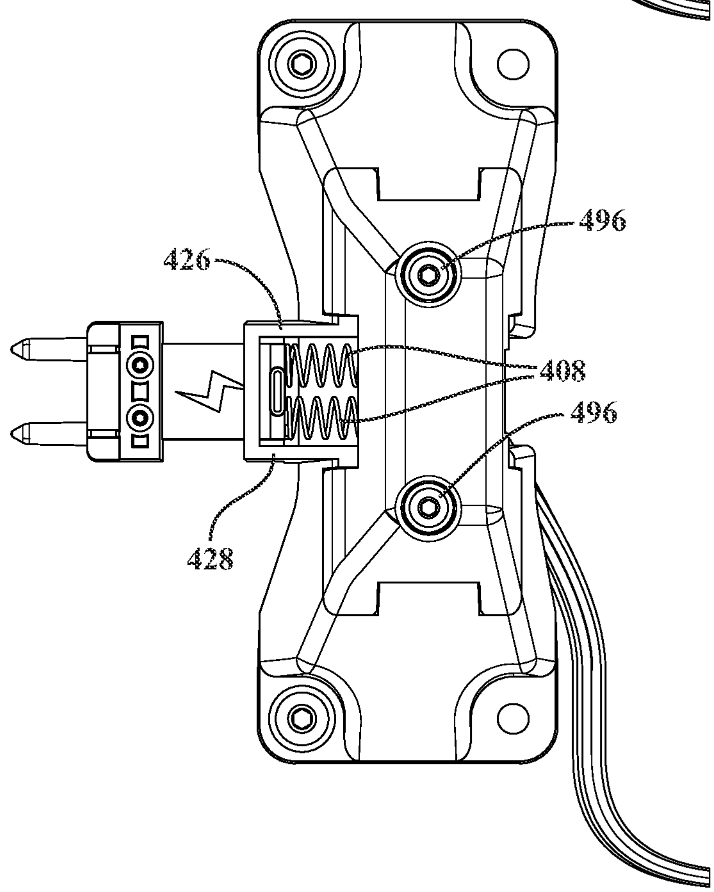
FIG. 75 is a top, plan view of the charging hub according to one embodiment of the disclosure, which includes a pair of biasing members.
Figure 76:
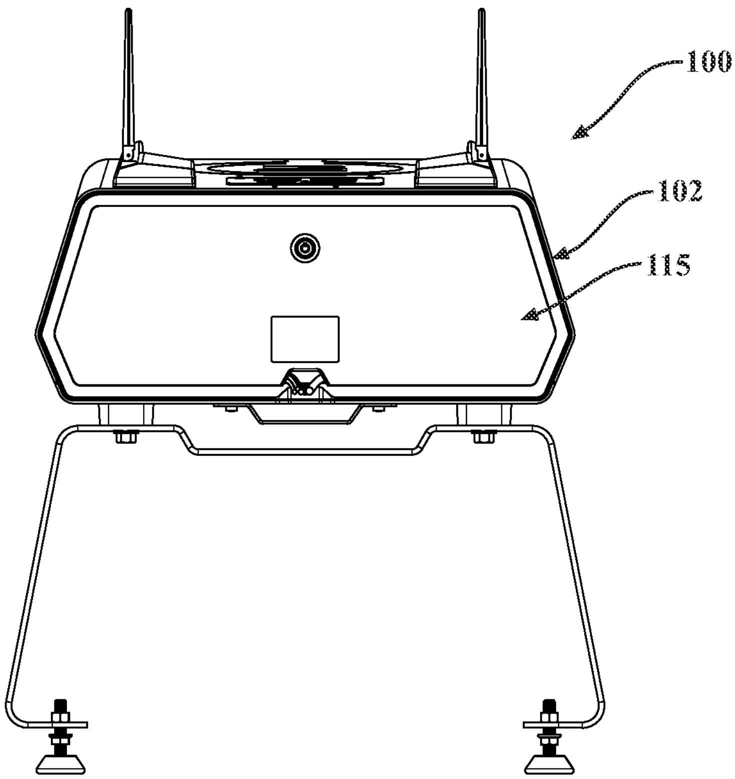
FIG. 76 is a rear, plan view of the base station.

In the particular embodiment illustrated in FIGS. 66-74, the charging hub 143 includes a single biasing member 408 that is configured as a coil spring 480. It should be appreciated, however, that the particular number and/or configuration of the biasing member(s) 408 may be varied in alternate embodiments without departing from the scope of the present disclosure. For example, FIG. 75 illustrates an embodiment of the charging hub 143 that includes a pair of biasing members 408.

The biasing member 408 is located within the cavity 418 and is captured between the alignment bracket 406 and the base 404. More specifically, the biasing member 408 includes a first (rear) end 482 that engages (contacts) the base 404 and a second (front) end 484 that engages (contacts) the alignment bracket 406. More specifically, the first end 482 of the biasing member 408 is supported by (connected to) the boss 422 and the second end 484 of the biasing member 408 is supported by (connected to) the boss 474, whereby the biasing member 408 is (vertically) offset from the alignment member(s) 458 along a (vertical) axis V that extends in orthogonal (or generally orthogonal) relation to the axis of movement M.

The charging hub 143 (e.g., the base 404 and the alignment bracket 406) is configured such that the biasing member 408 carries a preloaded force, whereby the biasing member 408 sits in compression between the alignment bracket 406 and the base 404 (e.g., between the bosses 422, 474). The preload carried by the biasing member 408 biases (urges) the alignment bracket 406 towards the normal position and increases alignment between the charging member 410 and the power source 14 of the UAV 10 to facilitate proper electrical connection thereof.

Figure 71A:
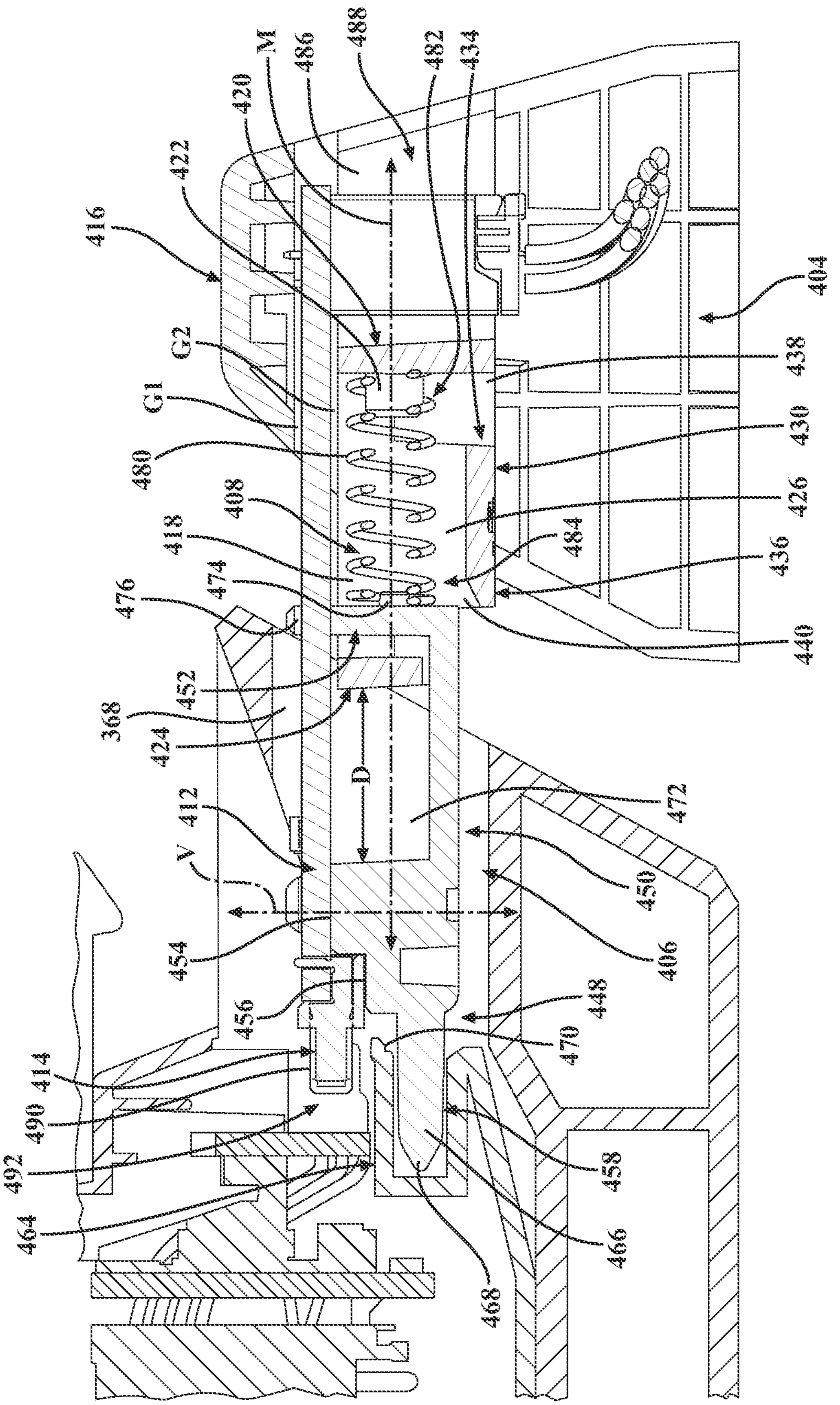
FIG. 71A is a longitudinal, cross-sectional view of the UAV and the charging hub taken along line 71A-71A in FIG. 66 with the alignment bracket shown in a normal position.
Figure 71B:
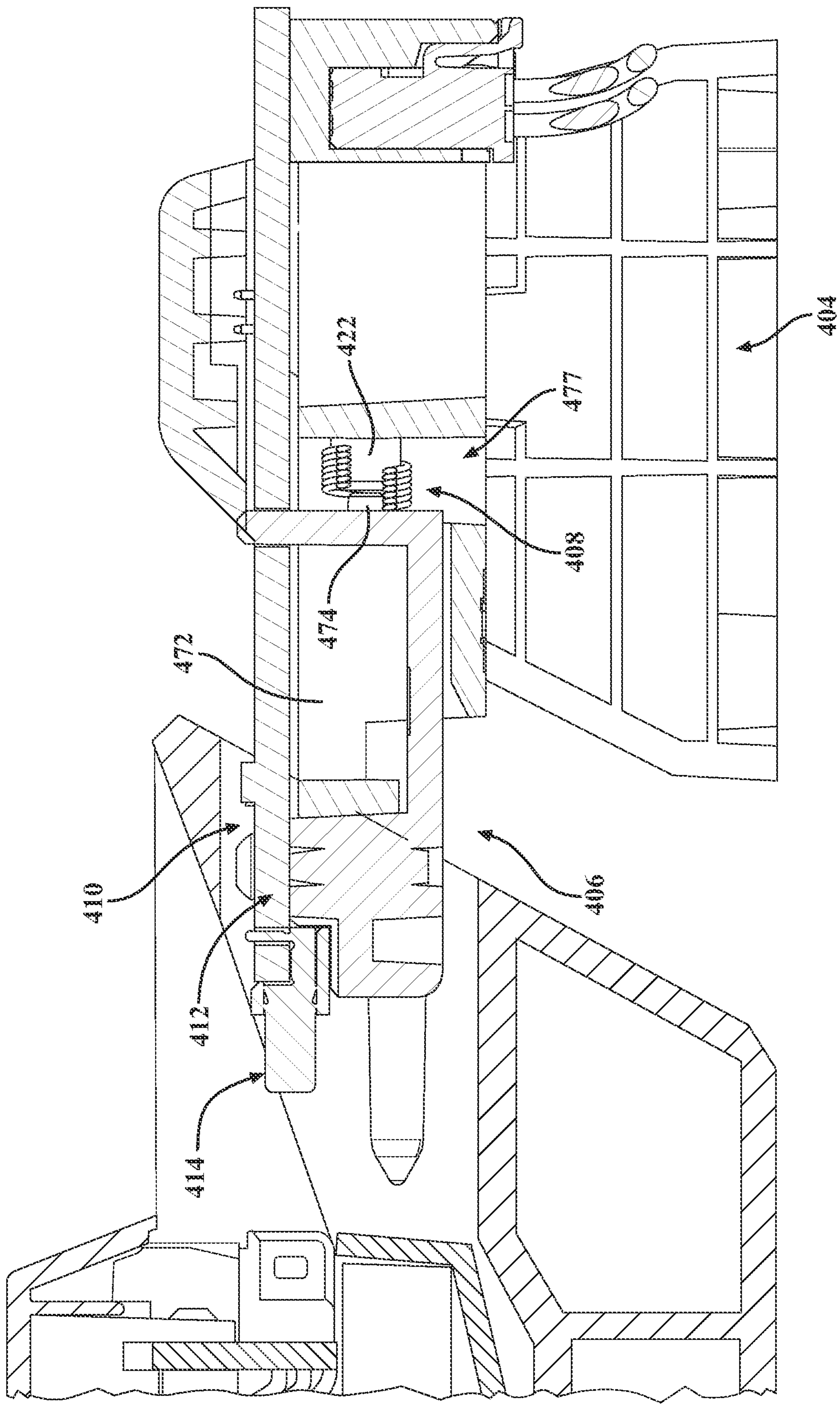
FIG. 71B is a longitudinal, cross-sectional view of the UAV and the charging hub with the alignment bracket shown in a deflected position.

The charging member 410 includes the PCB 412 and the electrical connector 414 mentioned above and is configured for electrical connection to the power source 14 of the UAV 10. The electrical connector 414 is fixedly connected (e.g., soldered) to the PCB 412 so as to inhibit (if not entirely prevent) relative movement therebetween, whereby the electrical connector 414 moves concomitantly (simultaneously) with the PCB 412 and the alignment bracket 406 during repositioning of the alignment bracket 406 between the normal and deflected positions. To allow for axial displacement (movement) of the PCB 412 and the electrical connector 414 during repositioning of the alignment bracket 406, the charging hub 143 includes an opening 486 (FIGS. 67, 70, 71A) defined in a rear end 488 thereof. The opening 486 is configured to receive the PCB 412 and the electrical connector 414 and allows the PCB 412 and the electrical connector 414 to exit and re-enter the charging hub 143 (e.g., the base 404) during retraction and extension of the alignment bracket 406. As seen in FIG. 71A, for example, the PCB 412 and the electrical connector 414 are configured and positioned such that they are concealed by the charging hub 143 when the alignment bracket 406 is in the normal position.

Together, the PCB 412 and the electrical connector 414 establish and control (regulate) electrical connection and communication between the charging hub 143 and the power source 14 of the UAV 10. More specifically, the PCB 412 and the electrical connector 414 allow for the transmission of data between the UAV 10 and the base station 100 (via the charging hub 143) including, for example, the temperature of the power source 14, the voltage in each of the power cell(s) 20 (FIG. 5), the occurrence of an undervoltage event, the number charge cycles, information pertaining to the general health and status of the power source 14, etc.

The electrical connector 414 is configured for insertion into an opening 490 on the power source 14 of the UAV 10 through the charging window 368 (FIGS. 66, 67, 71A) defined in the rear end 106*b* of the cradle 106. The charging window 368 is configured to receive the charging member 410 such that the charging member 410 moves into and out of the cradle 106 during repositioning of the slide mechanism 150 and the cradle 106 between the extended and retracted positions. Upon insertion of the charging member 410 through the charging window 368, the electrical connector 414 engages a corresponding (female) electrical connector 492 on the power source 14 so as to establish an electrical connection between the base station 100 (e.g., the charging hub 143) and the UAV 10 that facilitates charging of the power source 14.

In certain embodiments of the disclosure, it is envisioned that the charging window 368 may be reconfigurable between an open position, in which the charging member 410 is receivable by the charging window 368, and a closed position, in which the charging window 368 is concealed, so as to inhibit (if not entirely prevent) unintended contact between the UAV 10 and the cradle 106 (e.g., abutment of the charging member 410 with the walls defining the charging window 368). For example, it is envisioned that the cradle 106 may include a movable door that is configured to expose the charging window 368 in the open position and conceal the charging window 368 in the closed position.

Figure 68:
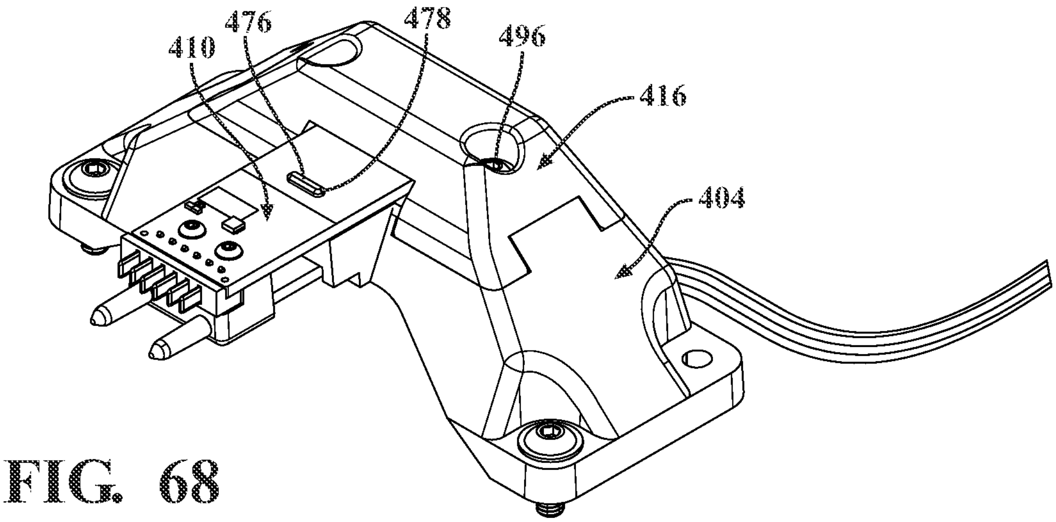
FIG. 68 is a top, perspective view of the charging hub shown separated from the UAV.
Figure 69:
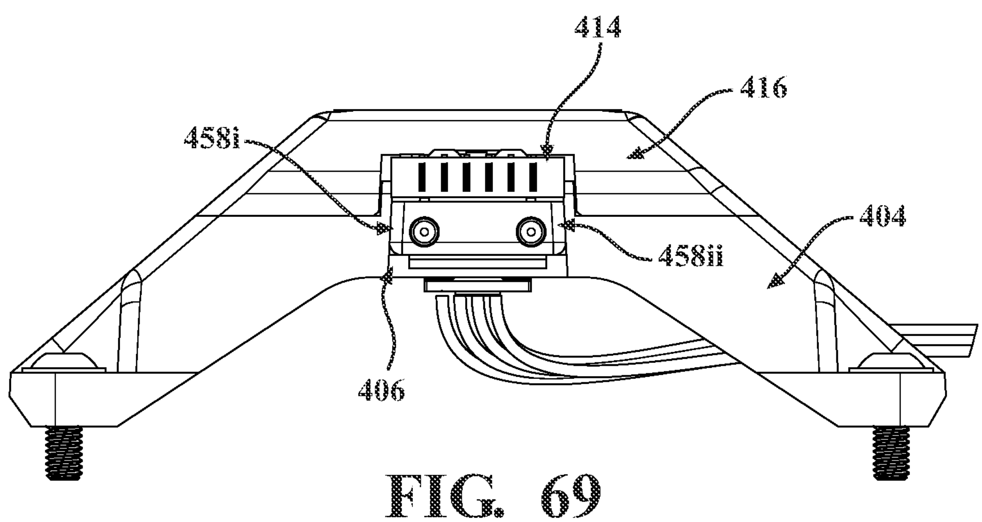
FIG. 69 is a front, plan view of the charging hub.
Figure 70:
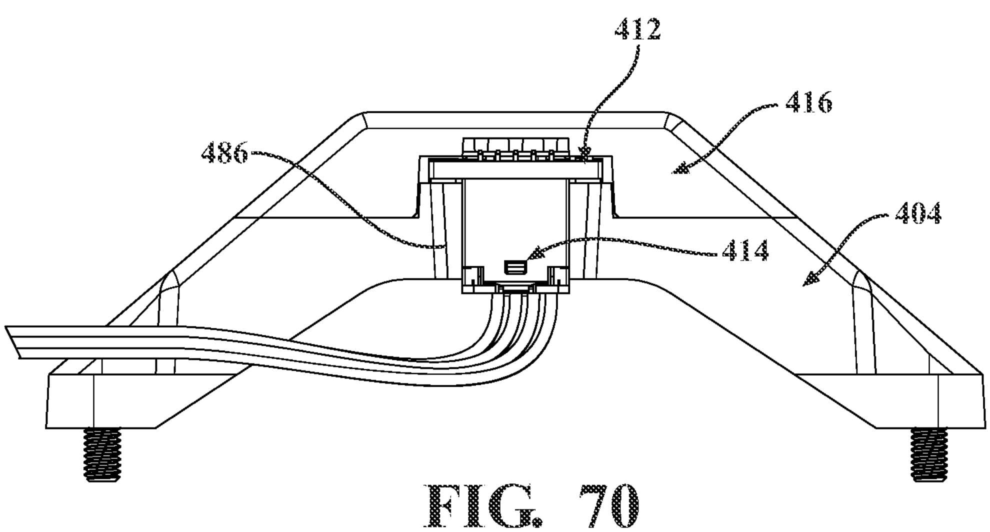
FIG. 70 is a rear, plan view of the charging hub

The cap 416 defines a channel 494 (FIGS. 67, 74) that is configured to receive the charging member 410, which allows for movement of the charging member 410 in relation to the cap 416 (and the base 404), as described in further detail below. The cap is releasably connected to the base 404 by a plurality of mechanical fasteners 496 (e.g., screws, pins, bolts, clips, etc.) (FIGS. 68, 74, 75). The cap 416 thus inhibits (if not entirely prevents) rotation (twisting) of the alignment bracket 406 and the charging member 410 in relation to the base 404 that may otherwise occur during insertion of the alignment member(s) 458 into the receptacle 464 (e.g., during repositioning the alignment bracket from the normal position into the deflected position) as a result of the vertical offset between the alignment member(s) 458 and the biasing member 408.

During connection of the UAV 10 to the charging hub 143, it is envisioned that misalignment may occur between the charging member 410 and the power source 14 of the UAV 10. For example, misalignment may occur as a result of variability in seating of the UAV 10 within the cradle 106, exchange (replacement) of the power source 14, which may result in seating of the UAV 10 in a different position within the cradle 106, etc. Any such misalignment, however, is accommodated by axial, vertical, and horizontal tolerances (gapping), which allows for movement of the alignment bracket 406 and the charging member 410 in relation to the base 404 and the cap 416 in three degrees of freedom. More specifically, axial movement (floating, displacement) of the charging member 410 along the axis of movement M (FIG. 71A) is tolerated via repositioning of the alignment bracket 406 (and the charging member 410) between the normal position (FIG. 71A) and the deflected position (FIG. 71B), which is facilitated by the cavity 418 in the base 404 and the axial separation between the end wall 424 and the head section 448 of the alignment bracket 406. Additionally, the charging hub 143 is configured so as to define vertical gaps G1, G2 (FIG. 71A) between the base 404, the charging member 410, and the cap 416, which allow for movement (floating, displacement) of the charging member 410 along the vertical axis V as well as (lateral) horizontal gaps G3, G4 (FIG. 67) between the charging member 410 and the cap 416, which is facilitated by the relative dimensioning of the charging member 410 and the channel 494. The gaps G3, G4 allow for movement (floating, displacement) of the charging member 410 within the channel 494 along a horizontal axis H, which extends in orthogonal (or generally orthogonal) relation to the axis of movement M and the vertical axis V (FIG. 71A).

The axial, vertical, and horizontal tolerances described above not only facilitate more robust, consistent connection of the UAV 10 and the charging hub 143, but protects the UAV 10, the charging hub 143, and the base station 100 during retraction of the cradle 106 and the UAV 10. For example, in instances of gross misalignment (e.g., when connection of the charging member 410 to the power source 14 is physically impossible), retraction of the alignment bracket 406 and the charging member 410 inhibits (if not entirely prevents) damage to the UAV 10, the charging member 410, etc. (e.g., puncturing of the UAV 10, unseating of the UAV 10 from the cradle 106, etc.).

With continued reference to FIGS. 66-74, a method of using the base station 100 to charge the UAV 10 (e.g., the power source 14) will be discussed. Initially, the UAV 10 is docked within the cradle 106, during which, the power source 14 is guided into the chamber 142 (FIG. 67) by the sidewalls 146 and the angled guide surface 148. After docking with the cradle 106, the cradle 106 is retracted into the enclosure 102 via repositioning of the slide mechanism 150 from the extended position into the retracted position, during which, the charging hub 143 is inserted into the cradle 106. More specifically, as the slide mechanism 150 (and the cradle 106) moves into the retracted position, the alignment bracket 406 is inserted into the receptacle 464 defined by the power source 14 of the UAV 10, as seen in FIG. 71A, which facilitates proper positioning of the charging member 410 and alignment of the electrical connector 414 with the opening 490 on the power source 14. Continued retraction of the cradle 106 causes insertion of the charging member 410 into the power source 14 (via the opening 490) and, thus, engagement (contact) between the electrical connectors 414, 492 so as to establish an electrical connection between the power source 14 and the charging hub 143.

During retraction of the cradle 106, biasing of the alignment bracket 406 towards the normal position (FIG. 71A) supports a proper electrical interface between the electrical connectors 414, 492. Additionally, the axial tolerance created by the configuration of the base 404 and the alignment bracket 406 and the inclusion of the biasing member 408 allows for repositioning of the alignment bracket 406 between the normal position (FIG. 71A) and the deflected position (FIG. 71B) as necessary so as to accommodate misalignment between the UAV 10 and the charging hub 143, during which, the biasing member 408 is compressed, which increases the preloaded force carried by the biasing member 408.

Serviceability of Electronic Modules

With reference now to FIGS. 76-88, the base station 100 includes a plurality of electronic modules that are configured to control certain functional aspects of the base station 100. More specifically, in the particular embodiment of the disclosure illustrated, the base station 100 includes a (first) electronics module 500; a (second) electronics module 502; and a third electronics module 504. As described in further detail below, each of the electronics modules 500, 502, 504 is specifically configured and positioned for individual connection to and disconnection from the base station 100, which allows each of the electronics modules 500, 502, 504 to be removed separately (e.g., for repair, service, replacement, etc.), thereby reducing downtime of the base station 100.

Figure 78:
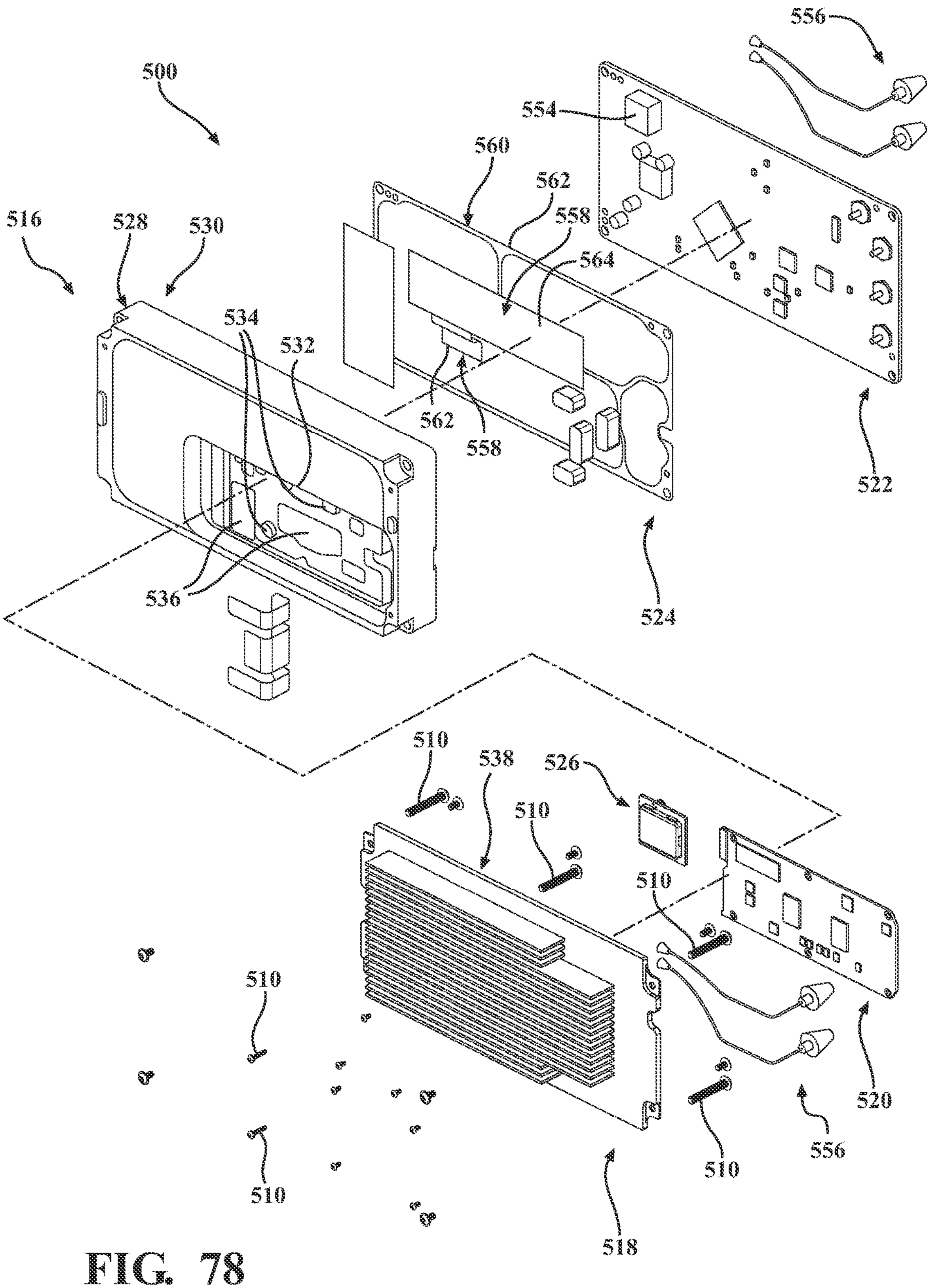
FIG. 78 is a front, perspective view of the electronics module seen in FIG. 77 with parts separated.
Figure 83:
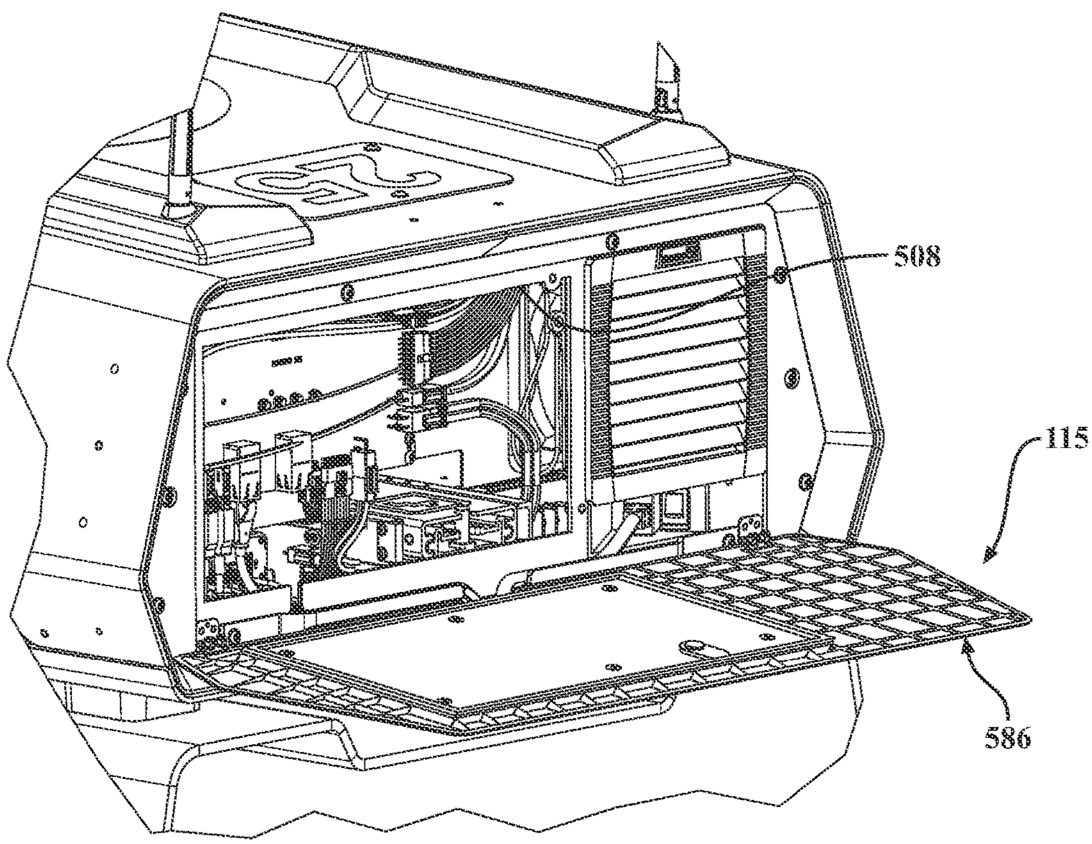
FIG. 83 is a rear, perspective view of the base station with a rear door thereof shown in an open position.

The electronics module 500 is supported by the enclosure 102 and is housed behind (inwardly of) a rear door 115 of the base station 100, which represents an alternate embodiment of the aforementioned access panel 114 (FIG. 7) and is hingedly connected to the rear end 102*b* of the enclosure 102 such that the rear door 115 is repositionable between a closed position (FIG. 76) and an open position (FIG. 83). More specifically, the electronics module 500 is removably connected to a rear frame 506 of the outer housing 110 and is positioned adjacent to the (rear) door 115 within an access window 508 defined by the rear frame 506. In the particular embodiment illustrated, the electronics module 500 is secured (connected) to the rear frame 506 by a plurality of mechanical fasteners 510 (FIG. 78) (e.g., screws, pins, bolts, clips, etc.) and is positioned in a (rear) upper corner section 512 of the base station 100 (e.g., to increase ease of access to the electronics module 500 during connection and disconnection). It should be appreciated, however, that the particular location of the electronics module 500 may be altered in various embodiments without departing from the scope of the present disclosure, so long as access to the electronics module 500 in the manner described herein is maintained. For example, embodiments are envisioned in which the electronics module 500 may be connected to the rear frame 506 in a lower corner section 514 of the base station 100. With reference to FIG. 78 in particular, the electronics module 500 includes: a main (first) heat sink 516; an auxiliary (second, supplemental, ancillary) heat sink 518; a logic board 520; a (first) PCBA 522; an interface member 524; and an SD card 526, as described in detail below.

The main heat sink 516 includes (e.g., is formed partially or entirely from) a thermally conductive material (e.g., aluminum) and facilitates the distribution of thermal energy, either away from the electronics module 500 (e.g., in hot environments and/or conditions) or towards the electronics module 500 (e.g., in cold environments and/or conditions). The main heat sink 516 includes a body 528 with a block-style configuration, which provides structural integrity to the electronics module 500 to increase the stability (e.g., rigidity) thereof. The main heat sink 516 thus acts as (and provides) a (first) housing component 530 of the electronics module 500.

The body 528 of the main heat sink 516 defines a cavity (pocket) 532 that includes one or more recesses 534 and one or more standoffs (bosses) 536. The cavity 532 is configured to receive (accommodate, house) the logic board 520 such that the logic board 520 is positioned in engagement (contact) with the standoff(s) 536.

Figure 77:
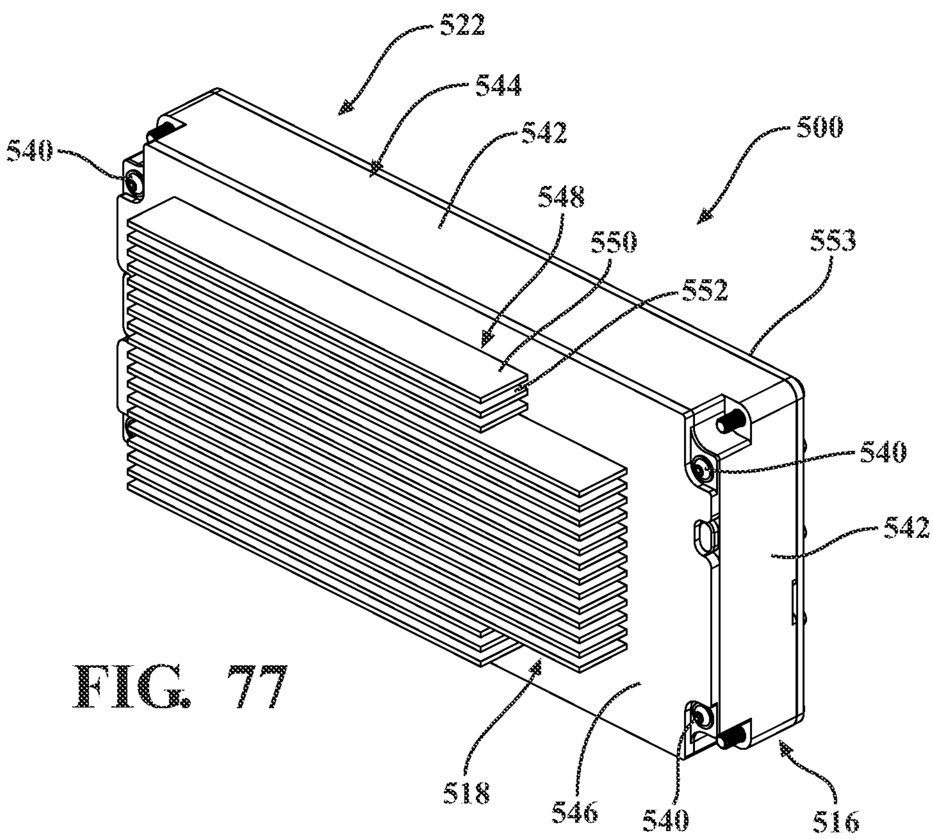
FIG. 77 is a front, perspective view of a (first) electronics module included in the base station.

The auxiliary heat sink 518 is connected to the main heat sink 516 and acts as (and provides) a (second) housing component 538 of the electronics module 500 that supplements the distribution of thermal energy performed by the main heat sink 516. More specifically, in the particular embodiment illustrated, the heat sinks 516, 518 are connected by a plurality of mechanical fasteners 540 (e.g., screws, pins, bolts, clips, etc.), which allows for assembly and disassembly of the electronics module 500 during repair, service, replacement, etc. As seen in FIG. 77, upon connection of the heat sinks 516, 518, the main heat sink 516 defines a plurality of side walls 542 that collectively describe a perimeter 544 of the electronics module 500 and the auxiliary heat sink 518 defines a (first, front) end wall 546 of the electronics module 500.

Like the main heat sink 516, the auxiliary heat sink 518 includes (e.g., is formed partially or entirely from) a thermally conductive material (e.g., aluminum) and facilitates the distribution of thermal energy, either away from the electronics module 500 (e.g., in hot environments and/or conditions) or towards the electronics module 500 (e.g., in cold environments and/or conditions). While the heat sinks 516, 518 are illustrated as including identical materials of construction in the particular embodiment shown, the present disclosure also envisions embodiments in which the heat sinks 516, 518 may include different materials of construction. For example, it is envisioned that the main heat sink 516 may include (e.g., may be formed partially or entirely from) a first material with a first thermal conductivity and that the auxiliary heat sink 518 may include (e.g., may be formed partially or entirely from) a second, different material with a second, different thermal conductivity, which may be greater than or less than the first thermal conductivity.

To increase the available surface area and, thus, the ability of the auxiliary heat sink 518 to distribute thermal energy, in certain embodiments, such as that which is illustrated, the auxiliary heat sink 518 includes one or more diffusers 548, which may be configured in any manner suitable for that intended purpose. For example, in the particular embodiment illustrated, the diffusers 548 are configured as fins 550 that define a plurality of channels 552 therebetween, which collectively direct air flow along the auxiliary heat sink 518 to further increase the distribution of thermal energy. It should be appreciated, however, is envisioned that the diffuser(s) 548 may include any suitable configuration (e.g., pins, protrusions, ribs, or other such surface irregularities) without departing from the scope of the present disclosure.

The logic board 520 supports operation and certain functional aspects of the base station 100 including, for example, temperature control of the power source 14, powering of the heating elements(s) 244*a*, powering of the light source(s) 173, 182, opening and closure of the (front) door 104, extension and retraction of the slide mechanism 150 and the cradle 106, communication between the base station 100, the UAV 10, and/or an external network, etc. As indicated above, the logic board 520 is supported by the main heat sink 516 (e.g., within the cavity 532), whereby the logic board 520 is located between, and is protected by, the heat sinks 516, 518. In certain embodiments of the disclosure, it is envisioned that the cavity 532 (e.g., the recess(es) 534) may include a thermal interface material (e.g., to augment the distribution of thermal energy from the logic board 520 to the main heat sink 516).

The (first) PCBA 522 is supported by (connected to) the main heat sink 516 so as to define a (second, rear) end wall 553 of the electronics module 500. The PCBA 522 is configured to further support operation and certain functional aspects of the base station 100 including, for example,, temperature control of the power source 14, powering of the heating elements(s) 244*a*, powering of the light source(s) 173, 182, opening and closure of the (front) door 104, extension and retraction of the slide mechanism 150 and the cradle 106, etc. To support such operation and functionality, the PCBA 522 includes a processor 554 that is configured to facilitate data processing and control of the base station 100.

In certain embodiments, it is envisioned that the PCBA 522 may also be connected to one or more of the antennas on the base station 100 (e.g., the antenna(s) 166) via one or more antenna ports 556 (FIG. 78). It is envisioned that connection of the PCBA 522 to the antenna(s) 166 may allow for communication over WiFi, LTE, over various frequencies, etc. Although shown as including two antenna ports 556 in the particular embodiment illustrated, it should be appreciated that the particular number of antenna ports 556 may be varied without departing from the scope of the present disclosure.

The interface member 524 physically, thermally, and electrically connects the PCBA 522 and the heat sink 516 and is located therebetween. As seen in FIG. 78, the interface member includes at least one thermally conductive section 558 and at least one electrically conductive section 560. The thermally conductive section(s) 558 include a thermal interface material 562 and physically and thermally connects the PCBA 522 to the main heat sink 516 to facilitate the transfer of thermal energy therebetween. The electrically conductive section(s) 560 include an electrically conductive pressure-sensitive adhesive 564 (e.g., to facilitate connection of the PCBA 522 to the main heat sink 516) and are configured to electrically ground the various components of the PCBA 522 so as to facilitate and increase shielding from electromagnetic interference (EMI) and/or radiofrequency interference (RFI).

The SD card 526 is configured to further support operation and certain functional aspects of the base station 100 by facilitating high-capacity memory and the reading and writing of a data to support processing (e.g., by the PCBA 522). Although illustrated as being supported by (connected to) the logic board 520 in the particular embodiment illustrated, it should be appreciated that the particular location of the SD card 526 may be varied in alternate embodiments without departing from the scope of the present disclosure. For example, embodiments in which the SD card 526 may be supported by (connected to) the PCBA 522 are also envisioned herein.

Figure 79:
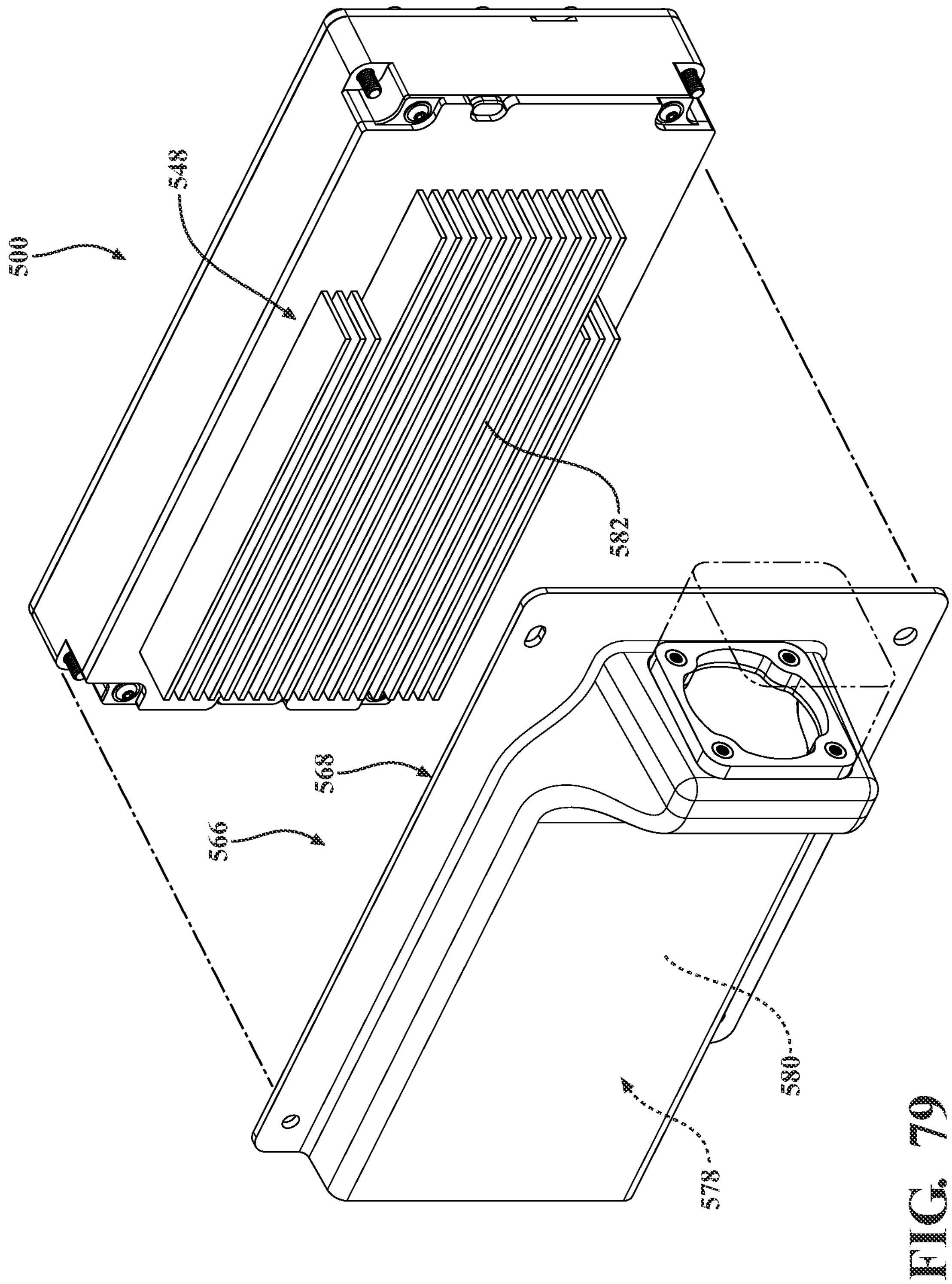
FIG. 79 is a front, perspective view of the electronics module seen in FIG. 77 shown with an air circulation module.
Figure 80:
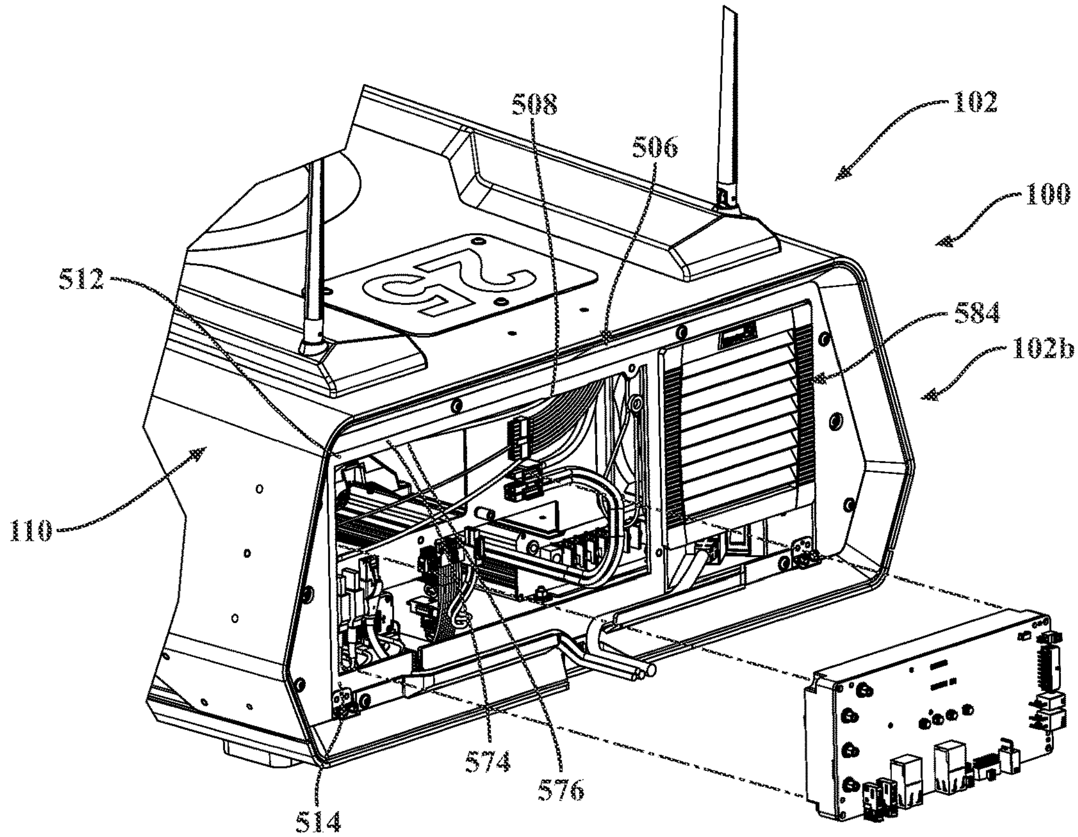
FIG. 80 is a rear, perspective view illustrating connection of the electronics module seen in FIG. 77.
Figure 81:
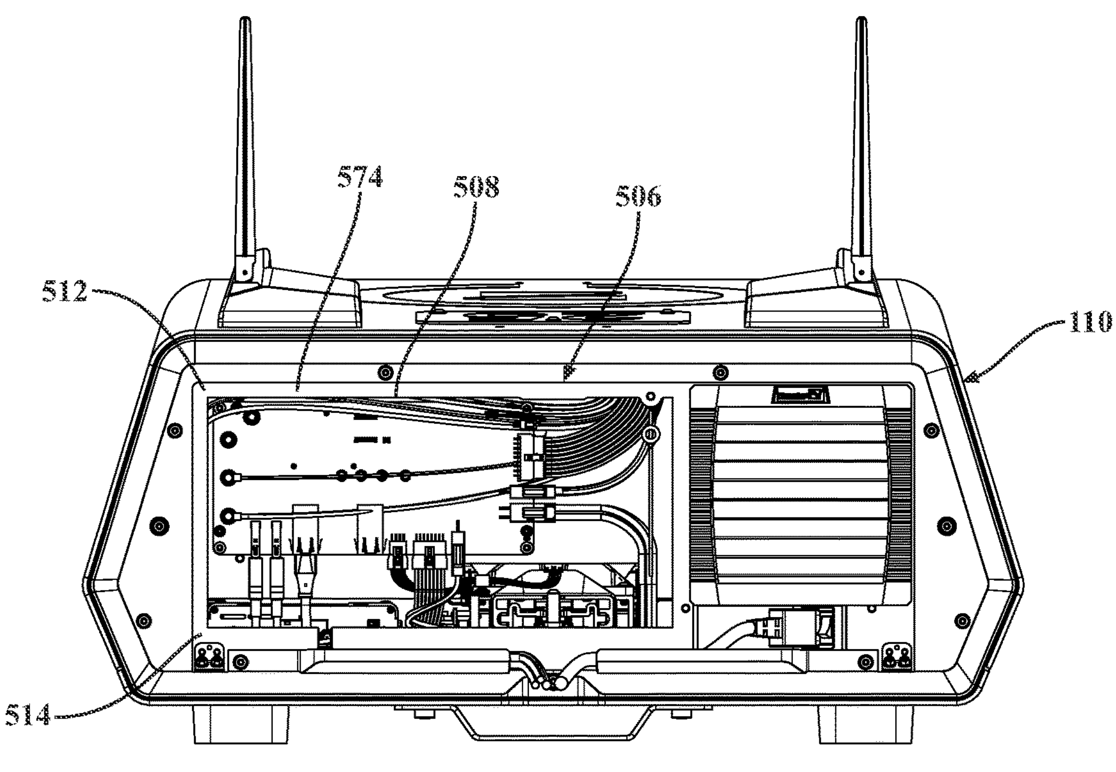
FIG. 81 is a rear, plan view of the base station upon connection of the electronics module seen in FIG. 77.
Figure 82:
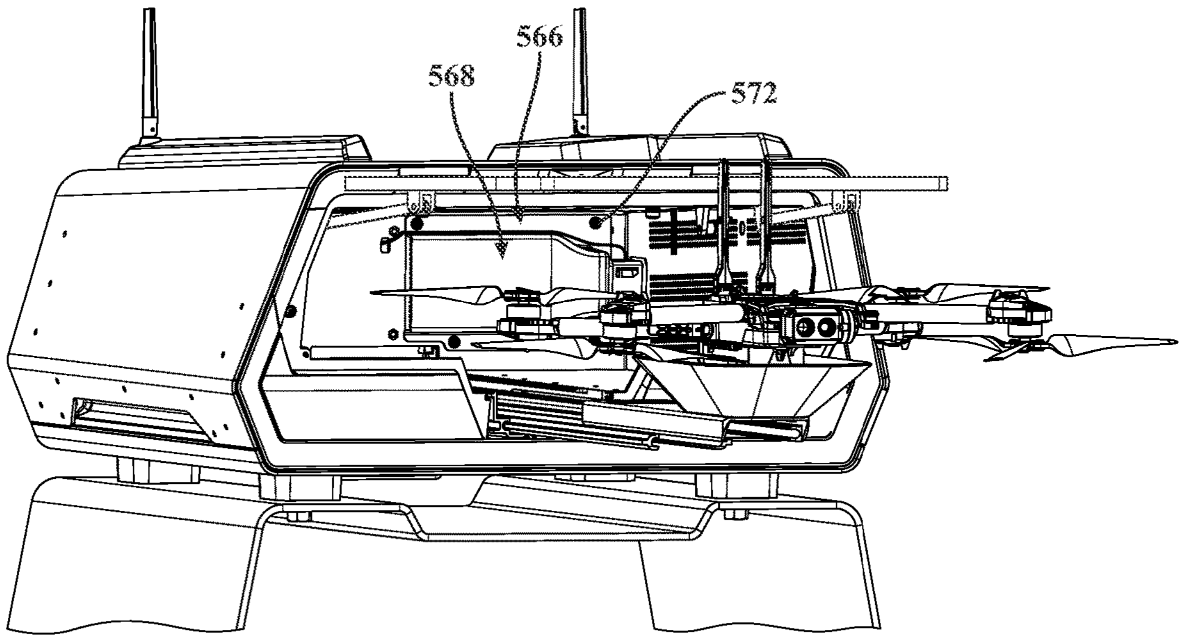
FIG. 82 is a front, perspective view of the base station shown with the air circulation module connected.

With reference now to FIGS. 79 and 82, in certain embodiments, the base station 100 may further include an air circulation module 566 to further facilitate the transfer of thermal energy away from, and thereby cool, the electronics module 500. As seen in FIG. 79, the air circulation module 566 is positioned about the electronics module 500 and includes ducting 568, which is configured to direct air flow across the electronics module 500, and a (first) fan 570, which is supported by (connected to) the ducting 568 and is configured to draw air therethrough.

The air circulation module 566 is removably supported by the enclosure 102 adjacent to the (rear) door 115. More specifically, the air circulation module 566 is connected to the rear frame 506 by a plurality of mechanical fasteners 572 (FIG. 82) (e.g., screws, pins, bolts, clips, etc.), which allows for removal of the electronics module 500 and the air circulation module 566 from the base station 100 independently of (separately from) each other to facilitate repair, service, replacement, etc., thereby further reducing downtime of the base station 100. Whereas the electronics module 500 is supported by (connected to) an outer (rear) surface 574 of the rear frame 506, the air circulation module 566 is supported by (connected to) an inner (front) surface 576 of the rear frame 506, whereby the rear frame 506 is located between the electronics module 500 and the air circulation module 566.

As seen in FIG. 79, the ducting 568 is configured to cover (overlie) the electronics module 500 and is configured in correspondence with the auxiliary heat sink 518. More specifically, the ducting 568 defines a chamber 578 with an inner contour 580 that mirrors (e.g., substantially matches) an outer contour 582 defined by the diffuser(s) 548. The corresponding configurations of the ducting 568 and the diffuser(s) 548 not only facilitates reception of the diffuser(s) 548 by the chamber 578, but proper mating of the ducting 568 and the auxiliary heat sink 518 as well as proper relative orientation of the air circulation module 566 and the electronics module 500.

As indicated above, the electronics module 500 is positioned behind the (rear) door 115 within the access window 508 defined by the rear frame 506 (e.g., such that the door 115 is positioned adjacent (or generally adjacent) to the electronics module 500). The door 115 acts not only the protect the electronics module 500, but reduce (if not entirely eliminate) emissions from the base station 100. More specifically, together with the enclosure 102, the door 115 defines a Faraday cage for the electronics module 500 that reduces (if not entirely eliminates) EMI and/or RFI. The door 115 also conceals and protects an air filter housing 584 (FIG. 80) for one or more of the internal fans (e.g., the fan 248 (FIG. 64)) located within the base station 100.

Figure 84:
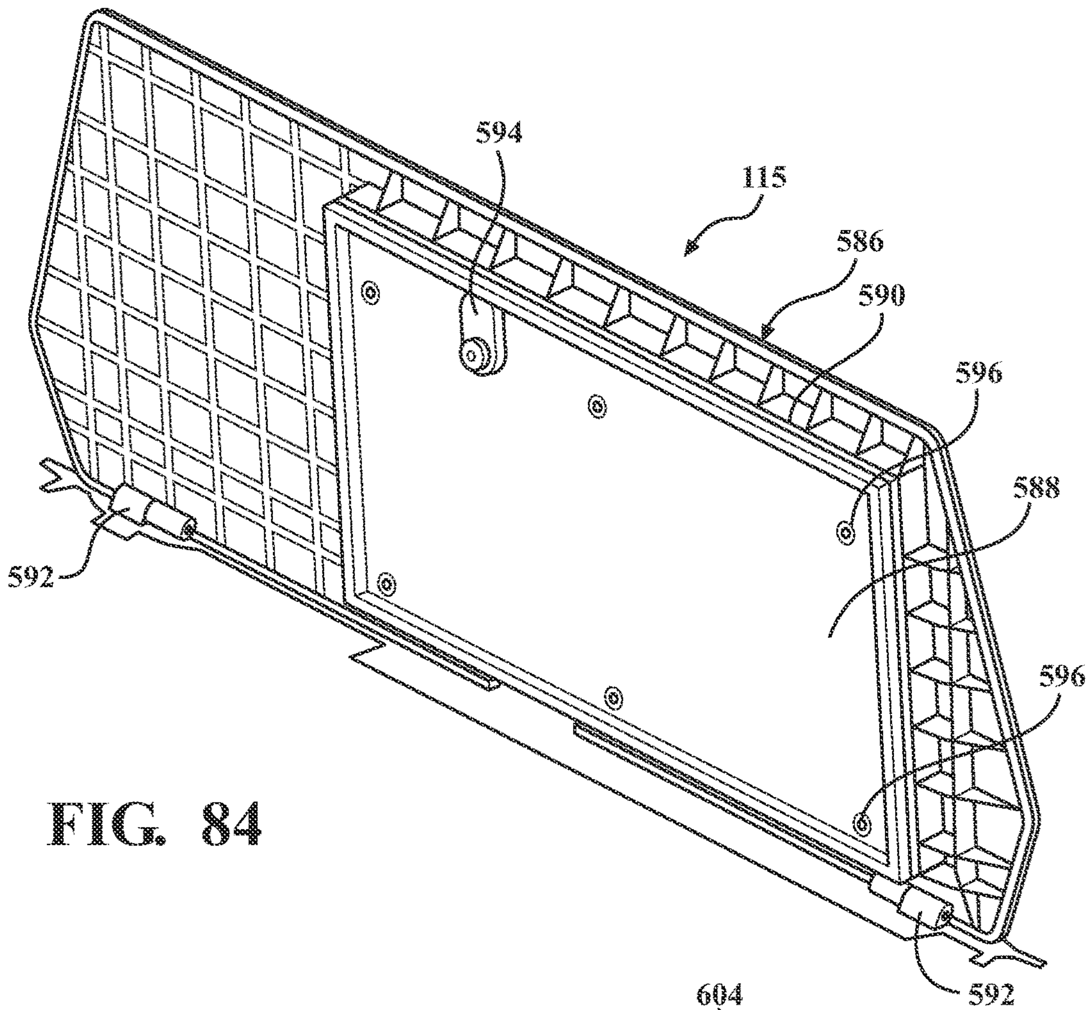
FIG. 84 is a front, perspective view of the rear door of the base station.

With reference to FIGS. 83 and 84, the door 115 includes: a (non-metallic) frame 586; a (metallic) panel 588 that is supported by (connected to) the frame 586; a sealing member 590 that extends about the panel 588 and which is configured for engagement (contact) with the enclosure 102 (e.g., the rear frame 506) to inhibit (if not entirely prevent) the entry of dust, debris, moisture, water, etc., into the base station 100; a plurality of hinges 592, which pivotably connect the door 115 to the rear frame 506; and a locking mechanism 594, which inhibits theft and/or unauthorized access to the internal components of the base station 100 through the door 115. The multi-material construction of the door 115 (e.g., the use of both metallic and non-metallic materials) not only reduces the overall weight of the door 115 and, thus, the base station 100, but the overall cost of the base station 100.

The panel 588 is fixedly connected to the frame 586 by a plurality of mechanical fasteners 596 (e.g., screws, pins, bolts, clips, etc.) such that the panel 588 is positioned in correspondence with the electronics assembly 500 and covers (overlies) the electronics assembly 500 upon closure of the door 115. The metallic construction of the panel 588 results in the creation of an enclosed, metallic environment for the electronics assembly 500 when the door 115 is closed and establishment of the aforementioned Faraday cage upon grounding of the enclosure 102 (e.g., the rear frame 506).

While the frame 586 and the panel 588 are respectively illustrated as including (e.g., as being formed partially or entirely from) plastic and sheet metal in the particular embodiment shown in the figures, it should be appreciated that the particular material(s) used in construction of the frame 586 and the panel 588 may be varied without departing from the scope of the present disclosure.

Figure 85:
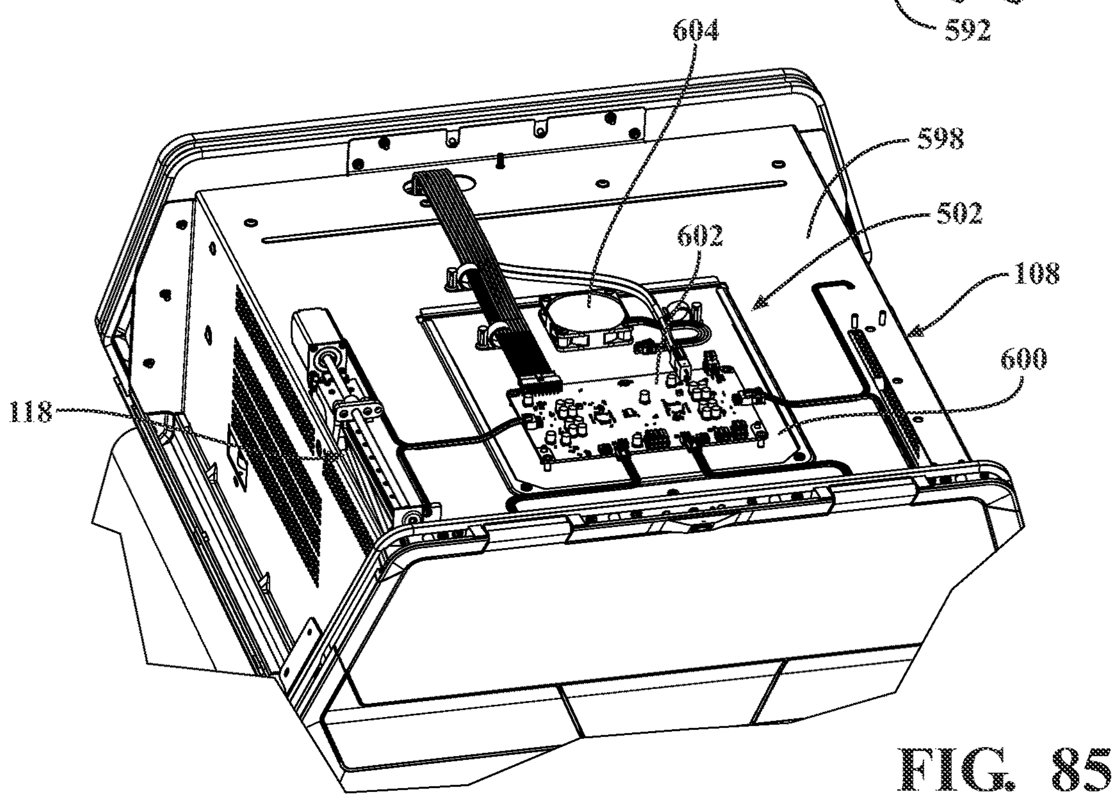
FIG. 85 is a partial, top, perspective view of the base station illustrating a (second) electronics module.
Figure 86:
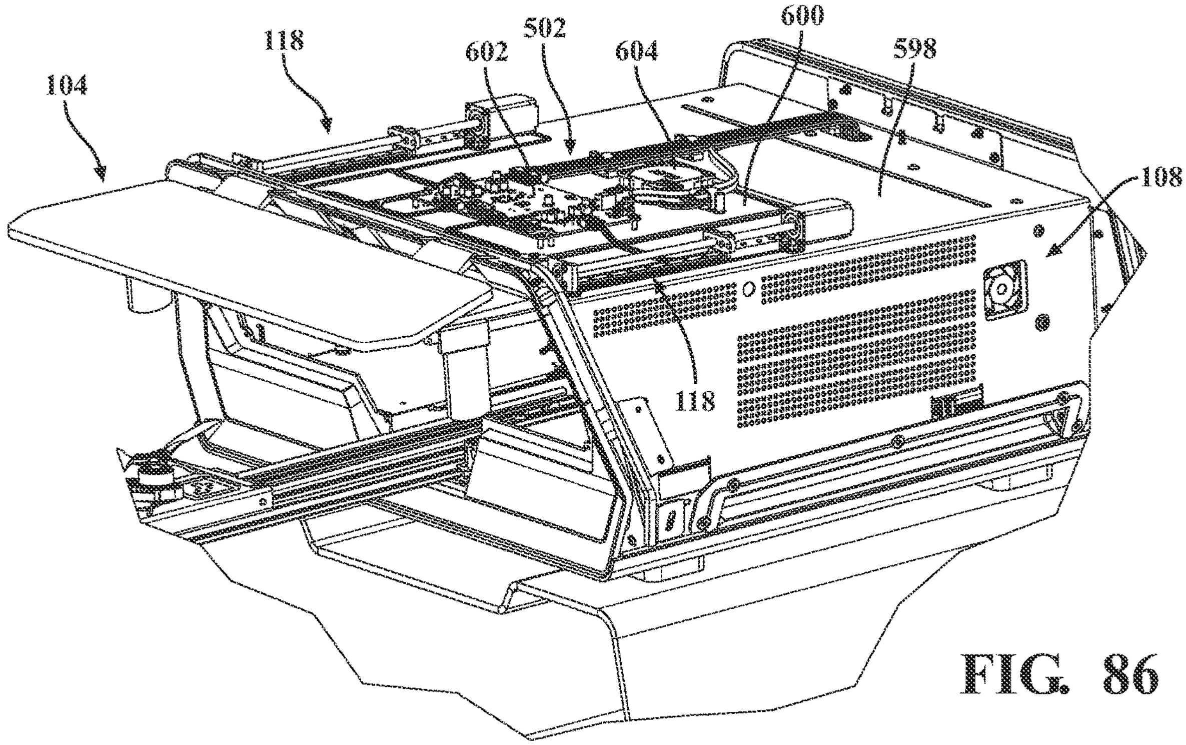
FIG. 86 is a partial, side, perspective view of the base station illustrating the electronics module seen in FIG. 85.
Figure 87:
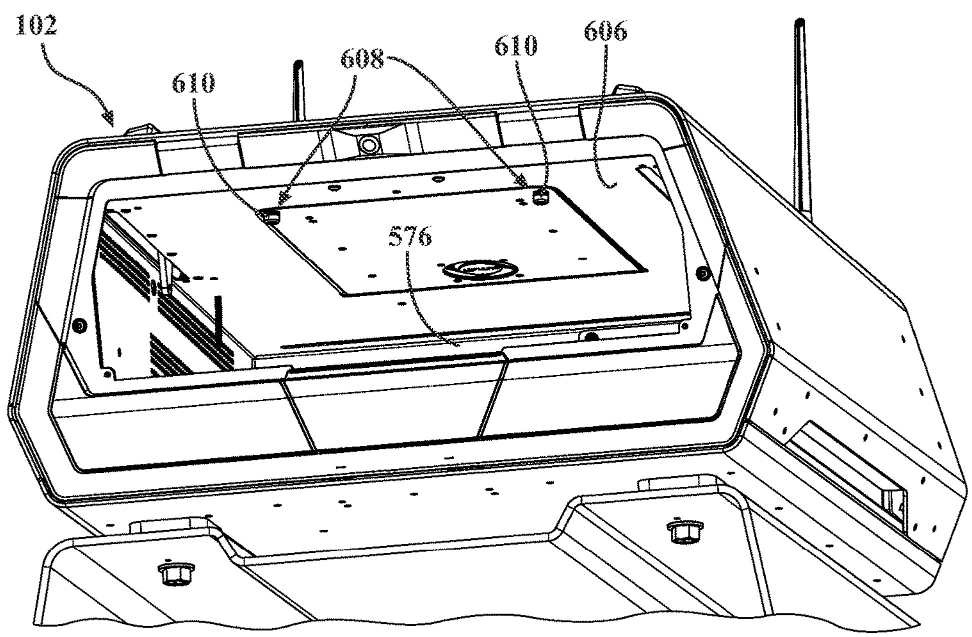
FIG. 87 is a front, perspective view of the base station illustrating the electronics module seen in FIG. 85.

With reference now to FIGS. 85-87, the (second) electronics module 502 will be discussed. The electronics module 502 is configured to facilitate and control operation of the actuator(s) 118 and, thus, opening and closure of the (front) door 104. The electronics module 502 is removably connected to a roof section 598 of the inner housing 108 and includes: an access panel 600, which is removably supported by (connected to) the roof section 598; a (second) PCBA 602; and a (second) fan 604, each of which is secured (connected) to the access panel 600.

As seen in FIG. 87, the access panel 600 is removably connected to an inner surface 606 of the roof section 598 via a plurality of mechanical fasteners 608, whereby the electronics module 502 can be accessed and/or removed from within the enclosure 102. Alternatively, the electronics module 502 (e.g., the PCBA 602 or the fan 604) can be accessed (e.g., serviced) externally upon removal of the outer housing 110 (FIG. 1). In the particular embodiment illustrated, the mechanical fasteners 608 are configured as thumb screws 610, which allow for toolless (e.g., manual) connection and disconnection of the access panel 600.

Figure 88:
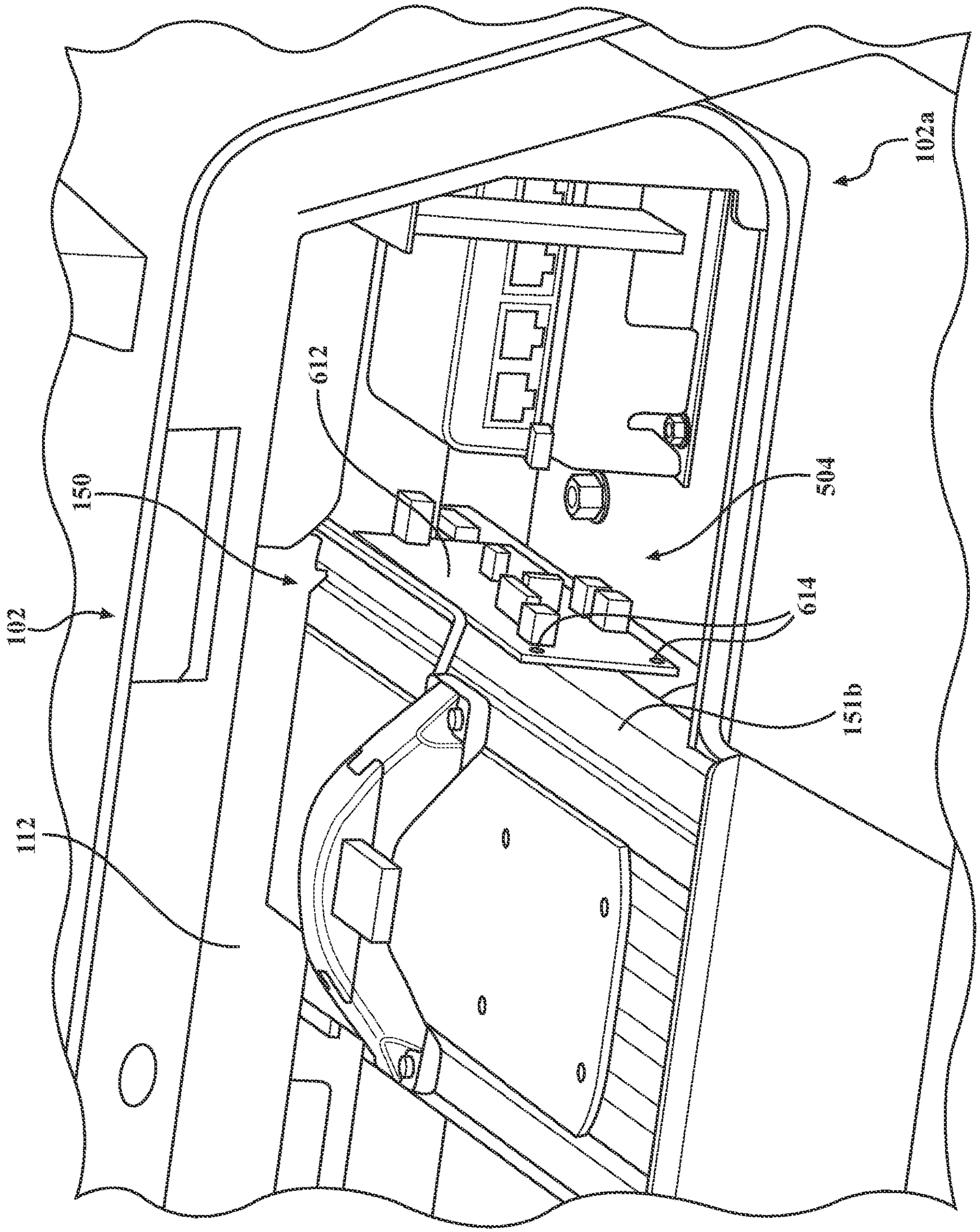
FIG. 88 is a partial, front, perspective view of the base station illustrating a (third) electronics module.

With reference now to FIG. 88, the (third) electronics module 504 will be discussed. The electronics module 504 is supported by (connected to) the slide mechanism 150 and is configured to facilitate and control the operation thereof and, thus, repositioning of the cradle 106 between the retracted and extended positions. More specifically, the electronics module 504 includes a (third) PCBA 612 that is removably connected to the stationary slide member **151*b* via a plurality of mechanical fasteners 614, which allows the electronics module 504 to be accessed and removed from within the internal cavity 112 of the enclosure 102 (via the front end 102*a*) upon opening of the door 104 and removal of the UAV 10**.

In certain embodiments, a method of docking a UAV within a base station including a landing surface and a door assembly movable in relation to the landing surface is disclosed. The method includes folding the rear propeller assemblies on the UAV via rotation of the rear propeller assemblies into contact with engagement members that are supported by the door assembly of the base station.

While the present disclosure has been described in connection with certain embodiments, it is to be understood that the present disclosure is not to be limited to the disclosed embodiments, but, on the contrary, is intended to cover various modifications and equivalent arrangements included within the scope of the appended claims, which scope is to be accorded the broadest interpretation so as to encompass all such modifications and equivalent structures as is permitted under the law.

Persons skilled in the art will understand that the various embodiments of the present disclosure and shown in the accompanying figures constitute non-limiting examples, and that additional components and features may be added to any of the embodiments discussed hereinabove without departing from the scope of the present disclosure. Additionally, persons skilled in the art will understand that the elements and features shown or described in connection with one embodiment may be combined with those of another embodiment without departing from the scope of the present disclosure to achieve any desired result and will appreciate further features and advantages of the presently disclosed subject matter based on the description provided. Variations, combinations, and/or modifications to any of the embodiments and/or features of the embodiments described herein that are within the abilities of a person having ordinary skill in the art are also within the scope of the present disclosure, as are alternative embodiments that may result from combining, integrating, and/or omitting features from any of the disclosed embodiments.

Use of the term "optionally" with respect to any element of a claim means that the element may be included or omitted, with both alternatives being within the scope of the claim. Additionally, use of broader terms such as "comprises," "includes," and "having" should be understood to provide support for narrower terms such as "consisting of," "consisting essentially of," and "comprised substantially of." Accordingly, the scope of protection is not limited by the description set out above, but is defined by the claims that follow, and includes all equivalents of the subject matter of the claims.

In the preceding description, reference may be made to the spatial relationship between the various structures illustrated in the accompanying drawings, and to the spatial orientation of the structures. However, as will be recognized by those skilled in the art after a complete reading of this disclosure, the structures described herein may be positioned and oriented in any manner suitable for their intended purpose. Thus, the use of terms such as "above," "below," "upper," "lower," "inner," "outer," "left," "right," "upward," "downward," "inward," "outward," "horizontal," "vertical," etc., should be understood to describe a relative relationship between the structures and/or a spatial orientation of the structures. Those skilled in the art will also recognize that the use of such terms may be provided in the context of the illustrations provided by the corresponding figure(s).

Additionally, terms such as "approximately," "generally," "substantially," and the like should be understood to allow for variations in any numerical range or concept with which they are associated and encompass variations on the order of 25% (e.g., to allow for manufacturing tolerances and/or deviations in design). For example, the term "generally parallel" should be understood as referring to configurations in with the pertinent components are oriented so as to define an angle therebetween that is equal to 180°+25% (e.g., an angle that lies within the range of (approximately) 135° to (approximately)) 225°. The term "generally parallel" should thus be understood as referring to encompass configurations in which the pertinent components are arranged in parallel relation.

Although terms such as "first," "second," "third," etc., may be used herein to describe various operations, elements, components, regions, and/or sections, these operations, elements, components, regions, and/or sections should not be limited by the use of these terms in that these terms are used to distinguish one operation, element, component, region, or section from another. Thus, unless expressly stated otherwise, a first operation, element, component, region, or section could be termed a second operation, element, component, region, or section without departing from the scope of the present disclosure.

Each and every claim is incorporated as further disclosure into the specification and represents embodiments of the present disclosure. Also, the phrases "at least one of A, B, and C" and "A and/or B and/or C" should each be interpreted to include only A, only B, only C, or any combination of A, B, and C.

What is claimed is:

1. A base station for an unmanned aerial vehicle (UAV), the base station comprising:

an enclosure defining an internal cavity configured to receive the UAV;

a door movably connected to the enclosure;

actuators extending between the door and the enclosure to facilitate opening and closure of the door;

a cradle configured to receive the UAV, the cradle being movable in relation to the enclosure such that the cradle is repositionable between a retracted position and an extended position to facilitate movement of the UAV into and out of the enclosure; and engagement members secured to the actuators and configured for contact with propeller assemblies on the UAV to facilitate folding of the propeller assemblies during movement of the UAV into the enclosure.

2. The base station of claim 1, wherein the engagement members include a compliant material to inhibit unseating of the UAV from the cradle upon contact between the engagement members and the propeller assemblies.

3. The base station of claim 1, wherein the engagement members include mounting brackets configured for connection to the actuators.

4. The base station of claim 1, wherein the actuators include:

a first actuator; and a second actuator spaced laterally from the first actuator along a width of the enclosure.

5. The base station of claim 4, wherein the engagement members include:

a first engagement member connected to the first actuator; and a second engagement member connected to the second actuator such that the second engagement member is spaced laterally from the first engagement member along the width of the enclosure.

6. A method of docking an unmanned aerial vehicle (UAV) within a base station, the method comprising:

opening a door of the base station;

performing a first stage retraction of the UAV into the base station;

partially folding rear propeller assemblies on the UAV via rotation of the rear propeller assemblies into contact with engagement members on the base station;

performing a second stage retraction of the UAV into the base station;

completely folding the rear propeller assemblies via rotation of the rear propeller assemblies into contact with the engagement members;

performing a third stage retraction of the UAV into the base station;

partially folding front propeller assemblies on the UAV via rotation of the front propeller assemblies into contact with the engagement members; and completely folding the front propeller assemblies.

7. The method of claim 6, wherein performing the second stage retraction of the UAV includes folding an antenna on the UAV via contact with the door.

8. The method of claim 6, wherein partially folding the rear propeller assemblies includes:

rotating a first rear propeller assembly in a first direction; and rotating a second rear propeller assembly in a second direction opposite to the first direction.

9. The method of claim 8, wherein completely folding the rear propeller assemblies includes:

rotating the first rear propeller assembly in the second direction; and rotating the second rear propeller assembly in the first direction.

10. The method of claim 9, wherein completely folding the rear propeller assemblies includes positioning the rear propeller assemblies such that they are oriented towards the front propeller assemblies.

11. The method of claim 10, further including partially closing the door to facilitate contact between the engagement members and the front propeller assemblies.

12. The method of claim 11, wherein partially folding the front propeller assemblies includes:

actively rotating a first front propeller assembly in the second direction; and actively rotating a second front propeller assembly in the first direction.

13. The method of claim 12, wherein partially folding the front propeller assemblies further includes:

passively rotating the first front propeller assembly in the first direction; and passively rotating the second front propeller assembly in the second direction, wherein passively rotating the first front propeller assembly and passively rotating the second front propeller assembly includes performing a fourth stage retraction of the UAV into the base station.

14. The method of claim 13, wherein partially folding the front propeller assemblies includes positioning the front propeller assemblies such that they are oriented away from the rear propeller assemblies.

15. The method of claim 14, wherein completely folding the front propeller assemblies includes:

rotating the first front propeller assembly in the first direction; and rotating the second front propeller assembly in the second direction.

16. The method of claim 15, wherein completely folding the front propeller assemblies includes actively rotating the front propeller assemblies such that they are oriented towards the rear propeller assemblies.

17. A method of docking an unmanned aerial vehicle (UAV) within a base station including a landing surface and a door assembly movable in relation to the landing surface, the method comprising:

folding rear propeller assemblies on the UAV via rotation of the rear propeller assemblies into contact with engagement members supported by the door assembly of the base station;

retracting the UAV into the base station; and folding front propeller assemblies on the UAV via rotation of the front propeller assemblies into contact with the engagement members.

18. The method of claim 17, further including adjusting a position of the door assembly to facilitate contact between the engagement members and the rear propeller assemblies and contact between the engagement members and the front propeller assemblies.

19. The method of claim 17, wherein folding the rear propeller assemblies and folding the front propeller assemblies includes rotating the rear propeller assemblies and rotating the front propeller assemblies into bumpers supported by actuators for the door assembly.

20. The method of claim 17, wherein folding the rear propeller assemblies and folding the front propeller assemblies includes rotating the rear propeller assemblies and rotating the front propeller assemblies into bumpers supported by a door of the door assembly.

* * * * *